(12) United States Patent
Kaneko

(10) Patent No.: US 9,110,205 B2
(45) Date of Patent: *Aug. 18, 2015

(54) BLACK CURABLE COMPOSITION, LIGHT-SHIELDING COLOR FILTER, LIGHT-SHIELDING FILM AND METHOD FOR MANUFACTURING THE SAME, WAFER LEVEL LENS, AND SOLID-STATE IMAGING DEVICE

(75) Inventor: Yushi Kaneko, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 193 days.

This patent is subject to a terminal disclaimer.

(21) Appl. No.: 13/514,887

(22) PCT Filed: Dec. 3, 2010

(86) PCT No.: PCT/JP2010/072190
§ 371 (c)(1),
(2), (4) Date: Jun. 8, 2012

(87) PCT Pub. No.: WO2011/071133
PCT Pub. Date: Jun. 16, 2011

(65) Prior Publication Data
US 2012/0243099 A1 Sep. 27, 2012

(30) Foreign Application Priority Data

Dec. 11, 2009 (JP) .................. 2009-281756
Dec. 11, 2009 (JP) .................. 2009-282002
Mar. 31, 2010 (JP) .................. 2010-082283
Mar. 31, 2010 (JP) .................. 2010-082284

(51) Int. Cl.
*G02B 5/00* (2006.01)
*G02B 13/00* (2006.01)
(Continued)

(52) U.S. Cl.
CPC ............ *G02B 5/003* (2013.01); *G02B 13/0085* (2013.01); *G03F 7/0007* (2013.01);
(Continued)

(58) Field of Classification Search
CPC .. G02B 5/003; G02B 13/0085; G02B 3/0012; G03F 7/105; G03F 7/0007; G03F 7/033; G03F 7/031; C09D 4/06; C08K 3/22; C08F 2/48; C08F 222/1006; C08F 2/44
See application file for complete search history.

(56) References Cited

U.S. PATENT DOCUMENTS 5,130,463 A  7/1992  Haubennestel et al.
5,725,978 A * 3/1998  Miyazawa .................. 430/25
(Continued)

FOREIGN PATENT DOCUMENTS

DE  3508820  *  9/1986
EP  2112182 A1  10/2009
(Continued)

OTHER PUBLICATIONS

Machine translation of JP 2008-051934.*
(Continued)

*Primary Examiner* — Martin Angebranndt
(74) *Attorney, Agent, or Firm* — Sughrue Mion, PLLC

(57) ABSTRACT

A black curable composition for a wafer level lens is provided which exhibits excellent developability during formation of a pattern and imparts excellent adhesion with a lens to a formed light-shielding film. The black curable composition contains an inorganic pigment, a specific dispersion resin, a polymerization initiator, and a polymerizable compound. The inorganic pigment is preferably titanium black.

29 Claims, 9 Drawing Sheets

(51) Int. Cl.
*G03F 7/00* (2006.01)
*G03F 7/031* (2006.01)
*G03F 7/033* (2006.01)
*G03F 7/105* (2006.01)
*C08F 2/44* (2006.01)
*C08F 2/48* (2006.01)
*C08F 222/10* (2006.01)
*C08K 3/22* (2006.01)
*C09D 4/06* (2006.01)
*G02B 3/00* (2006.01)

(52) U.S. Cl.
CPC .............. *G03F 7/031* (2013.01); *G03F 7/033* (2013.01); *G03F 7/105* (2013.01); *C08F 2/44* (2013.01); *C08F 2/48* (2013.01); *C08F 222/1006* (2013.01); *C08K 3/22* (2013.01); *C09D 4/06* (2013.01); *G02B 3/0012* (2013.01)

(56) References Cited

U.S. PATENT DOCUMENTS

| | | | |
|---|---|---|---|
| 6,426,829 B1 | 7/2002 | Feldman et al. | |
| 8,278,386 B2 * | 10/2012 | Nagata et al. | 524/497 |
| 2008/0063981 A1 * | 3/2008 | Ohnishi | 430/302 |
| 2008/0213550 A1 * | 9/2008 | Watanabe | 428/195.1 |
| 2009/0081420 A1 * | 3/2009 | Tojo et al. | 428/195.1 |
| 2009/0246650 A1 * | 10/2009 | Fujimori et al. | 430/7 |
| 2010/0002314 A1 * | 1/2010 | Duparre | 359/773 |
| 2010/0247752 A1 | 9/2010 | Hayashi et al. | |
| 2011/0279759 A1 * | 11/2011 | Nagata et al. | 349/106 |
| 2012/0134028 A1 * | 5/2012 | Maruyama | 359/601 |
| 2012/0202154 A1 * | 8/2012 | Shimada | 430/285.1 |
| 2012/0250166 A1 * | 10/2012 | Idei et al. | 359/722 |
| 2012/0262793 A1 * | 10/2012 | Yoshikawa et al. | 359/601 |
| 2013/0028587 A1 * | 1/2013 | Kaneko et al. | 396/439 |
| 2014/0011125 A1 * | 1/2014 | Inoue et al. | 430/7 |

FOREIGN PATENT DOCUMENTS

| | | | |
|---|---|---|---|
| JP | 60-175044 | * | 9/1985 |
| JP | 5-67433 A | | 3/1993 |
| JP | 9-54431 A | | 2/1997 |
| JP | 10-46042 A | | 2/1998 |
| JP | 10-246955 A | | 9/1998 |
| JP | 2000-104006 | * | 4/2000 |
| JP | 2003-183562 | * | 7/2003 |
| JP | 2003-238834 | * | 8/2003 |
| JP | 2003-344636 A | | 12/2003 |
| JP | 2004-287366 | * | 10/2004 |
| JP | 2004-339368 | * | 12/2004 |
| JP | 3724269 B2 | | 12/2005 |
| JP | 2006-36750 A | | 2/2006 |
| JP | 2006-182627 A | | 7/2006 |
| JP | 2006-206891 A | | 8/2006 |
| JP | 2006-209102 A | | 8/2006 |
| JP | 2007-113000 A | | 5/2007 |
| JP | 2007-115921 A | | 5/2007 |
| JP | 3926380 B1 | | 6/2007 |
| JP | 2008-039952 | * | 2/2008 |
| JP | 2008051934 A | | 3/2008 |
| JP | 2008122789 A | | 5/2008 |
| JP | 2008-134583 A | | 6/2008 |
| JP | 2009150979 A | | 7/2009 |
| JP | 2009197146 A | | 9/2009 |
| JP | 2009-244401 A | | 10/2009 |
| JP | 2009-276741 A | | 11/2009 |
| TW | 200905265 A | | 2/2009 |
| WO | 2005/037926 A1 | | 4/2005 |
| WO | 2008/102648 A1 | | 8/2008 |
| WO | 2008117803 A1 | | 10/2008 |
| WO | 2008/156148 A1 | | 12/2008 |
| WO | 2010/038836 | * | 4/2010 |

OTHER PUBLICATIONS

Machine translation of JP 2008-134583.*
Machine translation of JP 2004-122789.*
Machine translation of JP 2009-244401.*
First Office Action, issued Oct. 24, 2013, issued in corresponding Chinese Application No. 201080056050.1, 17 pages in English and Chinese.
International Search Report for PCT/JP2010/072190 dated Mar. 8, 2011.
Communication, dated Jan. 2, 2014, issued in corresponding EP Application No. 10836052.0, 6 pages in English.
Notice of Reasons for Rejection, dated Dec. 3, 2013, issued in corresponding JP Application No. 2009-281756, 6 pages in English and Japanese.
Notice of Reasons for Rejection, dated Dec. 3, 2013, issued in corresponding JP Application No. 2010-082283, 7 pages in English and Japanese.
Notice of Reasons for Rejection, dated Dec. 3, 2013, issued in corresponding JP Application No. 2010-082284, 7 pages in English and Japanese.
Office Action dated Oct. 21, 2014, issued by the Japanese Patent Office in counterpart Japanese Application No. 2010-082283.
Office Action dated Aug. 26, 2014, issued by the Japanese Patent Office in counterpart Japanese Application No. 2009-281756.
Office Action dated Jan. 23, 2015 from the Taiwanese Patent Office in counterpart Taiwanese Application No. 099142578.
Decision of Refusal dated Jun. 2, 2015 from the Japanese Patent Office in counterpart JP Application No. 2010-082283.
Decision to Dismiss Amendment dated Jun. 2, 2015 from the Japanese Patent Office in counterpart JP Application No. 2010-082283.

* cited by examiner

BLACK CURABLE COMPOSITION, LIGHT-SHIELDING COLOR FILTER, LIGHT-SHIELDING FILM AND METHOD FOR MANUFACTURING THE SAME, WAFER LEVEL LENS, AND SOLID-STATE IMAGING DEVICE

CROSS REFERENCE TO RELATED APPLICATIONS

This application is a National Stage of International Application No. PCT/JP2010/072190 filed Dec. 3, 2010, claiming priority based on Japanese Patent Application Nos. 2009-281756 filed Dec. 11, 2009, 2009-282002 filed Dec. 11, 2009, 2010-082283 filed Mar. 31, 2010, and 2010-082284 dated Mar. 31, 2010, the contents of all of which are incorporated herein by reference in their entirety.

TECHNICAL FIELD

The present invention relates to a black curable composition, a light-shielding color filter, a solid-state imaging device, a wafer level lens, a light-shielding film, and a method for manufacturing the light-shielding film.

Specifically, the present invention relates to a black curable composition for a wafer level lens, which is useful for formation of a light-shielding layer of a wafer level lens in which plural lenses are arranged on a substrate, and a wafer level lens including a light-shielding film obtained by using the black curable composition.

Further, the present invention relates to a black curable composition, a light-shielding film and a method for manufacturing the same, and a solid-state imaging device.

RELATED ART

Recently, mobile terminals of electronic equipment such as mobile phones or Personal Digital Assistants (PDAs) have come to be equipped with small and low-profile (thin) imaging units. These imaging units generally include solid-state imaging devices such as a charge coupled device (CCD) image sensor or a Complementary Metal-Oxide Semiconductor (CMOS) image sensor, and lenses for imaging a subject image on the solid-state imaging devices.

With the reduction in size and thickness of mobile terminals and with the widespread use thereof, further reduction in the size and thickness of an imaging unit mounted in a mobile terminals is required and improvement in the productivity thereof is also required. With respect to such requirements, a method of mass-producing imaging units is known whereby a lens substrate on which plural lenses are formed and a sensor substrate on which plural solid-state imaging devices are formed are integrally combined, and then the lens substrate and the sensor substrate are cut so as to include a lens and a solid-state imaging device in each cut portion.

In addition, adopting a method of forming a lens on a wafer enables various simple methods of formation to be carried out including, for example, a method where only lenses are produced on a glass wafer, for example, which is cut to a size for combination of the respective lenses with sensors, followed by combination with pre-separated imaging devices to produce respective imaging units; a method where plural lenses are formed from only a resin using a mold, which are combined on a sensor substrate and then cut; and a method where a lens is cut to a size for combination with respective sensors, followed by combination with pre-separated imaging devices, to produce respective imaging units.

Hereinbelow, each one of plural lenses formed on a lens substrate is referred to as a wafer level lens, and a group of lenses formed on a lens substrate, including the lens substrate, is referred to as a wafer level lens array.

Recently, there have been attempts to use a light-shielding curable composition for camera module members in, for example, a mobile phone. In particular, as a conventional wafer level lens arrays, a wafer level lens array is known that has plural lenses formed thereon by applying dropwise a curable resin material onto the surface of a parallel plate formed of a light transmissive material such as glass and curing the resin material in a state in which it is arranged in a prescribed shape using a mold (see, for example, Japanese Patent No. 3926380, International Publication WO 2008/102648, and U.S. Pat. No. 6,426,829). A light-shielding region made of a black film, a metal film or the like may be formed so as to modulate the light amount in a region other than the lens section of a wafer level lens, or at a part of the lens. In general, the light-shielding region is formed by coating a curable light-shielding composition using a photolithography method or by depositing a metal.

When using the photolithography method, a black film is formed by applying a light-shielding composition (for example, a light-shielding curable composition) onto a lens and a glass substrate, exposing and curing a section thereof in which a light-shielding film is to be formed, and removing the light-shielding composition in the unexposed section using an alkali developing liquid.

For this reason, it is important that a light-shielding film exhibits both high adhesion to a lens section and high adhesion to a glass substrate, but it is very difficult to satisfy both of these requirements. Further, the developability of the unexposed section and the adhesion of the light-shielding film in the exposed section are important in order to form a light-shielding film as designed. However, if the developability is improved so as not to allow a residue to remain on the lens, the adhesion between the formed cured film and the lens is reduced, and thus, there is a concern that the light-shielding film will easily peel off. On the other hand, when introducing a partial structure, for improving adsorption property, to a curable composition in order to improve the adhesion thereof with the lens, the developability is reduced correspondingly, and thus, a problem is caused whereby the light-shielding film remains on the lens due to poor development. Therefore, compatibility between adhesion with the lens and developability during formation of a pattern is very difficult to achieve.

Furthermore, a light-shielding film is provided in solid-state imaging devices such as a CCD image sensor or a CMOS image sensor, for the purpose of preventing generation of noise and improving image quality.

As a composition for forming a light-shielding film for a solid-state imaging device, a black curable composition containing black color materials such as carbon black or titanium black is known.

Specifically, for the purpose of improving optical density or the like, a black curable composition containing titanium black having a specific X-ray diffraction peak intensity ratio (see, for example, Japanese Patent No. 3724269 and International Publication WO 2005/037926), and a black curable composition containing titanium black having a specific nitrogen concentration or a specific crystallite diameter (see, for example, Japanese Patent Application Laid-Open (JP-A) No. 2006-182627, JP-A No. 2006-206891, and JP-A No. 2006-209102) have been investigated.

Furthermore, a composition for forming a light-shielding film, which contains titanium black and a resin component for the purpose of obtaining a high light-shielding property with a thin film, has been disclosed (see, for example, JP-A No. 2007-115921).

Moreover, a color filter used in a liquid crystal display device includes a light-shielding color filter called a black matrix for the purpose of improving contrast by shielding light between colored pixels, and other purposes. Further, a camera module including a wafer level lens formed by integration of a solid-state imaging device and a lens is also provided with a light-shielding color filter or a light-shielding film for the purpose of preventing generation of noise, improving the image quality, and other purposes.

As the composition for forming a black matrix for a liquid crystal display device or a light-shielding color filter for a solid-state imaging device, a photosensitive resin composition containing black color materials such as carbon black or titanium black is known (see, for example, JP-A No. 10-246955, JP-A No. 9-54431, JP-A No. 10-46042, JP-A No. 2006-36750, and JP-A No. 2007-115921).

A black matrix for a liquid crystal display device is usually required to exhibit light-shielding properties in the visible light region, whereas a light-shielding color filter for a solid-state imaging device and a light-shielding film for a wafer level lens are required to exhibit light-shielding properties in the infrared light region as well as light-shielding properties in the visible light region.

That is, a light-shielding color filter for a solid-state imaging device and a light-shielding film for a wafer level lens are required to block light of a wavelength in the infrared light region from 800 nm to 1300 nm as well as to block light in the visible light region for the prevention of noise. When forming a light-shielding color filter for a solid-state imaging device and a light-shielding film for a wafer level lens by employing a photosensitive resin composition containing a black pigment such as carbon black, which has been conventionally used in a black matrix in, for example, a liquid crystal display device, the light-shielding properties are insufficient in the infrared light region, and when attempting to satisfy the demands for light-shielding properties in the infrared light region, it is necessary to increase the carbon content or thicken the black layer of the light-shielding color filter.

When the photosensitive resin composition containing carbon black is cured by exposure with ultraviolet rays or the like, carbon black absorbs ultraviolet rays in a 300 nm to 500 nm region. As a result, the curing of the photosensitive resin composition is insufficient, and a product satisfying the above requirements cannot be obtained.

Other black inorganic pigments—for example, a metal pigment containing a metal such as silver or tin, or titanium black—have a higher light-shielding property in the infrared light region than carbon black, and further, absorption of ultraviolet rays at a wavelength of 300 nm to 500 nm is lower than with carbon black. However, when the photosensitive resin composition containing the black inorganic pigment is cured with ultraviolet rays, there is still the problem that the curing is insufficient and adhesion to the substrate is low.

Recently, as solid-state imaging devices have become smaller, thinner, and more sensitive, there have been increasingly strong demands for a light-shielding film which blocks infrared light incident on a silicon substrate from one side of a silicon substrate having an imaging device on the other side. For example, there are increasingly strong demands for a light-shielding film (which is hereinafter also referred to as "infrared light-shielding film") which blocks infrared light incident on a silicon substrate.

The reason for this is that a silicon substrate which is a base body of a solid-state imaging device exhibits a high transmittance with respect to infrared light, and further, an imaging device with which a solid-state imaging device is equipped has sensitivity not only to visible light rays but also to infrared light.

For electrical connection to an imaging device section contained at one side of a silicon substrate in the above kind of solid-state imaging device, methods are often employed in which a solder ball electrically connected with the metal electrode formed on the other side of the silicon substrate is interposed and connected to a circuit substrate. In this case, a solder resist layer is formed as a protective layer in the metal electrode in places other than those having a connection between the metal electrode and the solder ball. In this regard, both of high adhesion strength with the metal electrode and high adhesion strength with the solder resist layer are required in the infrared light-shielding film. Such infrared light-shielding film is generally formed in a pattern shape on the metal electrode and the solder resist layer using a photolithography method.

In these circumstances, since a light-shielding film (infrared light-shielding film) using carbon black has a high transmittance with respect to infrared light, the above requirements are far from satisfied. As such, a light-shielding film using titanium black, or a light-shielding film using a metal pigment containing a metal such as silver or tin has a low transmittance with respect to infrared light and an excellent infrared light-shielding ability, and is therefore suitable as a light-shielding film which satisfies the requirements.

However, according to the investigation of the inventors of the present invention, it became apparent that when a light-shielding film is formed using a black curable composition containing an inorganic pigment such as titanium black, residue derived from the black curable composition tends to remain outside the region in which the light-shielding film is formed. On the other hand, in order to reduce the residue, when an alkali-soluble resin, for example, is added as an additive to the black curable composition and the addition amount thereof is relatively high, the developability during formation of the light-shielding film is improved and thus, the residue is reduced. However, a region (step) in which the film thickness of the peripheral portion of the light-shielding film becomes lower than that of the central portion of the light-shielding film is generated and, therefore, there is the problem that the light-shielding ability in the peripheral portion of the light-shielding film is reduced, and thus, the infrared light-shielding ability of the light-shielding film is reduced. Further, when the addition amount of the alkali-soluble resin is relatively high in order to remove the residue as described above, there is a problem in that the adhesion of the light-shielding film to the silicon substrate is reduced and, therefore, the light-shielding film is easily peeled off. As such, it is difficult to provide a black curable composition for formation of a light-shielding film which provides an excellent infrared light-shielding ability, reduction in residue, and good adhesion to a silicon substrate.

Furthermore, as described above, a black curable composition including a metal pigment containing a metal such as silver or tin, or including titanium black has insufficient transmittance at a wavelength of from 300 nm to 500 nm and poor adhesion with a solder resist layer or a metal electrode.

A light-shielding curable composition containing a block polymer dispersant as a dispersant used for manufacturing a color material dispersion of a colored pigment, a light-shielding material, or the like, is known (see, for example, JP-A No. 2007-113000). However, there are no specific examples of the applications for forming a light-shielding film using a light-shielding material, and there is a need for the development thereof.

DISCLOSURE OF INVENTION

The present invention has been made in view of the above, and addresses the following objectives.

According to a first aspect of the invention, a black curable composition for a wafer level lens is provided which exhibits excellent developability during formation of a pattern and also imparts excellent adhesion with a lens to a light-shielding film formed therefrom.

According to the first aspect of the invention, a wafer level lens is also provided which allows the amount of light to be appropriately adjusted by the presence of a light-shielding film and which can be simply manufactured.

According to a second aspect of the invention, a black curable composition for formation of a light-shielding film is provided, which is capable of forming a light-shielding film having an excellent infrared light-shielding ability, which enables reduction of residue generated in an unexposed region during formation of the light-shielding film and has excellent adhesion to a silicon substrate.

According to the second aspect of the invention, a light-shielding film having an excellent infrared light-shielding ability and excellent adhesion to a silicon substrate is provided, and a method for manufacturing a light-shielding film is provided, with which the obtained light-shielding film has an excellent infrared light-shielding ability, in which residue generated in an unexposed region thereof during formation of the light-shielding film is reduced, and which also has improved adhesion to a silicon substrate.

According to the second aspect of the invention, a solid-state imaging device is provided, which exhibits reduction in noise caused by infrared light and reduction in noise caused by residue, and also has a uniform film thickness.

According to a third aspect of the invention, a black curable composition is provided, which is capable of forming a light-shielding film which has favorable light-shielding properties with respect to light in a broad wavelength range from the visible light region to the infrared light region and good adhesion to a substrate, which also has a high curing sensitivity, and can form a high-precision pattern.

According to the third aspect of the invention, a light-shielding color filter for a solid-state imaging device is provided, which exhibits improved image quality with fine precision and prevents noise generation by using the black curable composition according to the present invention; a wafer level lens is provided, which allows the amount of light to be appropriately adjusted and can be simply manufactured; and a light-shielding film for a solid-state imaging device and a method for manufacturing the same are provided.

The inventors of the present invention have made extensive studies of these aspects, and as a result, they have found that the objectives can be achieved by using a pigment dispersion containing a resin having a specific structure, thereby completing the present invention.

That is, according to a first aspect of the invention, a black curable composition for a wafer level lens is provided, which includes (A1) an inorganic pigment, (B1) a dispersion resin having a phosphoric acid group or a sulfonic acid group in a molecule thereof, (C1) a polymerization initiator, and (D1) a polymerizable compound.

As the (A1) inorganic pigment used herein, from the viewpoints of transmittance properties in the ultraviolet region and light-shielding properties from the visible light region to the infrared light region, titanium black is preferable.

In the black curable composition, it is preferable that the (A1) inorganic pigment be contained in the form of a pigment dispersion obtained by dispersing the inorganic pigment using the (B1) dispersion resin containing a phosphoric acid group or a sulfonic acid group, from the viewpoint of uniformity of the formed light-shielding film.

Since the black curable composition for a wafer level lens according to the first aspect of the invention contains the (A1) inorganic pigment, and preferably titanium black, as a light-shielding material, it cures with high sensitivity while maintaining the light-shielding properties and, therefore, it functions as a black resist having excellent resistance to a developing liquid.

Further, for the purpose of improving the light-shielding performance in the visible light region, it is preferable to further add a colorant selected from a pigment dispersion containing a desired (E1) organic pigment, a dye, or the like.

In the first aspect of the present invention, a wafer level lens which has a light-shielding section obtained by using the black curable composition for a wafer level lens of the present invention at a peripheral portion of a lens that is present on a substrate, is provided.

Specifically, the first aspect of the invention is described below.

<1> A black curable composition for a wafer level lens, comprising:
(A1) an inorganic pigment;
(B1) a dispersion resin having a phosphoric acid group or a sulfonic acid group in a molecule thereof;
(C1) a polymerization initiator; and
(D1) a polymerizable compound.

<2> The black curable composition according to <1>, wherein the (A1) inorganic pigment comprises titanium black.

<3> The black curable composition according to <1> or <2>, further comprising (E) an organic pigment.

<4> The black curable composition according to any one of <1> to <3>, wherein the (B1) dispersion resin comprises a copolymer of a monomer (b1-1) having a phosphoric acid group or a sulfonic acid group with a macromonomer (b1-2) having a weight average molecular weight of from 1,000 to 30,000.

<5> The black curable composition according to any one of <1> to <3>, wherein the (B1) dispersion resin comprises a resin represented by the following Formula (I):

Formula (I)

wherein, in Formula (I), $R_A$ represents a molecular chain which has a number average molecular weight of from 500 to 30,000 and which is selected from a polyether or a polyester; and y represents 1 or 2.

<6> A wafer level lens, comprising, at a peripheral portion of a lens that is present on a substrate, a light-shielding section obtained using the black curable composition for a wafer level lens according to any one of <1> to <5>.

The second aspect of the invention is described below.

<7> A black curable composition for formation of a light-shielding film, comprising:
(A2) an inorganic pigment;
(B2) a dispersion resin which has at least one of a phosphoric acid group or a sulfonic acid group in a molecule thereof and has an acid value of from 10 mgKOH/g to 100 mgKOH/g;

(C2) a polymerization initiator; and (D2) a polymerizable compound, wherein the light-shielding film blocks infrared light and is provided on one surface of a silicon substrate having an imaging device section on an opposite surface thereof.

<8> The black curable composition according to <7>, wherein the (A2) inorganic pigment comprises titanium black.

<9> The black curable composition according to <7> or <8>, wherein the (B2) dispersion resin comprises a copolymer of a monomer (b2-1) having at least one of a phosphoric acid group or a sulfonic acid group with a macromonomer (b2-2) having a weight average molecular weight of from 1,000 to 30,000.

<10> The black curable composition according to any one of <7> to <9>, wherein the (B2) dispersion resin comprises a resin represented by the following Formula (I):

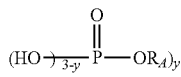

Formula (I)

wherein, in Formula (I), $R_A$ represents a molecular chain which has a number average molecular weight of from 500 to 30,000 and which is selected from a polyether or a polyester; and y represents 1 or 2.

<11> The black curable composition according to any one of <7> to <10>, wherein the (B2) dispersion resin has an acid value of from 20 mgKOH/g to 70 mgKOH/g.

<12> The black curable composition according to any one of <7> to <11>, wherein the (C2) polymerization initiator is an oxime ester compound or a hexaarylbiimidazole compound.

<13> The black curable composition according to <8>, wherein the titanium black as the (A2) inorganic pigment has an average primary particle diameter of from 30 nm to 65 nm.

<14> The black curable composition according to any one of <7> to <13>, wherein the content of the (B2) dispersion resin in terms of mass ratio is from 0.20 to 0.40 relative to the (A2) inorganic pigment.

<15> A light-shielding film, which is formed using the black curable composition according to any one of <7> to <14> on one surface of a silicon substrate having an imaging device section on an opposite surface thereof.

<16> A method for manufacturing a light-shielding film, comprising: applying the black curable composition according to any one of <7> to <14> on one surface of a silicon substrate having an imaging device section on an opposite surface thereof to form a black curable composition layer;

subjecting the black curable composition layer to pattern exposure; and developing the black curable composition layer after exposure to form a pattern.

<17> A solid-state imaging device, comprising the light-shielding film according to <15> on one surface of a silicon substrate having an imaging device section on an opposite surface thereof.

<18> The solid-state imaging device according to <17>, comprising:

a silicon substrate having an imaging device section on one surface thereof;

a metal electrode provided on an opposite surface of the silicon substrate and electrically connected with the imaging device section; and the light-shielding film according to <15>, which is provided on the surface of the silicon substrate having the metal electrode provided thereon, and which is patterned so that at least a part of the metal electrode is exposed.

<19> The solid-state imaging device according to <18>, wherein a solder resist is provided between the metal electrode and the light-shielding film.

The third aspect of the invention is described below.

<20> A black curable composition, comprising:

(A3) an inorganic pigment;

(B3) a chain resin comprising a solvent-compatible moiety and a pigment-adsorbing moiety having an acid group or a basic group;

(C3) a polymerization initiator; and (D3) a polymerizable compound.

<21> The black curable composition according to <20>, wherein the (A3) inorganic pigment comprises titanium black.

<22> The black curable composition according to <20> or <21>, wherein the solvent-compatible moiety comprises repeating units having an I/O value in a range from 0.05 to 1.50 in an amount of 80% by mass or more.

<23> The black curable composition according to any one of <20> to <22>, wherein the solvent-compatible moiety comprises a repeating unit represented by the following Formula (I-A) or the following Formula (I-B):

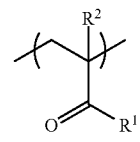

(I-A)

wherein, in Formula (I-A), $R^1$ represents an alkoxy group, a cycloalkoxy group, or an aryloxy group; and $R^2$ represents a hydrogen atom, a halogen atom, or an alkyl group:

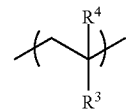

(I-B)

wherein, in Formula (I-B), $R^3$ represents an aryl group; and $R^4$ represents a hydrogen atom or an alkyl group.

<24> The black curable composition according to any one of <20> to <23>, wherein the (C3) polymerization initiator is an oxime ester compound or a hexaarylbiimidazole compound.

<25> The black curable composition according to any one of <20> to <24>, further comprising (E3) an alkali-soluble resin that is other than the (B3) chain resin.

<26> The black curable composition according to any one of <20> to <25>, further comprising (F3) an organic pigment.

<27> A black curable composition for a solid-state imaging device, comprising the black curable composition according to any one of <20> to <26>.

<28> A light-shielding color filter for a solid-state imaging device, comprising the black curable composition according to <27>.

<29> A solid-state imaging device, comprising the light-shielding color filter for a solid-state imaging device according to <28>.

<30> A black curable composition for a wafer level lens, comprising the black curable composition according to any one of <20> to <26>.

<31> A wafer level lens, comprising, at a peripheral portion of a lens present on a substrate, a light-shielding film obtained using the black curable composition according to <30>.

<32> The black curable composition according to any one of <20> to <26>, which is used for formation of an infrared light-shielding film which blocks infrared light and is provided on one surface of a silicon substrate.

<33> An infrared light-shielding film, which is formed, using the black curable composition according to <32> and on a silicon substrate having an imaging device section, on an opposite surface to a surface on which the imaging device is provided.

<34> A method for manufacturing an infrared light-shielding film, comprising:

applying the black curable composition according to <32> to a silicon substrate having an imaging device section, on an opposite surface to a surface on which the imaging device is provided, to form a photosensitive layer;

subjecting the photosensitive layer to pattern exposure; and developing the photosensitive layer after exposure to form a pattern.

<35> A solid-state imaging device, comprising the infrared light-shielding film according to <33> provided on a silicon substrate having an imaging device section, at an opposite surface to a surface on which the imaging device is provided.

According to the first aspect of the present invention, a black curable composition for a wafer level lens is provided, which can form a cured film having an excellent light-shielding property, which can form a light-shielding film in which no residue is caused by development residue after formation of a pattern on a lens and which has excellent adhesion to a glass substrate.

According to the first aspect of the present invention, a wafer level lens is also provided, which allows the amount of light to be appropriately adjusted by the presence of the light-shielding film and can be simply manufactured.

According to the second aspect of the present invention, a black curable composition for formation of a light-shielding film is provided, which can form a light-shielding film having an excellent infrared light-shielding ability, and having a reduced amount of residue in an unexposed region during formation of the light-shielding film, and also having excellent adhesion to a silicon substrate.

According to the second aspect of the present invention, a light-shielding film is also provided, which has an excellent infrared light-shielding ability, can reduce the amount of residue in an unexposed region during formation of the light-shielding film, and also has excellent adhesion to a silicon substrate.

According to the second aspect of the present invention, a method for manufacturing a light-shielding film is provided, which has an excellent infrared light-shielding ability and thus can reduce the amount of residue in an unexposed region during formation of the light-shielding film, and also has improved adhesion to a silicon substrate.

According to the second aspect of the present invention, a solid-state imaging device is provided, which has reduced noise caused by infrared light and reduced noise caused by residue, and thus has a uniform film thickness.

According to <20> according to the third aspect of the present invention, a black curable composition is provided, which can form alight-shielding film having favorable light-shielding properties with respect to light in a broad wavelength range from the visible light region to the infrared light region and good adhesion to a substrate, which also has a high curing sensitivity, and can form a high-precision pattern.

Further, by using the black curable composition according to the third aspect of the present invention, a light-shielding color filter for a solid-state imaging device which has improved image quality due to fine precision and prevention of noise generation, and a wafer level lens which allows the amount of light to be appropriately adjusted and can be simply manufactured, are provided.

In addition, by using the black curable composition according to the third aspect of the present invention, a solid-state imaging device having a reduced amount of noise caused by infrared light, is provided.

That is, according to <28> to <29> according to the third aspect of the invention, a black curable composition for solid-state imaging, which can form a light-shielding color filter for a solid-state imaging device having favorable light-shielding properties with respect to light in a broad wavelength range from the visible light region to the infrared light region and good adhesion to a substrate, a light-shielding color filter for a solid-state imaging device including the same, and a solid-state imaging device including the light-shielding color filter for a solid-state imaging device, are provided.

Further, according to <30> to <31> according to the third aspect of the invention, a black curable composition for a wafer level lens, which can form a light-shielding film having favorable light-shielding properties with respect to light in a broad wavelength range from the visible light region to the infrared light region and good adhesion to a substrate, and a wafer level lens having a light-shielding film obtained by using the same, are provided.

In addition, according to <32> to <35> according to the third aspect of the invention, a black curable composition used for formation of an infrared light-shielding film having an infrared light-shielding performance and excellent adhesion to both of a metal electrode and a solder resist layer, an infrared light-shielding film formed by using the same, a method for manufacturing the same, and a solid-state imaging device having the infrared light-shielding film, are provided.

The black curable composition according to the third aspect of the present invention includes (A3) an inorganic pigment, (B3) a resin having a specific structure, (C3) a polymerization initiator, and (D3) a polymerizable compound, in which the (B3) resin having a specific structure contains a solvent-compatible moiety, and a pigment-adsorbing moiety having an acid group or a basic group. Thus, when the black curable composition is used in the light-shielding color filter of a solid-state imaging device, the substrate adhesion is improved. Particularly, in the applications for wafer level lenses, both the adhesion between the lens peripheral portion and the light-shielding film, and the adhesion between the glass substrate and the light-shielding film can be improved at the same time. Further, as for the infrared light-shielding film which blocks infrared light applied to one surface of the silicon substrate, the adhesion both to the solder resist and the metal electrode is improved. The reason for this is presumed to be that the solvent-compatible moiety of the (B3) resin having a specific structure spreads into a solvent, and also has densely-concentrated acid groups or basic groups, and that the adhesion is improved not only to the surface of the inorganic pigment but also to the lens peripheral portion and the glass substrate.

BEST MODE FOR CARRYING OUT THE INVENTION

Figure 1:
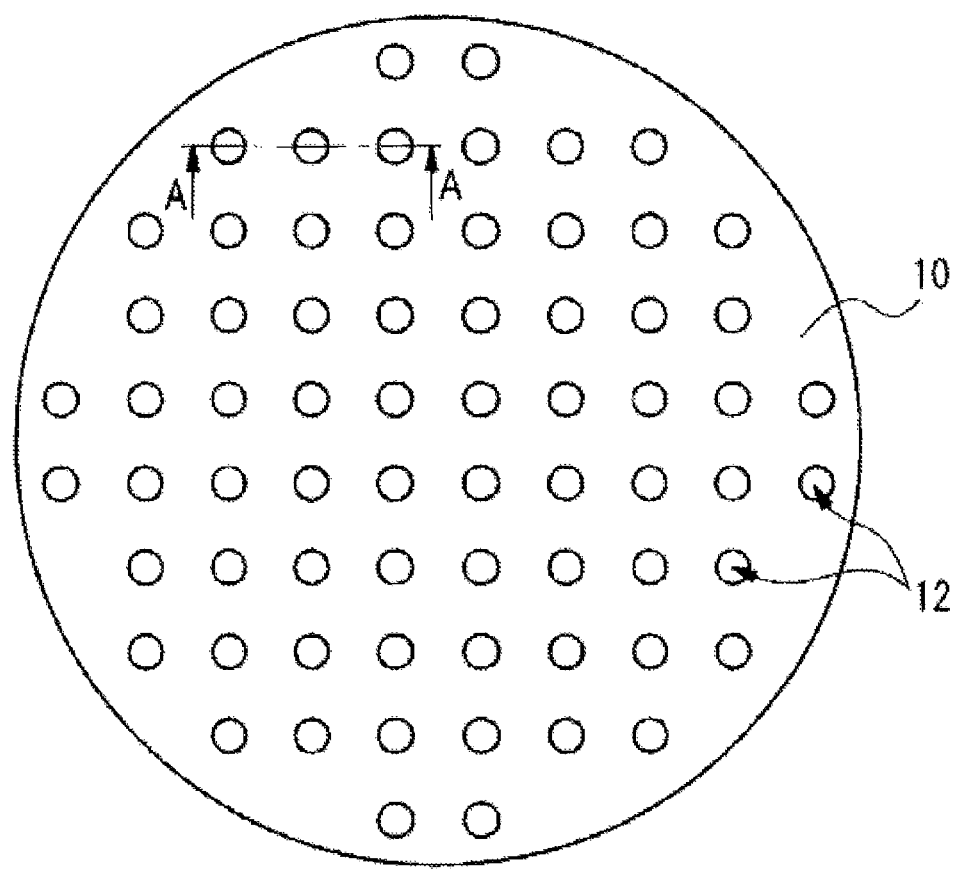
FIG. 1 is a plan view showing an example of a wafer level lens array.

Black Curable Composition According to First Aspect

Hereinbelow, the black curable composition according to the first aspect of the invention is described in detail.

The black curable composition according to the first aspect of the present invention contains (A1) an inorganic pigment, (B1) a dispersion resin having a phosphoric acid group or a sulfonic acid group in the molecule, (C1) a polymerization initiator, and (D1) a polymerizable compound.

Hereinbelow, each of the components included in the black curable composition for a wafer level lens according to the first aspect of the invention is described sequentially.

(A1) Inorganic Pigment

As the light-shielding material used in the first aspect of the present invention, the (A1) inorganic pigment is selected from the viewpoints of storage stability and stability. As the (A1) inorganic pigment, a pigment having an absorbance from ultraviolet light to infrared light is preferable in order to exhibit a light-shielding property in a region ranging from ultraviolet light to infrared light.

Examples of the (A1) inorganic pigment include pigments including single metals and pigments including metal compounds selected from metal oxides and metal complex salts. Specific examples thereof include zinc oxide, lead white, lithopone, titanium oxide, chromium oxide, iron oxide, precipitated barium sulfate, barite powders, red lead, red iron oxide, chrome yellow, zinc yellow (zinc yellow I, zinc yellow II), ultramarine blue, Prussian blue (potassium ferric ferrocyanide) zircon grey, praseodymium yellow, chromium titanium yellow, chrome green, peacock, Victoria green, navy blue (independent of Prussian blue), vanadium zirconium blue, chrome tin pink, manganese pink, and salmon pink.

Furthermore, examples of the black inorganic pigment include metal oxides and metal nitrogen compounds, each containing one or two or more kinds selected from the group consisting of Co, Cr, Cu, Mn, Ru, Fe, Ni, Sn, Ti, and Ag. These may be used alone or as a mixture of two or more kinds thereof.

Particularly, it is possible to use the pigment alone or as a mixture of plural kinds thereof for the purpose of exhibiting a light-shielding property in a wide wavelength region ranging from ultraviolet light to infrared light.

As the (A1) inorganic pigment used in the first aspect, a metal pigment containing at least one selected from silver and tin, or titanium black is preferable from the viewpoints of a light-shielding property and curing property, and titanium black is most preferable from the viewpoints of the light-shielding property.

Titanium black as used in the present invention refers to black particles having titanium atoms. Low-order titanium oxide, titanium oxynitride, and the like are preferred.

Titanium black may be used as it is, but may be used after modification of its surface, optionally, for the purpose of improvement of dispersibility, inhibition of aggregability, and the like. Examples of the surface modification method include a method of coating with materials selected from the group consisting of silicon oxide, titanium oxide, germanium oxide, aluminum oxide, magnesium oxide, and zirconium oxide, and it is also possible to carry out a surface treatment with a water-repellent material such as those shown in JP-A No. 2007-302836.

Furthermore, for the purpose of adjusting dispersibility, coloration properties, or the like, the titanium black may contain one kind or a combination of two or more kinds of black pigments such as composite oxides of Cu, Fe, Mn, V, Ni, and the like, cobalt oxide, iron oxide, carbon black, or aniline black. In this case, titanium black particles are contained at 50% by mass or more of the pigment.

Examples of the commercially available product of the titanium black include TITANIUM BLACK 10S, 12S, 13R, 13M, 13M-C, 13R, 13R-N (trade names) (all manufactured by Mitsubishi Materials Corporation), and TILACK D (trade name) (manufactured by Ako Kasei Co., Ltd.).

Examples of a method for manufacturing the titanium black include a method in which a mixture of titanium dioxide and metallic titanium is heated in a reducing atmosphere, thus carrying out reduction (JP-A No. 49-5432), a method in which ultrafine titanium dioxide obtained by high temperature hydrolysis of titanium tetrachloride is reduced in a reducing atmosphere containing hydrogen (JP-A No. 57-205322), a method in which titanium dioxide or titanium hydroxide is reduced at high temperature in the presence of ammonia (the publications of JP-A Nos. 60-65069 and 61-201610), and a method in which a vanadium compound is deposited on titanium dioxide or titanium hydroxide, and a high temperature reduction is carried out in the presence of ammonia (JP-A No. 61-201610), but are not limited to these.

The average primary particle diameter of the titanium black particles is not particularly limited, but from the viewpoints of dispersibility and a light-shielding property, it is preferably from 3 nm to 2000 nm, more preferably from 10 nm to 500 nm, and most preferably from 10 nm to 100 nm.

The average primary particle diameter of the titanium black as mentioned herein can be measured by using a TEM (Transmission Electron Microscope). Specifically, the average primary particle diameter may be measured in such a manner that: pigment powder is observed at a magnification of from 30,000 times to 100,000 times using a transmission electron microscope, and its photograph is taken; the diameters of 100 primary particles are measured; and this operation is repeated at three points in total while changing the areas of the pigment powder; and the results are averaged. In the present specification, the values measured by this method are used as the average primary particle diameter.

The specific surface area of the titanium black is not particularly limited, but in order to obtain a predetermined performance for water repellency after the titanium black is surface-treated with a water repellant, the specific surface are of the titanium black measured by a BET method is preferably from about 5 $m^2/g$ to 150 $m^2/g$, and more preferably from about 20 $m^2/g$ to 100 $m^2/g$.

As for the particle diameter of the (A1) inorganic pigment according to the first aspect of the invention such as the titanium black, the average primary particle diameter is preferably from 3 nm to 2000 nm, and from the viewpoints of dispersibility, a light-shielding property, and precipitation over time, the average particle diameter is preferably from 10 nm to 500 nm.

In the black curable composition according to the first aspect of the present invention, the (A1) inorganic pigments may be used alone or in combination of two or more kinds thereof. Further, as described below, for the purpose of adjusting the light-shielding property, or other purposes, an organic pigment, a dye, or the like may be used in combination therewith, if desired.

The content of the (A1) inorganic pigment in the black curable composition is preferably from 5% by mass to 70% by mass, and more preferably from 10% by mass to 50% by mass, based on the total mass of the composition.

When the (A1) inorganic pigment is blended into the black curable composition, it is preferable to blend the (A1) inorganic pigment as a pigment dispersion in which the (B1) dispersion resin having a phosphoric acid group or a sulfonic acid group in the molecule as described below has been dispersed in advance from the viewpoints of uniformity of the obtained composition.

(B1) Dispersion Resin Having Phosphoric Acid Group or Sulfonic Acid Group in Molecule Hereinbelow, the dispersion resin (B1) containing phosphoric acid or sulfonic acid according to the first aspect of the invention is described.

The (B1) dispersion resin having a phosphoric acid group or a sulfonic acid group in a molecule thereof (which is hereinafter be appropriately referred to as "(B1) specific resin") used in the first aspect of the invention has a phosphoric acid group or a sulfonic acid group in a molecule thereof. Due to this, the developability and adhesion of the wafer level lens are improved. This is thought to be based on the fact that the dispersion resin has a strong acid group (an acid group having a low pKa) such as a phosphoric acid group or a sulfonic acid group, interacting with the molecules constituting a resin used in the lens, thereby increasing the adhesion, and on the other hand, the dispersion resin has a strong acid group easily dissociated in an alkali developing liquid, thereby easily penetrating into the developing liquid, and also, by strong adsorption with an inorganic pigment, the (A1) inorganic pigment contained in the composition can be removed efficiently together with the removal of the development of the resin.

The (B1) specific resin used in the first aspect of the invention is not particularly limited as long as it is a resin having at least one phosphoric acid group or sulfonic acid group in any position in the molecule thereof. From the viewpoints of the effect, specifically, the (B1) specific resin is preferably (B1-1) a copolymer of a (b1-1) monomer having a phosphoric acid group or a sulfonic acid group with a (b1-2) macromonomer having a weight average molecular weight of 1,000 or more [which is hereinafter suitably referred to as "(B1-1) copolymer"], or a (B1-2) resin represented by the following Formula (I) [which is hereinafter suitably referred to as "(B1-2) resin"].

Hereinbelow, preferable embodiments of the (B1) specific resin according to the first aspect of the invention is described in detail.

(B1-1) Copolymer of (b1-1) Monomer Having Phosphoric Acid Group or Sulfonic Acid Group with (b1-2) Macromonomer Having Weight Average Molecular Weight of 1,000 or More In the first aspect of the invention, the effect of the present invention is exerted since a phosphoric acid group or a sulfonic acid group, that is, a strong acid group having a dissociation constant pKa of 3 or less is contained in the molecule of the (B1) specific resin. In order to introduce such a strong acid group into the resin, it is preferable to employ a method for copolymerizing (b1-1) monomers having a phosphoric acid group or a sulfonic acid group.

Examples of the monomers having a phosphoric acid group or a sulfonic acid group include known monomers, for example, phosphoric acid group-containing monomers such as vinyl phosphonic acid, and sulfonic acid group-containing monomers such as styrene sulfonic acid, vinyl sulfonic acid, or 2-(acryloylamino)-2-methyl-1-propanesulfonate. The monomers can be obtained as commercially available products, and examples of the commercially available products include PHOSMER M, PHOSMER CL, PHOSMER PE, AND PHOSMER PP (trade names) (all manufactured by Unichemical Co., Ltd.).

As the (b1-2) macromonomer having a weight average molecular weight of 1,000 or more, which is a second copolymerization component of the (B1-1) copolymer, any of known macromonomers can be used.

Examples of the macromonomer (b1-2) include MACROMONOMER AA-6 (methyl polymethacrylate having a methacryloyl group as a terminal group), AS-6 (polystyrene having a methacryloyl group as a terminal group), AN-6S (copolymer of styrene with acrylonitrile, having a methacryloyl group as a terminal group), and AB-6 (butyl polyacrylate having a methacryloyl group as a terminal group) (all trade names, manufactured by TOAGOSEI Co., Ltd.); PLACCEL FM5 (addition product with 5 molar equivalent of ε-caprolactone to 2-hydroxyethyl methacrylate), and FA10L (addition product with 10 molar equivalent of ε-caprolactone to 2-hydroxyethyl methacrylate) (trade names, manufactured by Daicel Chemical Industries Limited); and polyester-based macromonomers as described in JP-A No. 2-272009. Among these, the polyester-based macromonomers are particularly preferable from the viewpoints of dispersibility and dispersion stability, of the pigment dispersion in which the (A1) inorganic pigment is dispersed in the (B1) specific resin, and the developability shown by the colored curable composition using the pigment dispersion.

The weight average molecular weight of the macromonomer (b1-2) is preferably from 1,000 to 30,000, more preferably from 2,000 to 20,000, and most preferably from 2,000 to 10,000. When the weight average molecular weigh is within the ranges, the solubility of the (B1-1) copolymer in the solvent is improved, while the dispersion stability is improved.

The weight average molecular weight of the (B1-1) copolymer is preferably from 3,000 to 50,000, more preferably from 5,000 to 40,000, and most preferably from 7,000 to 30,000. When the weight average molecular weight is within the ranges, the dispersion stability, and the developability and adhesion on the lens are improved.

The content of the (b1-1) monomer having a phosphoric acid group or a sulfonic acid group in the (B1-1) copolymer is preferably from 5% by mass to 60% by mass, more preferably from 5% by mass to 50% by mass, and most preferably from 10% by mass to 40% by mass. When the content is within the ranges, the dispersion stability, solvent solubility, and developability of the inorganic pigment due to the (B1-1) copolymer, and the adhesion of the formed cured film with a lens are improved.

Furthermore, the content of the (b1-2) macromonomer having a weight average molecular weight of 1,000 or more in the (B1-1) copolymer is preferably from 20% by mass to 90% by mass, more preferably from 25% by mass to 70% by mass, and most preferably from 30% by mass to 60% by mass. When the content is within the ranges, the dispersion stability, solvent solubility, and developability of the inorganic pigment due to the (B1-1) copolymer, and the adhesion of the formed cured film with a lens are improved.

The (B1-1) copolymer may further contain another monomer as a copolymerization component in order to adjust the solvent solubility or the developability. Examples of other monomers include carboxylic acid group-containing monomers such as (meth)acrylic acid, aliphatic group-containing monomers such as benzyl(meth)acrylate or styrene, and alkylene oxide group-containing monomers. These monomers are preferably contained in an amount of from 5% by mass to 30% by mass, and most preferably from 5% by mass to 20% by mass in the (B1-1) copolymer.

Among the (B1) specific resins used in the first aspect of the invention, specific structures of the compounds belonging to the (B1-1) copolymer are shown below ((B1-1-1) to (B1-1-11)) with respect to the copolymerization components contained in the compound, but the present invention is not limited thereto.

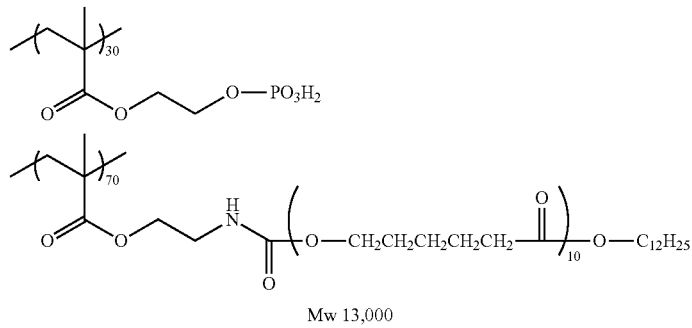

(B-1-1)

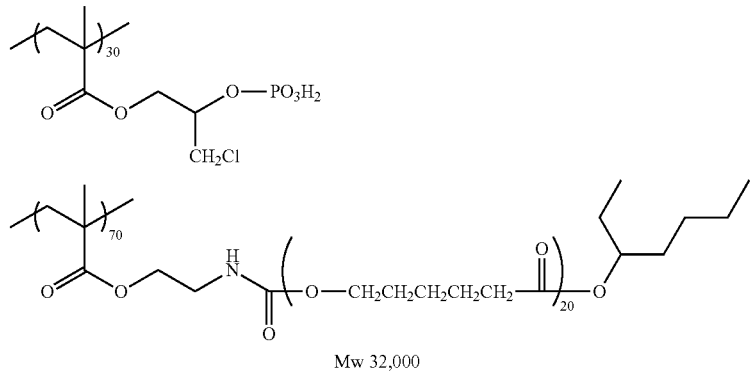

(B-1-2)

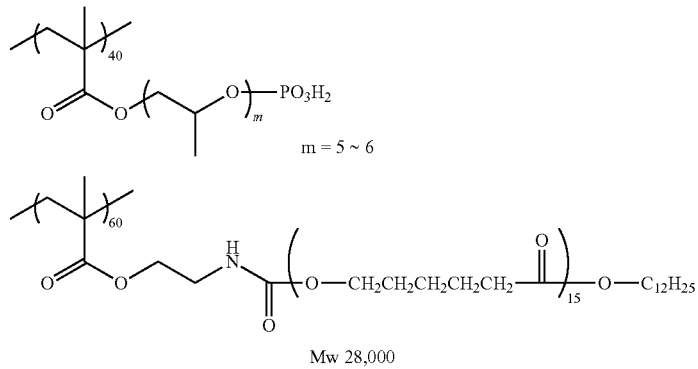

(B-1-3)

-continued
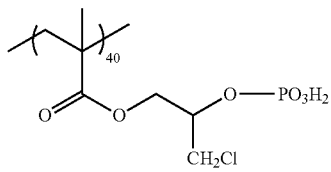
(B-1-4)
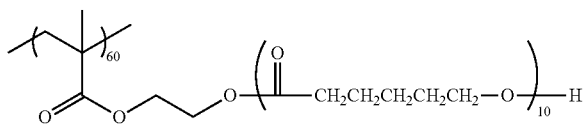
Mw 28,000
(B-1-5)
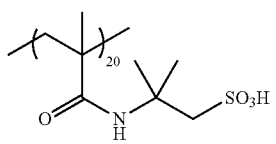
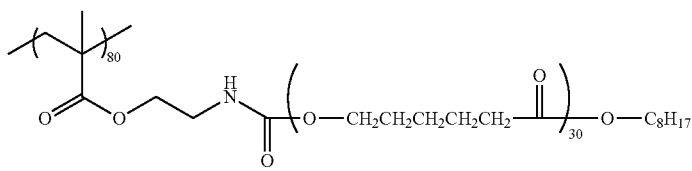
Mw 42,000
(B-1-6)
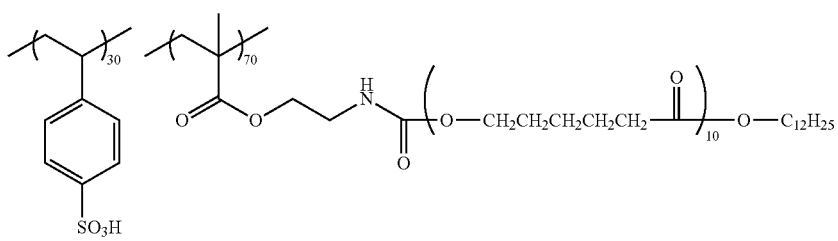
Mw 18,000
(B-1-7)
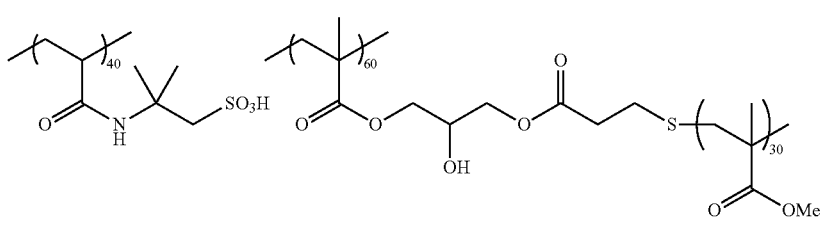
Mw 36,000
(B-1-8)
m = 4 ~ 5
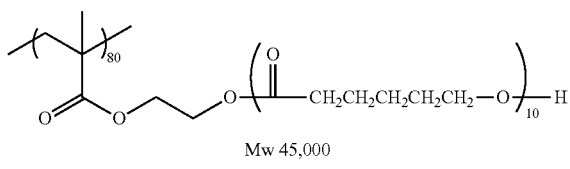
Mw 45,000

(B-1-9)

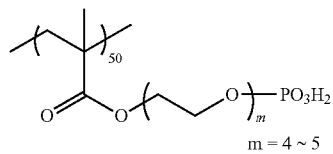

Mw 32,000

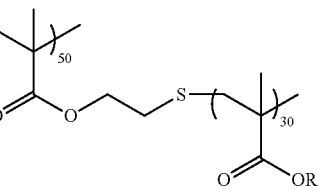

(B-1-10)

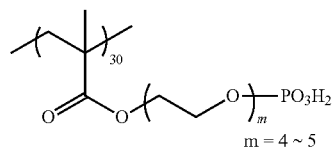

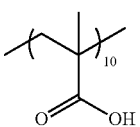

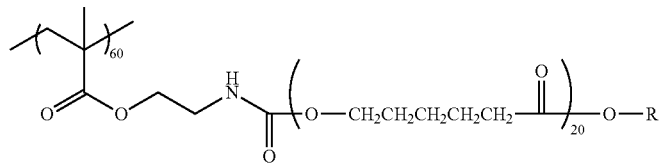

Mw 25,000

(B-1-11)

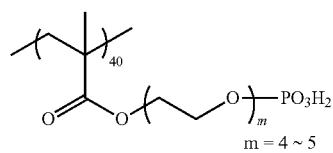

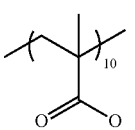

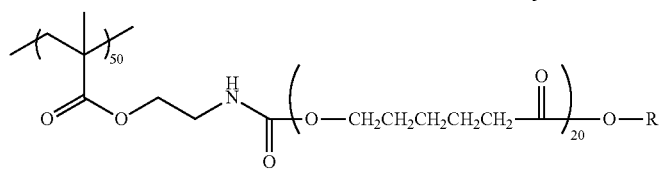

Mw 27,000

(B1-2) Resin Represented by Formula (I)

Next, the (B1-2) resin which is another preferred embodiment of the (B1) specific resin used in the first aspect of the invention is described. The (B1-2) resin is a resin represented by the following Formula (I).

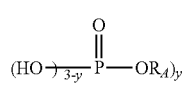

Formula (I)

In Formula (I), $R_A$ represents a molecular chain having a number average molecular weight of 500 to 30,000, which is selected from a polyether and a polyester. y represents an integer of 1 or 2. When y represents 2, plural $R_A$'s may be the same as or different from each other.

The (B1-2) resin represented by Formula (I) may be produced by a known method, for example, the method described in JP-A No. 3-112992, and specifically, it can be prepared by the reaction of a polyether and/or a polyester having a hydroxyl group at a terminal with anhydrous phosphoric acid or polyphosphoric acid. As the polyether in the case in which $R_A$ represents a polyether, polyethylene oxide or polypropylene oxide is preferable. As the polyester in the case in which $R_A$ represents a polyester, a polyester formed by a ring-opening polymerization of a lactone is preferable, and a polycaprolactone is also preferable.

The number average molecular weight of the molecular chain represented by $R_A$ is preferably from 500 to 30,000, more preferably from 500 to 20,000, and most preferably from 500 to 10,000.

The weight average molecular weight of the (B1-2) resin is preferably from 500 to 30,000, more preferably from 500 to 20,000, and most preferably from 500 to 10,000. When the weight average molecular weight is within the ranges, the dispersion stability and the developability, and adhesion to the lens are improved.

The (B1-2) resin is obtained as a mixture of a phosphoric acid monoester (in Formula (1), y=1) and a phosphoric acid diester (in Formula (I), y=2) when produced according to the synthesis method. The content ratios of the phosphoric acid monoester and the phosphoric acid diester (i.e., phosphoric acid monoester: the phosphoric acid diester) are preferably from 95:5 to 65:35 at a molar ratio, and most preferably from 95:5 to 75:25 at a molar ratio. By setting the content ratios of the phosphoric acid monoester to the phosphoric acid diester within the ranges, the dispersion stability is improved. The presence ratio of the phosphoric acid monoester and the phosphoric acid diester can be determined by a $^{31}$P NMR spectrophotometry method described in Japanese Patent Application Publication (JP-T) No. 2003-533455. Further, the presence ratio can be controlled by changing the introduction ratio of the polyether and/or polyester having a hydroxyl group at a terminal and the anhydrous phosphoric acid or polyphosphoric acid during synthesis.

Among the (B1) specific resins according to the first aspect of the invention, the specific structures of the compounds belonging to the (B1-2) resin are shown below, but the present invention is not limited to these. Further, as for the following specific examples, y is a mixture of 1 and 2 as described above; n represents an integer of from 5 to 100; and R represents a chained alkyl group having 1 to 30 carbon atoms or a cyclic alkyl group having 3 to 30 carbon atoms.

the side chain is preferable. Examples of this polymer compound include polymers including polymerization units derived from monomers represented by Formula (1) described in JP-A No. 2008-266627, or monomers including maleimides or maleimide derivatives. Such pigment dispersants are specifically described in Paragraphs [0020] to [0047] of JP-A No. 2008-266627, and the dispersants described therein can also be suitably used in the present invention.

As other combined dispersants, any one of known compounds may be arbitrary selected, and commercially available dispersants or surfactants may be used. Specific examples of the commercial product which can be used as the combined dispersant include: cationic surfactants such as organosiloxane polymer KP341 (trade name) (manufactured by Shin-Etsu Chemical Co., Ltd.), (meth)acrylic acid (co) polymer POLYFLOW No. 75, No. 90, No. 95 (trade names) (manufactured by Kyoeisha Chemical Co., Ltd.), or W001 (trade names) (available from Yusho Co., Ltd.); nonionic

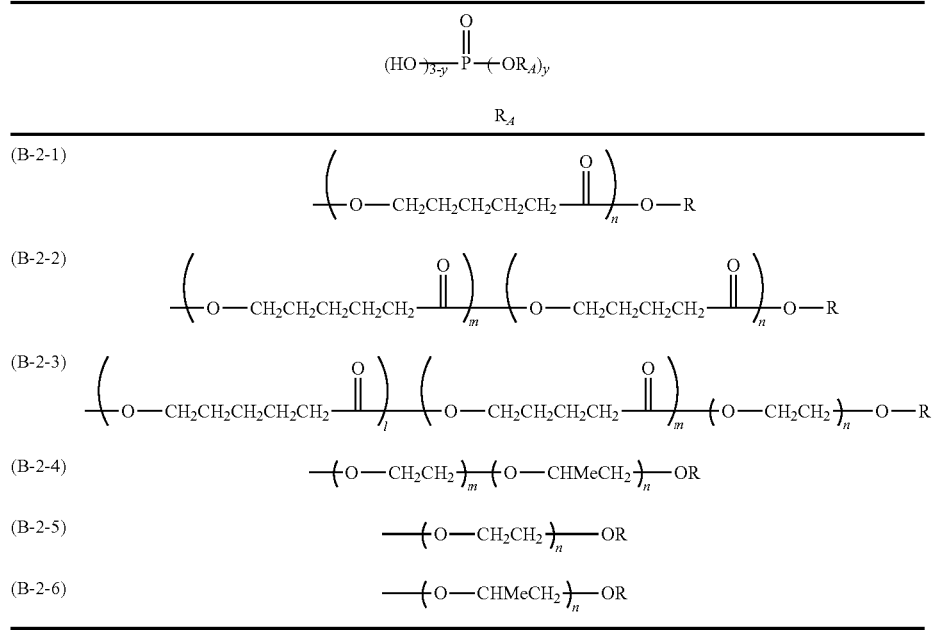

The content of the (B1) specific resin in the black curable composition for a wafer level lens according to the first aspect of the invention is preferably in the range from 1% by mass to 90% by mass, more preferably in the range from 3% by mass to 70% by mass, and most preferably in the range from 5% by mass to 50% by mass, based on the mass of the total solid contents of the black curable composition. When the content is within the ranges, the dispersion stability of the pigment and the pattern formability during the curing of a film are excellent.

The black curable composition for a wafer level lens according to the first aspect of the invention contains the (A1) inorganic pigment as described below dispersed therein by means of the (B1) specific resin. The black curable composition may further include an additional pigment dispersant (which is hereinbelow simply referred to as "dispersant") in addition to the (B1) specific resin, as long as the effect of the invention is not impaired. Examples of the dispersant to be used in combination with the (B1) specific resin include known pigment dispersants and surfactants, which can be suitably selected and used.

As the dispersant to be used in combination with the (B1) specific resin, a polymer compound having a heterocycle in surfactants such as polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, or sorbitan fatty acid ester; anionic surfactants such as W004, W005, or W017 (trade names) (manufactured by Yusho Co., Ltd.);

polymeric dispersants such as EFKA-46, EFKA-47, EFKA-47EA, EFKA POLYMER 100, EFKA POLYMER 400, EFKA POLYMER 401, EFKA POLYMER 450 (trade name) (manufactured by Ciba Specialty Chemicals), DISPERSE AID 6, DISPERSE AID 8, DISPERSE AID 15, or DISPERSE AID 9100 (trade names) (manufactured by San Nopco Limited); various SOLSPERSE dispersants such as SOLSPERSE 3000, 5000, 9000, 12000, 13240, 13940, 17000, 24000, 26000, 28000, 32000 or 36000 (trade names) (manufactured by The Lubrizol Corporation); ADEKA PLURONIC L31, F38, L42, L44, L61, L64, F68, L72, P95, F77, P84, F87, P94, L101, P103, F108, L121, P-123 (trade names) (manufactured by Asahi Denka Company Limited); IONET S-20 (trade name) (manufactured by Sanyo Chemical Industries, Ltd.); and DISPERBYK 101, 103, 106, 108, 109, 111, 112, 116, 130, 140, 142, 162, 163, 164, 166, 167, 170, 171, 174, 176, 180, 182, 2000, 2001, 2050, 2150 (trade names) (manufactured by BYK-Chemie).

In addition, other preferable examples of the combined dispersant include oligomers and polymers having a polar group at an end or a side chain of the molecules, such as acrylic copolymers.

In the case of using other pigment dispersants in combination with the (B1) specific resin, the addition amount thereof is preferably in the range from 5% by mass to 50% by mass, and more preferably in the range from 5% by mass to 30% by mass, based on the content of the (B1) specific resin.

(C1) Polymerization Initiator

The black curable composition according to the first aspect of the invention includes a polymerization initiator.

The photopolymerization initiator used in the black curable composition according to the first aspect of the invention is a compound which is degraded by light or heat to initiate and promote the polymerization of the polymerizable compound as described below, and preferably has absorption in a wavelength region from 300 nm to 500 nm.

Specific examples of the photopolymerization initiator include an organic halide compound, an oxydiazole compound, a carbonyl compound, a ketal compound, a benzoin compound, an organic peroxide compound, an azo compound, a coumarin compound, an azide compound, a metallocene compound, an organic boric acid compound, a disulfonic acid compound, an oxime ester compound, an onium salt compound, an acyl phosphine (oxide) compound, and a hexaarylbiimidazole-based compound, but an oxime ester compound and a hexaarylbiimidazole-based compound are preferable from the viewpoints of a smaller amount of the development residues and good adhesion.

More specific examples of the photopolymerization initiator include the photopolymerization initiators described in Paragraphs [0081] to [0100], and [0101] to [0139] of JP-A No. 2006-78749.

As a suitable oxime ester compound, known compounds such as those known as a photopolymerization initiator of a photosensitive composition in electronic part applications or the like may be used. For example, a compound selected from the compounds described in each publication of JP-A No. 57-116047, JP-A No. 61-24558, JP-A No. 62-201859, JP-A No. 62-286961, JP-A No. 7-278214, JP-A No. 2000-80068, JP-A No. 2001-233842, JP-T No. 2004-534797, JP-T No. 2002-538241, JP-A No. 2004-359639, JP-A No. 2005-97141, JP-A No. 2005-220097, WO 2005-080337 A1, JP-T No. 2002-519732, JP-A No. 2001-235858, and JP-A No. 2005-227525 can be used.

Generally, the oxime ester compound has low absorption in a near ultraviolet light region of 365 nm or 405 nm, or the like and thus has a low sensitivity, but it is rendered to have high sensitivity by increasing the photosensitivity in the near ultraviolet ray region by a sensitizer. Further, it is known that the amount of effective radicals generated is increased by using a co-sensitizer such as amines or thiols in combination, when it is desired to have higher sensitivity in practical uses.

In the present invention, even the oxime ester compound having low absorption in a near ultraviolet light region of 365 nm or 405 nm, or the like is rendered to have remarkably higher sensitivity in practical uses when used together with a sensitizer.

Herein, the oxime ester compound has low absorption in a region of from 380 nm to 480 nm, and little coloration, particularly little coloration in yellow, and therefore, in the case in which it is used in a color filter for an image display device which is a main application of the present invention, an image having a high color purity can be obtained. When the oxime ester compound is used in a color filter for color decomposition for a solid-state imaging device which is another application, a color signal having a high resolution can be obtained, and thus, a solid-state imaging device with a high resolution can be obtained.

As the oxime ester compound, a compound having low absorption in the range from 380 nm to 480 nm, and a high decomposition efficiency, or a compound having high absorption in the range from 380 nm to 480 nm, but having decreased absorption in the region due to photodecomposition (absorption of byproducts at a short wavelength) is preferable.

Hereinbelow, specific examples of the oxime ester compound are shown.

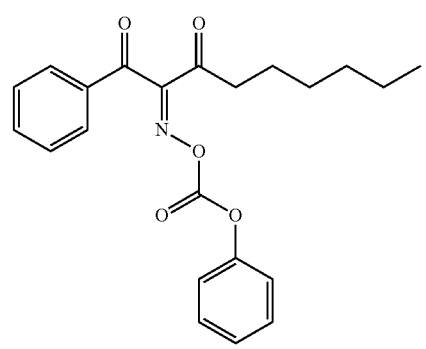

I-1

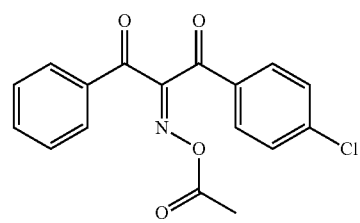

I-2

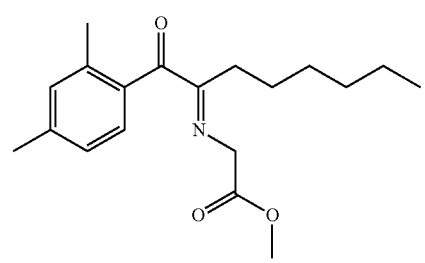

I-3

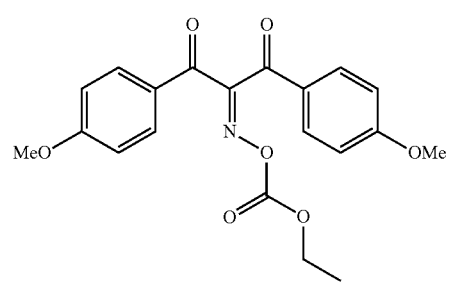

I-4

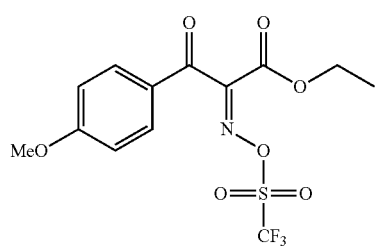
(I-5)
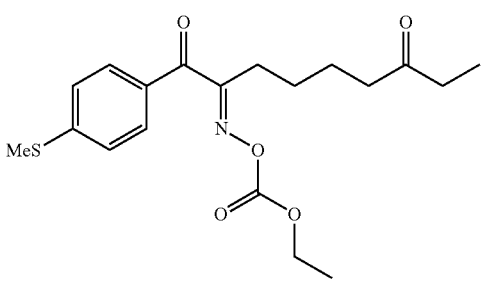
(I-10)
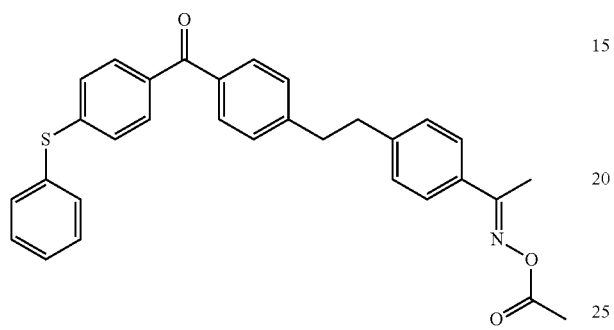
(I-6)
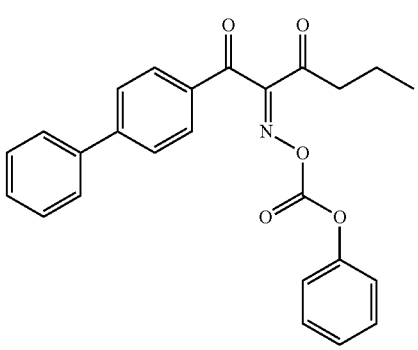
(I-11)
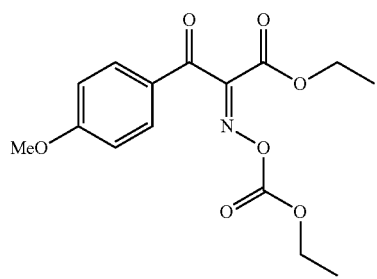
(I-7)
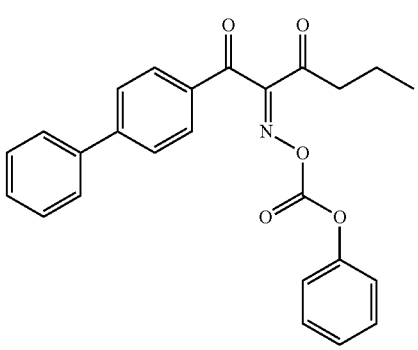
(I-12)
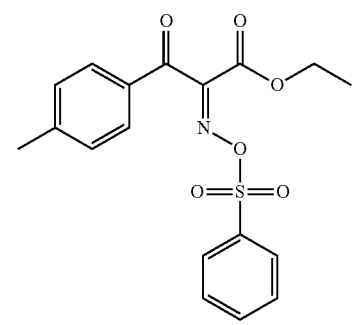
(I-8)
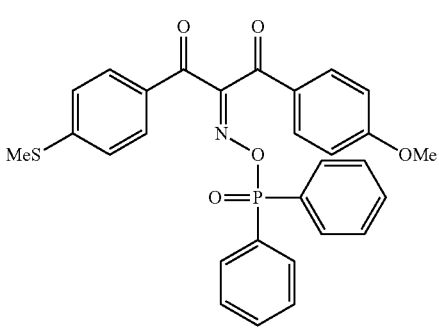
(I-13)
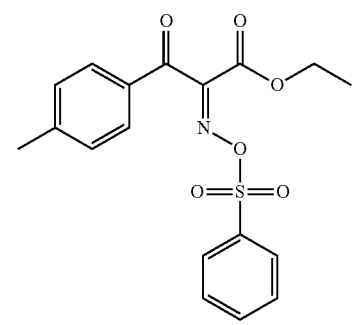
(I-9)
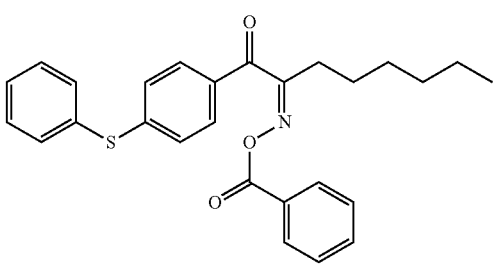
(I-14)

(I-15)
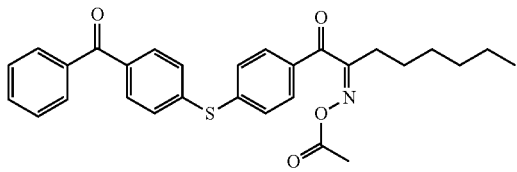

(I-16)
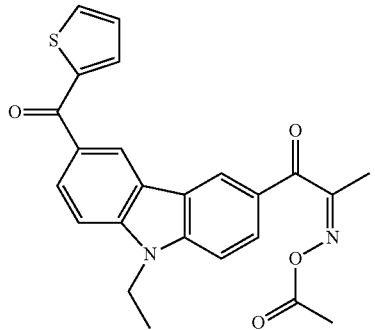

(I-17)
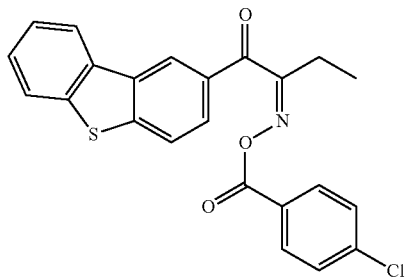

(I-18)
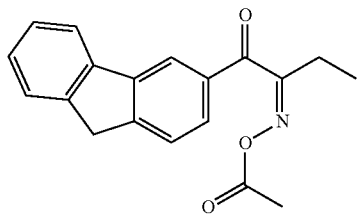

(I-19)
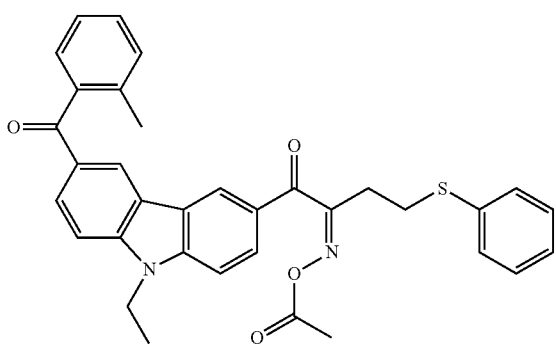

(I-20)
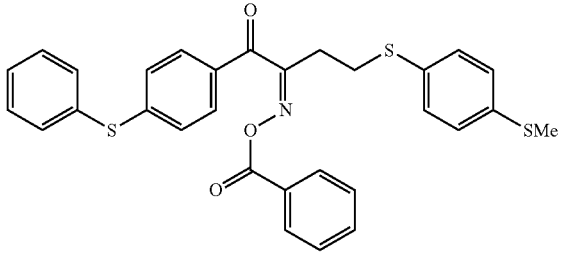

Examples of the hexaarylbiimidazole compound include various compounds as disclosed in JP-B No. 6-29285, and U.S. Pat. Nos. 3,479,185, 4,311,783, and 4,622,286, and more specifically include 2,2'-bis(o-chlorophenyl)-4,4',5,5'-tetraphenyl biimidazole, 2,2'-bis(o-bromophenyl)-4,4',5,5'-tetraphenyl biimidazole, 2,2'-bis(o,p-dichlorophenyl)-4,4',5,5'-tetraphenyl biimidazole, 2,2'-bis(o-chlorophenyl)-4,4',5,5'-tetra(m-methoxyphenyl) biimidazole, 2,2'-bis(o,o'-dichlophenyl)-4,4',5,5'-tetraphenyl biimidazole, 2,2'-bis(o-nitrophenyl)-4,4',5,5'-tetraphenyl biimidazole, 2,2'-bis(o-methylphenyl)-4,4',5,5'-tetraphenyl biimidazole, and 2,2'-bis (o-trifluorophenyl)-4,4',5,5'-tetraphenyl biimidazole.

The content of the (C1) polymerization initiator in the black curable composition according to the first aspect of the invention is from 0.1% by mass to 30% by mass, more preferably from 1% by mass to 25% by mass, and particularly preferably from 2% by mass to 20% by mass, in the total solid contents of the black curable composition. The polymerization initiators may be used alone or in combination of two or more kinds thereof.

The black curable composition according to the first aspect of the invention may include a chain transfer agent depending on the polymerization initiator used. Examples of the chain transfer agent include an N,N-dialkylaminonbenzoic acid alkyl ester and a thiol-based compound, and as the thiol-based compound, 2-mercaptobenzothiazole, 2-mercapto-1-phenyl-benzimidazole, and 3-mercaptopropionic acid may be used alone or as a mixture of two or more kinds thereof. Particularly, it is preferable to use a combination of a hexaarylbiimidazole compound and a thiol-based compound from the viewpoints of the residues and adhesion.

(D1) Polymerizable Compound

The black curable composition according to the first aspect of the invention includes a polymerizable compound.

As the (D1) polymerizable compound, a compound which has at least one addition-polymerizable ethylenically unsaturated group and has a boiling point of 100° C. or higher at normal pressure is preferable.

Examples of the compound which has at least one addition-polymerizable ethylenically unsaturated group and has a boiling point of 100° C. or higher at normal pressure include monofunctional acrylate or methacrylates such as polyethylene glycol mono(meth)acrylate, polypropylene glycol mono(meth)acrylate, or phenoxyethyl(meth)acrylate; and polyfunctional acrylates or methacrylates such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol hexa(meth)acrylate, hexanediol(meth)acrylate, trimethylolpropane tri(acryloyloxypropyl)ether, tri(acryloyloxyethyl)isocyanurate, or compounds in which ethylene oxide or propylene oxide is added to polyfunctional alcohols such as glycerin or trimethylolethane, and then (meth)acrylated, poly(meth)acrylated pentaerythritol or poly (meth)acrylated dipentaerythritol, urethane acrylates described in the publications of Japanese Examined Patent Application Publication (JP-B) Nos. 48-41708 and 50-6034 and JP-A No. 51-37193, polyester acrylates described in the publications of JP-A No. 48-64183 and JP-B Nos. 49-43191 and 52-30490, and epoxy acrylates as reaction products of epoxy resins and (meth)acrylic acid.

Further, those proposed as the photocurable monomers and oligomers in Nihon Secchaku Kyoukaishi (Journal of the Adhesion Society of Japan), Vol. 20, No. 7, pp. 300 to 308 can also be used.

Furthermore, the compounds in which ethylene oxide or propylene oxide is added to the polyfunctional alcohols and then (meth)acrylated, and which are described as Formulae (1) and (2) together with specific examples thereof in JP-A No. 10-62986 can also be used.

Among those, dipentaerythritol penta(meth)acrylate, dipentaerythritol hexa(meth)acrylate, pentaerythritol tri (meth)acrylate, and a structure thereof in which the acryloyl group has an ethylene glycol or propylene glycol residue therethrough are preferable. The oligomer types thereof can also be used.

In addition, urethane acrylates described in JP-B No. 48-41708, JP-A No. 51-37193, and JP-B Nos. 2-32293 and 2-16765, and urethane compounds having an ethylene oxide-based skeleton described in JP-B Nos. 58-49860, 56-17654, 62-39417, and 62-39418 are also preferable. Furthermore, by using addition-polymerization compounds having an amino structure or a sulfide structure in the molecule, as described in JP-A Nos. 63-277653, 63-260909, and 1-105238, a photopolymerizable composition, which is excellent in terms of a photosensitive speed, can be obtained. Examples of the commercially available product include urethane oligomers UAS-10 and UAB-140 (trade names) (manufactured by Nippon Paper Industries Co., Ltd.), UA-7200 (manufactured by Shin-Nakamura Chemical Co., Ltd., DPHA-40H (trade name) (manufactured by Nippon Kayaku Co., Ltd.), and UA-306H, UA-306T, UA-306I, AH-600, T-600, and AI-600 (manufactured by Kyoeisha Chemical Co., Ltd.).

In addition, ethylenically unsaturated compounds having acid groups are also preferred. Examples of commercial products include TO-756 (carboxy group-containing trifunctional acrylate) and TO-1382 (carboxy group-containing pentafunctional acrylate) (trade names, manufactured by Toagosei Co., Ltd.).

The polymerizable compounds may be used alone or in combination of two or more kinds thereof. As the preferable examples of the combination, a combination of two kinds of monomers having different polymerizable groups contained is preferable, a combination of a monomer having a polymerizable group with tetrafunctionality or lower and a monomer with a pentafunctionality or higher is more preferable from the viewpoints of developability/adhesion. The content of the polymerizable compound in the black curable composition is preferably from 3% by mass to 55% by mass, and more preferably from 10% by mass to 50% by mass, based on the total solid contents, in terms of mass. When the content of the (D1) polymerizable compound is within the ranges, a curing reaction proceeds sufficiently.

(E1) Other Additives

In the black curable composition according to the first aspect of the invention, various additives may be optionally used according to the purposes, in addition to the (A1) to (D1) components and the pigment dispersant.

(E1-1) Binder Polymer

Optionally, a binder polymer (for example, an alkali-soluble resin) may also be used in the black curable composition for the purpose of improving dispersion stability, developability, film characteristics and the like. The binder polymer may be added during dispersion or during preparation of a curable composition.

A linear organic polymer is preferably used as a binder. Any known "linear organic polymer" may be used. In order to enable development with water or a weakly basic aqueous solution, a linear organic polymer soluble or swellable in water or a weakly basic aqueous solution is preferably selected. The linear organic polymer may be selected and used depending not only on applications as a film-forming agent but also on the developer such as water, a weakly basic aqueous solution or an organic solvent.

Among the linear organic polymers, a [benzyl(meth)acrylate/(meth)acrylic acid/optionally, other addition-polymerizable vinyl monomers] copolymer, and an [aryl(meth)acrylate/(meth)acrylic acid/optionally other addition-polymerizable vinyl monomers] copolymer are suitable due to excellent balance among film strength, sensitivity, and developability.

The weight average molecular weight of the binder polymer usable as the black curable composition is preferably in the range of 5,000 or more, and more preferably in the range of from 10,000 to 30,000, and the number average molecular weight is preferably in the range of 1,000 or more, and more preferably in the range of from 5,000 to 20,000. Further, the molecular weight of the binder polymer can be measured by a GPC method.

The content of the binder polymer in the total solid contents of the black curable composition of the present invention is preferably from 0.1% by mass to 7.0% by mass, and from the viewpoints of compatibility between inhibition of the pattern peeling-off and inhibition of the development residues, it is more preferably from 0.3% by mass to 6.0% by mass, and further more preferably from 1.0% by mass to 5.0% by mass.

(E1-2) Other Colorants

A light-shielding material other than known organic pigments or inorganic pigments such as a dye can also be used in the black curable composition according to the first aspect of the invention, in order to exhibit a desired light-shielding property.

Examples of the colorant to be used in combination include the pigments described in Paragraphs [0030] to [0044] of JP-A No. 2008-224982, C. I. Pigment Green 58, and C. I. Pigment Blue 79, in which the Cl substituent is changed to OH as the organic pigment, and among those, examples of the pigments that are preferably usable are as follows. However, the present invention is not limited thereto.

C.I. Pigment Yellow 11, 24, 108, 109, 110, 138, 139, 150, 151, 154, 167, 180, 185;

C.I. Pigment Orange 36;

C.I. Pigment Red 122, 150, 171, 175, 177, 209, 224, 242, 254, 255;

C.I. Pigment Violet 19, 23, 29, 32;

C.I. Pigment Blue 15:1, 15:3, 15:6, 16, 22, 60, 66;

C.I. Pigment Green 7, 36, 37, 58; and

C.I. Pigment Black 1, 7.

The dye which can be used as the additional light-shielding material is not particularly limited, and any dye selected from known dyes may be used. Example of dyes includes dyes disclosed in JP-A No. 64-90403, JP-A No. 64-91102, JP-A No. 1-94301, JP-A No. 6-11614, Japanese Patent No. 2592207, U.S. Pat. No. 4,808,501, U.S. Pat. No. 5,667,920, U.S. Pat. No. 5,059,500, JP-A No. 5-333207, JP-A No. 6-35183, JP-A No. 6-51115, JP-A No. 6-194828, JP-A No.

8-211599, JP-A No. 4-249549, JP-A No. 10-123316, JP-A No. 11-302283, JP-A No. 7-286107, JP-A No. 2001-4823, JP-A No. 8-15522, JP-A No. 8-29771, JP-A No. 8-146215, JP-A No. 11-343437, JP-A No. 8-62416, JP-A No. 2002-14220, JP-A No. 2002-14221, JP-A No. 2002-14222, JP-A No. 2002-14223, JP-A No. 8-302224, JP-A No. 8-73758, JP-A No. 8-179120, and JP-A No. 8-151531.

Examples of usable dyes include pyrazole azo dyes, anilino azo dyes, triphenylmethane dyes, anthraquinone dyes, anthrapyridone dyes, benzylidene dyes, oxonol dyes, pyrazolotriazole azo dyes, pyridone azo dyes, cyanine dyes, phenothiazine dyes, pyrrolopyrazole azomethine dyes, xanthene dyes, phthalocyanine dyes, benzopyran dyes, and indigo dyes.

In the present invention, for combinations with inorganic pigments, as a combination for compatibility between curing property and a light-shielding property, a combination of a titanium black pigment with a pigment selected from an orange pigment, a red pigment, and a violet pigment is preferable, and examples of the most preferable combinations include a combination of a titanium black pigment with a red pigment. More specific preferable examples of the red pigment to be used in combination include C. I. Pigment Red 254 and 255.

(E1-3) Sensitizer

The black curable composition may contain a sensitizer for the purpose of improvement in the radical generating efficiency of a polymerization initiator and achievement of a long wavelength of the sensitizing wavelength.

As the sensitizer to be used in the present invention, those which sensitize the polymerization initiators to be used in combination by an electron transfer mechanism or an energy transfer mechanism are preferable.

Preferable examples of the sensitizer include the compounds described in Paragraphs [0085] to [0098] of JP-A No. 2008-214395.

The content of the sensitizer is preferably in the range from 0.1% by mass to 30% by mass, more preferably in the range from 1% by mass to 20% by mass, and even more preferably in the range of from 2% by mass to 15% by mass, based on the mass of the total solid contents of the black curable composition, from the viewpoints of sensitivity and storage stability.

(E1-4) Polymerization Inhibitor

It is preferable that the light-shielding curable composition according to the first aspect of the invention contains a polymerization inhibitor in order to suppress polymerization reactions of polymerizable compounds during production or storage of the composition. The polymerization inhibitor may be a known thermal polymerization inhibitor, and specific examples thereof include hydroquinone, p-methoxyphenyl, di-t-butyl-p-cresol, pyrogallol, t-butylcatechol, benzoquinone, 4,4'-thiobis-(3-methyl-6-t-butylphenol), 2,2'-methylenebis-(4-methyl-6-t-butylphenol), and N-nitrosophenylhydroxylamine cerium (I) salt.

The amount of thermal polymerization inhibitor to be added is preferably from about 0.01% by mass to about 5% by mass with respect to the total solid content of the light-shielding curable composition.

The composition may optionally contain, for example, a higher fatty acid derivative such as behenic acid or behenic acid amide for preventing polymerization inhibition caused by oxygen. When the light-shielding curable composition containing a higher fatty acid derivative is coated and dried to form a film, the higher fatty acid derivative is localized at the surface of the coated film. The amount of the higher fatty acid derivative to be added is preferably from about 0.5% by mass to about 10% by mass with respect to the total mass of the light-shielding curable composition.

(E1-5) Adhesion Promoter

An adhesion promoter may be added to the light-shielding curable composition according to the first aspect of the invention in order to improve adhesiveness to the surface of a hard material such as a support. Examples of the adhesion promoter include a silane coupling agent and a titanium coupling agent.

Preferable examples of the silane coupling agent include γ-methacryloxypropyl trimethoxy silane, γ-methacryloxypropyl triethoxy silane, γ-acryloxypropyl trimethoxy silane, γ-acryloxypropyl triethoxy silane, γ-mercaptopropyl trimethoxy silane, γ-aminopropyl triethoxy silane and phenyl trimethoxy silane. More preferable examples include γ-methacryloxypropyl trimethoxy silane.

The amount of the adhesion promoter to be added is preferably from 0.5% by mass to 30% by mass, and more preferably from 0.7% by mass to 20% by mass, in the total solid contents of the black curable composition.

Particularly, in the black curable composition of the present invention, the sensitivity of a sensitizing colorant or an initiator to an active radiation is further improved for the purpose of manufacturing a lens on a glass substrate, or a co-sensitizer may be contained for the purpose of suppressing the polymerization inhibition of the photopolymerizable compound caused by oxygen, or other purposes. Further, known additives such as a surfactant, a diluent, a plasticizer, or a sensitizer, may be added optionally, in order to improve the physical properties of the cured film.

The black curable composition according to the first aspect of the invention may be prepared by adding the (A1) inorganic pigment (preferably as a pigment-dispersed composition including the pigment dispersant), the (B1) specific resin, the (C1) polymerization initiator, the (D1) polymerizable compound, and optionally, various additives to be used together, to a solvent, and further mixing them with an optional additive such as a surfactant.

The black curable composition according to the first aspect of the invention has the constitution as described above, and thus, by curing it with high sensitivity, a light-shielding film having an excellent light-shielding property can be formed. Further, by using the (E-1) alkali-soluble binder polymer in combination, a higher-precision light-shielding pattern is formed, and thus, it is useful for formation of a light-shielding film for a wafer level lens.

Black Curable Composition according to Second Aspect

Hereinbelow, the black curable composition according to the second aspect of the invention is described in detail.

The black curable composition according to the second aspect of the invention is a black curable composition for formation of a light-shielding film (which may be referred to as a black curable composition for a backside light-shielding film in some cases), which includes (A2) an inorganic pigment, (B2) a dispersion resin having at least one of a phosphoric acid group and a sulfonic acid group having an acid value of 10 mgKOH/g to 100 mgKOH/g in the molecule, (C2) a polymerization initiator, and (D2) a polymerizable compound, and blocks infrared light applied to one side of the silicon substrate having an imaging device section on the other side.

The inventors of the present invention have made extensive studies, and as a result, they have found that by using the black curable composition containing the (B2) dispersion resin having at least one of a phosphoric acid group and a sulfonic acid group having an acid value of from 10 mgKOH/g to 100 mgKOH/g in the molecule, a black curable composition for formation of a light-shielding film, which can form a light-shielding film having an excellent infrared light-shielding ability, can reduce the residues outside the region in which the light-shielding film is formed, and has excellent adhesion to a silicon substrate, can be provided.

The reason why the effects are exerted is not clear, but is presumed as follows. However, the present invention is not limited to the presumption.

It is estimated that since the black curable composition of the present invention contains a strong acid group such as a phosphoric acid group and a sulfonic acid group (an acid group having a low pKa) such that the acid value of the dispersion resin is 10 mgKOH/g to 100 mgKOH/g, the excessive development during formation of the light-shielding film is inhibited, and thus, a region (step) in which the film thickness of the peripheral portion of the light-shielding film becomes lower than that of the central portion of the light-shielding film is generated. Therefore, it is thought that a light-shielding film having an excellent infrared light-shielding ability can be formed by using the black curable composition of the present invention.

Furthermore, it is estimated that since the (B2) dispersion resin contains a strong acid group easily dissociated in an alkali developing liquid, such as a phosphoric acid group and a sulfonic acid group, the alkali developing liquid can easily penetrate into the black curable composition during formation of the light-shielding film, and the penetrated alkali developing liquid is strongly adsorbed to the inorganic pigment. From this, it is thought that when the development of the black curable composition is removed, the (A2) inorganic pigment contained in the black curable composition is efficiently removed from a surface of the silicon substrate. Therefore, it is thought that reduction in the residues in an unexposed region (which may be referred to as the other formation region in some cases) during formation of the light-shielding film is promoted.

Furthermore, it is estimated that since the black curable composition contains the (B2) dispersion resin having at least one of a phosphoric acid group and a sulfonic acid group in the molecule and having an acid value of from 10 mgKOH/g to 100 mgKOH/g, the strong acid group such as a phosphoric acid group and a sulfonic acid group (an acid group having a low pKa) interacts with the molecules constituting the materials used in the region in contact with the light-shielding film on a surface of the silicon substrate, and thus, adhesion of the light-shielding film to a silicon substrate is further increased.

Herein, in the second aspect of the present invention, the "infrared light" refers to a region at a wavelength of from 700 nm to 1200 nm.

Furthermore, "blocking infrared light" refers to a state where the transmittance is 3% or less in an entire range of the wavelength region from 700 nm to 1200 nm.

Hereinbelow, each of the components contained in the black curable composition for a backside light-shielding film according to the second aspect of the present invention is described sequentially.

(A2) Inorganic Pigment (A2) The inorganic pigment functions as a light-shielding material for the black curable composition according to the second aspect of the invention. It is preferable to use the (A2) inorganic pigment as a light-shielding material from the viewpoints of storage stability and safety.

As the (A2) inorganic pigment, so as to exhibit a light-shielding property in a region from the ultraviolet light to infrared light, a pigment having an absorbance of ultraviolet light to infrared light is preferable, and examples thereof include a pigment including a single metal, and a pigment including a metal compound selected from a metal oxide, a metal complex salt, and the like.

Specific examples of the (A2) inorganic pigment used in the second aspect of the invention are the same as the specific examples of the (A1) inorganic pigment used in the first aspect of the invention, and details thereof (including the preferable ranges) are also the same.

In particular, as the (A2) inorganic pigment used in the second aspect, a metal pigment containing at least one selected from silver and tin, or titanium black is preferable from the viewpoints of a light-shielding property and curing property, and titanium black is most preferable from the viewpoints of the light-shielding property to ultraviolet light or visible light as well as the light-shielding property to infrared light (i.e., infrared light-shielding property).

The titanium black used in the second aspect of the invention has the same definition as that of the titanium black used in the first aspect, and details thereof (including the preferable ranges) are also the same.

The average primary particle diameter of the inorganic pigment in the black curable composition according to the second aspect of the invention is particularly preferably from 30 nm to 65 nm. When the average primary particle diameter is within the ranges, the coloring power is not lowered, adhesion of the light-shielding film to a silicon substrate is improved, and also, the step is further reduced and the residues are further inhibited.

The reason why the effects are exerted is not clear, but is presumed that when a light-shielding film having a desired shape (pattern) is formed by using a black curable composition including finer titanium black as an inorganic pigment, the smoothness of the light-shielding film is improved, and thus the unevenness portion is reduced, and as a result, the external force load on the light-shielding film (specifically a fine pattern) during development/rinsing is reduced. Further, it is estimated that if the black curable composition including finer titanium black as an inorganic pigment is used, the alkali developing liquid penetrated into the black curable composition is easily and strongly adsorbed by the inorganic pigment during formation of the light-shielding film, and as a result, further reduction in the residues and reduction of the step (region in which the film thickness of the peripheral portion of the light-shielding film becomes lower than that of the central portion of the light-shielding film is promoted).

(B2) Dispersion Resin Having Phosphoric Acid Group or Sulfonic Acid Group in Molecule Hereinbelow, the dispersion resin (B2) containing at least one of phosphoric acid and sulfonic acid (hereinafter may be referred to as "(B2) specific resin") according to the second aspect of the invention is described.

The (B2) specific resin contained in the black curable composition according to the second aspect of the invention is a dispersion resin having an acid value of from 10 mgKOH/g to 100 mgKOH/g, and also having at least one of a phosphoric acid group and a sulfonic acid group.

Further, the "acid value" of the (B2) specific resin represents an acid value of the first acid dissociation in the case in which the (B2) specific resin has a polybasic acid such as a phosphoric acid group.

The acid value of the (B2) specific resin of the present invention is from 10 mgKOH/g to 100 mgKOH/g, but it is preferably 20 mgKOH/g to 70 mgKOH/g, and most preferably 30 mgKOH/g to 60 mgKOH/g.

When the acid value of the (B2) specific resin is within the ranges, adhesion of the light-shielding film to a silicon, substrate is improved, and further reduction of the residues outside the region in which the light-shielding film is formed is promoted.

The acid value of the (B2) specific resin is adjusted to be in the range, for example, by controlling the content of the acid groups contained in the (B2) specific resin.

Further, the total amount of the phosphoric acid group and the sulfonic acid group contained in the (B2) specific resin may be an amount such that the acid value of the (B2) specific resin is considered to be in the range, but specifically, it is preferably in the range of from 5% by mass to 50% by mass, and more preferably in the range from 10% by mass to 30% by mass, based on the mass of the specific resin.

In addition, the acid value of the (B2) specific resin is determined by, for example, neutralization titration using an aqueous sodium hydroxide solution. Specifically, titration with an aqueous sodium hydroxide solution by means of potentiometry is carried out in a solution formed by dissolution of a specific resin in a solvent, and the number of millimoles of the acid contained in 1 g of the solid of the (B2) specific resin is determined. Then, by multiplying the value by 56.1, the molecular weight of KOH, the value of the acid value of the (B2) specific resin can be obtained.

The (B2) specific resin contained in the black curable composition according to the second aspect of the present invention is not particularly limited as long as it is a resin having at least one of a phosphoric acid group and a sulfonic acid group in any position in the molecule and an acid value in the range from 10 KOH/g to 100 mgKOH/g, but from the viewpoints of the effect, more specifically, it is preferably (B2-1) a copolymer of a monomer (b2-1) having at least one of a phosphoric acid group and a sulfonic acid group, with a macromonomer (b2-2) having a weight average molecular weight from 1,000 to 30,000 (which is hereinafter appropriately referred to as "(B2-1) copolymer), or (B2-2) a resin represented by Formula (I) (which is hereinafter appropriately referred to as "(B2-2) resin").

Hereinbelow, more preferable embodiments of the (B2) specific resin according to the present invention is described in detail.

(B2-1) Copolymer of (B2-1) Monomer Having at Least One of Phosphoric Acid Group and Sulfonic Acid Group with (B2-2) Macromonomer Having Weight Average Molecular Weight of from 1,000 to 30,000

In the second aspect of the invention, the effect of the present invention is exerted since at least one of a phosphoric acid group and a sulfonic acid group, that is, a strong acid group having a dissociation constant pKa of 3 or less is contained in the molecule of the (B2) specific resin. In order to introduce such a strong acid group into the resin, it is preferable to employ a method for copolymerizing (b2-1) monomers having at least one of a phosphoric acid group and a sulfonic acid group.

The monomer having at least one of a phosphoric acid group and a sulfonic acid group used in the second aspect of the invention has the same definition as that of the monomer having a phosphoric group or a sulfonic group used in the first aspect of the invention, and details thereof (including the preferable ranges) are also the same.

As the (b2-2) macromonomer having a weight average molecular weight of from 1,000 to 30,000, which is a second copolymerization component of the (B2-1) copolymer, any of known macromonomers can be used.

Examples of the (b2-2) macromonomer are the same as those of the (b1-2) macromonomer used in the first aspect of the invention, and details thereof (including the preferable ranges) are also the same.

The weight average molecular weight of the (b2-2) macromonomer has the same definition as that of the (b1-2) macromonomer used in the first aspect of the invention, and details thereof (including the preferable ranges) are also the same.

The weight average molecular weight of the (B2-1) copolymer has the same definition as that of the (B1-1) copolymer used in the first aspect of the invention, and details thereof (including the preferable ranges) are also the same. When the weight average molecular weight is within the ranges, the dispersion stability, developability, and adhesion property to a silicon substrate are improved.

The content of the (b2-1) monomer having at least one of a phosphoric acid group and a sulfonic acid group in the (B2-1) copolymer has the same definition as the content of the (b1-1) monomer having a phosphoric acid group or a sulfonic acid group in the (B1-1) copolymer used in the first aspect of the invention, and details thereof (including the preferable ranges) are also the same. When the content is within the ranges, the dispersion stability, solvent solubility, and developability of the inorganic pigment due to the (B2-1) copolymer, and the adhesion of the formed light-shielding film with a silicon substrate are improved.

Furthermore, the content of the (b2-2) macromonomer having a weight average molecular weight of 1,000 or more in the (B2-1) copolymer has the same definition as the content of the (b1-2) monomer having a weight average molecular weight of 1,000 or more in the (B1-1) copolymer used in the first aspect of the invention, and details thereof (including the preferable ranges) are also the same. When the content is within the ranges, the dispersion stability, solvent solubility, and developability of the inorganic pigment due to the (B2-1) copolymer, and the adhesion of the formed light-shielding film with a silicon substrate are improved.

The (B2-1) copolymer may further contain another monomer as a copolymerization component in order to adjust the solvent solubility or the developability. Examples of the additional monomer are the same as those of the additional monomer used in the first aspect, and details thereof (including the preferable ranges) are also the same.

Among the (B2) specific resins used in the second aspect of the invention, specific structures of the compounds belonging to the (B2-1) copolymer are shown below ((B2-1-1) to (B2-1-18)), but the present invention is not limited thereto. In the following copolymers (B2-1-1) to (B2-1-18), R represent an alkyl group.

(B2-1-1)

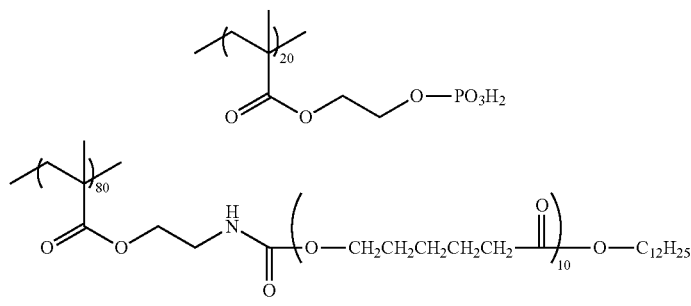

Mw 13,000~42,000

-continued
(B2-1-2)
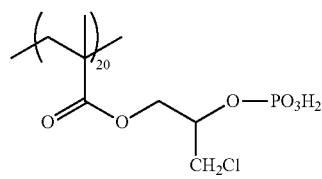
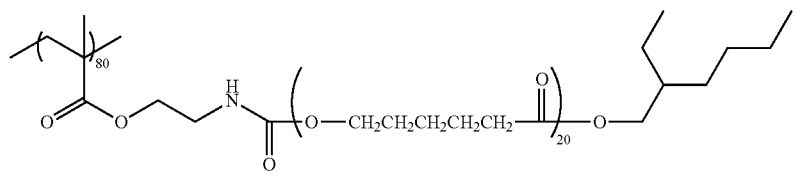
Mw 32,000
(B2-1-3)
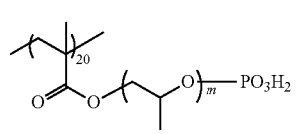
m = 5~6
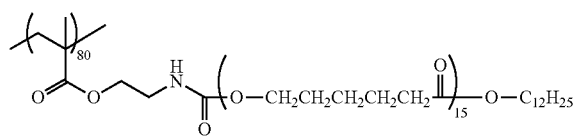
Mw 28,000
(B2-1-4)
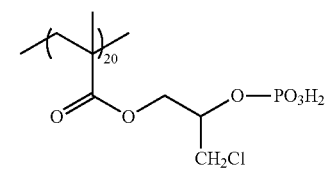
Mw 28,000
(B2-1-5)
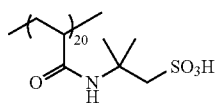
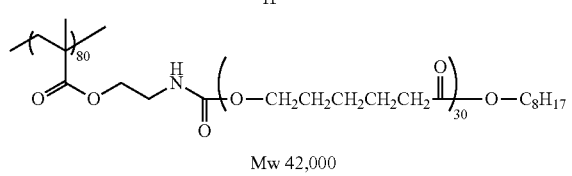
Mw 42,000
(B2-1-6)
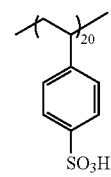
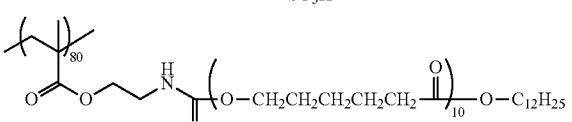
Mw 18,000
(B2-1-7)
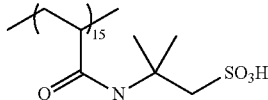
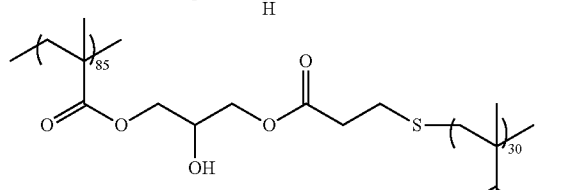
Mw 36,000
(B2-1-8)
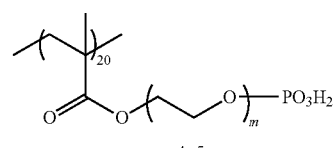
m = 4~5
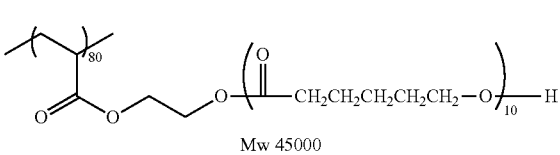
Mw 45000

-continued
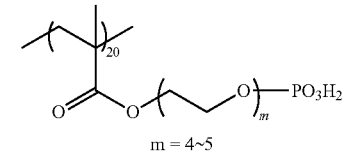
(B2-1-9)
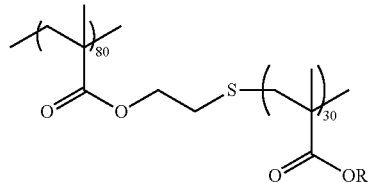
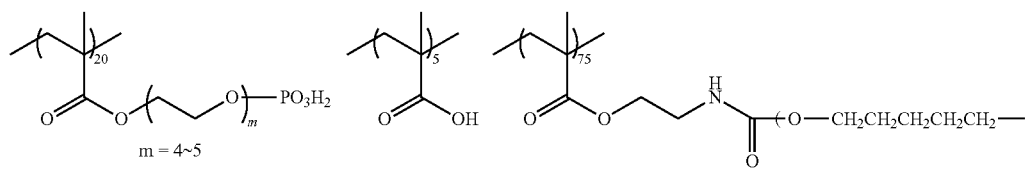
(B2-1-10)
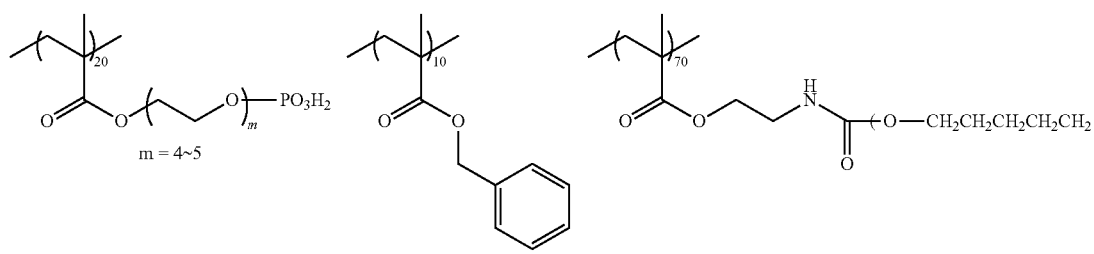
(B2-1-11)
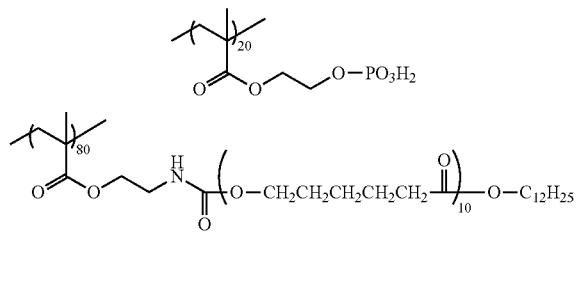
(B2-1-12)
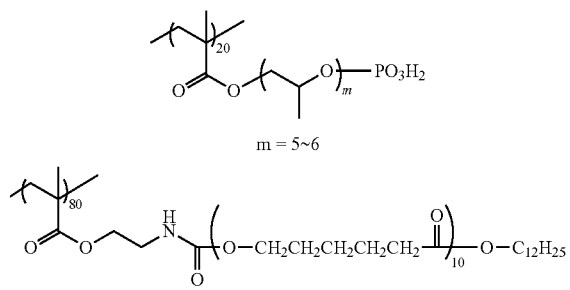
(B2-1-13)
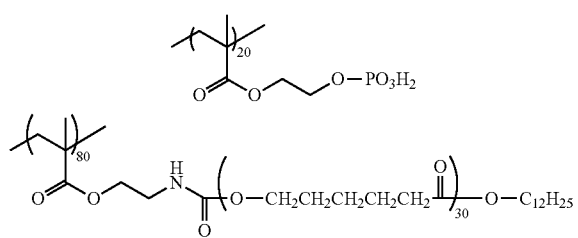
(B2-1-14)
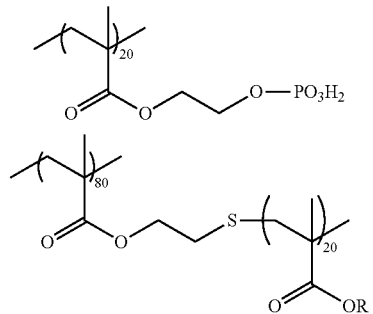
(B2-1-15)

(B2-1-16)

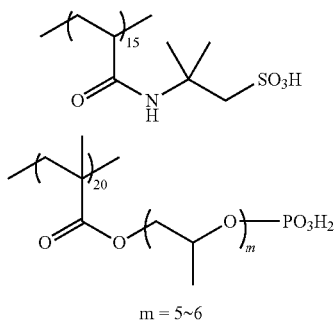

m = 5~6

(B2-1-17)

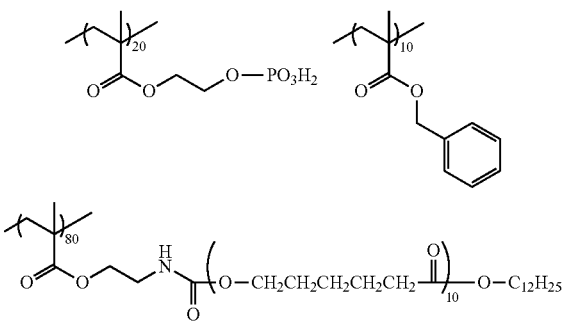

Mw 22,000

(B2-1-18)

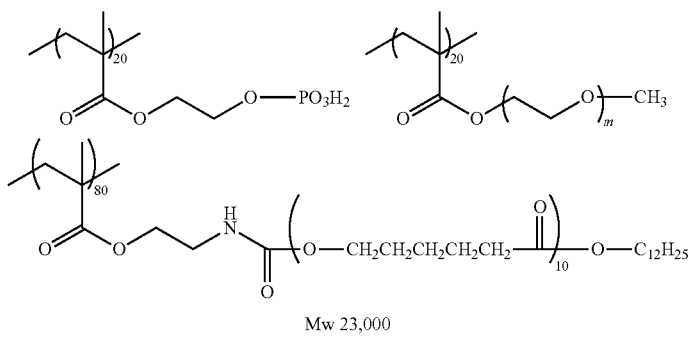

Mw 23,000

Among the (B2-1-1) copolymer to (B2-1-18) copolymer which are the (B2-1) copolymers, the (B2-1-1) copolymer and the (B2-1-18) copolymer are preferable from the viewpoints of an infrared light-shielding property, reduction of the residues, adhesion to a silicon substrate, and reduction of the step.

Next, the (B2-2) resin which is another preferred embodiment of the (B2) specific resin used in the second aspect of the invention is described. The (B2-2) resin has the same definition as that of the (B1-2) resin represented by Formula (I) in the first aspect of the invention, and details thereof (including the preferable ranges) are also the same.

The (B2-2) resin represented by Formula (I) may be produced by the same known method as that used in the first aspect of the invention.

The number average molecular weight of the molecular chain represented by $R_A$ in Formula (I) in the second aspect has the same definition as that in the first aspect, and preferable ranges thereof are also the same.

The weight average molecular weight of the (B2-2) resin has the same definition as that of the (B1-2) resin used in the first aspect, and preferable ranges thereof are also the same. When the weight average molecular weight is within the ranges, the dispersion stability, the developability, and adhesion to a silicon substrate are improved.

Among the (B2) specific resins according to the second aspect of the invention, the specific structures of the compounds belonging to the (B2-2) resin are shown below, but the present invention is not limited to these. As for the structural formulae (B2-2-1) to (B2-2-7), $-OR_A$ in Formula (I) is shown below. Further, as for the following specific examples, y represents 1 or 2 as described above; n represents an integer of from 5 to 100; R represents a chained alkyl group having 1 to 30 carbon atoms or a cyclic alkyl group having 3 to 30 carbon atoms; m represents 1 to 50; l represents represent 1 to 50; and n represents 1 to 50.

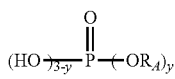

| | $OR_A$ |
|---|---|
| (B2-2-1) | 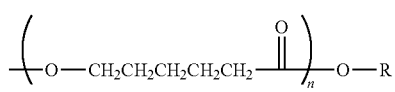 |
| (B2-2-2) | 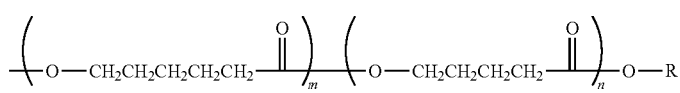 |

-continued

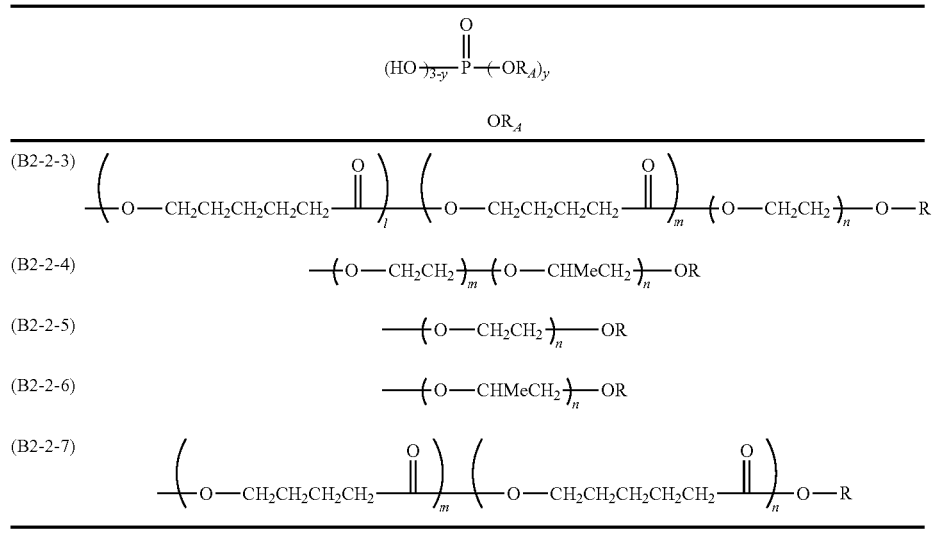

As the specific resin (B2) in the black curable composition according to the second aspect of the present invention, among those as described above, the resin represented by Formula (I) ((B2-2) resin) is most preferable from the viewpoints of further reduction of a step in the light-shielding film (a phenomenon where a region (step) in which the film thickness of the peripheral portion of the light-shielding film becomes lower than that of the central portion of the light-shielding film is generated), and further reduction of the residues outside the region in which the light-shielding film is formed.

The content of the (B2) specific resin in the black curable composition according to the second aspect of the invention is preferably in the range from 1% by mass to 40% by mass, more preferably in the range from 3% by mass to 30% by mass, and further more preferably in the range from 5% by mass to 20% by mass, based on the mass of the total solid contents of the black curable composition. It is thought that within this range, formability of a light-shielding film having an excellent infrared light-shielding ability, reduction of the residues in regions other than the region in which the light-shielding film is formed, and adhesion to a surface of the silicon substrate are particularly improved.

Furthermore, the content in terms of a mass ratio of the (B2) specific resin to the (A2) inorganic pigment (i.e., (B2) specific resin/(A2) inorganic pigment) in the black curable composition according to the second aspect of the present invention is preferably from 0.10 to 0.50, more preferably from 0.20 to 0.40, and most preferably from 0.20 to 0.30. When the mass ratio is within the ranges, inhibition of the residues and reduction of the step are excellent.

The black curable composition according to the second aspect of the invention contains the (A2) inorganic pigment as described below dispersed therein by means of the (B2) specific resin. The black curable composition may further include an additional pigment dispersant (which is hereinbelow simply referred to as "dispersant") in addition to the (B2) specific resin, as long as the effect of the invention is not impaired.

Examples of the dispersant to be used in combination with the (B2) specific resin include the same pigment dispersants and surfactants used in combination with the (B1) specific resin in the black curable composition according to the first aspect of the invention, and details thereof (including the preferable ranges) are also the same.

(C2) Polymerization Initiator

The black curable composition according to the second aspect of the invention includes a polymerization initiator.

The photopolymerization initiator used in the black curable composition according to the second aspect of the invention has the same definition as that of the photopolymerization initoator used in the first aspect of the invention, and details thereof (including the preferable ranges) are also the same.

In the second aspect of the present invention, among the oxime ester-based compounds, 2-(O-benzoyloxime)-1-[4-(phenyl thio)phenyl]-1,2-octanedione, 1-(O-acetyloxime)-1-[9-ethyl-6-(2-methylbenzoyl)-9H-carbazol-3-yl]ethanone is preferable.

Furthermore, as the oxime-based photopolymerization initiator, a compound represented by the following Formula (I) (which is hereinafter also referred to as "specific oxime compound") is also preferable. Further, the specific oxime compound may be an oxime compound in which the N-O bond of the oxime is an (E)-isomeric oxime compound or a (Z)-isomeric oxime compound, or a mixture of the (E)-isomeric oxime compound and the (Z)-isomeric oxime compound.

(1)

In Formula (1), R and B each independently represent a monovalent substituent; A represents a divalent organic group; and Ar represents an aryl group.

The monovalent group represented by R is preferably a monovalent non-metal atomic group.

Examples of the monovalent non-metal atomic group include an alkyl group, an aryl group, an alkenyl group, an alkynyl group, an alkylsulfinyl group, an arylsulfinyl group, an alkylsulfonyl group, an arylsulfonyl group, an acyl group, an alkoxycarbonyl group, an aryloxycarbonyl group, a phosphinoyl group, a heterocyclic group, an alkylthiocarbonyl group, an arylthiocarbonyl group, a dialkylaminocarbonyl group, and a dialkylaminothiocarbonyl group. Each of them may have at least one substituent, and the substituent may be substituted with another substituent.

Examples of the substituent include: a halogen atom such as a fluorine atom, a bromine atom, or an iodine atom; an alkoxy group such as a methoxy group, an ethoxy group, or a tert-butoxy group; an aryloxy group such as a phenoxy group or a p-tolyloxy group; an alkoxycarbonyl group or an aryloxycarbonyl group, such as a methoxycarbonyl group, a butoxycarbonyl group, or a phenoxycarbonyl group; an acyloxy group such as an acetoxy group, a propionyloxy group, or a benzoyloxy group; an acyl group such as an acetyl group, a benzoyl group, an isobutyryl group, an acryloyl group, a methacryloyl group, or a methoxalyl group; an alkylsulfanyl group such as a methylsulfanyl group or a tert-butylsulfanyl group; an arylsulfanyl group such as a phenylsulfanyl group or p-tolylsulfanyl group; an alkylamino group such as a methylamino group or a cyclohexylamino group; a dialkylamino group such as a dimethylamino group, a diethylamino group, a morpholino group, or a piperidino group; an arylamino group such as a phenylamino group or a p-tolylamino group; an alkyl group such as a methyl group, an ethyl group, a tert-butyl group, or a dodecyl group; an aryl group such as a phenyl group, a p-tolyl group, a xylyl group, a cumenyl group, a naphthyl group, an anthryl group, or a phenanthryl group; and a hydroxyl group, a carboxyl group, a formyl group, a mercapto group, a sulfo group, a mesyl group, a p-toluenesulfonyl group, an amino group, a nitro group, a cyano group, a trifluoromethyl group, a trichloromethyl group, a trimethylsilyl group, a phosphono group, a trimethyl ammonium group, a dimethylsulfonium group, and a triphenylphenacylphosphonium group.

The alkyl group which may have a substituent is preferably an alkyl group having 1 to 30 carbon atoms, more preferably an alkyl group having 1 to 10 carbon atoms, and most preferably an alkyl group having 1 to 5 carbon atoms. Examples thereof include a methyl group, an ethyl group, a propyl group, a butyl group, a hexyl group, an octyl group, a decyl group, a dodecyl group, an octadecyl group, an isopropyl group, an isobutyl group, a sec-butyl group, a t-butyl group, a 1-ethylpentyl group, a cyclopentyl group, a cyclohexyl group, a trifluoromethyl group, a 2-ethylhexyl group, a phenacyl group, a 1-naphthoylmethyl group, a 2-naphthoylmethyl group, a 4-methylsulfanylphenacyl group, a 4-phenylsulfanylphenacyl group, a 4-dimethylaminophenacyl group, a 4-cyanophenacyl group, a 4-methylphenacyl group, a 2-methylphenacyl group, a 3-fulorophenacyl group, a 3-trifluoromethylphenacyl group, and a 3-nitrophenacyl group.

The aryl group which may have a substituent is preferably an aryl group having 6 to 30 carbon atoms. Examples thereof include a phenyl group, a biphenyl group, a 1-naphtyl group, a 2-naphtyl group, a 9-anthryl group, a 9-phenanthryl group, a 1-pyrenyl group, a 5-naphthacenyl group, a 1-indenyl group, a 2-azulenyl group, a 9-fluorenyl group, terphenyl group, a quarter phenyl group, an o-tolyl group, a m-tolyl group, a p-tolyl group, a xylyl group, an o-cumenyl group, a m-cumenyl group, a p-cumenyl group, a mesityl group, a pentalenyl group, a binaphthalenyl group, a ternaphthalenyl group, a quarter naphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quarter anthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

The alkenyl group which may have a substituent is preferably an alkenyl group having 2 to 10 carbon atoms. Examples thereof include a vinyl group, an allyl group, and styryl group.

The alkynyl group which may have a substituent is preferably an alkynyl group having 2 to 10 carbon atoms. Examples thereof include an ethynyl group, a propynyl group, and a propargyl group.

The alkylsulfinyl group which may have a substituent is preferably an alkylsulfinyl group having 1 to 20 carbon atoms. Examples thereof include a methylsulfinyl group, an ethylsulfinyl group, a propylsulfinyl group, an isopropylsulfinyl group, a butylsulfinyl group, a hexylsulfinyl group, a cyclohexylsulfinyl group, an octylsulfinyl group, a 2-ethylhexylsulfinyl group, a decanoylsulfinyl group, a dodecanolylsulfinyl group, an octadecanolylsulfinyl group, a cyanomethylsulfinyl group, and a methoxymethylsulfinyl group.

The arylsulfinyl group which may have a substituent is preferably an arylsulfinyl group having 6 to 30 carbon atoms. Examples thereof include a phenylsulfinyl group, a 1-naphthylsulfinyl group, a 2-naphthylsulfinyl group, a 2-chlorophenylsulfinyl group, a 2-methylphenylsulfinyl group, a 2-methoxyphenylsulfinyl group, a 2-butoxyphenylsulfinyl group, a 3-chlorophenylsulfinyl group, a 3-trifluoromethylphenylsulfinyl group, a 3-cyanophenylsulfinyl group, a 3-nitrophenylsulfinyl group, a 4-fluorophenylsulfinyl group, a 4-cyanophenylsulfinyl group, a 4-methoxyphenylsulfinyl group, a 4-methylsulfanylphenylsulfinyl group, a 4-phenylsulfanylphenylsulfinyl group, and a 4-dimethylaminophenylsulfinyl group.

The alkylsulfonyl group which may have a substituent is preferably an alkylsulfonyl group having 1 to 20 carbon atoms. Examples thereof include a methylsulfonyl group, an ethylsulfonyl group, a propylsulfonyl group, an isopropylsulfonyl group, a butylsulfonyl group, a hexylsulfonyl group, a cyclohexylsulfonyl group, an octylsulfonyl group, a 2-ethylhexylsulfonyl group, a decanolylsulfonyl group, a dodecanolylsulfonyl group, an octadecanoylsulfonyl group, a cyanomethylsulfonyl group, a methoxymethylsulfonyl group, and a perfluoroalkylsulfonyl group.

The arylsulfonyl group which may have a substituent is preferably an arylsulfonyl group having 6 to 30 carbon atoms. Examples thereof include a phenylsulfonyl group, a 1-naphthylsulfonyl group, a 2-naphthylsulfonyl group, a 2-chlorophenylsulfonyl group, a 2-methylphenylsulfonyl group, a 2-methoxyphenylsulfonyl group, a 2-butoxyphenylsulfonyl group, a 3-chlorophenylsulfonyl group, a 3-trifluoromethylphenylsulfonyl group, a 3-cyanophenylsulfonyl group, a 3-nitrophenylsulfonyl group, a 4-fluorophenylsulfonyl group, a 4-cyanophenylsulfonyl group, a 4-methoxyphenylsulfonyl group, a 4-methylsulfanylphenylsulfonyl group, a 4-phenylsulfanylphenylsulfonyl group, and a 4-dimethylaminophenylsulfonyl group.

The acyl group which may have a substituent is preferably an acyl group having 2 to 20 carbon atoms. Examples thereof include an acetyl group, a propanoyl group, a butanoyl group, a trifluoromethylcarbonyl group, a pentanoyl group, a benzoyl group, a toluoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

The alkoxycarbonyl group which may have a substituent is preferably an alkoxycarbonyl group having 2 to 20 carbon atoms. Examples thereof include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group.

Examples of the aryloxycarbonyl group which may have a substituent include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and a 4-methoxyphenyloxycarbonyl group.

The phosphinoyl group which may have a substituent is preferably a phosphinoyl group having 2 to 50 total carbon atoms. Examples thereof include a dimethylphosphinoyl group, a diethylphosphinoyl group, a dipropylphosphinoyl group, a diphenylphosphinoyl group, a dimethoxyphosphinoyl group, a diethoxyphosphinoyl group, a dibenzoylphosphinoyl group, and a bis(2,4,6-trimethylphenyl)phosphinoyl group.

The heterocyclic group which may have a substituent is preferably an aromatic or aliphatic heterocycle containing a nitrogen atom, an oxygen atom, a sulfur atom, or a phosphorus atom.

Examples thereof include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxalinyl group, a quinazolinyl group, a cinnolinyl group, a pteridinyl group, a 4aH-carbazolyl group, a carbazolyl group, a β-carbolinyl group, a phenanthridinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group, and a thioxanthonyl group.

Examples of the alkylthiocarbonyl group which may have a substituent include a methylthiocarbonyl group, a propylthiocarbonyl group, a butylthiocarbonyl group, a hexylthiocarbonyl group, an octylthiocarbonyl group, a decylthiocarbonyl group, an octadecylthiocarbonyl group, and a trifluoromethyl thiocarbonyl group.

Examples of the arylthiocarbonyl group which may have a substituent include a 1-naphthylthiocarbonyl group, a 2-naphthylthiocarbonyl group, a 4-methylsulfanylphenylthiocarbonyl group, a 4-phenylsulfanylphenylthiocarbonyl group, a 4-dimethylaminophenylthiocarbonyl group, a 4-diethylaminophenylthiocarbonyl group, a 2-chlorophenylthiocarbonyl group, a 2-methylphenylthiocarbonyl group, a 2-methoxyphenylthiocarbonyl group, a 2-butoxyphenylthiocarbonyl group, a 3-chlorophenylthiocarbonyl group, a 3-trifluoromethylphenylthiocarbonyl group, a 3-cyanophenylthiocarbonyl group, a 3-nitrophenylthiocarbonyl group, a 4-fluorophenylthiocarbonyl group, a 4-cyanophenylthiocarbonyl group, and a 4-methoxyphenylthiocarbonyl group.

Examples of the dialkylaminocarbonyl group which may have a substituent include a dimethylaminocarbonyl group, a dimethylaminocarbonyl group, a dipropylaminocarbonyl group, and a dibutylaminocarbonyl group.

Examples of the dialkylaminothiocarbonyl group which may have a substituent include a dimethylaminothiocarbonyl group, a dipropylaminothiocarbonyl group, and a dibutylaminothiocarbonyl group.

Among them, in view of increasing the sensitivity, R in Formula (I) is more preferably an acyl group, and, in particular, an acetyl group, a propanoyl group, a benzoyl group, and a toluoyl group are preferable.

The monovalent substituent represented by B in Formula (I) is an aryl group, a heterocyclic group, an arylcarbonyl group, or a heterocyclic carbonyl group. Each of these groups may have at least one substituent, and examples of the substituent are the same as those described above. The substituent may further be substituted with another substituent.

The monovalent substituent represented by B particularly preferably has any one of the following structures.

In the following structures, Y, X, and n have the same definitions as those of Y, X, and n in Formula (2) described below, and preferable ranges thereof are also the same.

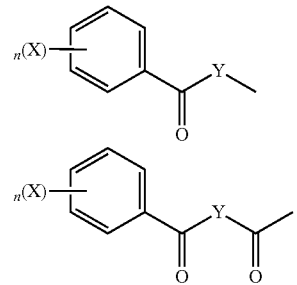

Examples of the divalent organic group represented by A in Formula (I) include an alkylene group which has 1 to 12 carbon atoms and may have at least one substituent, a cyclohexylene group which may have at least one substituent, and an alkynylene group which may have at least one substituent. Examples of the substituents are the same as those described above, and the substituents may be further substituted by another substituent.

In particular, in view of increasing the sensitivity and suppressing the coloration due to heat-aging, A in Formula (I) is preferably an unsubstituted alkylene group, an alkylene group substituted with an alkyl group (for example, a methyl group, an ethyl group, a tert-butyl group, or a dodecyl group), an alkylene group substituted with an alkenyl group (for example, a vinyl group or an allyl group), or an alkylene group substituted with an aryl group (for example, a phenyl group, a p-tolyl group, a xylyl group, a cumenyl group, a naphthyl group, an anthryl group, a phenanthryl group or a styryl group).

The aryl group represented by Ar in Formula (I) is preferably an aryl group having 6 to 30 carbon atoms, and may have a substituent. Examples of the substituent are the same as those described above.

Specific examples of the aryl group include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, 9-fluorenyl group, a terphenyl group, a quater phenyl group, an o-tolyl group, a m-tolyl group, a p-tolyl group, a xylyl group, an o-cumenyl group, a m-cumenyl group, a p-cumenyl group, a mesityl group, a pentalenyl group, a binaphthalenyl group, ternaphthalenyl group, a quater naphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quater anthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

In particular, in view of increasing the sensitivity and suppressing coloration due to heat-aging, a substituted or unsubstituted phenyl group is preferable.

In Formula (1), the structure of "SAr" formed by Ar and S adjacent to the Ar is preferably a structure shown below in view of sensitivity. Note that, "Me" represents a methyl group, and "Et" represents an ethyl group.

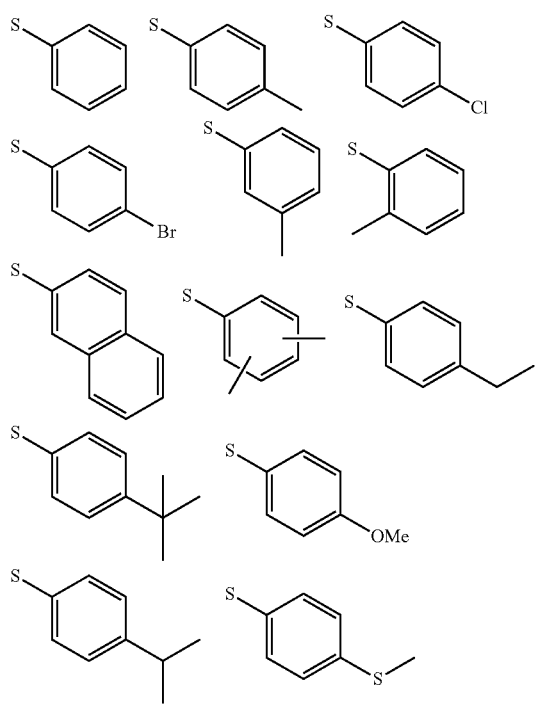

-continued

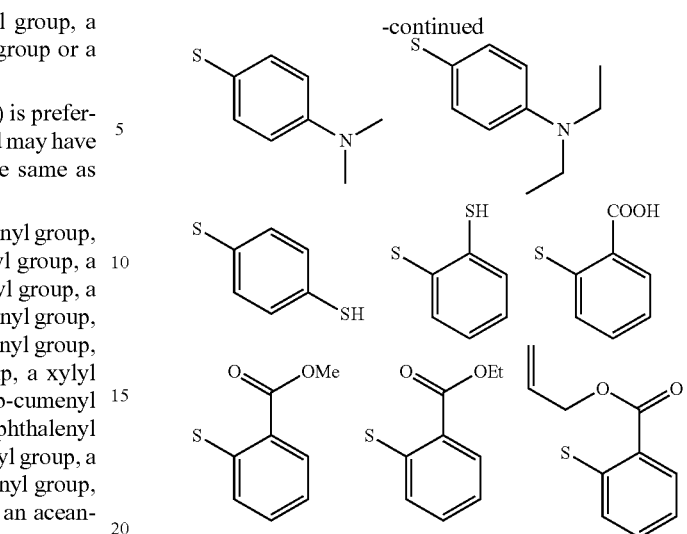

The specific oxime compound used in the second aspect of the invention is preferably a compound represented by the following Formula (2).

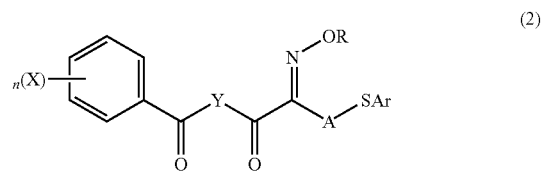

In Formula (2), R and X each independently represent a monovalent substituent; A and Y each independently represent a divalent organic group; Ar represents an aryl group; and n represents an integer from 0 to 5.

R, A, and Ar in Formula (2) have the same definitions as those of R, A, and Ar in Formula (1), respectively, and the preferable examples thereof are also the same.

Examples of the monovalent substituent represented by X in Formula (1) include an alkyl group which may have at least one substituent, an aryl group which may have at least one substituent, an alkenyl group which may have at least one substituent, an alkynyl group which may have at least one substituent, an alkoxy group which may have at least one substituent, an aryloxy group which may have at least one substituent, an acyloxy group which may have at least one substituent, an alkylsulfanyl group which may have at least one substituent, an arylsulfanyl group which may have at least one substituent, an alkylsulfinyl group which may have at least one substituent, an arylsulfinyl group which may have at least one substituent, an alkylsulfonyl group which may have at least one substituent, an arylsulfonyl group which may have at least one substituent, an acyl group which may have at least one substituent, an alkoxycarbonyl group which may have at least one substituent, a carbamoyl group which may have at least one substituent, a sulfamoyl group which may have at least one substituent, an amino group which may have at least one substituent, a phosphinoyl group which may have at least one substituent, a heterocyclic group which may have at least one substituent, and a halogen group. Examples of the substituents are the same as those described above, and each of the substituents may be further substituted by another substituent.

The alkyl group, aryl group, alkenyl group, alkynyl group, alkylsulfinyl group, arylsulfinyl group, alkylsulfonyl group, arylsulfonyl group, acyl group, alkoxycarbonyl group, aryloxycarbonyl group, phosphonoyl group, and heterocyclic group represented by X in Formula (2) have the same definitions as those of the alkyl group, aryl group, alkenyl group, alkynyl group, alkylsulfinyl group, arylsulfinyl group, alkylsulfonyl group, arylsulfonyl group, acyl group, alkoxycarbonyl group, aryloxycarbonyl group, phosphonoyl group, and heterocyclic group represented by R in Formula (1), respectively, and the preferable ranges thereof are also the same.

As the alkoxy group which may have a substituent, an alkoxy group having 1 to 30 carbon atoms is preferable. Examples thereof include a methoxy group, an ethoxy group, a propyloxy group, an isopropyloxy group, a butoxy group, an isobutoxy group, a sec-butoxy group, a tert-butoxy group, a pentyloxy group, an isopentyloxy group, a hexyloxy group, a heptyloxy group, an octyloxy group, a 2-ethylhexyloxy group, a decyloxy group, a dodecyloxy group, an octadecyloxy group, an ethoxycarbonylmethyl group, an ethylhexyloxycarbonyl methyloxy group, an aminocarbonylmethyloxy group, an N,N-dibutylaminocarbonylmethyloxy group, an N-methylaminocarbonylmethyloxy group, an N-ethylaminocarbonylmethyloxy group, an N-octylaminocarbonylmethyloxy group, an N-methyl-N-benzylaminocarbonylmethyloxy group, a benzyloxy group, and a cyanomethyloxy group.

As the aryloxy group which may have a substituent, an aryloxy group having 6 to 30 carbon atoms is preferable. Examples thereof include a phenyloxy group, a 1-naphthyloxy group, a 2-naphthyloxy group, a 2-chlorophenyloxy group, a 2-methylphenyloxy group, a 2-methoxyphenyloxy group, a 2-butoxyphenyloxy group, a 3-chlorophenyloxy group, a 3-trifluoromethylphenyloxy group, a 3-cyanophenyloxy group, a 3-nitrophenyloxy group, a 4-fluorophenyloxy group, a 4-cyanophenyloxy group, a 4-methoxyphenyloxy group, a 4-dimethylaminophenyloxy group, a 4-methylsulfanylphenyloxy group, and a 4-phenylsulfanylphenyloxy group.

As the acyloxy group which may have a substituent, an acyloxy group having 2 to 20 carbon atoms is preferable. Examples thereof include an acetyloxy group, a propanoyloxy group, a butanoyloxy group, a pentanoyloxy group, a trifluoromethylcarbonyloxy group, a benzoyloxy group, a 1-naphthylcarbonyloxy group, and a 2-naphthylcarbonyloxy group.

As the alkylsulfanyl group which may have a substituent, an alkylsulfanyl group having 1 to 20 carbon atoms is preferable. Examples thereof include a methylsulfanyl group, an ethylsulfanyl group, a propylsulfanyl group, an isopropylsulfanyl group, a butylsulfanyl group, a hexylsulfanyl group, a cyclohexylsulfanyl group, an octylsulfanyl group, a 2-ethylhexylsulfanyl group, a decanoylsulfanyl group, a dodecanoylsulfanyl group, an octadecanoylsulfanyl group, a cyanomethylsulfanyl group, and a methoxymethylsulfanyl group.

As the arylsulfanyl group which may have a substituent, an arylsulfanyl group having 6 to 30 carbon atoms is preferable. Examples thereof include a phenylsulfanyl group, a 1-naphthylsulfanyl group, a 2-naphthylsulfanyl group, a 2-chlorophenylsulfanyl group, a 2-methylphenylsulfanyl group, a 2-methoxyphenylsulfanyl group, a 2-butoxyphenylsulfanyl group, a 3-chlorophenylsulfanyl group, a 3-trifluoromethyl phenylsulfanyl group, a 3-cyanophenylsulfanyl group, a 3-nitrophenylsulfanyl group, a 4-fluorophenylsulfanyl group, a 4-cyanophenylsulfanyl group, a 4-methoxyphenylsulfanyl group, a 4-methylsulfanylphenylsulfanyl group, a 4-phenylsulfanylphenylsulfanyl group, and a 4-dimethylaminophenylsulfanyl group.

As the carbamoyl group which may have a substituent, a carbamoyl group having 1 to 30 total carbon atoms is preferable. Examples thereof include an N-methylcarbamoyl group, an N-ethylcarbamoyl group, an N-propylcarbamoyl group, an N-butylcarbamoyl group, an N-hexylcarbamoyl group, an N-cyclohexylcarbamoyl group, an N-octylcarbamoyl group, an N-decylcarbamoyl group, an N-octadecylcarbamoyl group, an N-phenylcarbamoyl group, an N-2-methylphenylcarbamoyl group, an N-2-chlorophenylcarbamoyl group, an N-2-isopropoxyphenylcarbamoyl group, an N-2-(2-ethylhexyl)phenylcarbamoyl group, an N-3-chlorophenylcarbamoyl group, an N-3-nitrophenylcarbamoyl group, an N-3-cyanophenylcarbamoyl group, an N-4-methoxyphenylcarbamoyl group, an N-4-cyanophenylcarbamoyl group, an N-4-methylsulfanylphenylcarbamoyl group, an N-4-phenylsulfanylphenylcarbamoyl group, an N-methyl-N-phenylcarbamoyl group, an N,N-dimethylcarbamoyl group, an N,N-dibutylcarbamoyl group, and an N,N-diphenylcarbamoyl group.

As the sulfamoyl group which may have a substituent, a sulfamoyl group having 0 to 30 total carbon atoms is preferable. Examples thereof include a sulfamoyl group, an N-alkylsulfamoyl group, an N-arylsulfamoyl group, an N,N-dialkylsulfamoyl group, an N,N-diarylsulfamoyl group, and an N-alkyl-N-arylsulfamoyl group. Specific examples thereof include an N-methylsulfamoyl group, an N-ethylsulfamoyl group, an N-propylsulfamoyl group, an N-butylsulfamoyl group, an N-hexylsulfamoyl group, an N-cyclohexylsulfamoyl group, an N-octylsulfamoyl group, an N-2-ethylhexylsulfamoyl group, an N-decylsulfamoyl group, an N-octadecylsulfamoyl group, an N-phenylsulfamoyl group, an N-2-methylphenylsulfamoyl group, an N-2-chlorophenylsulfamoyl group, an N-2-methoxyphenylsulfamoyl group, an N-2-isopropoxyphenylsulfamoyl group, an N-3-chlorophenylsulfamoyl group, an N-3-nitrophenylsulfamoyl group, an N-3-cyanophenylsulfamoyl group, an N-4-methoxyphenylsulfamoyl group, an N-4-cyanophenylsulfamoyl group, an N-4-dimethylaminophenylsulfamoyl group, an N-4-methylsulfanylphenylsulfamoyl group, an N-4-phenylsulfanylphenylsulfamoyl group, an N-methyl-N-phenylsulfamoyl group, an N,N-dimethylsulfamoyl group, an N,N-dibutylsulfamoyl group, and an N,N-diphenylsulfamoyl group.

As the amino group which may have a substituent, an amino group having 0 to 50 total carbon atoms is preferable. Examples thereof include —NH$_2$, an N-alkylamino group, an N-arylamino group, an N-acylamino group, an N-sulfonylamino group, N,N-dialkylamino group, an N,N-diarylamino group, an N-alkyl-N-arylamino group, and an N,N-disulfonylamino group. More specifically, examples thereof include an N-methylamino group, an N-ethylamino group, an N-propylamino group, an N-isopropylamino group, an N-butylamino group, an N-tert-butylamino group, an N-hexylamino group, an N-cyclohexylamino group, an N-octylamino group, an N-2-ethylhexylamino group, an N-decylamino group, an N-octadecylamino group, an N-benzylamino group, an N-phenylamino group, an N-2-methylphenylamino group, an N-2-chlorophenylamino group, an N-2-methoxyphenylamino group, an N-2-isopropoxyphenylamino group, an N-2-(2-ethylhexyl)phenylamino group, an N-3-chlorophenylamino group, an N-3-nitrophenylamino group, an N-3-cyanophenylamino group, an N-3-trifluoromethylphenylamino group, an N-4-methoxyphenylamino group, an N-4-cyanophenylamino group, an N-4-trifluoromethylphenylamino group, an N-4-methylsulfanylphenylamino group, an N-4-phenylsulfanylphenylamino group, an N-4-dimethylaminophenylamino group, an N-methyl-N-phenylamino group, an N,N-dimethylamino group, an N,N-diethylamino group, an N,N-dibutylamino group, an N,N-diphenylamino group, an N,N-diacetylamino group, an N,N-dibenzoylamino group, an N,N-(dibutylcarbonyl)amino group, an N,N-(dimethylsulfonyl)amino group, an N,N-(diethylsulfonyl)amino group, an N,N-(dibutylsulfonyl)amino group, an N,N-(diphenylsulfonyl)amino group, a morpholino group, a 3,5-dimethylmorpholino group, and a carbazole group.

Examples of the halogen atom include a fluorine atom, a chlorine atom, a bromine atom, and an iodine atom.

Among these, from the viewpoints of increasing solubility in a solvent and increasing absorption efficiency in a long wavelength region, X in Formula (2) is preferably an alkyl group, an aryl group, an alkenyl group, an alkynyl group, an alkoxy group, an aryloxy group, an alkylsulfanyl group, an arylsulfanyl group, or an amino group.

Furthermore, n in Formula (2) represents an integer of from 0 to 5, and more preferably an integer of from 0 to 2.

Examples of the divalent organic group represented by Y in Formula (2) include the structures shown below. Note that, in the groups shown below, "*" indicates the positions of the bonds to the carbon atoms adjacent to Y in Formula (2).

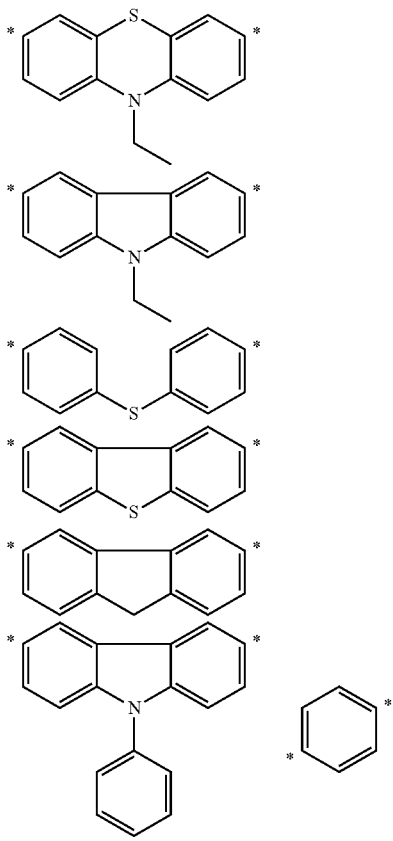

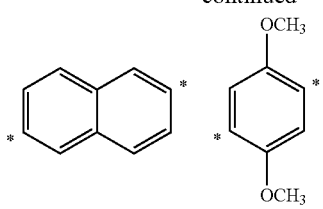

Among those, from the viewpoints of increasing sensitivity, the structures shown below are preferable.

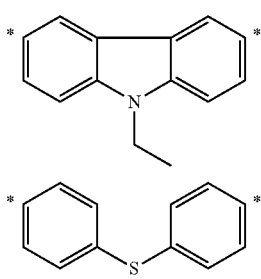

The specific oxime compound used in the second aspect of the invention is preferably a compound represented by the following Formula (3).

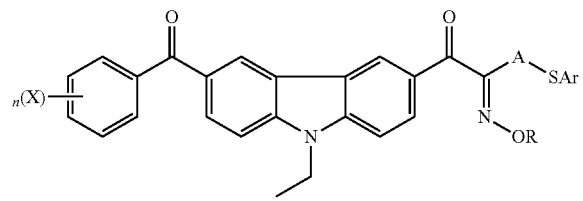

(3)

In Formula (3), R and X each independently represent a monovalent substituent; A represents a divalent organic group; Ar represents an aryl group; and n represents an integer of from 0 to 5.

R, X, A, Ar, and n in Formula (3) have the same definitions as those of R, X, A, Ar and n in Formula (2) above, respectively, and preferable examples thereof are also the same.

Specific examples of the specific oxime compound used in the second aspect of the present invention are shown below, but the present invention is not limited thereto.

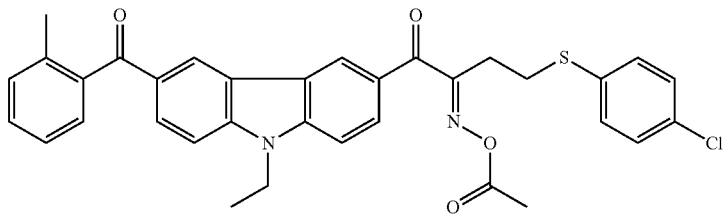

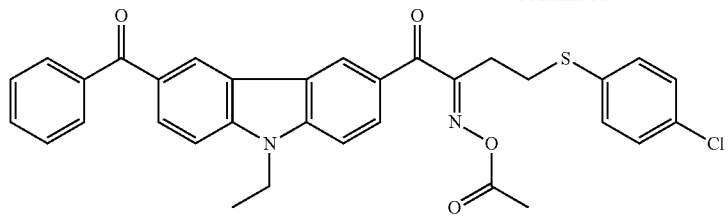
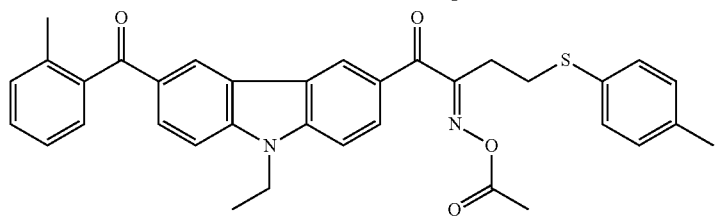
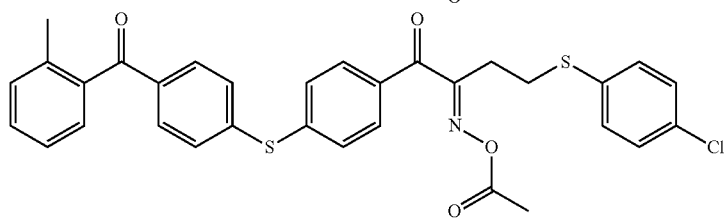
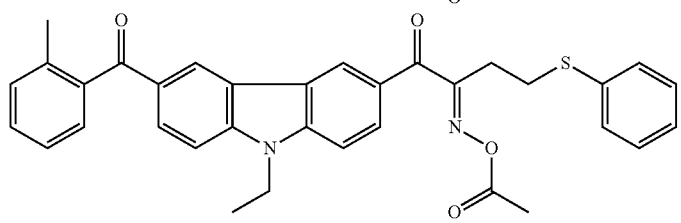
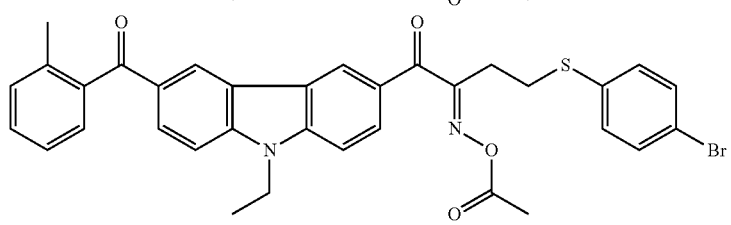
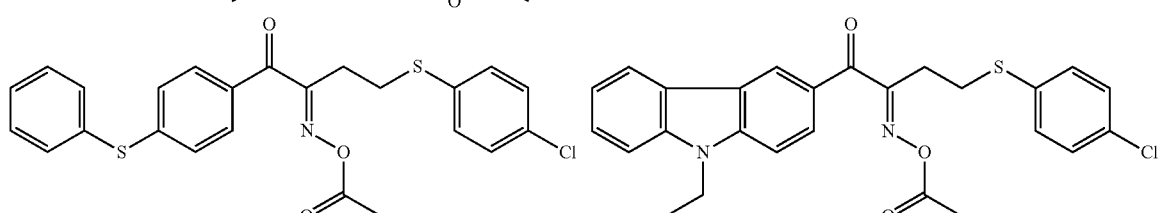
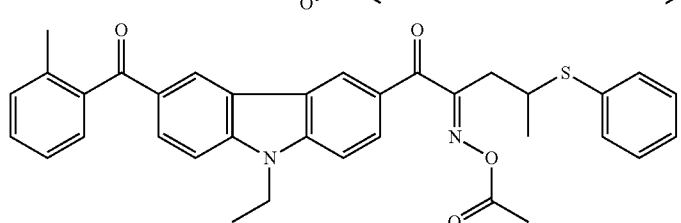
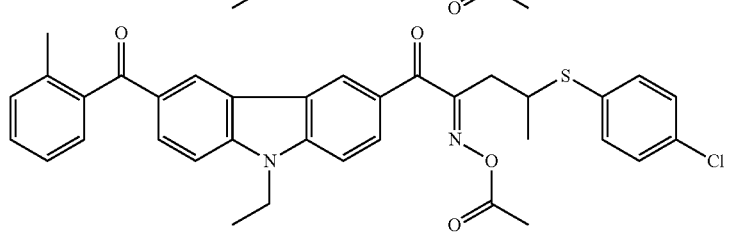

-continued
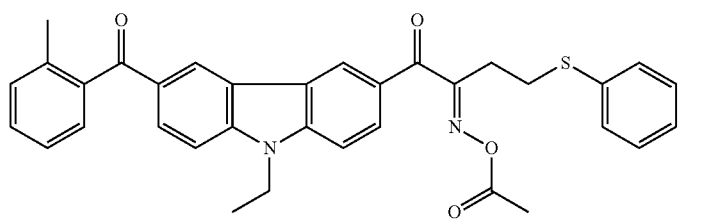
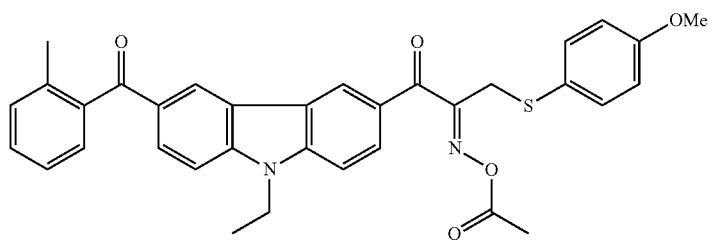
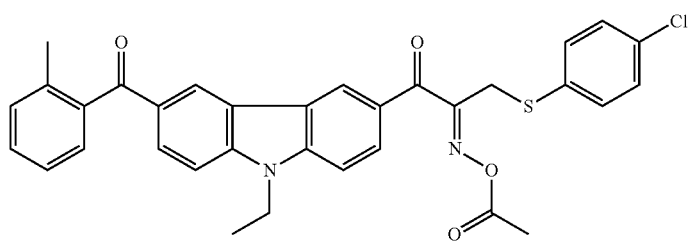
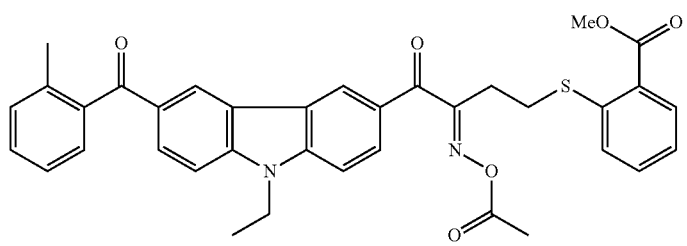
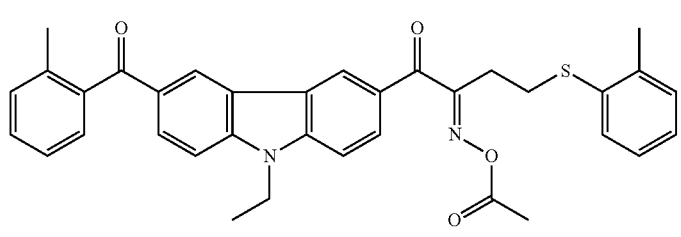
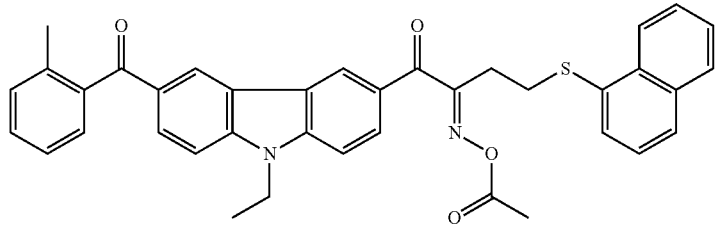
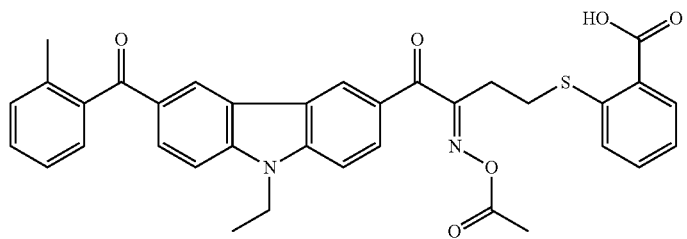

-continued
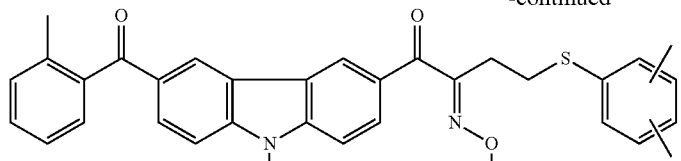
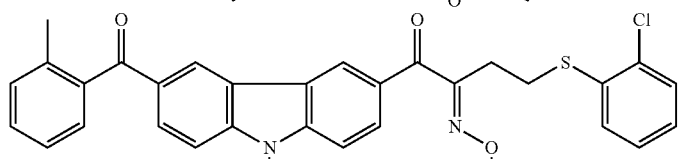
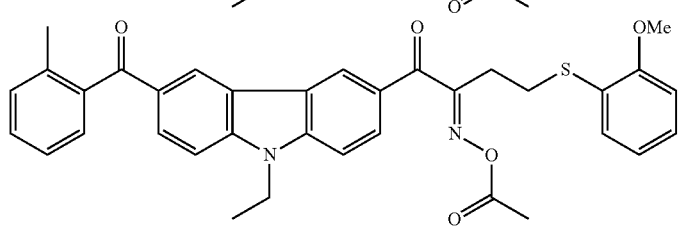
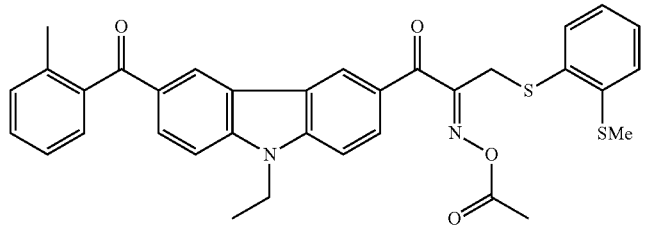
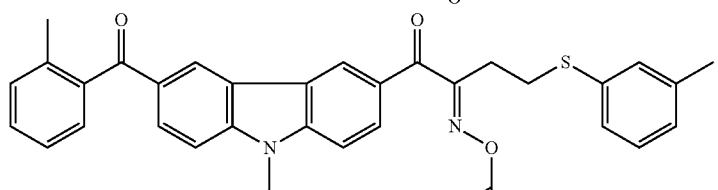
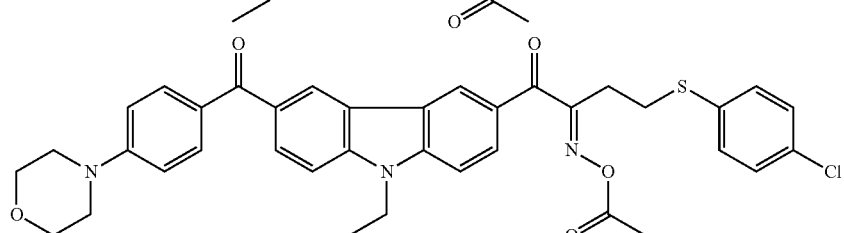
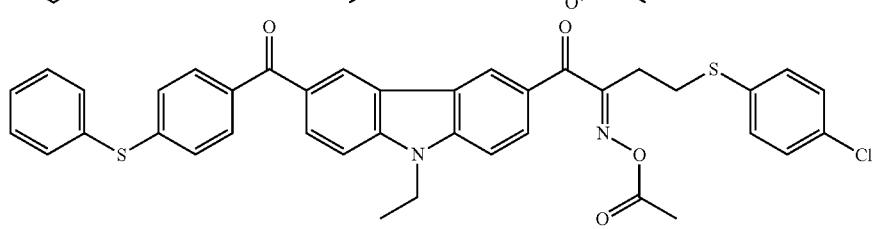
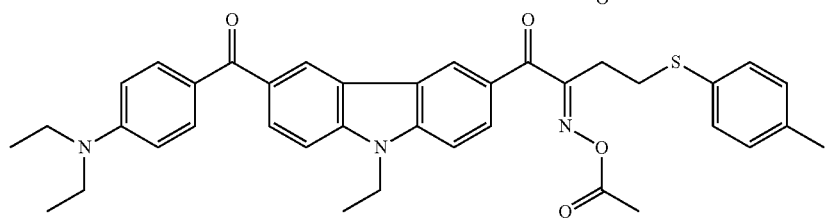

-continued
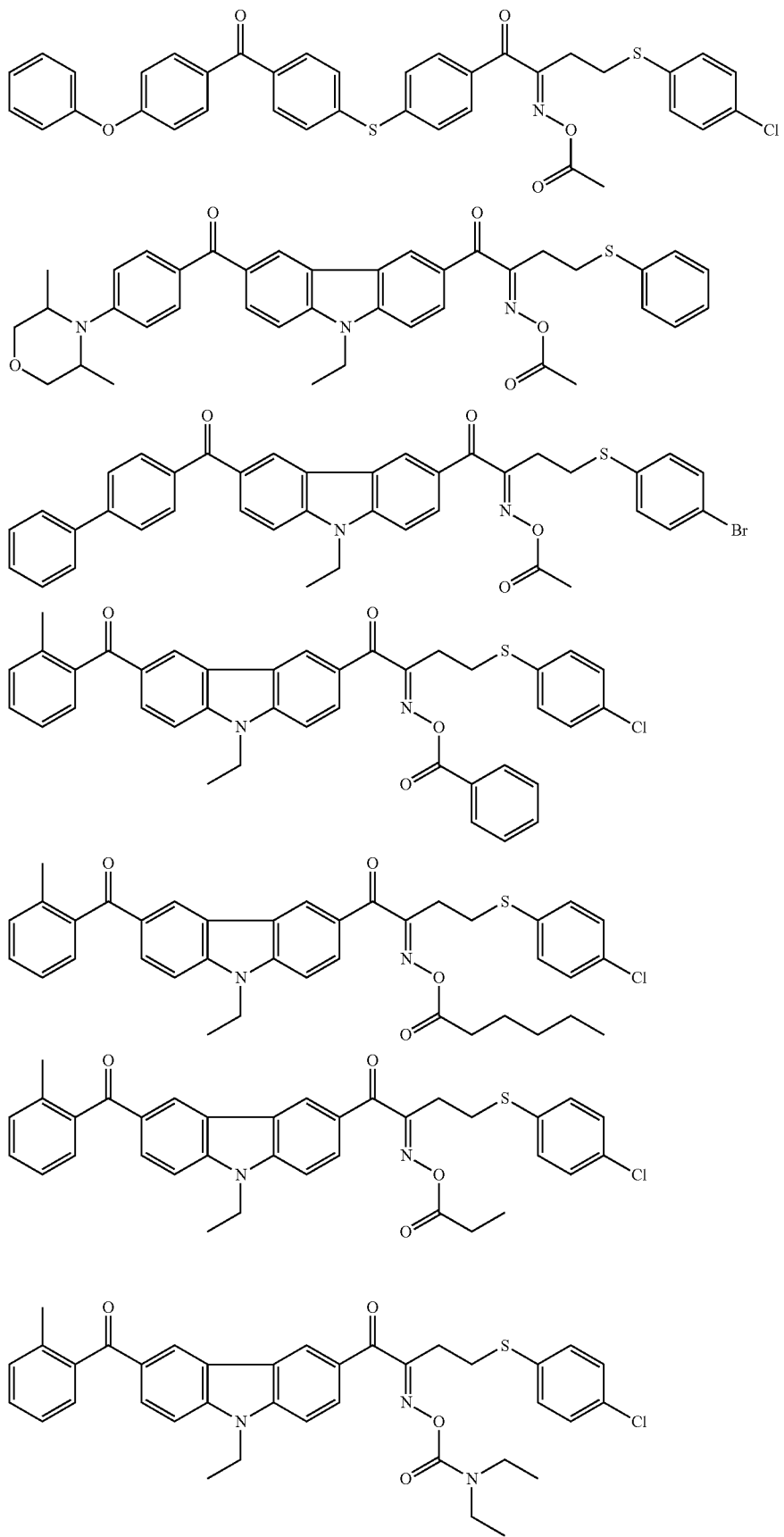

-continued
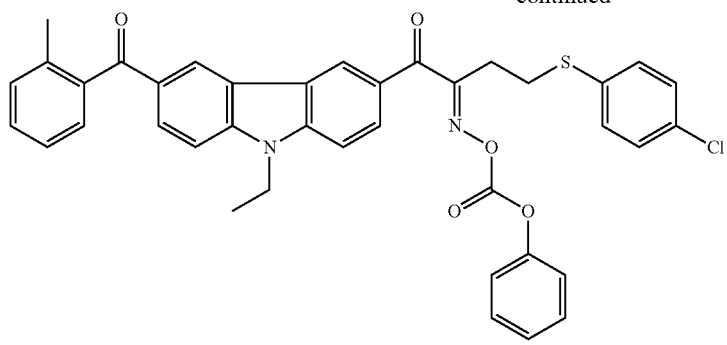
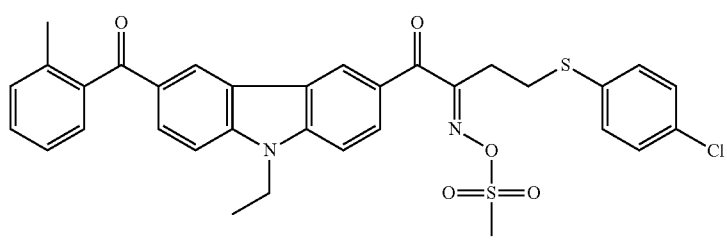
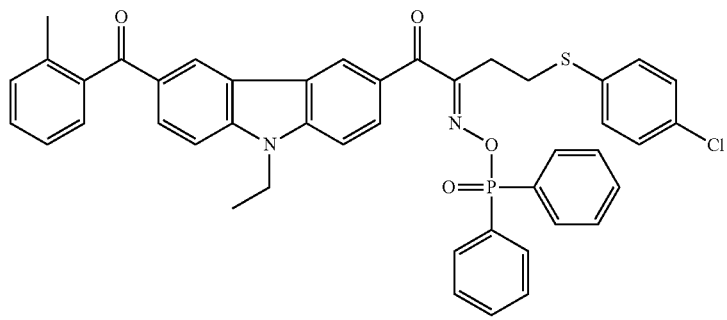
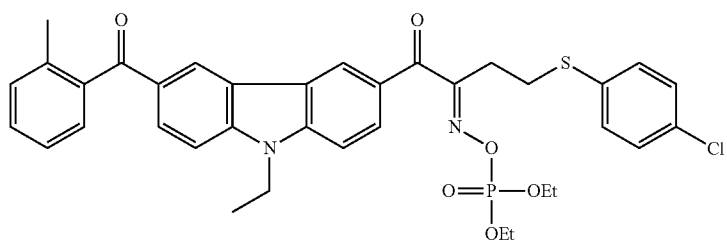
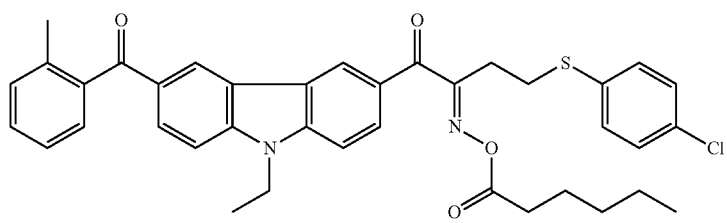
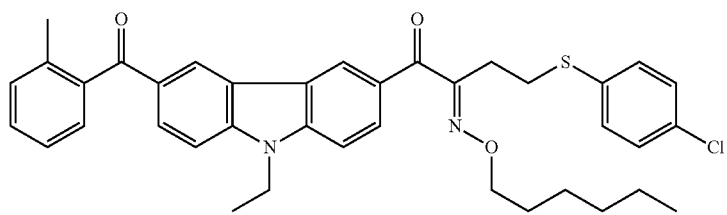

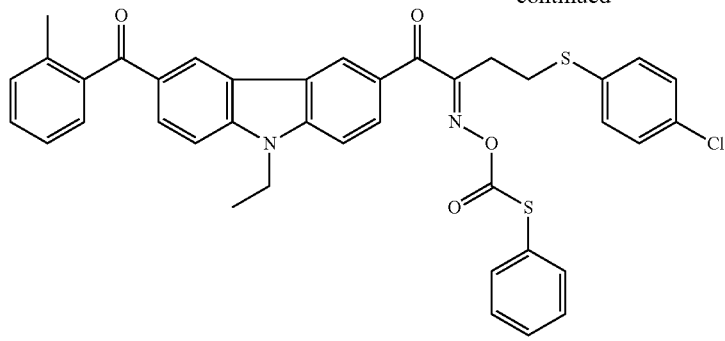
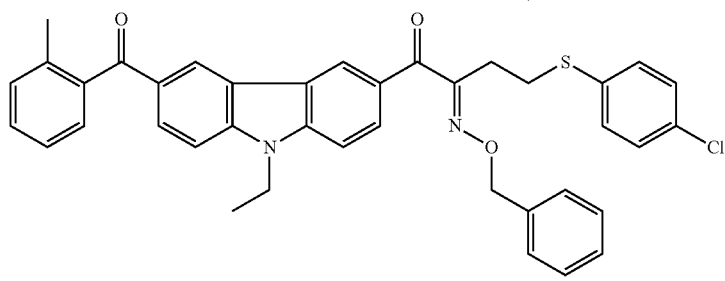
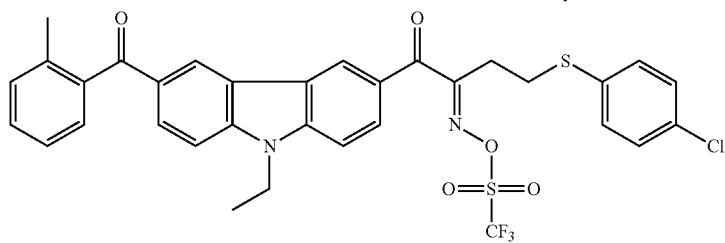
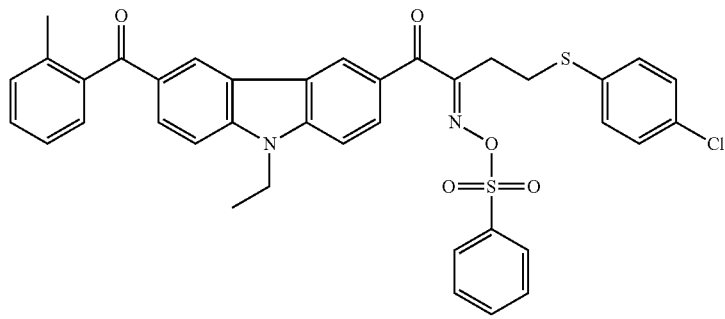
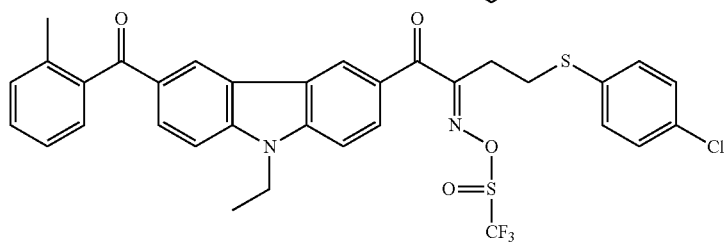
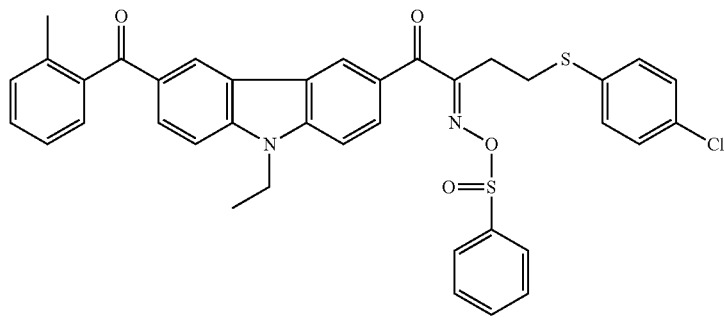

-continued
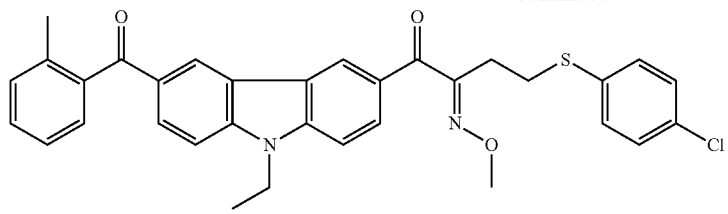
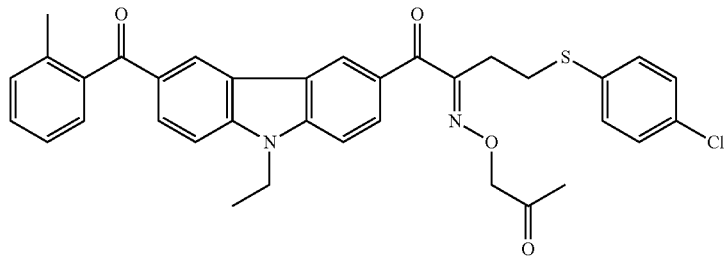
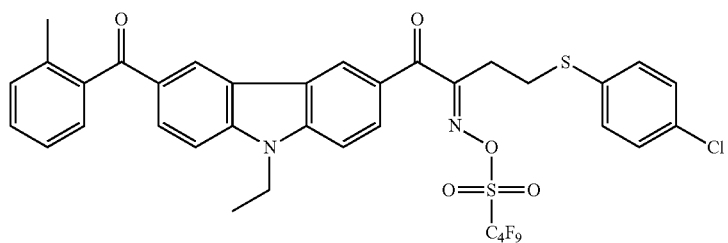
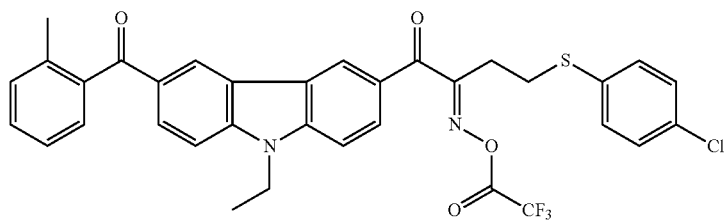 [SMILES: CCn1c2ccc(C(=O)/C(CCSc3ccc(Cl)cc3)=N/OC(=O)C(F)(F)F)cc2c2cc(C(=O)c3ccccc3)ccc21]
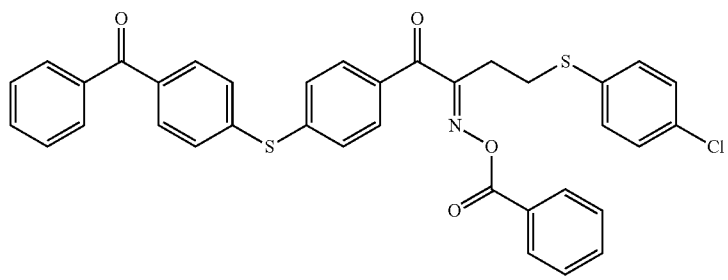
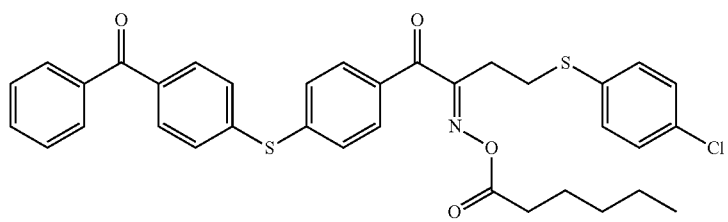
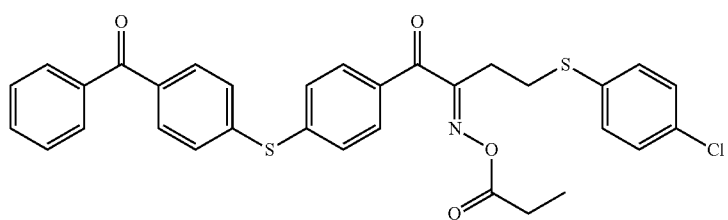

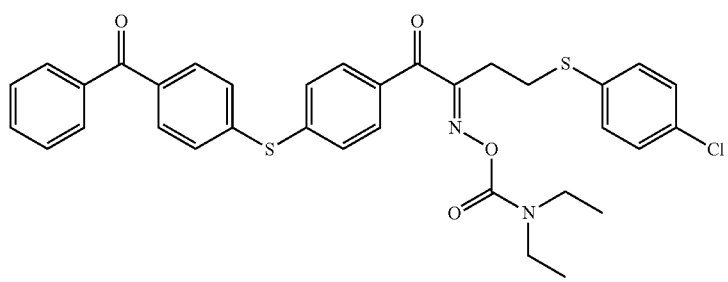
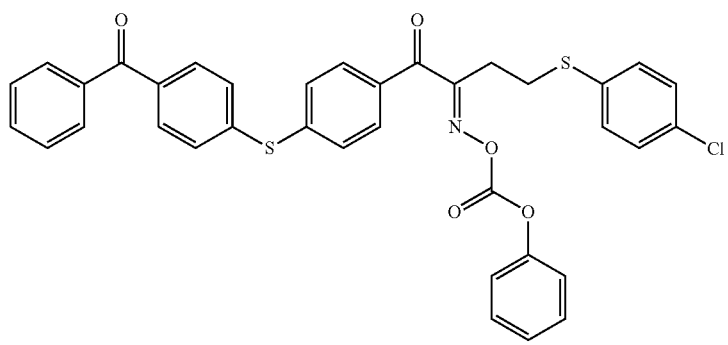
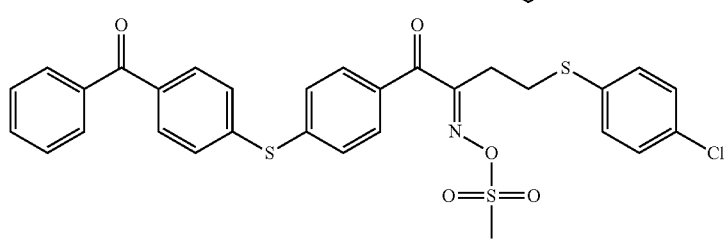
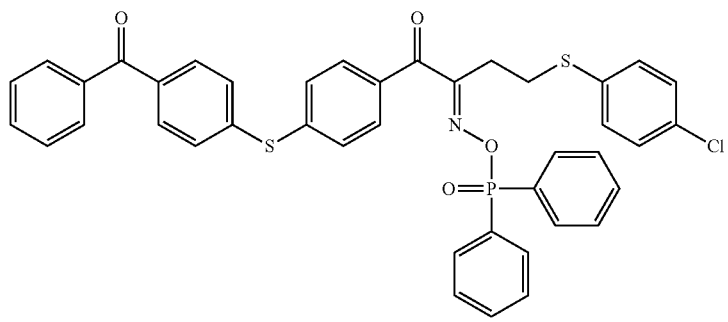
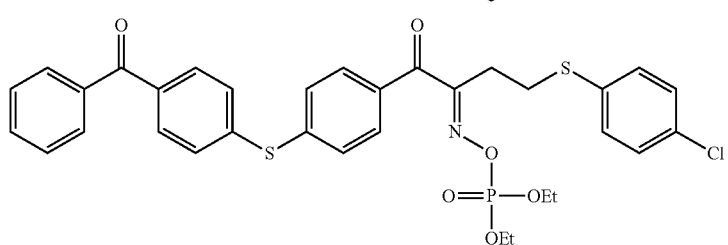
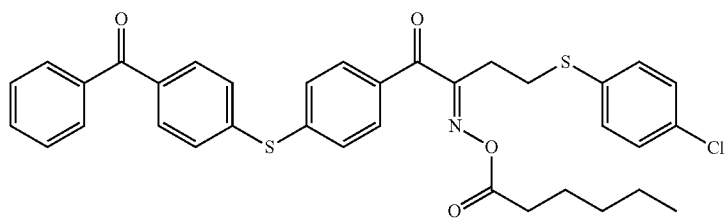

-continued
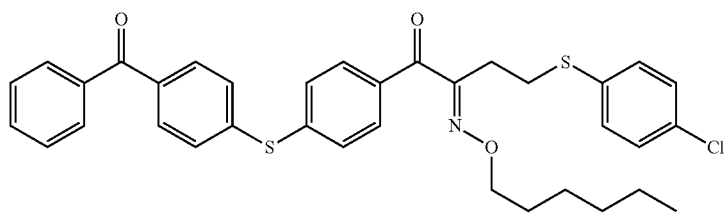
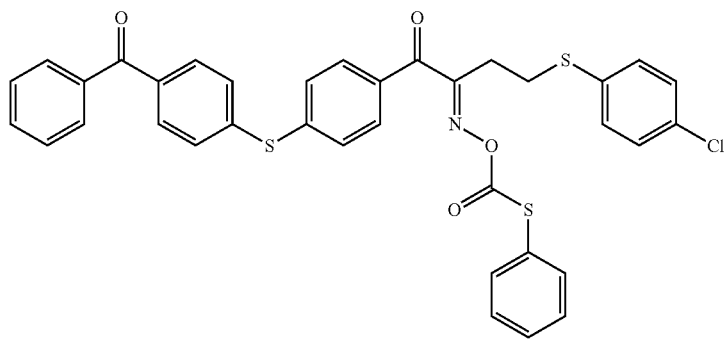
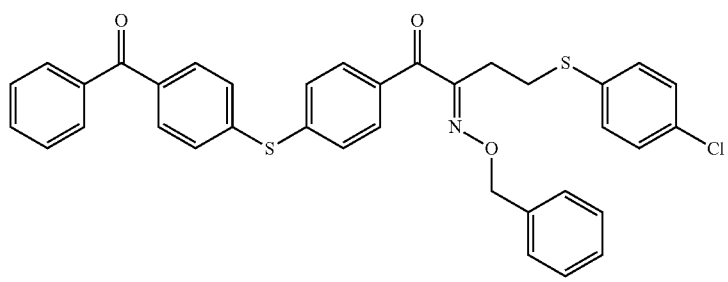
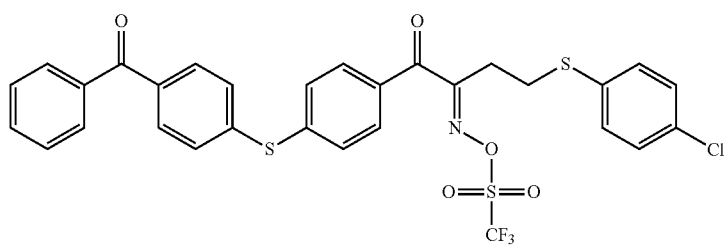
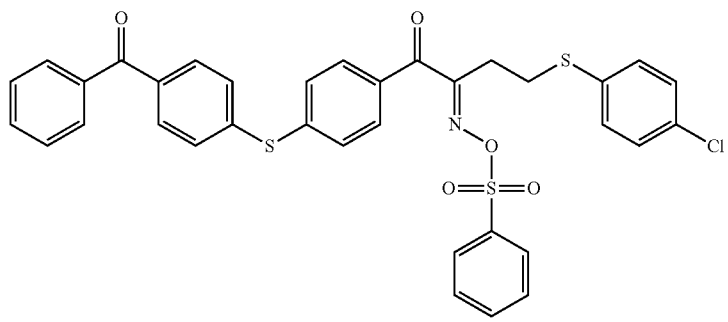
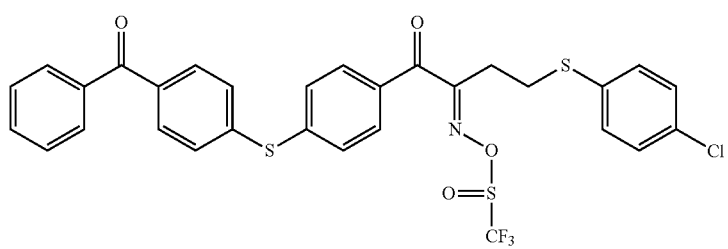

-continued
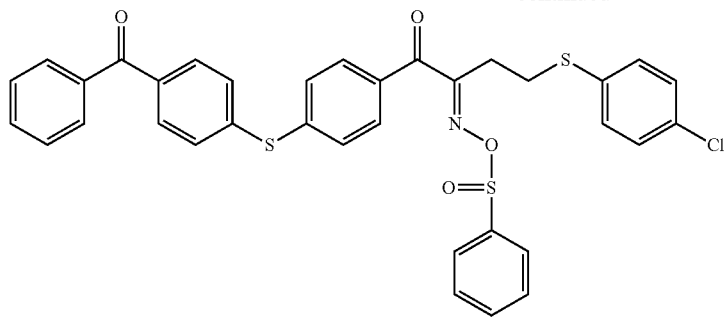
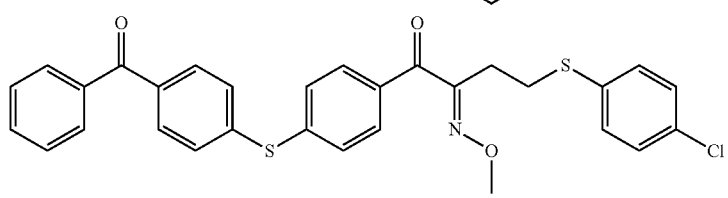
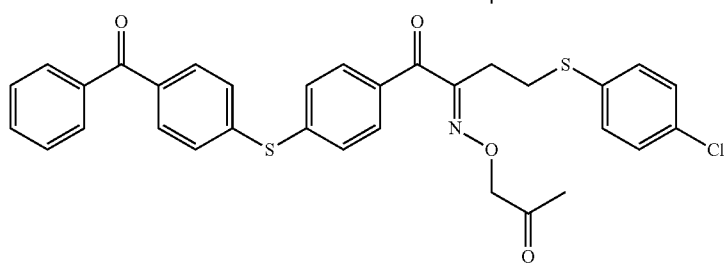
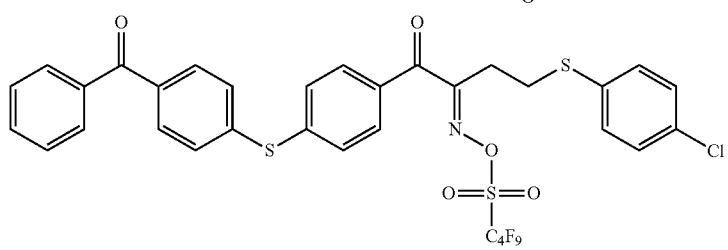
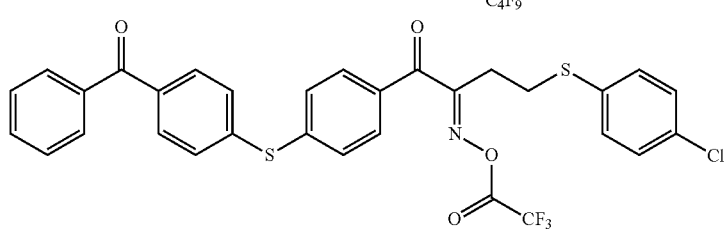
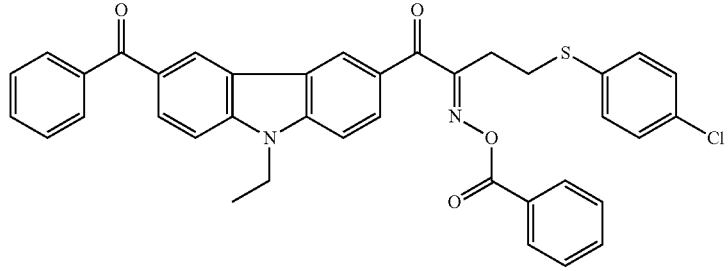
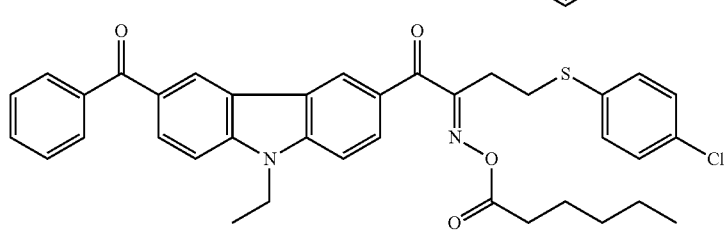

-continued
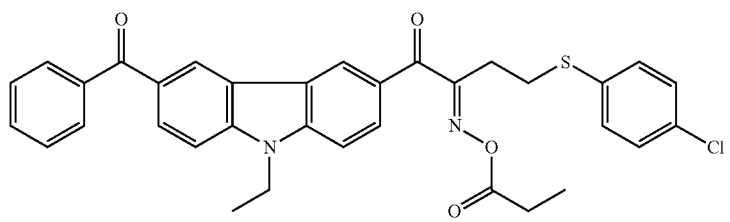
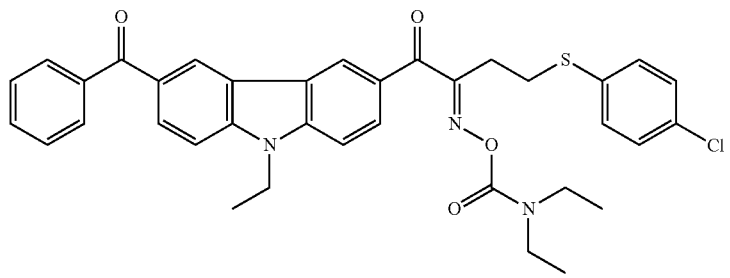
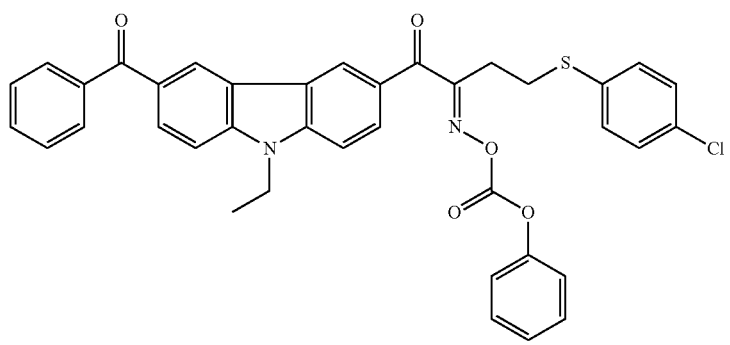
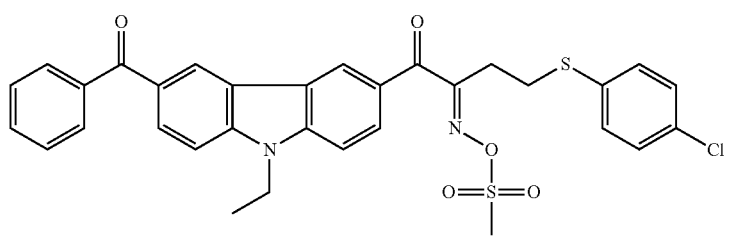
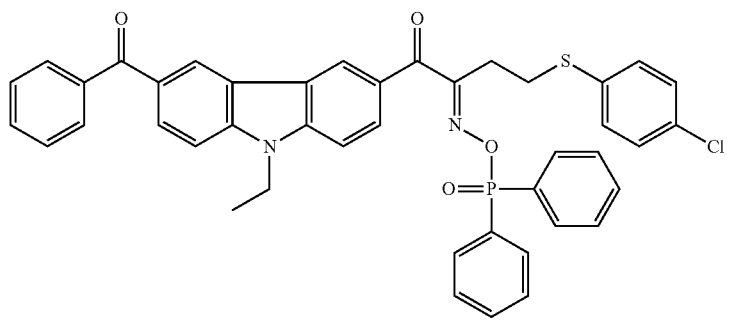
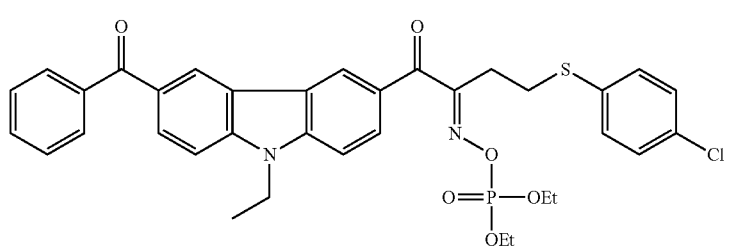

-continued
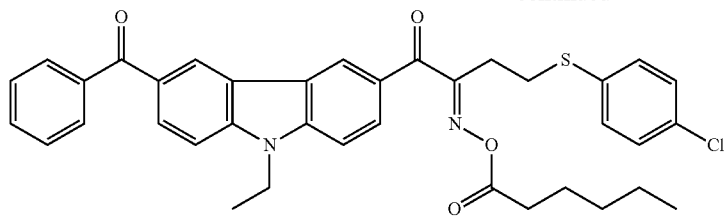
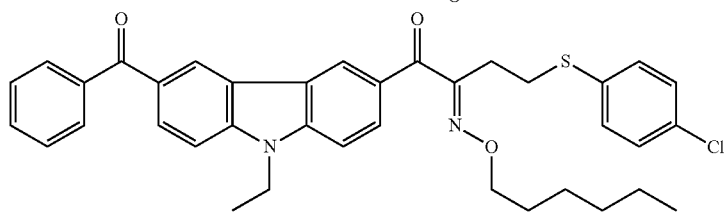
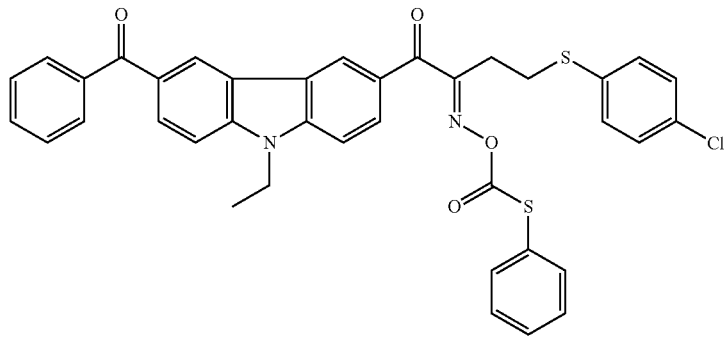
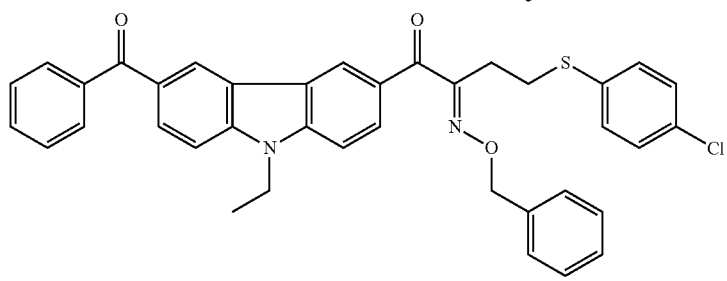
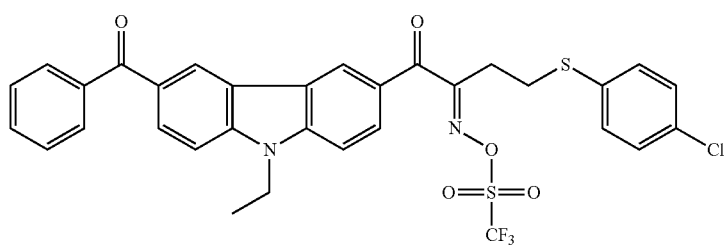
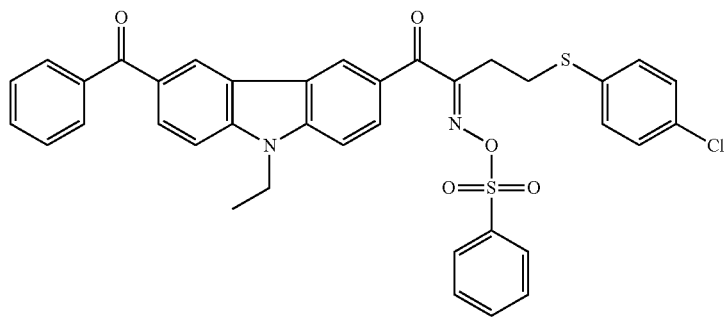

-continued

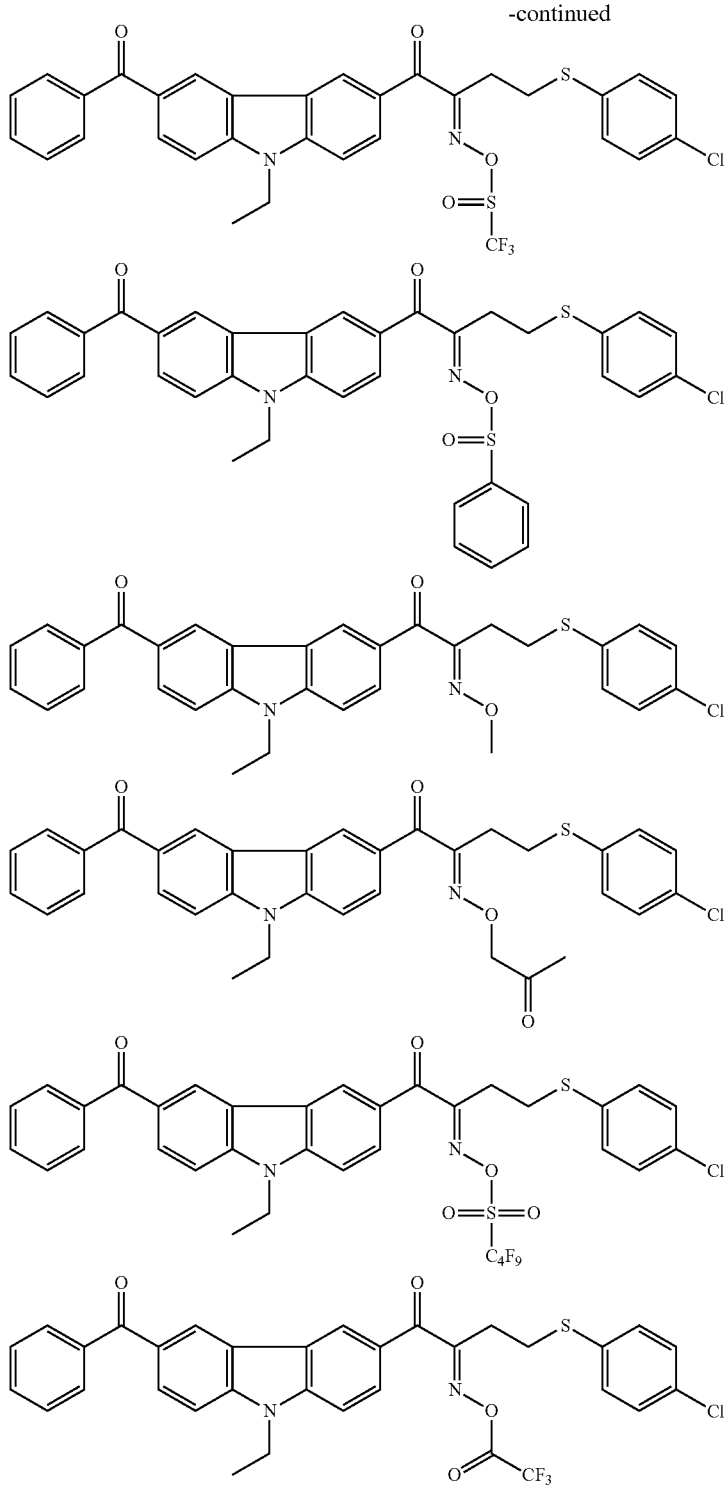

The specific oxime compound used in the second aspect of the invention preferably has a maximum absorption wavelength in a wavelength region of from 350 nm to 500 nm, and an absorption wavelength in a wavelength region of from 360 nm to 480 nm, and particularly preferably has an absorbance at 365 nm and 455 nm. Particularly, the specific oxime compound has absorption in a long wavelength region, as compared with the conventional oxime-based compounds, and accordingly, when exposed by a light source of 365 nm or 405 nm, excellent sensitivity is exhibited.

The specific oxime compound used in the second aspect of the invention preferably has a molar absorptivity at 365 nm or 405 nm of from 10,000 to 300,000, more preferably from 15,000 to 300,000, and particularly preferably from 20,000 to 200,000, from the viewpoints of sensitivity. Further, in the present invention, the molar absorptivity of the compound can be measured by using a known method, but specifically, it is preferably measured by using, for example, ethyl acetate solvent at a concentration of 0.01 g/L, with an Ultraviolet-Visible Spectrophotometer (CARY-5 SPECTROPHOTOMETER (trade name) manufactured by Varian Inc.).

The hexaarylbiimidazole compound used in the second aspect of the invention has the same definition as that of the hexaarylbiimidazole compound used in the first aspect of the invention, and details thereof (including the preferable ranges) are also the same.

The content of the (C2) polymerization initiator in the black curable composition according to the second aspect of the invention is the same as that of the (C1) polymerization initiator in the black curable composition according to the first aspect of the invention, and details thereof (including the preferable ranges) are also the same.

The black curable composition according to the second aspect of the invention may include a chain transfer agent depending on the polymerization initiator used. The chain transfer agent used in the second aspect has the same definition as that of the chain transfer agent used in the first aspect, and details thereof (including the preferable ranges) are also the same.

(D2) Polymerizable Compound

The black curable composition according to the second aspect of the invention includes a polymerizable compound.

The (D2) polymerizable compound has the same definition as that of the (D1) polymerizable compound used in the first aspect, and details thereof (including the preferable ranges) are also the same.

(E2) Other Additives

In the black curable composition according to the second aspect of the invention, various additives may be optionally used according to the purposes, in addition to the (A2) to (D2) components and the pigment dispersant.

(E2-1) Binder Polymer (Alkali-Soluble Resin)

To the black curable composition, a binder polymer (for example, an alkali-soluble resin) is preferably added, for the purpose of improving dispersion stability, developability, film characteristics, and the like. The binder polymer (alkali-soluble resin) may be added during dispersion or may be added during preparation of a curable composition.

Examples of the alkali-soluble resin include the linear organic polymers recited as examples of the (E1-1) binder polymer used in the first aspect of the invention.

The alkali-soluble resin also preferably includes a polymer (a) formed by polymerization of a monomer component having a compound represented by the following Formula (ED) (which may be hereinafter appropriately referred to as "ether dimer" in some cases) as an essential component. By including the polymer (a), the black curable composition of the present invention can form a cured film having excellent heat resistance and transparency. Hereinafter, the compound represented by Formula (ED) may be referred to as "ether dimer" in some cases.

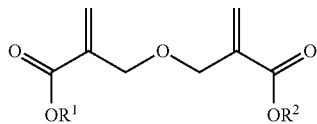

Formula (ED)

In Formula (ED), $R^1$ and $R^2$ each independently represent a hydrogen atom or a hydrocarbon group having 1 to 25 carbon atoms, which may have a substituent.

In Formula (ED), the hydrocarbon group having 1 to 25 carbon atoms, which may have a substituent, represented by $R^1$ or $R^2$ is not particularly limited. Examples thereof include: linear or branched alkyl groups such as a methyl group, an ethyl group, a n-propyl group, an isopropyl group, a n-butyl group, an isobutyl group, a t-butyl group, a t-amyl group, a stearyl group, a lauryl group, or a 2-ethylhexyl group; aryl groups such as a phenyl group; alicyclic groups such as a cyclohexyl group, a t-butyl cyclohexyl group, a dicyclopentadienyl group, a tricyclodecanyl group, an isobornyl group, an adamantyl group, or a 2-methyl-2-adamantyl group; alkoxy-substituted alkyl groups such as a 1-methoxyethyl group or a 1-ethoxyethyl group; and aryl group-substituted alkyl groups such as a benzyl group. Among these, a primary or secondary hydrocarbon group which is hardly eliminated by acid or heat, such as a methyl group, an ethyl group, a cyclohexyl group, or a benzyl group is particularly preferable. Further, $R^1$ and $R^2$ may be the same as, or may be different from each other.

Specific examples of the ether dimer include dimethyl-2,2'-[oxybis(methylene)]bis-2-propenoate, diethyl-2,2'-[oxybis(methylene)]bis-2-propenoate, di(n-propyl)-2,2'-[oxybis(methylene)]bis-2-propenoate, di(isopropyl)-2,2'-[oxybis(methylene)]bis-2-propenoate, di(n-butyl)-2,2'-[oxybis(methylene)]bis-2-propenoate, di(isobutyl)-2,2'-[oxybis(methylene)]bis-2-propenoate, di(t-butyl)-2,2'[oxybis(methylene)]bis-2-propenoate, di(t-amyl)-2,2'-[oxybis(methylene)]bis-2-propenoate, di(stearyl)-2,2'-[oxybis(methylene)]bis-2-propenoate, di(lauryl)-2,2'-[oxybis(methylene)]bis-2-propenoate, di(2-ethylhexyl)-2,2'-[oxybis(methylene)]bis-2-propenoate, di(1-methoxyethyl)-2,2'-[oxybis(methylene)]bis-2-propenoate, di(1-ethoxyethyl)-2,2'[oxybis(methylene)]bis-2-propenoate, dibenzyl-2,2'-[oxybis(methylene)]bis-2-propenoate, diphenyl-2,2'-[oxybis(methylene)]bis-2-propenoate, dicyclohexyl-2,2'-[oxybis(methylene)]bis-2-propenoate, di(t-butyl cyclohexyl)-2,2'-[oxybis(methylene)]bis-2-propenoate, di(dicyclopentadienyl)-2,2'-[oxybis(methylene)]bis-2-propenoate, di(tricyclodecanyl)-2,2'-[oxybis(methylene)]bis-2-propenoate, di(isobornyl)-2,2'-[oxybis(methylene)]bis-2-propenoate, diadamantyl-2,2'-[oxybis(methylene)]bis-2-propenoate, and di(2-methyl-2-adamantyl)-2,2'[oxybis(methylene)]bis-2-propenoate. Among these, dimethyl-2,2'-[oxybis(methylene)]bis-2-propenoate, diethyl-2,2'[oxybis(methylene)]bis-2-propenoate, dicyclohexyl-2,2'[oxybis(methylene)]bis-2-propenoate, and dibenzyl-2,2'-[oxybis(methylene)]bis-2-propenoate are particularly preferable. These ether dimers may be used singly, or in combination of two or more thereof.

The binder polymer preferably contains a polymerizable unsaturated bond. As a method for introducing the polymerizable unsaturated bond, known methods may be used. The unsaturation equivalents of the alkali-soluble resin (the mass of the resin per mole of the unsaturated double bonds) is preferably from 400 to 3,000, and most preferably from 500 to 2,000. Within the ranges, the curing property is increased, and adhesion of the light-shielding film to a silicon substrate is improved.

The acid value of the alkali-soluble resin added to the black curable composition according to the second aspect of the invention is particularly preferably from 10 mgKOH/g to 100 mgKOH/g, more preferably from 20 mgKOH/g to 80 mgKOH/g, and most preferably from 30 mgKOH/g to 60 mgKOH/g. When the acid value is within the ranges, adhesion of the light-shielding film to a silicon substrate and developability of an unexposed section are both satisfied.

The weight average molecular weight of the alkali-soluble resin is preferably from 5,000 to 30,000, and more preferably from 7,000 to 20,000. When the weight average molecular weight is within the ranges, adhesion of the light-shielding film to a silicon substrate and developability of an unexposed section are both satisfied, and the coating property is improved.

The content of the alkali-soluble resin based on the total solid contents of the black curable composition according to the second aspect of the invention is preferably from 0.1% by mass to 7.0% by mass, and from the viewpoints of improving adhesion of the light-shielding film to a silicon substrate and further improving inhibition of the development residues, it is more preferably from 0.3% by mass to 6.0% by mass, and further more preferably from 1.0% by mass to 5.0% by mass.

(E2-2) Other Colorants

The black curable composition according to the second aspect of the invention may further include a light-shielding material such as a known organic pigment or dye, other than inorganic pigments, for exhibiting a desired light-shielding property.

Examples of (E2-2) other colorants used in combination with the inorganic pigments are the same as those used as the (E1-2) other colorants in the first aspect of the invention, and details thereof (including the preferable ranges) are also the same.

(E2-3) Sensitizer

The black curable composition according to the second aspect of the invention may further include a sensitizer for the purpose of improving the radial generation efficiency of the polymerization initiator and increasing the wavelength of the photosensitivity wavelength.

The sensitizer (E2-3) used in the black curable composition according to the second aspect of the invention has the same definition as that of the (E1-3) sensitizer used in the first aspect, and details thereof (including the preferable ranges) are also the same.

(E2-4) Polymerization Inhibitor

It is preferable that the light-shielding curable composition according to the second aspect of the invention contains a polymerization inhibitor in order to suppress polymerization reactions of polymerizable compounds during production or storage of the composition.

The (E2-4) polymerization inhibitor used in the second aspect has the same definition as that of the (E1-4) polymerization inhibitor used in the first aspect, and details thereof (including the preferable ranges) are also the same.

(E2-5) Adhesion Promoter

An adhesion promoter may be added to the light-shielding curable composition according to the second aspect of the invention in order to improve adhesiveness to the surface of a hard material such as a support.

Examples of the (E2-5) adhesion promoter are the same as those of the (E1-5) adhesion promoter used in the first aspect, and details thereof (including the preferable ranges) are also the same.

(E2-6) Surfactant

The black curable composition according to the second aspect of the invention may further include any one of various surfactants, from the viewpoints of further improving coating property. As the surfactant, various surfactants such as a fluorine-based surfactant, a non-ion-based surfactant, a cation-based surfactant, an anion-based surfactant, or a silicon-based surfactant, may be used.

In particular, when the black curable composition according to the second aspect of the invention contains a fluorine-containing surfactant, the liquid properties (in particular, fluidity) of the composition prepared as a coating liquid are improved, and the uniformity of the coating thickness and the liquid saving property can be improved.

That is, when a black curable composition including a fluorine-containing surfactant is used as a coating liquid to form a film, the wettability on the surface to be coated is improved due to decrease in the surface tension between the surface to be coated and the coating liquid, and the coatability on the surface to be coated is improved. Therefore, even when a thin film of several micrometers thickness is formed with a small amount of the liquid, a film with uniform thickness may be suitably formed.

The fluorine content in the fluorine-containing surfactant is preferably from 3% by mass to 40% by mass, more preferably from 5% by mass to 30% by mass, and still more preferably from 7% by mass to 25% by mass. When the fluorine content of the fluorine-containing surfactant is within the above range, it is effective in terms of the uniformity of the coating film thickness and the liquid saving, and excellent solubility in the black curable composition can be achieved.

Examples of the fluorine-containing surfactant include MEGAFAC F171, F172, F173, F176, F177, F141, F142, F143, F144, R30, F437, F479, F482, F780 and F781 (trade names, manufactured by DIC Corporation), FLUORAD FC430, FC431 and FC 171 (trade names, manufactured by Sumitomo 3M Limited), SURFLON S-382, SC-101, SC-103, SC-104, SC-105, SC-1068, SC-381, SC-383, S-393 and KH-40 (trade names, manufactured by Asahi Glass Co., Ltd.), and SOLSPERSE 20000 (trade name, manufactured by The Lubrizol Corporation).

Examples of the nonionic surfactant include polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and sorbitan fatty acid esters such as PLURONIC L10, L31, L61, L62, 10R5, 17R2 and 25R2, and TETRONIC 304, 701, 704, 901, 904 and 150R1 (trade names, manufactured by BASF).

Examples of the cationic surfactant include phthalocyanine derivatives such as EFKA-745 (trade name, manufactured by Morishita & Co., Ltd.), organosiloxane polymers such as KP341 (trade name, manufactured by Shin-Etsu Chemical Co., Ltd.); (meth)acrylic acid (co)polymers such as POLYFLOW No. 75, No. 90, No. 95 (trade names, manufactured by Kyoeisha Chemical Co., Ltd.); and WO01 (trade name, available from Yusho Co., Ltd.).

Examples of the anionic surfactant include WO04, WO05 and WO17 (trade names, available from Yusho Co., Ltd.).

Examples of the silicone surfactant include TORAY SILICONE DC3PA, SH7PA, DC11PA, SH21PA, SH28PA, SH29PA, SH30PA and SH8400 (trade names, manufactured by Dow Corning Toray Co., Ltd.), TSF-4440, 4300, 4445, 444(4)(5)(6)(7)6, 4460 and 4452 (trade names, manufactured by Momentive Performance Materials Inc.), KP341 (trade name, manufactured by Shin-Etsu Chemical Co., Ltd.), and BYK 323 and 330 (trade names, manufactured by BYK Chemie).

These surfactants may be used singly or in combination of two or more kinds thereof.

The black curable composition according to the second aspect of the invention may be prepared by adding the (A2) inorganic pigment, the (B2) specific resin, the (C2) polymerization initiator, the (D2) polymerizable compound, and optionally, various additives to be used together, to a solvent, and further mixing them with an optional additive such as a surfactant.

The black curable composition, described above, according to the second aspect of the invention is provided at the backside of a silicon substrate having an imaging device section in its front surface, and may be used without specific limitation for a light-shielding film for blocking infrared light (that is, for used in a light-shielding film for blocking infrared light incident from the backside side of the silicon substrate which is a solid-state imaging device).

Also, among solid-state imaging devices, a structure of the solid-state imaging device according to the second aspect described below has a strong requirement for blocking the infrared light incident from the backside and for reducing the development residues on metal electrodes. For this reason, the second black curable composition of the present invention having the infrared light-shielding improvement and effects of the reduction in residues is particularly suitable for formation of a light-shielding film of the solid-state imaging device according to the second aspect described below.

Black Curable Composition According to Third Aspect

Hereinbelow, a black curable composition according to a third aspect of the invention is described in detail.

The black curable composition according to the third aspect of the invention includes (A3) an inorganic pigment, (B3) a chain resin including a solvent-compatible moiety, and a pigment-adsorbing moiety having an acid group or a basic group (hereinbelow, properly referred to as "specific resin"), (C3) a polymerization initiator, and (D3) a polymerizable compound. Hereinbelow, each of the components included in the black curable composition according to the third aspect of the invention is described sequentially.

(A3) Inorganic Pigment

As the (A3) inorganic pigment included in the black curable composition according to the third aspect of the invention, a pigment having an absorbance at a wavelength within a range from ultraviolet light to infrared light is preferably used, from the viewpoint of exhibiting a light-shielding property in a region from the visible light to infrared light.

Specific examples of the (A3) inorganic pigment used in the third aspect of the invention are the same as those of the (A1) inorganic pigment used in the first aspect, and details thereof (including the preferable ranges) are also the same.

In the third aspect, only one kind of inorganic pigment may be used, or a mixture of plural kinds of inorganic pigments may be used for the purpose of exhibiting a light-shielding property in a wide wavelength region ranging from visible light to infrared light.

As the (A3) inorganic pigment used in the third aspect, a metal pigment containing silver or tin, or titanium black is preferable from the viewpoints of a light-shielding property and curing property, and titanium black is most preferable from the viewpoints of the light-shielding property in a wavelength region of from visible light to infrared light.

The titanium black used in the third aspect has the same definition as that of the titanium black used in the first aspect, and details thereof (including the preferable ranges) are also the same.

The method for manufacturing the titanium black used in the third aspect is the same as that used in the first aspect.

The average primary particle diameter of the titanium black particles used in the third aspect has the save definition as that used in the first aspect, and details thereof (including the preferable ranges) are also the same.

The average particle diameter of the (A3) inorganic pigment according to the third aspect of the invention such as titanium black is preferably from 5 nm to 500 nm, and from the viewpoints of dispersibility, a light-shielding property, and precipitation over time, the average particle diameter is preferably from 10 nm to 100 nm.

In the black curable composition according to the third aspect of the invention, the inorganic pigments (A3) may be used alone, or in combination of two or more kinds thereof. Further, as described below, for the purpose of adjusting the light-shielding property, or other purposes, an organic pigment, a dye, or the like may be used in combination with the inorganic pigment, if desired.

The content of the (A3) inorganic pigment in the black curable composition is preferably from 5% by mass to 70% by mass, and more preferably from 10% by mass to 50% by mass, based on the total mass of the composition. When the content is within the ranges, a excellent light-shielding property, and excellent developability when a pattern is formed are achieved.

When the (A3) inorganic pigment is blended into the black curable composition, it is preferable to blend the (A1) inorganic pigment as a pigment dispersion in which an inorganic pigment (B3) has been dispersed by the specific resin or the like in advance from the viewpoints of uniformity of the obtained composition.

(B3) Chain Resin Including Solvent-Compatible Moiety, and Pigment-Adsorbing Moiety Having Acid Group or Basic Group The black curable composition according to the third aspect of the invention includes (B3) a chain resin including a solvent-compatible moiety, and a pigment-adsorbing moiety having an acid group or a basic group (hereinbelow, properly referred to as "(B3) specific resin").

The (B3) specific resin is a chain resin containing, as constituent units, a solvent-compatible moiety, and a pigment-adsorbing moiety having an acid group or a basic group (hereinbelow, properly referred to as "pigment-adsorbing moiety").

By containing the specific resin, the adhesion to the substrate of the black curable composition according to the third aspect of the invention is improved. Particularly, in the applications for wafer level lenses, both of the adhesion on the lens and the adhesion on the glass substrate are achieved, which had been difficult. Also, in order to form an infrared light-shielding film provided on a surface of a silicon substrate provided with a solid-state imaging device on the other surface, when the black curable composition according to the third aspect of the invention is used; both of the adhesion to the solder resist layer and the adhesion to the metal electrode are achieved, which had been difficult to achieve.

The solvent-compatible moiety contained in the (B3) specific resin includes a constituent unit exhibiting a solvent compatibility. The solvent compatibility as used here means a high solubility to propylene glycol monomethyl ether acetate which is a main component of a solvent included in the black curable composition. In order to exhibit the solvent compatibility, it is preferable that the (B3) specific resin include a repetition unit having an I/O value close to the I/O value (0.67) of propylene glycol monomethyl ether acetate.

The I/O value of the repetition unit close to the I/O value (0.67) of propylene glycol monomethyl ether acetate refers to an I/O value of from 0.05 to 1.50, preferably from 0.03 to 1.30, and more preferably from 0.40 to 0.70. When the (B3) specific resin includes a repetition unit having an I/O value within these ranges, the dispersion stability is further improved. This is thought to be since the solvent compatibility of the specific resin increases when the I/O value thereof approaches 0.67, which is the I/O value of propylene glycol monomethyl ether acetate as a main component of a solvent used in the black curable composition, thereby suppressing aggregation of pigments.

The (B3) specific resin preferably includes a solvent-compatible repetition unit having an I/O value of from 0.05 to 1.50 at an amount of 80% by mass or more, more preferably 90% by mass or more, and most preferably 95% by mass, in the solvent-compatible moiety, from the viewpoints of the dispersion stability.

In the third aspect of the invention, the content of the constituent units exhibiting solvent compatibility included in the specific resin is preferably from 30% by mass to 95% by mass from the viewpoints of the solubility and the dispersion stability, and more preferably from 40% by mass to 95% by mass, and most preferably from 50% by mass to 90% by mass.

The I/O value is a value for treating polarities of various kinds of organic compounds, also referred to as (inorganic value)/(organic value) in an organic conceptual manner, and is used in a functional group contribution method for setting parameters to a functional group. Details of the I/O value is disclosed in documents, such as, ORGANIC CONCEPTUAL DIAGRAMS (written by KODA Yoshi, published by Sankyo Publishing Co., Ltd. (1984)), KUMAMOTO PHARMACEUTICAL BULLETIN, No. 1, columns 1 to 16 (1954); Chemical Field, Vol. 11, No. 10, Columns 719~725 (1957); FRAGRANCE JOURNAL, No. 34, Columns 97~111 (1979); FRAGRANCE JOURNAL, No. 50, Columns 79~82 (1981); and the like.

The concept of the I/O value is such that properties of compounds are classified into organic groups showing a covalent bond property and inorganic groups showing an ionic bond property, and each organic compound is expressed for evaluation by one point on straight coordinate axes named an organic axis and an inorganic axis.

The inorganic value refers to the magnitude of influences of various substituents or bonds included in the organic compounds on boiling points and is numerically expressed using a hydroxyl group as a reference. Specifically, since if a distance between a boiling point curve for a linear alcohol and a boiling point curve for a linear paraffin is taken at around 5 carbon atoms, equating to 100° C., an influence of one hydroxyl group is designated as 100 as a numerical value, and, based on this numerical value, numerical values by which influences of various kinds of substituents or bonds on the boiling points are expressed are inorganic values of substituents included in the organic compounds. For example, the inorganic value of —COOH group is 150, and the inorganic value of double bond is 2. Therefore, an inorganic value of a certain kind of organic compound means a sum total of inorganic values of various kinds of substituents, bonds, and the like included in the organic compound.

The organic value is determined using as a reference an influence of carbon atoms as represented by a methylene group which is designated as a unit in the molecule, on a boiling point. In other words, since an increasing average value in the boiling point due to the addition of one carbon atom to a linear saturated hydrocarbon compound having about 5 to 10 carbon atoms is 20° C., based thereon, an organic value of one carbon atom is designated as 20, and, based thereon, and numerical values by which influences of various kinds of substituents or bonds on the boiling point are expressed are the organic values. For example, the organic value of the nitro group (—NO$_2$) is 70.

The I/O value indicates nonpolar (hydrophobic and with a substantial organic property) organic compounds when approaching 0 and polar (hydrophilic and with a substantial inorganic property) organic compounds when becoming larger.

In the following, a calculation method for the I/O value is described.

The I/O value of the repetition unit (A) shown below may be obtained by calculating an organic value and an inorganic value of the repetition unit using the method described below, and then calculating according to the following formula (Inorganic value of the copolymer)/(organic value of the copolymer).

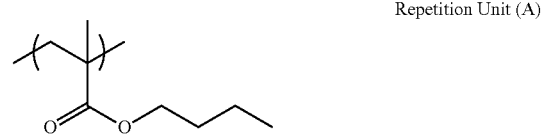

Repetition Unit (A)

The repetition unit (A) has one ester group, and thus the inorganic value of the repetition unit (A) is as follows:

60 (the inorganic value of the ester group)×1 (the number of the ester group)=60.

The repetition unit (A) has 8 carbon atoms, and thus the organic value of the repetition unit (A) is as follows:

20 (the organic value of the carbon atoms)×8=160.

Therefore, the I/O value of the copolymer is as follows:

60 (inorganic value of copolymer)/160 (organic value of copolymer)=0.38.

Specifically, the repetition unit that forms the solvent-compatible moiety is preferably a repetition unit represented by the following Formula (I-A) or the following Formula (I-B).

(I-A)

In Formula (I-A), $R^1$ represents an alkoxy group, a cycloalkoxy group, or an aryloxy group. The alkoxy group represented by $R^1$ is preferably a chain or cyclic alkoxy group having 1 to 30 carbon atoms, and more preferably a chain or cyclic alkoxy group having 1 to 10 carbon atoms, and a part of carbon atoms of the alkoxy group may be substituted with a hetero atom such as an oxygen atom, a nitrogen atom, or a sulfur atom. Specific examples thereof include a methoxy group, an ethoxy group, a propoxy group, an isopropoxy group, a butoxy group, a sec-butoxy group, a tert-butoxy group, a pentyloxy group, an isopentyloxy group, a tert-pentyloxy group, a neopentyloxy group, a hexyloxy group, a 2-ethylhexyloxy group, an octyloxy group, a decyloxy group, a dodecyloxy group, a 2-methoxyethyl group, a 3-ethoxyethyl group, a 2-(2-methoxyethoxy)ethyl group, a benzyloxy group, a 2-hydroxyethyloxy group, and a 3-hydroxypropyloxy group.

The cycloalkyl group represented by $R^1$ is preferably a monocyclic or polycyclic cycloalkyl group having 3 to 30 carbon atoms, and most preferably a monocyclic or polycyclic cycloalkyl group having 5 to 20 carbon atoms, and a part of carbon atoms of the cycloalkoxy group may be substituted with a hetero atom such as an oxygen atom, a nitrogen atom, or a sulfur atom. Specific examples thereof include a cyclopropoxy group, a cyclobutoxy group, a cyclopentyloxy group, a cyclohexyloxy group, a cyclooctyloxy group, a cyclodecyloxy group, a bicyclo[1,2,2]heptan-2-yloxy group, a bicyclo[2,2,2]octan-3-yloxy group, and tricyclo[5.2.1.0$^{2.6}$]decan-8-yloxy group.

The aryloxy group represented by $R^1$ is preferably an aryloxy group having 6 to 30 carbon atoms, and more preferably an aryloxy group having 6 to 20 carbon atoms. Examples of the aryloxy group preferably include a phenoxy group, a 1-naphthyloxy group, and a 2-naphthyloxy group. $R^1$ is particularly preferably an alkoxy group having 1 to 10 carbon atoms, or a cycloalkoxy group having 5 to 15 carbon atoms.

$R^2$ represents a hydrogen atom, a halogen atom, or an alkyl group. The alkyl group represented by $R^2$ is preferably an alkyl group having 1 to 5 carbon atoms, and is more preferably a methyl group, a 2-hydroxymethyl group, or a trifluoromethyl group from the viewpoints of polymerization property. It is particularly preferable that $R^2$ is a hydrogen atom or a methyl group.

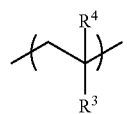
(I-B)

In Formula (I-B), $R^3$ represents an aryl group; and $R^4$ represents a hydrogen atom or an alkyl group.

The aryl group represented by $R^3$ is preferably an aryl group having 6 to 30 carbon atoms, more preferably an aryl group having 6 to 20 carbon atoms, and most preferably an aryl group having 6 to 15 carbon atoms. Specific examples thereof include a phenyl group and a naphthyl group.

Hereinbelow, specific examples of Formula (I-A) and Formula (I-B) are shown, but the present invention is not limited thereto. Also, in the specific examples, $R^2$ has the same definition as $R^2$ in Formula (I-A), and $R^4$ has the same definition as $R^4$ in Formula (I-B).

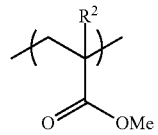
(I-A-1)

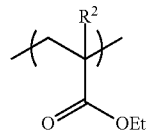
(I-A-2)

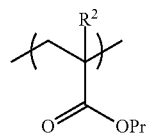
(I-A-3)

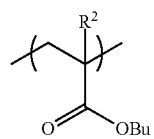
(I-A-4)

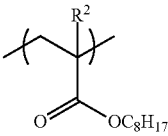
(I-A-5)

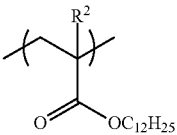
(I-A-6)

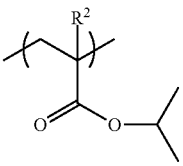
(I-A-7)

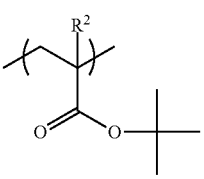
(I-A-8)

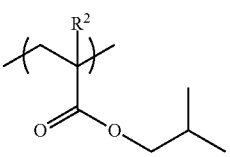
(I-A-9)

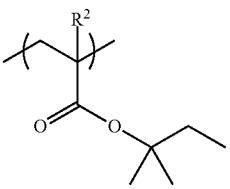
(I-A-10)

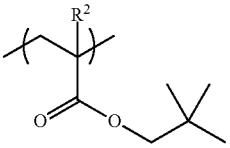
(I-A-11)

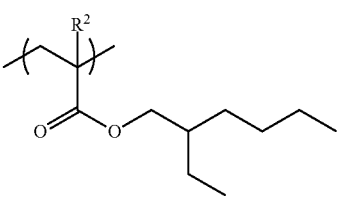
(I-A-12)

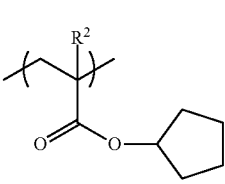
(I-A-13)

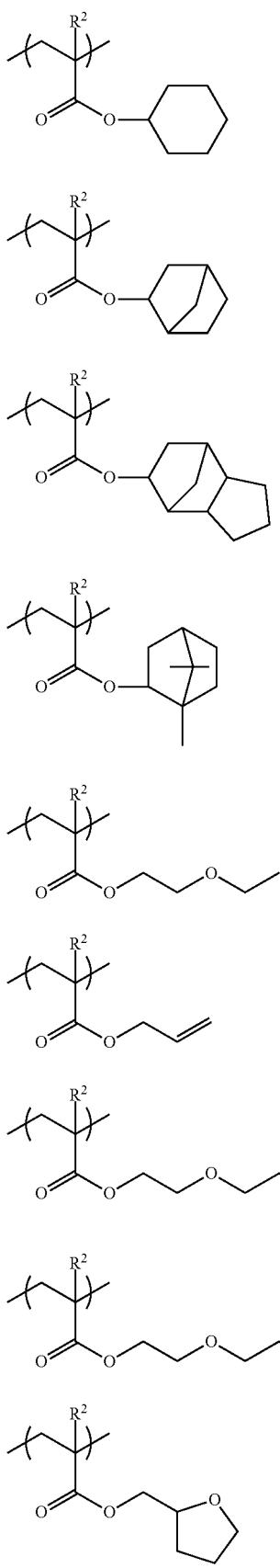
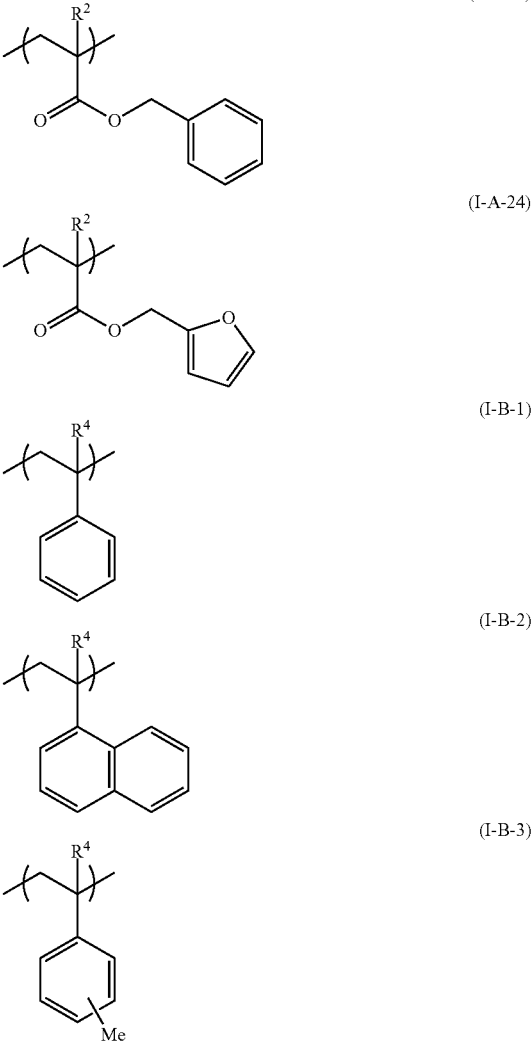

Among the repetition units, the repetition units represented by (I-A-1) to (I-A-17), and (I-A-23), and having, as a monomer, (meth)acrylate in which $R^2$ is a hydrogen atom or a methyl group, and the repetition units represented by (I-B-1) and having, as a monomer, styrene in which $R^4$ is a hydrogen atom, are preferable from the viewpoints of the dispersion stability.

The solvent-compatible moiety may include two or more kinds of repetition units exhibiting solvent compatibility.

The solvent-compatible moiety may further include, as a repetition unit other than the repetition unit exhibiting solvent compatibility, a repetition unit having an I/O value that does not fall within the range of from 0.05 to 1.50. Examples of the repetition unit other than the repetition unit exhibiting solvent compatibility include repetition units having a polar group such as an acid group, a hydroxyl group, or an amide group, and repetition units composed of only an alkyl group or an alkenyl group.

The I/O value of the repetition unit other than the repetition unit exhibiting solvent compatibility is lower than 0.05, or more than 1.50, and preferably is equal to or less than 0.03, or equal to or more than 2.00.

Specific examples of the repetition unit other than the repetition unit exhibiting solvent compatibility include a repetition unit (I/O value of 4.375) including methacrylic acid, a repetition unit (I/O value of 5.833) including acrylic acid, a repetition unit (I/O value of 1.33) including 2-hydroxyethyl methacrylate, a repetition unit (I/O value of 1.857) including 2,3-dihydroxypropyl methacrylate, a repetition unit (I/O value of 2.1) including N-vinylpyrrolidone, a repetition unit (I/O value of 0.875) including N,N-dimethylacrylamide, a repetition unit (I/O value of 0) including ethylene, and a repetition unit (I/O value of 0.02) including isoprene. The content of the repetition units are 20% by mass or less, and preferably 10% by mass or less, with respect to the total mass.

When the solvent-compatible moiety has an acid group, an acid value (the number of millimoles of the acid group contained in the solvent-compatible moiety (mmol)×56.1 (g-KOH/mol)/the mass (g) of the solvent-compatible moiety) is 20 mgKOH/g or less, and preferably 10 mgKOH/g. When the acid value is larger than this value, the dispersion stability is lowered.

A weight average molecular weight of the solvent-compatible moiety according to the GPC measurement method is preferably in the range from 2,000 to 30,000, more preferably from 3,000 to 20,000, and most preferably from 5,000 to 15,000 from the viewpoints of the dispersion stability. Here, "weight average molecular weight of the solvent-compatible moiety" is defined as "Mw2-Mw1" when a weight average molecular weight of a resin before the solvent-compatible moiety is introduced is denoted by Mw1, and a weight average molecular weight of the resin after the solvent-compatible moiety is introduced is denoted by Mw2.

A pigment-adsorbing moiety having an acid group or a basic group in the specific resin is described. "The pigment-adsorbing moiety having an acid group or a basic group" described here preferably includes a repetition unit including a monomer having at least one of the acid group and the basic group, and a molecular weight ranging from 70 to 500 (hereinbelow, also referred to as "acid group-containing monomer" or "basic group-containing monomer").

The acid group-containing monomer is preferably (meth) acrylic acid base and styrene base from the viewpoints of polymerization. Examples of the acid groups contained in the acid group-containing monomer include carboxylic acid, phosphoric acid, and sulfonic acid.

Specific structures of repetition units including the acid group-containing monomer are shown below, but the present invention is not limited thereto. $R_A$ in the formula represents a hydrogen atom, a methyl group, a hydroxylmethyl group, or a trifluoromethyl group.

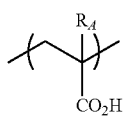
(B-1)

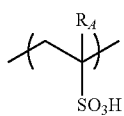
(B-2)

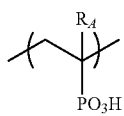
(B-3)

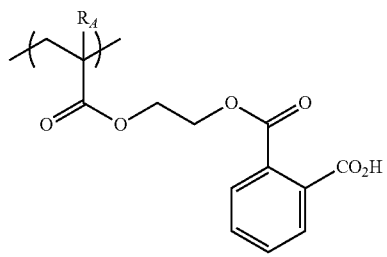
(B-4)

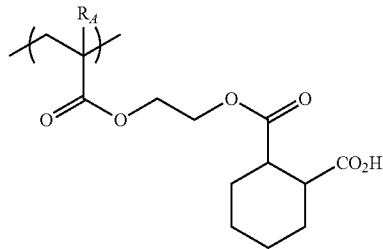
(B-5)

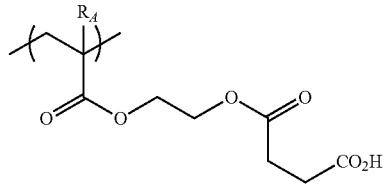
(B-6)

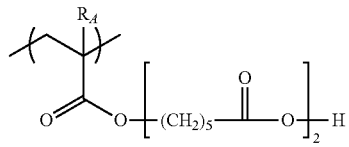
(B-7)

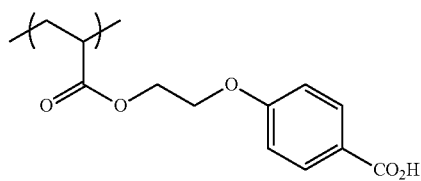
(B-8)

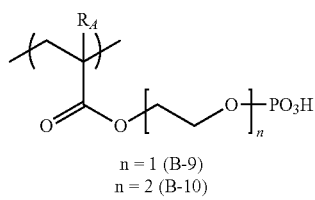

n = 1 (B-9)
n = 2 (B-10)
n = 3 (B-11)

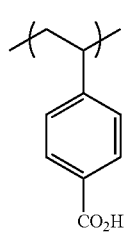
(B-12)

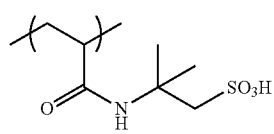
(B-13)

Among the repetition units including the acid group-containing monomer, (B-1), and (B-4) to (B-12) which are the repetition units including the carboxylic group are particularly preferable from the viewpoints of the dispersion stability.

The repetition unit including the basic group-containing monomer refers to a repetition unit including a monomer which has at least one basic group and a molecular weight ranging from 70 to 500 (hereinbelow, also referred to as "basic group-containing monomer"). The basic group-containing monomer is preferably (meth)acrylic acid base and styrene base from the viewpoints of the dispersion stability. As a basic group contained in the basic group-containing monomer, an amino group, and a nitrogen-containing hetero ring group are preferable, the amino group and a pyridinyl group are more preferable, and the amino group is most preferable.

Specific structures of the repetition units including the basic group-containing monomer are shown below, but the present invention is not limited thereto. $R_B$ in the formula represents a hydrogen atom, a methyl group, a hydroxylmethyl group, or a trifluoromethyl group.

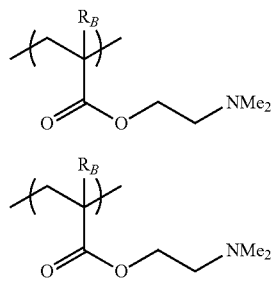
(B-14)

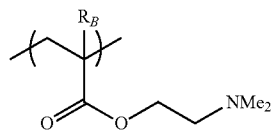
(B-15)

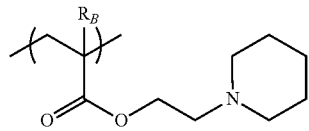
(B-16)

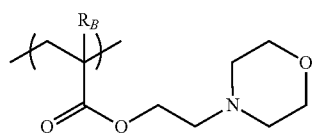
(B-17)

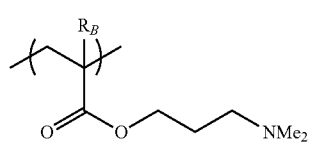
(B-18)

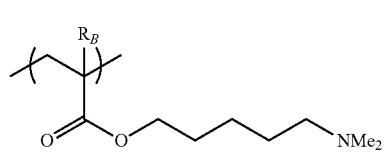
(B-19)

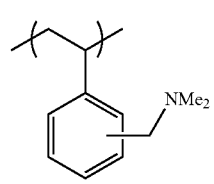
(B-20)

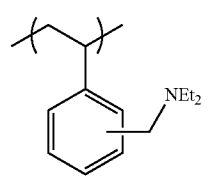
(B-21)

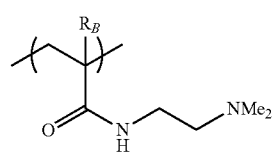
(B-22)

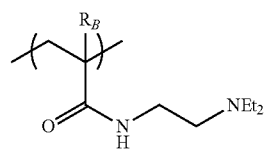
(B-23)

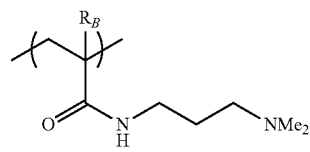
(B-24)

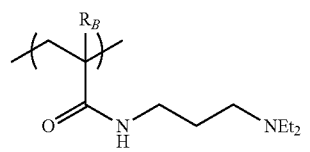
(B-25)

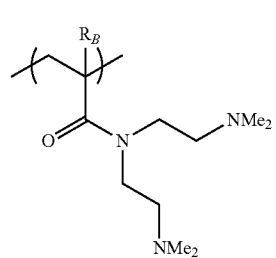
(B-26)

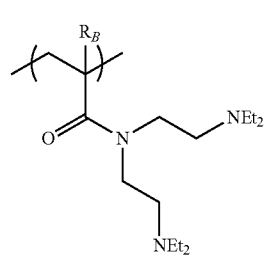
(B-27)

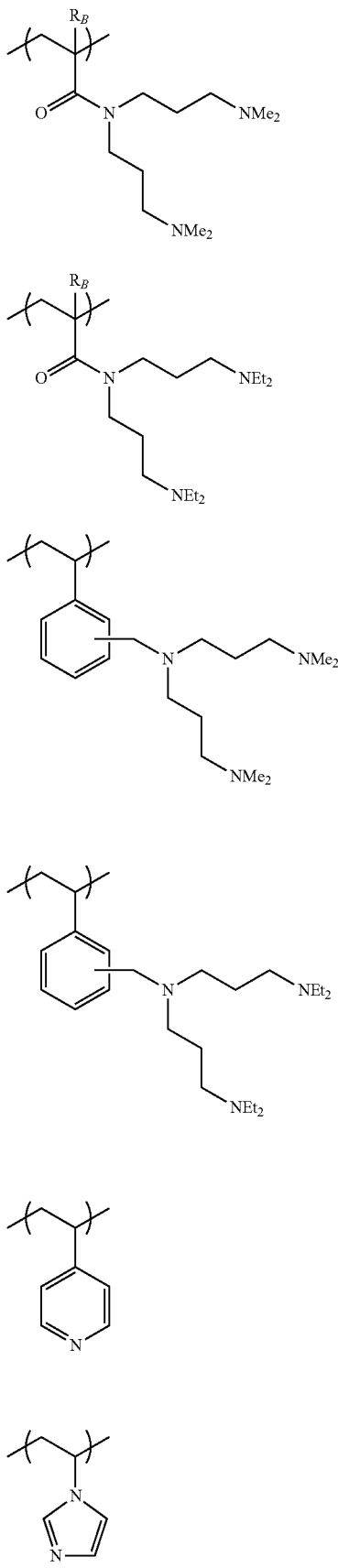

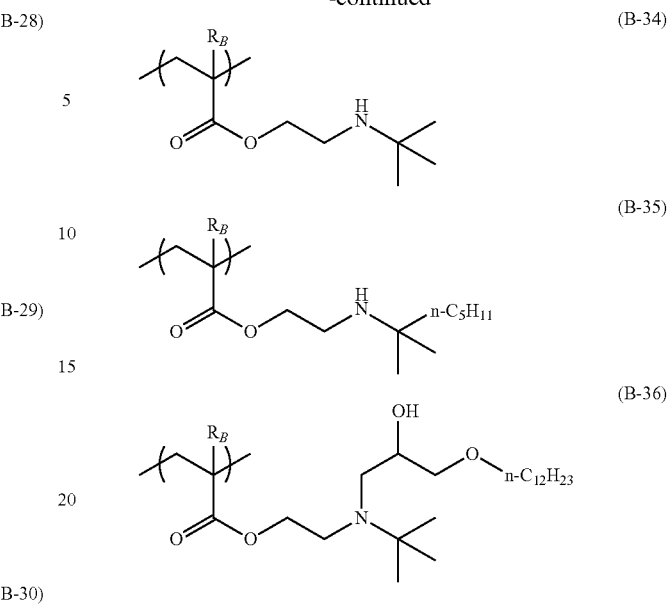

Among the repetition units including the basic group, particularly, (B-14) to (B-31), and (B-34) to (B-36) having the amino group are preferable from the viewpoints of the dispersion stability, (B-14) to (B-31) having the tertiary amino group are more preferable, and (B-14) to (B-19), and (B-22) and (B-25) are most preferable.

When the specific resin contains the repetition units including the acid group, the acid value is preferably from 50 mgKOH/g to 150 mgKOH/g, more preferably from 60 mgKOH/g to 130 mgKOH/g, and most preferably from 75 mgKOH/g to 120 mgKOH/g. When the acid group is within the ranges, the adhesions on the glass substrate and the lens are both satisfied.

When the specific resin contains the basic group, the amine value is preferably from 50 mgKOH/g to 150 mgKOH/g, more preferably from 60 mgKOH/g to 140 mgKOH/g, and most preferably from 75 mgKOH/g to 120 mgKOH/g. When the amine value is within the ranges, the adhesions on the glass substrate and the lens are both satisfied. The pigment-adsorbing moiety in the specific resin is preferably constituted by the repetition units including, particularly the acid group, from the viewpoints of the developability.

A weight average molecular weight of the pigment-adsorbing moiety in the specific resin according to the GPC measurement method preferably ranges from 500 to 10,000, more preferably 1,000 to 5,000, and most preferably 1,000 to 3,000 from the viewpoints of the adhesion. Here, "the weight average molecular weight of the pigment-adsorbing moiety" is defined as "Mw2-Mw1" when a weight average molecular weight of a resin before the pigment-adsorbing moiety is introduced is denoted by Mw1, and a weight average molecular weight of the resin after the pigment-adsorbing moiety is introduced is denoted by Mw2.

The pigment-adsorbing moiety may include two kinds or more repetition units having acid groups and basic groups.

The pigment-adsorbing moiety having the acid group or the basic group may include repetition units other than the repetition units including the acid group or the basic group, and examples of these repetition units include an alkyl group, an alkylene oxide group, a cyano group, an amide group, a hydroxyl group, a lactone group, an aromatic ring group, and a hetero ring group.

Specific examples of the repetition units other than the repetition units including the acid group or the basic group include the repetition units represented by (I-A-1) to (I-A-24), (I-B-1), and (I-B-2), repetition units including acrylonitrile, repetition units including N,N-dimethyl acrylamide, and repetition units including N-vinyl pyrrolidone and 2-hydroxy ethyl methacrylate. These repetition units are contained in an amount of 10% by mass or less, but preferably in an amount of 5% by mass in the total mass of the pigment-adsorbing moiety.

The pigment-adsorbing moiety having the acid group or the basic group preferably includes the repetition units including the acid group or the basic group in an amount of 90% by mass or more, more preferably in an amount of 95% by mass, and most preferably in an amount of 99% by mass. When the content is within the ranges, the adhesion is further improved.

The content (in terms of mass ratio) of the solvent-compatible moiety to the pigment-adsorbing moiety in the specific resin (i.e., solvent-compatible moiety: pigment-adsorbing moiety) is preferably from 95:5 to 30:70, more preferably from 90:10 to 40:60, and most preferably from 90:10 to 50:50. When the mass ratio is within the ranges, the dispersion stability and the adhesion are further improved.

The specific resin preferably has a weight average molecular weight according to the GPC measurement method ranging from 5,000 to 25,000, more preferably from 6,000 to 20,000, and most preferably from 7,000 to 15,000. When the weight average molecular weight is within the ranges, the dispersion stability is considerably improved.

The specific resin in the present invention is a chain dispersion resin into which the solvent-compatible moiety and the pigment-adsorbing moiety are intentionally introduced. A method of introducing the solvent-compatible moiety and the pigment-adsorbing moiety is preferably a living polymerization method, and particularly, preferably a living radical polymerization method. The living radical polymerization method is preferably a living radical polymerization method performed under the presence of nitroxy-free radical disclosed in Japanese Patent No. 4,304,014 or a living radical polymerization method performed under the presence of dithioester disclosed in JP-A No. 2009-9114.

Structure of Specific Resin Including Solvent-Compatible Moiety and Pigment-Adsorbing Moiety When the solvent-compatible moiety is constituted only by one kind of repetition unit exhibiting solvent compatibility and the pigment-adsorbing moiety is constituted only by a repetition unit including one kind of acid group-containing monomer or basic group-containing monomer, a monomer P constituting the solvent-compatible moiety and a monomer Q constituting the pigment-adsorbing moiety are polymerized. In this case, in a method of polymerizing by a mixture with a radical generation agent in the state where P and Q are mixed, a repetition unit including P and Q is arranged substantially randomly as follows.

PPPQPPQPPPQPQPPQPPQP (random arrangement part)

In contrast, in the case of the specific resin used in the third aspect of the invention, since a single kind of repetition unit (or the same repetition units) is polymerized, the obtained specific resin has a part in which plural P's or Q's are continuously arranged. In this case, the specific resin is a block polymer.

Specifically, the specific resin may have a PQ type structure including one structural unit formed of plural P's and one structural unit formed of plural Q's, or may have a PQP type structure including two structural units each formed of plural P's and one structural unit formed of plural Q's. Particularly, it is preferable that the specific resin have the PQ type structure from the viewpoints of the adhesion property.

The case in which a solvent-compatible moiety and a pigment-adsorbing moiety are present (PQ type)

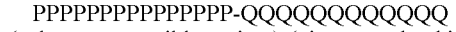

(solvent-compatible moiety)-(pigment-adsorbing moiety)

The case in which a solvent-compatible moiety, a pigment-adsorbing moiety, and a solvent-compatible moiety are present (PQP type)

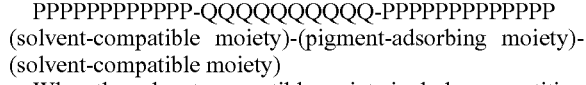

(solvent-compatible moiety)-(pigment-adsorbing moiety)-(solvent-compatible moiety)

When the solvent-compatible moiety includes a repetition unit A other than the repetition unit P exhibiting solvent compatibility and the pigment-adsorbing moiety includes a repetition unit B other than the repetition unit Q formed from an acid group- or basic group-containing monomer, a case similar to the PQ type becomes as follows.

Here, when A and B have the same structure, the structure of the specific resin becomes as follows. In the following structure, the solvent-compatible groups indicate parts of the constituent elements, excluding those having the acid group or basic group that form the pigment-adsorbing moiety.

That is to say, in the present invention, in the above case, the moiety "QQQQQQQAAQQQQQ" in which AA is interposed by plural Q's is defined as the pigment-adsorbing moiety, and the moiety "PPPPAPPPPAAA-A" excluding the pigment-adsorbing moiety is defined as the solvent-compatible moiety. Similarly, in a case in which two or more kinds of repetition units exhibiting solvent compatibility exist and/or two or more kinds of repetition units formed from an acid group-containing monomer or a basic group-containing monomer are present in the structure, a moiety being interposed by the repetition units formed from the acid group-containing monomer or basic group-containing monomer is defined as the pigment-adsorbing moiety, and the remainder is defined as the solvent-compatible moiety. The amount of "A" contained in the pigment-adsorbing moiety is 10% by mass or less, and preferably 5% by mass or less, based on the total mass of the pigment-adsorbing moiety.

When the curable composition according to the third aspect of the invention is prepared, the specific resin may be added in a solid state, or may be added after being dissolved in a solvent. In a case of being dissolved in a solvent, the specific resin is preferably dissolved in (F3) an organic solvent described below. A solution of the specific resin may be prepared by dissolving a solid-state specific resin in a solvent, or by dissolving monomers constituting the specific resin in a solvent and then by polymerizing them. When the specific resin is used in a form of a solution obtained by dissolving the specific resin in a solvent, a concentration of the solid content in the solution is preferably from 10% by mass to 70% by mass, and from preferably 20% by mass to 50% by mass.

The content of the black curable composition in the specific resin preferably ranges from 2% by mass to 30% by mass, and more preferably from 5% by mass to 20% by mass, based on the solid contents of the black curable composition.

The black curable composition according to the third aspect of the present invention may be prepared in advance as a pigment dispersion by adding inorganic pigments to the specific resin and other pigment dispersants in the specific resin. As the other pigment dispersion agents, the well-known pigment dispersants and surfactants are appropriately selected and used.

Examples of the additional pigment dispersants which may be used in the third aspect are the same as those of the dispersants that is used in combination with the (B1) specific resin used in the first aspect, and details thereof (including the preferable ranges) are also the same.

A resin having a polyester chain in a side chain disclosed in the specification in JP-A No. 2010-106268 which has been filed by the applicant of the present application is preferable from the viewpoints of the dispersibility, the developability, and the precipitation property, a resin having the polyester chain in the side chain is preferable, particularly, from the viewpoints of the dispersibility, and a resin having an acid group is more preferable from the viewpoints of the dispersibility and the resolution. As a preferable acid group, an acid group having a pKa of 6 or less is preferable from the viewpoints of the adsorption property, and, particularly, carboxylic acid, sulfonic acid, and an acid group derived from phosphoric acid are preferable.

From the viewpoints of the solubility, the dispersibility, and the developability in the pigment dispersion, a resin having a polyester chain at a polycaprolactone chain and having a carboxylic acid group is preferable.

The content of the additional pigment dispersant when the pigment dispersion is prepared is preferably from 1% by mass to 90% by mass, and more preferably from 3% by mass to 70% by mass. When the content is within the ranges, the substrate adhesion property is more preferable.

(C3) Polymerization Initiator

The black curable composition according to the third aspect of the invention includes a (B3) polymerization initiator.

The (C3) polymerization initiator used in the black curable composition of the third aspect of the invention has the same definition as that of the (C1) polymerization initiator used in the black curable composition of the first aspect, and details thereof (including the preferable ranges) are also the same.

In the third aspect of the present invention, among the oxime ester-based compounds, a compound expressed by the following Formula (a) is preferable from the viewpoints of the sensitivity, the stability over time, and the coloration during the post-heating. IRGACURE OXE-01, OXE-02 made by Ciba Specialty Chemicals are preferable.

Formula (a)

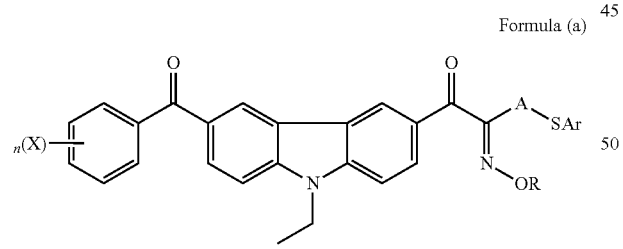

In Formula (a), R and X each independently represent a monovalent substituent; A represents a divalent organic group; and Ar represents an aryl group; and n represents an integer from 1 to 5.

R is preferably an acyl group from the viewpoints of increasing sensitivity, and specifically, is preferably an acetyl group, a propionyl group, a benzoyl group, or a toluoyl group.

From the viewpoints of increasing the sensitivity and suppressing the coloration due to heat aging, A is preferably an unsubstituted alkylene group, an alkylene group substituted with an alkyl group (for example, a methyl group, an ethyl group, a tert-butyl group, or a dodecyl group), an alkylene group substituted with an alkenyl group (for example, a vinyl group, or an allyl group), or an alkylene group substituted with an aryl group (for example, a phenyl group, a p-tolyl group, a xylyl group, a cumenyl group, a naphthyl group, an anthryl group, a phenanthryl group, or a styryl group).

From the viewpoints of increasing the sensitivity and suppressing the coloration due to heat aging, Ar is preferably a substituted or unsubstituted phenyl group. In the case of the substituted phenyl group, examples of substituent groups thereof include halogen groups such as a fluorine atom, a chlorine atom, a bromine atom, or an iodine atom.

From the viewpoints of the solubility and the improvement in the absorption efficiency for the long wavelength region, X is preferably an alkyl group which may have a substituent, an aryl group which may have a substituent, an alkenyl group which may have a substituent, an alkynyl group which may have a substituent, an alkoxy group which may have a substituent, an aryloxy group which may have a substituent, an alkylthioxy group which may have a substituent, an arylthioxy group which may have a substituent, and an amino group.

In Formula (a), n preferably represents 1 or 2.

Hereinbelow, specific examples (3-I-1) to (3-I-23) of the oxime ester compounds are shown.

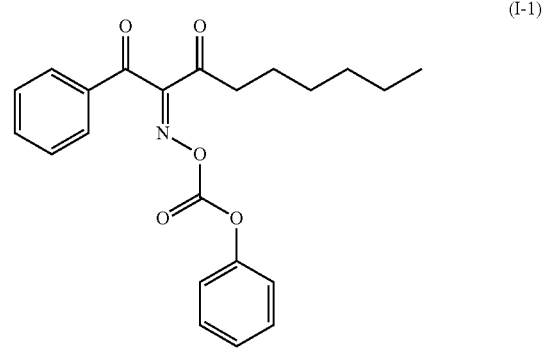

(I-1)

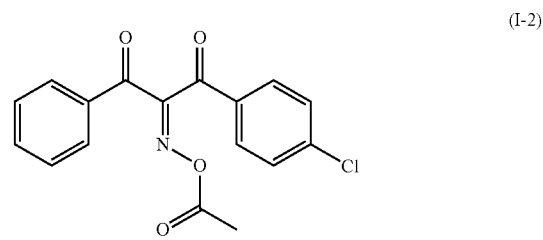

(I-2)

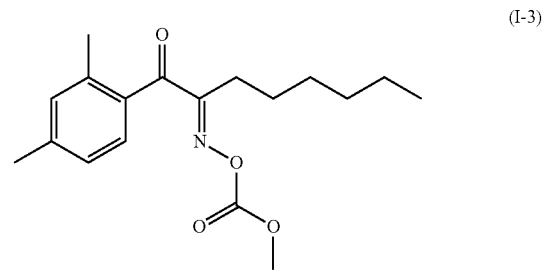

(I-3)

(I-4)
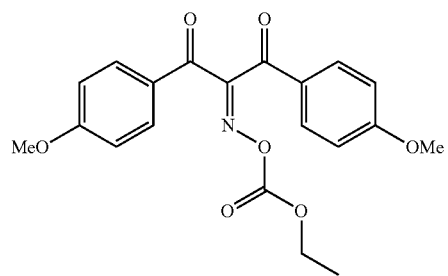
(I-5)
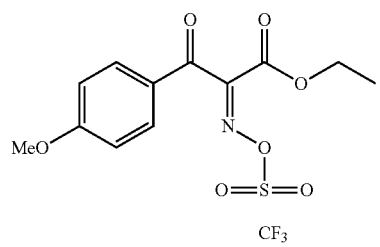
(I-6)
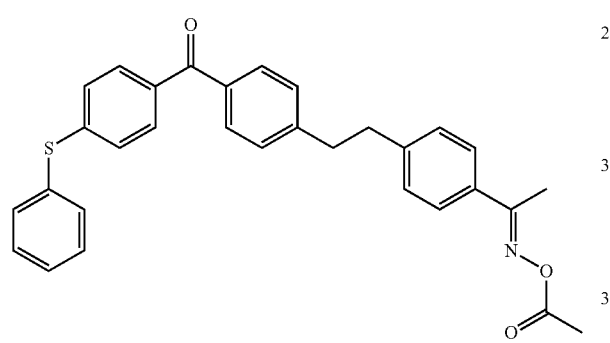
(I-7)
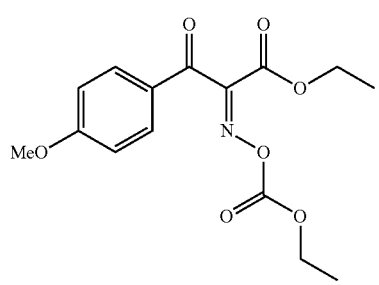
(I-8)
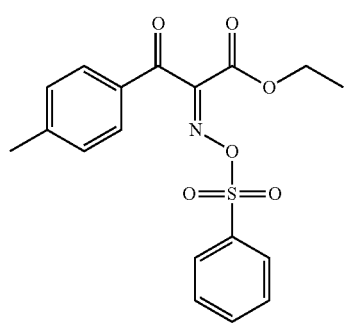
(I-9)
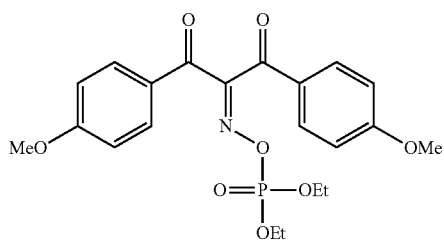
(I-10)
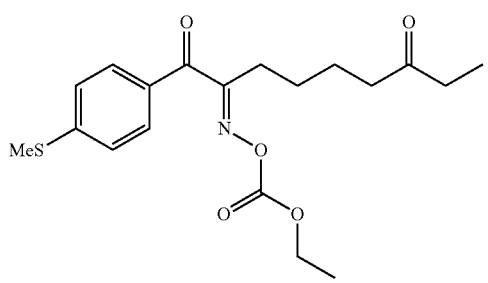
(I-11)
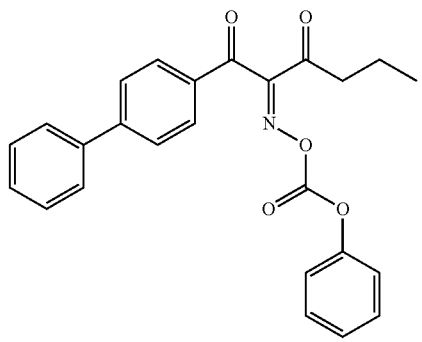
(I-12)
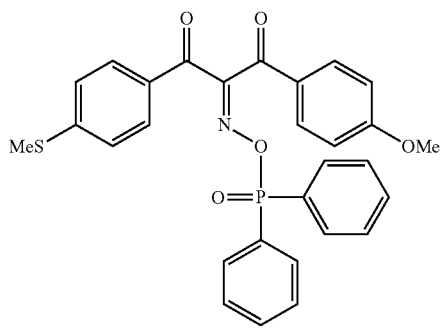
(I-13)
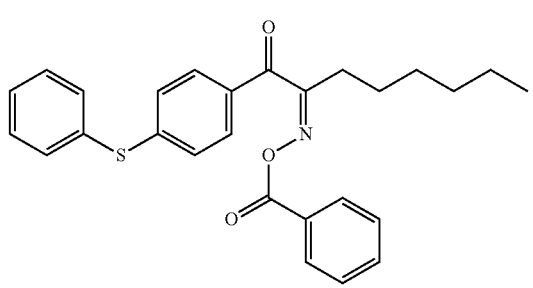

-continued (I-14)
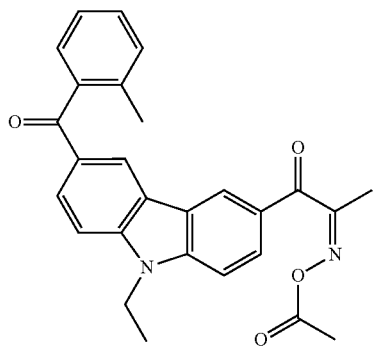

(I-19)
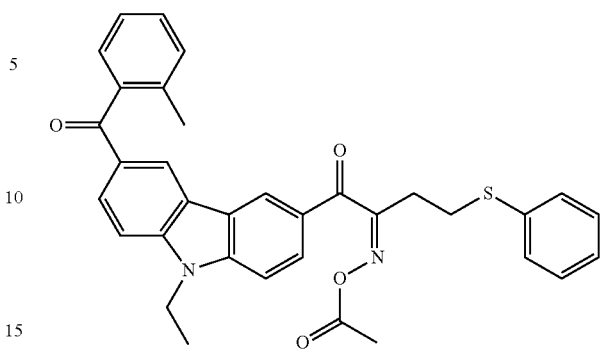

(I-15)
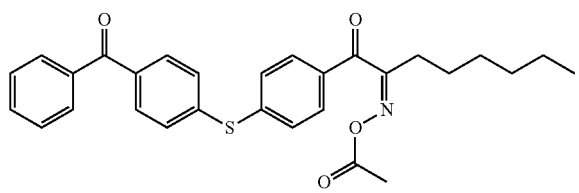

(I-20)
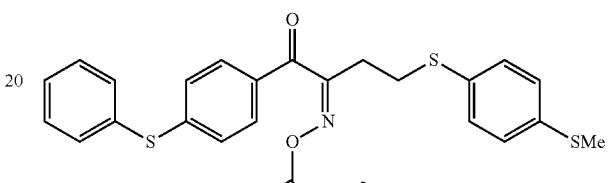

(I-16)
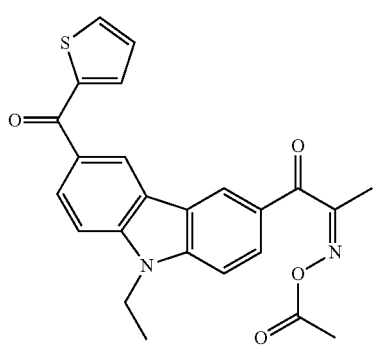

(I-21)
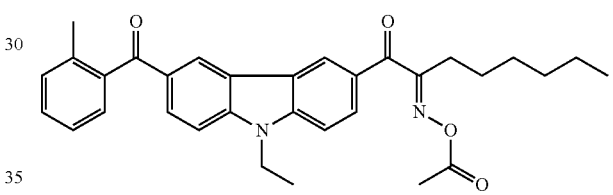

(I-22)
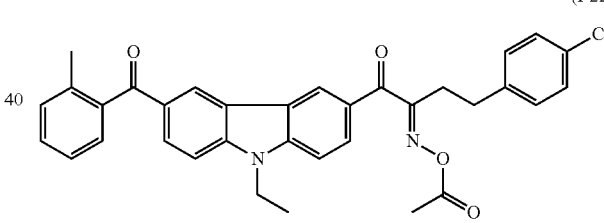

(I-17)
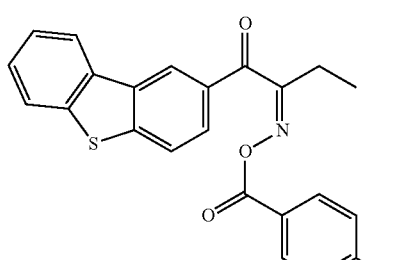

(I-23)
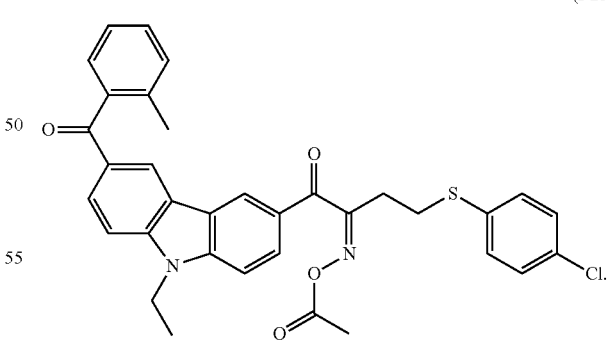

(I-18)
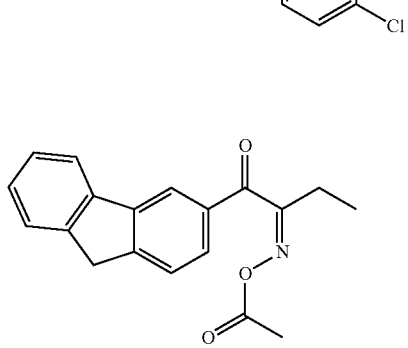

The hexaarylbiimidazole compound used in the third aspect of the invention has the same definition as that of the hexaarylbiimidazole compound used in the first aspect of the invention, and details thereof (including the preferable ranges) are also the same.

The content of the (C3) polymerization initiator in the black curable composition according to the third aspect of the invention is the same as that of the (C1) polymerization initiator in the black curable composition according to the first aspect of the invention, and details thereof (including the preferable ranges) are also the same.

The black curable composition according to the third aspect of the invention may include a chain transfer agent depending on the polymerization initiator used. The chain transfer agent used in the third aspect has the same definition as that of the chain transfer agent used in the first aspect, and details thereof (including the preferable ranges) are also the same.

(D3) Polymerizable Compound

The black curable composition according to the third aspect of the invention includes a polymerizable compound.

The (D3) polymerizable compound used in the third aspect has the same definition as that of the (D1) polymerizable compound used in the first aspect, and details thereof (including the preferable ranges) are also the same.

The polymerizable compound used in the third aspect may be used alone or in combination of two or more kinds thereof. For example, as examples of the combination, it is preferable to use a combination of two kinds of monomers having different polymerizable groups, and it is more preferable to use a combination of a monomer having four or less polymerizable groups (i.e., tetra-functional or lower-functional monomer) and a monomer having five or more polymerizable groups (i.e., penta-functional or higher-functional monomer) from the viewpoints of developability/adhesion.

The content of the polymerizable compound in the black curable composition is preferably from 3 parts by mass to 55 parts by mass, and more preferably from 10 parts by mass to 50 parts by mass, based on the total solid contents of 100 parts by mass. When the content of the polymerizable compound is within the ranges, a curing reaction proceeds sufficiently.

(E3) Other Additives

In the black curable composition according to the third aspect of the invention, various additives may be optionally used according to the purposes, in addition to the (A3) to (D3) components and the additional pigment dispersant.

(E3-1) Binder Polymer (alkali-soluble resin)

The black curable composition according to the third aspect of the invention may include an (E3-1) alkali-soluble resin (hereinbelow, simply referred to as "alkali-soluble resin") different from the resin having the (B3) component.

The alkali-soluble resin which can be used in the third aspect of the invention may be appropriately selected from alkali-soluble resins which are linear organic high molecular polymers, and have at least a group (for example, a carboxyl group, a phosphoric group, a sulfonic group, a hydroxyl group, or the like) that promotes an alkali-solubility in molecules thereof (preferably, molecules containing an acrylic copolymer or styrene copolymer in the main chain).

More preferably, the alkali-soluble resin is an acrylic copolymer or the like, such as, polymers having a carboxylic acid in the side chain, for example, methacrylic acid copolymers, acrylic acid copolymers, itaconic acid copolymers, crotonic acid copolymers, maleic acid copolymers, partially esterified maleic acid copolymers and the like as disclosed in JP-A No. 59-44615, JP-B No. 54-34327, JP-B No. 58-12577, JP-B No. 54-25957, JP-A No. 59-53836, JP-A No. 59-71048; acidic cellulose derivatives having a carboxylic acid in the side chain; and one adding acid anhydride to a polymer having a hydroxyl group.

The acid value of the alkali-soluble resin is preferably from 20 mgKOH/g to 200 mgKOH/g, more preferably from 30 mgKOH/g to 150 mgKOH/g, and most preferably from 50 mgKOH/g to 120 mgKOH/g.

Specific examples of the alkali-soluble resin include a copolymer of (meth)acrylic acid and other monomers copolymerizable therewith. Examples of other monomers copolymerizable with the (meth)acrylic acid include alkyl(meth)acrylate, aryl(meth)acrylate, vinyl compounds, and the like. Here, a hydrogen atom of an alkyl group and an aryl group may have a substituent.

The alkyl(meth)acrylate and the aryl(meth)acrylate include $CH_2=C(R^{11})(COOR^{13})$ (wherein, $R^{11}$ represents a hydrogen atom or an alkyl group having 1 to 5 carbon atoms, $R^{13}$ represents an alkyl group having 1 to 8 or an aralkyl group having 6 to 12 carbon atoms), specifically, methyl(meth)acrylate, ethyl(meth)acrylate, propyl(meth)acrylate, butyl(meth)acrylate, isobutyl(meth)acrylate, pentyl(meth)acrylate, hexyl (meth)acrylate, octyl(meth)acrylate, phenyl(meth)acrylate, benzyl(meth)acrylate, tolyl(meth)acrylate, naphthyl(meth)acrylate, cyclohexyl(meth)acrylate, hydroxyalkyl(meth)acrylate (alkyl represents an alkyl group having 1 to 8 carbon atoms), hydroxyglycidyl methacrylate, tetrahydrofurfuryl methacrylate, and the like.

The alkali-soluble resin having a polyalkylene oxide chain in a side chain is preferred. The polyalkylene oxide chain includes polyethylene oxide chain, polypropylene oxide chain, polytetramethyleneglycol chain or a combination of these.

A number of repetition units of the polyethylene oxide chain and the polypropylene oxide chain is preferably 1 to 20 and more preferably 2 to 12. Preferable examples of the acrylic copolymer having polyalkylene oxide chain in a side chain include 2-hydroxyethyl(meth)acrylate, hydroxypropyl (meth)acrylate, polyethyleneglycol mono(meth)acrylate, polypropyleneglycol mono(meth)acrylate, poly(ethyleneglycol-propyleneglycol) mono(meth)acrylate, and the like and alkyl-closed compounds by the terminal OH group, for example, methoxypolyethyleneglycol mono(meth)acrylate, ethoxypolypropyleneglycol mono(meth)acrylate, methoxypoly(ethyleneglycol-propyleneglycol)mono(meth)acrylate, and the like as a copolymerization component.

The vinyl compound $CH_2=CR^{12}R^{14}$ (wherein, $R^{12}$ represents an aromatic hydrocarbon ring having 6 to 10 carbon atoms, $R^{14}$ represents a hydrogen atom or an alkyl group having 1 to 5 carbon atoms), specifically, styrene, α-methyl styrene, vinyl toluene, acrylonitrile, vinyl acetate, N-vinyl pyrrolidone, polystyrene macromonomer, polymethyl methacrylate macromonomer, and the like.

The other copolymerizable monomers can be used alone or in a combination of two or more kinds. Other preferable copolymerizable monomers include alkyl(meth)acrylate (alkyl represents an alkyl group having 2 to 4 carbon atoms), phenyl(meth)acrylate, benzyl(meth)acrylate and styrene.

Examples of the alkali-soluble resin used in the third aspect include the ether dimers represented by Formula (ED), which may be used in the second aspect, and definition and details thereof (including the preferable ranges) are also the same.

Among these vinyl compounds, particularly benzyl(meth)acrylate/(meth)acrylic acid copolymer or a multi-component copolymer consisting of benzyl(meth)acrylate/(meth)acrylic acid/other monomers is preferred.

Such acrylic resin preferably has an acid value in a range of 20 mgKOH/g to 200 mgKOH/g as described above. When the acid value is within the ranges, the solubility of the alkali to the acrylic resin becomes appropriate, and thus it is possible to widen the development optimal range (development latitude).

A weight average molecular weight Mw of the acrylic resin (a corresponding value of polystyrene measured by the GPC method) is preferably from 2,000 to 100,000, and more preferably from 3,000 to 50,000, in order to realize a viscosity range easily used during a process such as application of the black curable composition and also in order to secure film strength.

The addition amount when the alkali-soluble resin is added to the black curable composition of the present invention is preferably from 5% by mass to 70% by mass, and more preferably from 10% by mass to 60% by mass, based on the total solid contents of the black curable composition. When the amount is within the ranges, the film strength is appropriately improved and the solubility during the development is easily controlled. This is preferable since the applied film having a desired thickness is achieved.

In addition, in order to improve the cross-linking efficiency of the black curable composition according to the present invention, it is preferable to use an alkali-soluble resin having a polymerizable double bond in the side chain of a polymer. Particularly, it is preferable to use an alkali-soluble resin containing a (meth)acryloyl group in the side chain. Thereby, the sensitivity is improved, and further residues on the lens or the glass substrate decrease.

Examples of polymers containing the polymerizable double bond are shown below, but are not limited to the following as long as an alkali-soluble group such as a COOH group or an OH group, and an unsaturated bond between carbon atoms are included.

(1) A urethane-modified polymerizable double bond-containing acryl resin obtained by reacting an isocyanate group and an OH group to leave an unreacted isocyanate group, which is obtained by reaction of a compound containing at least one (meth)acryloyl group and an acryl resin containing a carboxyl group.

(2) An unsaturated group-containing acryl resin obtained by reaction of an acryl resin containing a carboxyl group and a compound having an epoxy group and a polymerizable double bond in a molecule.

(3) An acid pendant type epoxy acrylate resin.

(4) A polymerizable double bond containing acryl resin obtained by reacting an acryl resin containing an OH group and dibasic acid anhydride having a polymerizable double bond.

Among them, particularly, the resins in (1) and (2) are preferable.

The acid value of the alkali-soluble resin having the polymerizable double bond in the present invention is preferably from 30 mgKOH/g to 150 mgKOH/g, more preferably from 35 mgKOH/g to 120 mgKOH/g, and, the weight average molecular weight Mw is preferably from 2,000 to 50,000, and more preferably from 3,000 to 30,000.

Specific examples which may be used include a compound (for example, a compound such as glycidyl acrylate) obtained by reaction of an unsaturated linkage group between carbon atoms and an epoxy ring having a reactivity to an OH group with a copolymer of 2-hydroxyethyl acrylate and methacrylic acid, and monomers such as acrylic or vinyl-based compounds copolymerizable therewith, to obtain a compound. Regarding the reaction to an OH group, a compound having acid anhydride other than an epoxy ring, an isocyanate group, or an acryloyl group can be used. An unsaturated carboxylic acid such as acrylic acid is reacted with the compound having the epoxy ring described in JP-A No. 6-102669, JP-A No. 6-1938 to obtain a compound, a saturated or unsaturated polybasic acid anhydride is reacted with the compound to obtain a reactant, which can be used. Further, a repeating unit which has a polymerizable group of an alkali resin having a polymerizable double bond is preferably from 5 to 60% by mass, more preferably from 10 to 40% by mass, with respect to the resin.

Examples of the compound having an alkali-soluble group such as a COOH group and an unsaturated group between carbon and carbon include DIANAL NR SERIES (trade name) (manufactured by Mitsubishi Layon); PHOTOMER 6173 (trade name) (COOH group-containing polyurethane acrylic oligomer, manufactured by Diamond Shamrock Co., Ltd.); BISCOAT R-264, KS RESISTER 106 (trade names) (manufactured by Osaka Organic Chemical Industries Ltd.); EBECRYL3800 (trade name) (manufactured by Daicel UCB Co., Ltd.), and the like.

Other most preferable alkali-soluble resins different from (B) resins having the (E) component which may be used in the invention include a resin of modifying a copolymer of alkyl (meth)acrylate or styrene and (meth)acrylic acid with glycidyl(meth)acrylate. The alkyl(meth)acrylate is preferably (meth)acrylate having 1 to 10 carbon atoms. Examples of the alkyl(meth)acrylate include methyl(meth)acrylate, ethyl (meth)acrylate, butyl(meth)acrylate, 2-ethylhexyl(meth) acrylate, benzyl(meth)acrylate, and the like.

(E3-3) Other Colorants

The black curable composition according to the third aspect of the invention may further include a colorant such as a known (F3) organic pigment or dye, other than inorganic pigments, for exhibiting a desired light-shielding property.

Examples of (E3-3) other colorants used in combination with the inorganic pigments are the same as those used as the (E1-2) other colorants in the first aspect of the invention, and details thereof (including the preferable ranges) are also the same.

The addition amount of an organic pigment when the organic pigment is added to the black curable composition according to the third aspect of the present invention is preferably from 5% by mass to 50% by mass, and more preferably from 10% by mass to 30% by mass, based on the total solid contents of the black curable composition.

The organic pigment may be prepared by dispersion along with an inorganic pigment, or may be prepared by addition of a dispersant while being dispersed using a dispersant.

Examples of the dispersant (pigment dispersant) capable of being used when a dispersion of the organic pigment of the invention is prepared include a polymer dispersant (for example, polyamide amine and a salt thereof, polycarboxylic acid and a salt thereof, high molecular unsaturated acid ester, modified polyurethane, modified polyester, modified poly (meth)acrylate, (meth)acrylic copolymer, naphthalene-sulfonic acid-formalin condensate) and polyoxyethylene alkyl phosphate, polyoxyethylene, alkyl amine, alkanol amine, pigment derivative, and the like.

The polymer dispersant is classified into a linear polymer, a terminal modified polymer, a graft polymer, and a block polymer from the viewpoints of the structure of the polymer dispersant.

The polymer dispersant functions so as to adsorb on the surface of the pigment and to prevent re-aggregation. Thus, the polymer dispersant includes a terminal modified polymer, a graft polymer, and a block polymer, which have an anchor portion on the surface of the pigment as a preferable structure. On the other hand, the pigment derivative modifies the surface of pigment, thereby achieving an effect of promoting the absorption of the polymer dispersant.

Specific examples of the pigment dispersant which may be used in the third aspect include: "DISPERBYK-101 (polyamideamine phosphate), 107 (carboxylate), 110 (copolymer containing an acid group), 130 (polyamide), 161, 162, 163, 164, 165, 166, 170 (high molecular weight copolymer)", "BYK-P104 and P105 (high molecular weight unsaturated polycarboxylic acid)" which are manufactured by BYK Chemie GmbH; "EFKA 4047, 4050, 4010, 4165 (polyurethane compound), EFKA 4330, 4340 (block copolymer), 4400, 4402 (modified polyacrylate), 5010 (polyester amide), 5765 (high molecular weight polycarboxylic acid salt), 6220 (fatty acid polyester), 6745 (phthalocyanine derivative), 6750 (azo pigment derivative)" which are manufactured by EFKA; "AJISPER PB821, PB822" manufactured by Ajinomoto Fine Techno Co., Inc.; "FLOWLEN TG-710 (urethane oligomer)", "POLYFLOW No. 50E, No. 300 (acrylate copolymer)" manufactured by Kyoeisha Chemical Co., Ltd.; "DISPARLON KS-860, 873SN, 874, #2150 (aliphatic polyvalent carboxylic acid), #7004 (polyether ester), DA-703-50, DA-705, DA-725" manufactured by Kusumoto Chemicals Ltd.; "DEMOL RN, N (naphthalenesulfonic acid-formalin polycondensation product), MS, C, SN-B (aromatic sulfonic acid-formalin polycondensation product)", "HOMOGENOL L-18 (high molecular polycarboxylic acid)", "EMULGEN 920, 930, 935, 985 (polyoxyethylene nonylphenyl ether)", "ACETAMIN 86 (stearylamine acetate)" manufactured by Kao Corporation; SOLSPERSE 5000 (phthalocyanine derivative), 22000 (azo pigment derivative), 13240 (polyester amine), 3000, 17000, 27000 (polymer having a functional group at a terminal thereof), 24000, 28000, 32000, 38500 (graft polymer)" manufactured by Lubrizol Corporation; and "NIKKOL T106 (polyoxyethylene sorbitanmonooleate) and MYS-IEX (polyoxyethylene monostearate)" manufactured by Nikko Chemicals Co., Ltd.

Such dispersants may be used alone or in a combination of two or more kinds thereof. In the third aspect of the invention, it is preferable to use a combination of the pigment derivatives and the polymer dispersant.

The content of the dispersant used in the third aspect of the invention is preferably from 1% by mass to 100% by mass, more preferably from 3% by mass to 100% by mass, and most preferably from 5% by mass to 80% by mass, with respect to the (F3) organic pigment.

Specifically, in a case of using the polymer dispersant, the amount thereof to be used is preferably from 5% by mass to 100% by mass, and more preferably from 10% by mass to 80% by mass, with respect to the pigment. In a case of using the pigment derivative, the amount thereof to be used is from 1% by mass to 30% by mass, more preferably from 3% by mass to 20% by mass, and most preferably from 5% by mass to 15% by mass, with respect to the pigment.

(E3-3) Sensitizer

The black curable composition according to the third aspect of the invention may further include a sensitizer for the purpose of improving the radial generation efficiency of the polymerization initiator and increasing the wavelength of the photosensitivity wavelength.

The sensitizer (E3-3) used in the black curable composition according to the third aspect of the invention has the same definition as that of the (E1-3) sensitizer used in the first aspect, and details thereof (including the preferable ranges) are also the same.

(E3-4) Polymerization Inhibitor

It is preferable that the light-shielding curable composition according to the third aspect of the invention contains a polymerization inhibitor in order to suppress polymerization reactions of polymerizable compounds during production or storage of the composition.

The (E3-4) polymerization inhibitor used in the third aspect has the same definition as that of the (E1-4) polymerization inhibitor used in the first aspect, and details thereof (including the preferable ranges) are also the same.

(E3-5) Adhesion Promoter

An adhesion promoter may be added to the light-shielding curable composition according to the third aspect of the invention in order to improve adhesiveness to the surface of a hard material such as a support.

Examples of the (E3-5) adhesion promoter are the same as those of the (E1-5) adhesion promoter used in the first aspect, and details thereof (including the preferable ranges) are also the same.

Particularly, in the case in which a wafer level lens is formed on a glass substrate using the black curable composition according to the third aspect of the present invention, it is preferable to add an adhesion promoter from the viewpoints of the sensitivity improvement.

(E3-6) Surfactant

The black curable composition according to the third aspect of the invention may further include any one of various surfactants, from the viewpoints of further improving coating property. The surfactant used in the third aspect has the same definition as that of the (E2-6) surfactant used in the second aspect, and details thereof (including the preferable range) are also the same.

(K) Other Components

The black curable composition according to the third aspect of the invention may further include a co-sensitizer for the purposes of, for example, additionally improving the sensitivity of a sensitizing dye or an initiator to active radiation, or suppressing the polymerization inhibition of the photopolymerizable compound caused by oxygen. Further, known additives such as a diluent, a plasticizer, or a sensitizer, may be added optionally, in order to improve the physical properties of the cured film.

(L) Organic Solvent

The black curable composition according to the third aspect of the invention may be produced using an organic solvent. The organic solvent is not particularly limited as long as the solubility for each component or the coating property of the colored curable composition is satisfied; however, particularly, the organic solvent is preferably selected in consideration of the ultraviolet absorber, the solubility of the binder, the coating property, and the safety. In order to manufacture the colored curable composition according to the third aspect of the invention, it is preferable to use at least two kinds of organic solvents.

Examples of the organic solvent include: esters such as ethyl acetate, n-butyl acetate, amyl formate, isobutyl acetate, butyl propionate, isopropyl butyrate, ethyl butyrate, butyl butyrate, methyl lactate, ethyl lactate, alkyl oxyacetate (for example, methyl oxyacetate, ethyl oxyacetate, butyl oxyacetate (for example, methyl methoxyacetate, ethyl methoxyacetate, butyl methoxyacetate, methyl ethoxyacetate, ethyl ethoxyacetate)), alkyl 3-oxypropionate (for example, methyl 3-oxypropionate, ethyl 3-oxypropionate (for example, methyl 3-methoxypropionate, ethyl 3-methoxypropionate, methyl 3-ethoxypropionate, ethyl 3-ethoxypropionate)), alkyl 2-oxypropionate (for example, methyl 2-oxypropionate, ethyl 2-oxypropionate, propyl 2-oxypropionate (for example, methyl 2-methoxypropionate, ethyl 2-methoxypropionate, propyl 2-methoxypropionate, methyl 2-ethoxypropionate, ethyl 2-ethoxypriopionate)), methyl 2-oxy-2-methylpropionate and ethyl 2-oxy-2-methylpropionate (for example, methyl 2-methoxy-2-methylpropionate, ethyl 2-ethoxyl-2-methylpropionate), methyl pyruvate, ethyl pyruvate, propyl pyruvate, methyl acetoacetate, ethyl acetoacetate, methyl 2-oxobutanoate, ethyl 2-oxobutanoate; and ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, and propylene glycol monopropyl ether acetate; and ketones such as methyl ethyl ketone, cyclohexanone, 2-heptanone, and 3-heptanone; and aromatic hydrocarbons such as toluene and xylene.

These organic solvents are preferably mixed in two or more kinds from the viewpoints of ultraviolet absorbance and solubility of the alkali-soluble resin, improvement of coating surface, and the like. In this case, particularly preferred is a mixed solution of two or more kinds selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate.

The content of the organic solvent in the colored curable composition is preferably adjusted such that the concentration of the total solid contents of the composition is preferably from 5% by mass to 80% by mass, more preferably from 5% by mass to 60% by mass, and most preferably from 10% by mass to 50% by mass, from the viewpoints of the coating property.

The black curable composition according to the third aspect of the invention may be manufactured by adding the (A3) inorganic pigment (preferably as a pigment-dispersed composition including the pigment dispersant), the (B3) specific resin, the (C3) polymerization initiator, the (D3) polymerizable compound, and optionally, various additives, to a solvent, and further mixing them with an optional additive such as a surfactant.

The black curable composition according to the third aspect of the invention has the constitution as described above, and thus, by curing it with high sensitivity, a light-shielding film having an excellent light-shielding property can be formed. Further, by using the (E3-1) alkali-soluble resin different from the resin of the component (B3) together, a higher-precision light-hielding pattern is formed.

Wafer Level Lenses According to the First and Third Aspects

The wafer level lens according to the first and the third aspects of the invention has at least a light-shielding film obtained using the black curable composition of the first aspect or the third aspect of the invention, in a peripheral portion of a lens that is present on the substrate.

Hereinbelow, the wafer level lens according to the first aspect or the third aspect of the invention is described with reference to the drawings.

FIG. 1 is a plan view illustrating an example of a configuration of a wafer level lens array having plural wafer level lenses.

As shown in FIG. 1, the wafer level lens array is provided with a substrate 10, and lenses 12 arranged in the substrate 10. Here, although the plural lenses 12 are arranged on the substrate 10 in a two-dimensional manner in FIG. 1, they may be arranged in a one-dimensional manner.

Figure 2:
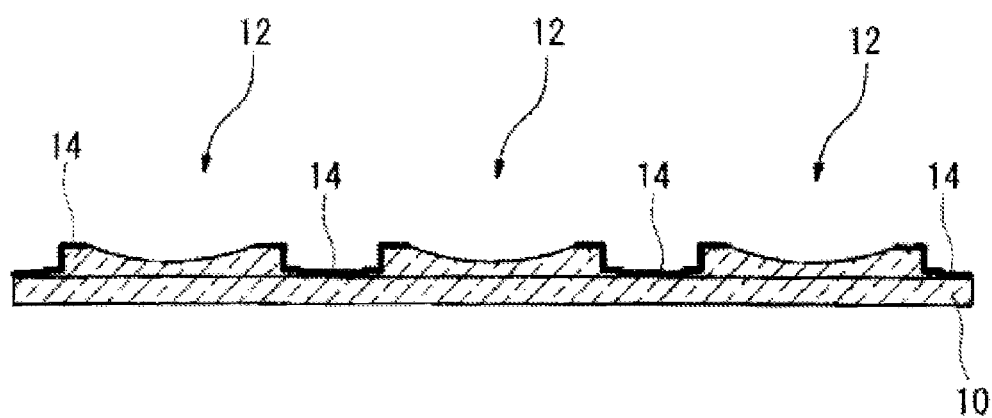
FIG. 2 is a cross-sectional view taken along the A-A line in the wafer level lens array shown in FIG. 1.

FIG. 2 is a sectional view taken along the line A-A in the wafer level lens array shown in FIG. 1.

As shown in FIG. 2, the wafer level lens array includes the substrate 10 and the plural lenses 12 arranged on the substrate 10. The plural lenses 12 are arranged in a one-dimensional manner or in a two-dimensional manner on the substrate 10. That is to say, light-shielding film 14 for blocking light from being transmitted through portions other than the lenses 12, is provided between the plural lenses 12 arranged on the substrate 10.

The wafer level lens according to the first aspect or the third aspect of the invention is constituted by one lens 12 on the substrate 10 and the light-shielding film 14 provided in the peripheral portion. The black curable composition of the present invention is used to form the light-shielding film 14.

In this embodiment, as shown in FIG. 1, the configuration where the plural lenses 12 are arranged on the substrate 10 in the two-dimensional manner is described. The lenses 12 are made of the same material as the substrate 10 and thus integrally formed on the substrate 10, or they are fixed on the substrate after being formed as separate structures.

Although an example is shown here, the wafer level lens of the present invention is not limited to this aspect but may have various aspects such as having a multiple layered structure, or being divided into lens modules by dicing.

Examples of the material for forming the lenses 12 include glass. Glass has an abundant number of types, and one having a high refractive index can be selected, and thereby it is suitable for a material of the lens which is intended to have a great power. In addition, glass has an excellent heat resistance and thus has an advantage in view of being to withstand a reflow mounting on an imaging unit.

Another example of a material for forming the lenses 12 includes a resin. The resin is easily processed and thus is suitable for forming a lens surface simply and at a low cost using a mold or the like.

For forming the wafer level lens, it is preferable to use an energy-curable resin. The energy-curable resin may include a thermosetting resin, or a resin which is cured by the irradiation of active energy (for example, irradiation of heat, ultraviolet light, and electron beams).

In consideration of the reflow mounting on the imaging unit, a resin having a relatively high softening temperature, for example, 200° C. or more, is preferable, and a resin having the softening temperature of 250° C. or more is more preferable.

Hereinbelow, resins suitable for materials of the lens are described.

Examples of the ultraviolet curable resin include an ultraviolet curable silicon resin, an ultraviolet epoxy resin, and an acryl resin. As the epoxy resin, an epoxy resin having the linear expansion coefficient of from 40 to 80 $[10^{-6}/K]$, and the refractive index of from 1.50 to 1.70, and preferably from 1.50 to 1.65, may be used.

Examples of the thermosetting resin include a thermosetting silicon resin, a thermosetting epoxy resin, a thermosetting phenol resin, and a thermosetting acryl resin. For example, as the silicon resin, a silicon resin having the linear expansion coefficient of from 30 to 160 $[10^{-6}/K]$, and the refractive index of from 1.40 to 1.55, may be used. As the epoxy resin, an epoxy resin having the linear expansion coefficient of from 40 to 80 $[10^{-6}/K]$, and the refractive index of from 1.50 to 1.70, and preferably from 1.50 to 1.65, may be used.

As the phenol resin, a phenol resin having the linear expansion coefficient of 30 to 70 $[10^{-6}/K]$, and the refractive index of from 1.50 to 1.70, may be used. As the acryl resin, an acryl resin having the linear expansion coefficient of from 20 to 60 $[10^{-6}/K]$, and the refractive index of from 1.40 to 1.60, and preferably from 1.50 to 1.60, may be used.

Examples of the thermosetting resin include an epoxy resin, a siloxane resin, and the like. The thermosetting resin can use commercially available products, examples of which include SMX-7852 and SMX-7877. (trade names, manufactured by Fuji Polymer Industries Co., Ltd.), NSM-4500 (trade name, manufactured by TOSHIBA CORPORATION), SR-7010 (trade name, manufactured by Dow Corning Toray Co., Ltd.).

Examples of the thermoplastic resin include a polycarbonate resin, a polysulfone resin, a polyethersulfone resin, and the like. As the polycarbonate resin, a polycarbonate resin having the linear expansion coefficient of from 60 to 70 $[10^{-6}/K]$, and the refractive index of from 1.40 to 1.70, and preferably from 1.50 to 1.65, may be used. As the polysulfone resin, a polysulfone resin having the linear expansion coefficient of from 15 to 60 $[10^{-6}/K]$, and the refractive index of 1.63 may be used. As the polyethersulfone resin, a polyethersulfone resin having the linear expansion coefficient of 20 to 60 $[10^{-6}/K]$, and the refractive index of 1.65 may be used.

Generally, the linear expansion coefficient of optical glass is from 4.9 to 14.3 $[10^{-6}/K]$ at 20° C., and the refractive index thereof is from 1.4 to 2.1 at a wavelength of 589.3 nm. Also, the linear expansion coefficient of quartz glass is from 0.1 to 0.5 $[10^{-6}/K]$, and the refractive index thereof is about 1.45.

A curable resin composition applicable to forming the lens preferably has appropriate flowability before being cured, from the viewpoints of molding such as transcription suitability for mold forms. Specifically, the curable resin composition is preferably in a liquid state at room temperature, and has the viscosity of about 1000 mPa·s to 50000 mPa·s.

The curable resin composition applicable to forming the lens preferably has a heat-resistance to a degree that is not thermally deformed through the reflow process after being cured. From the viewpoints thereof, a glass transition temperature of the cured material is preferably 200° C. or more, more preferably 250° C. or more, and most preferably 300° C. or more. In order to give such a high heat resistance to the resin composition, it is necessary to restrain mobility at a molecular level, and examples of useful means for this include (1) a means for increasing a cross-linking density per unit volume, (2) a means using a resin having a rigid ring structure (for example, a resin having an alicyclic structure such as cyclohexane, norbornane, tetracylcododecane; an aromatic structure such as benzene and naphthalene; a cardo structure such as 9,9'-biphenylfluorene, a spiro structure such as spirobiindane, specific examples of which include means disclosed in JP-A No. 9-137043, JP-A No. 10-67970, JP-A No. 2003-55316, JP-A No. 2007-334018, JP-A No. 2007-238883, and the like), (3) a means for uniformly dispersing a material having a high Tg such as inorganic particulates (for example, means disclosed in JP-A No. 5-209027, JP-A No. 10-298265, and the like), and the like. These means may be used in plurality together, and are preferably adjusted in a range of not influencing the other characteristics such as the flowability, the retraction rate, or the refractive index.

From the viewpoints of shape transcription accuracy, a resin composition having a low volume retraction rate due to the curing reaction (particularly, a curable resin composition having a low volume retraction rate due to the curing reaction) is preferable. The curing retraction rate of the resin composition used in the first aspect or the third aspect of the present invention is preferably 10% or less, more preferably 5% or less, and most preferably 3% or less.

Examples of the resin composition having the low curing retraction rate include (1) a resin composition including a polymeric curing agent (prepolymer or the like) (for example, ones disclosed in JP-A No. 2001-19740, JP-A No. 2004-302293, JP-A No. 2007-211247, or the like, and the number average molecular weight of the polymeric curing agent is preferably in a range of from 200 to 100,000, more preferably from 500 to 50,000, and most preferably from 1,000 to 20,000. Also, a value calculated by the number average molecular weight/the number of curing reactive groups of the curing agent is preferably in a range of from 50 to 10,000, more preferably from 100 to 5,000, and most preferably from 200 to 3,000), (2) a resin composition including nonreactive materials (organic/inorganic particulates, nonreactive resins, or the like) (for example, ones disclosed in JP-A No. 6-298883, JP-A No. 2001-247793, JP-A No. 2006-225434, or the like), (3) a resin composition including low retraction cross-linking reactive groups (for example, open ring polymerizable groups (for example, one disclosed in JP-A No. 2004-210932 or the like), oxetanyl groups (for example, disclosed in JP-A No. 8-134405) episulfide groups (for example, disclosed in JP-A No. 2002-105110 or the like), cyclic carbonate groups (for example, JP-A No. 7-62065 or the like), and so on), an en/thiol curing group (for example, disclosed in JP-A No. 2003-20334 or the like), a hydrosilylated curing group (for example, disclosed in JP-A 2005-15666 or the like) and so on), (4) a resin including a rigid skeleton resin (fluorine, adamantane, isophorone, and the like) (for example, disclosed in JP-A No. 9-137043 or the like), (5) a resin composition in which an interpenetrating polymer network structure (a so called IPN structure) containing two kinds of monomers having different polymerizable groups is formed (for example, disclosed in JP-A No. 2006-131868 or the like), (6) a resin composition including dilative materials (for example, disclosed in JP-A No. 2004-2719, JP-A No. 2008-238417 or the like), and so on, which may be suitably used in the present invention. Also, it is preferable to use the plural means for reducing curing retraction together (for example, the pre-polymer containing the open ring polymerizable group and the resin composition including the particulates) from the viewpoints of physical characteristics optimization.

In forming the wafer level lens of the present invention, it is preferable to use a composition containing two or more resins having different Abbe number of relatively high and relatively low Abbe numbers.

A resin having a relatively high Abbe number has an Abbe number (vd) of preferably 50 or more, more preferably 55 or more, and most preferably 60 or more. The refractive index (nd) of the resin is preferably 1.52 or more, more preferably 1.55 or more, and most preferably 1.57 or more.

Such resins are preferably aliphatic resins, and, particularly preferably resins having an alicyclic structure (for example, a resin having a ring structure such as cyclohexane, norbornane, adamantane, tricyclodecane, tetracyclododecane, specifically, resins disclosed in, for example, JP-A No. 10-152551, JP-A No. 2002-212500, JP-A No. 2003-20334, JP-A No. 2004-210932, JP-A No. 2006-199790, JP-A No. 2007-2144, JP-A No. 2007-284650, JP-A No. 2008-105999, or the like).

A resin having a relatively low Abbe number has an Abbe number (vd) of preferably 30 or less, more preferably 25 or less, and most preferably 20 or less. The refractive index (nd) of the resin is preferably 1.60 or more, more preferably 1.63 or more, and most preferably is 1.65 or more.

Such resins are preferably resins having an aromatic structure, and, for example, preferably resins including a resin containing structure such as 9,9'-diarylfluorene, naphthalene, benzothiazole, and benzotriazole (specifically, for example, resins disclosed in JP-A No. 60-38411, JP-A No. 10-67977, JP-A No. 2002-47335, JP-A No. 2003-238884, JP-A No. 2004-83855, JP-A No. 2005-325331, JP-A No. 2007-

238883, International Publication No. 2006/095610, Japanese Patent No. 2537540, or the like).

The resin composition used for forming a wafer level lens preferably includes organic and inorganic complex materials which is formed by dispersing inorganic particulates in a matrix, for the purpose of increasing the refractive index or adjusting the Abbe number.

Examples of the inorganic particulate in the organic inorganic complex material include oxide particulates, sulfide particulates, selenide particulates, and telluride particulates. In the first aspect, specific examples of inorganic particulate include particulates such as zirconium oxide, titanium oxide, zinc oxide, tin oxide, and zinc sulfide. In the first and third aspects, more specific examples include particulates such as zirconium oxide, titanium oxide, zinc oxide, tin oxide, niobium oxide, cerium oxide, aluminum oxide, lanthanum oxide, yttrium oxide, and zinc sulfide.

Particularly, in the first aspect, it is preferable to disperse particulates such as lanthanum oxide, aluminum oxide or zirconium oxide in the resin having a high Abbe number, and it is preferable to disperse particulates such as titanium oxide, tin oxide, or zirconium oxide in the resin having a low Abbe number.

In the first and third aspects, the inorganic particulates may be used alone or in a combination of two or more kinds thereof. Complex materials having plural components may be used.

For the various purposes such as reduction in photocatalytic activity, reduction in absorption ratio, or the like, heterogenous metals are doped in the inorganic particulates, or surfaces thereof are coated with heterogenous metal oxides such as silica or alumina, or the surfaces thereof may be modified by a silane coupling agent, a titanate coupling agent, or dispersants having an organic acid (carboxylic acids, sulfonic acids, phosphoric acids, phosphonic acids, or the like) or having an organic acid group.

The number average primary particle size of the inorganic particulate is typically from about 1 nm to 1000 nm; however, since if the size is too small, there is a case where physical characteristics of a material are changed, and if too large, the influence of Rayleigh scattering is notable, the size is preferably from 1 nm to 15 nm, more preferably from 2 nm to 10 nm, and most preferably from 3 nm to 7 nm. The distribution in the particle size of the inorganic particulate in the present invention is relatively narrower. Methods for defining such monodisperse particles are diverse, but the numerical value defining range as disclosed in JP-A No. 2006-160992 corresponds to a preferable particle diameter distribution range.

The number average primary particle size can be measured using, for example, an X-ray diffraction (XRD) device, or a transmissive electron microscope (TEM), or the like.

The refractive index of the inorganic particulate, at 22° C. and a wavelength of 589.3 nm, is preferably from 1.90 to 3.00, more preferably from 1.90 to 2.70, and most preferably from 2.00 to 2.70.

The content of the inorganic particulates in the resin is 5% by mass or more, more preferably from 10 to 70% by mass, and most preferably from 30 to 60% by mass from the viewpoints of the transparency and high refractive index.

The resin as the matrix, used for the organic and inorganic complex material may use any of the ultraviolet curable resin, the thermosetting resin, the thermoplastic resin, the resin having a high Abbe number, and the resin having a low Abbe number, which may be used as the materials of the wafer level lens. In addition, examples thereof include the resin having the refractive index larger than 1.60 as disclosed in JP-A No. 2007-93893, the block copolymer constituted by hydrophobic segments and hydrophilic segments disclosed in JP-A No. 2007-211164, the resin having functional groups which can form an arbitrary chemical bond with the inorganic particulates in the polymer terminal end or side chain disclosed in JP-A No. 2007-238929, JP-A No. 2010-0431919, JP-A No. 2010-065063, and JP-A No. 2010-054817, the thermoplastic resin disclosed in JP-A No. 2010-031186 and JP-A No. 2010-037368, and so on.

Also, additives such as a plasticizer or a dispersant may be optionally added in the organic and inorganic complex material.

In the third aspect, a preferable combination of the resin as a matrix and the inorganic particulate is as follows.

Specifically, when the resin having a high Abbe number is used as a matrix, particulates such as lanthanum oxide, aluminum oxide, or zirconium oxide are preferably dispersed therein as the inorganic particulate, and when the resin having a low Abbe number is used as a matrix, particulates such as titanium oxide, tin oxide, or zirconium oxide are preferably dispersed therein as the inorganic particulate.

In the first and third aspects, in order to uniformly disperse the particulates in the resin composition, it is preferable to appropriately use, for example, a dispersant including a functional group reacting with a resin monomer forming the matrix (for example, disclosed in the embodiments in JP-A No. 2007-238884 or the like), a block copolymer constituted by hydrophobic segments and hydrophilic segments (for example, disclosed in JP-A No. 2007-211164 or the like), or a resin having functional groups which can form an arbitrary chemical bond with the inorganic particulates in the polymer terminal end or side chain (for example, disclosed in JP-A No. 2007-238929, JP-A No. 2007-238930 or the like), and so on.

In the resin composition for forming the wafer level lens used in the present invention, additives such as a known mold release agent, for example, silicon, fluorine, long chain alkyl group-containing compound, or the like, or an oxidation inhibitor such as a hindered phenol may be appropriately blended.

In the resin composition used to form the wafer level lens of the present invention, a curing catalyst or initiator may be blended, optionally. Specific examples thereof include a compound for promoting the curing reaction (radical polymerization or ion polymerization) through working of heat or active energy rays, disclosed in paragraphs [0065] to [0066] in JP-A No. 2005-92099. The addition amount of the curing reaction promoter cannot be defined simply since it varies depending on the type of catalyst or initiator, or curing reactive parts or the like; however, it is generally preferably 0.1 to 15% by mass, more preferably 0.5 to 5% by mass, in terms of the total solid contents of the curing reactive resin composition.

The resin composition used to form the wafer level lens of the present invention may be manufactured by appropriately blending the components. At this time, although separate solvents are not required to be added in a case in which other components can be dissolved in a liquid low molecular monomer (reactive diluent) or the like, in a case not corresponding to this case, the resin composition may be manufactured by dissolving each constituent element using solvents. The solvents usable in the resin composition are not particularly limited but may be appropriately selected as long as the composition is uniformly dissolved or dispersed without being precipitated, and specific examples thereof include ketones (for example, acetone, methyl ethyl ketone, methyl isobutyl ketone, and the like), esters (for example, ethyl acetate, butyl acetate, and the like), ethers (for example, tetrahydrofuran, 1,4-dioxane, and the like), alcohols (for example, methanol, ethanol, isopropyl alcohol, butanol, ethylene glycol, and the like), aromatic hydrogen carbonates (for example, toluene, xylene, and the like) water, and the like. In a case in which the resin composition includes solvents, it is preferable to perform a mold shape transcription operation after casting the composition on the substrate and/or the mold so as to dry the solvents.

Formation of the Wafer Level Lens According to the First and Third Aspects

The substrate 10 may be formed from the same material as the molding material of the lens 12. The substrate 10 may be formed from a material different from the molding material of the lens 12 as long as the substrate 10 is formed from a material transparent with respect to visible light, such as a glass. In this case, it is preferred that the material for forming the substrate 10 has the same or substantially the same linear expansion coefficient as that of the material for forming the lens 12. In a case in which a linear expansion coefficient of the material for forming lens 12 is the same or substantially the same as that of the material for forming the substrate 10, distortion or breaking of the lens 12 during heating, which is caused owing to different linear expansion ratios, can be suppressed in reflow mounting of the wafer level lens on an imaging unit.

Further, an infrared filter (IR filter) may be formed on the surface of the optical incidence side of the substrate 10 (not shown in FIGS. 1 and 2).

Hereinafter, with reference to FIGS. 3 to 8C, specific description will be given to the configuration and production of a wafer level lens, by referring to a method of producing a wafer level lens array.

[Configuration and Production of Wafer Level Lens (1)]

First, referring to FIGS. 3, 4A to 4C, a method of forming the lenses 12 on the substrate 10 is described.

Figure 3:
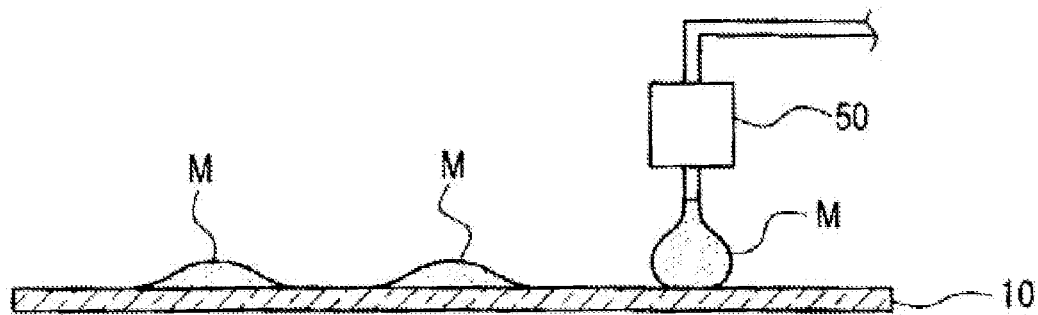
FIG. 3 is a plan view showing a state in which molding materials for a lens are supplied to a substrate.

FIG. 3 is a diagram illustrating a state where a molding material (denoted by M in FIG. 3) which is the resin composition for forming the lenses on the substrate is supplied.

Figure 4A:
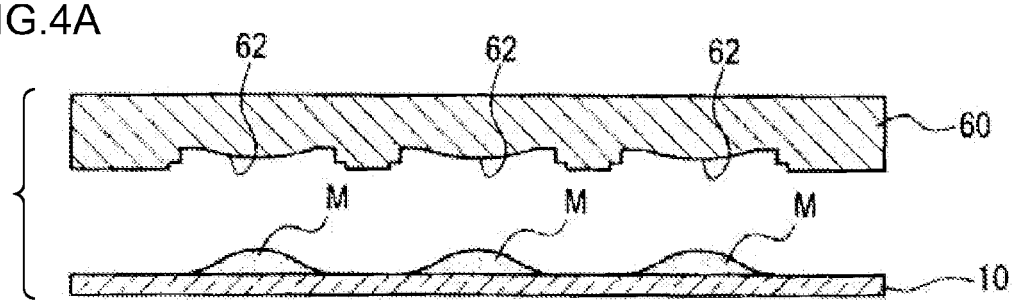
FIGS. 4A to 4C are views showing the sequences for shaping a lens in a mold on the substrate.
Figure 4B:
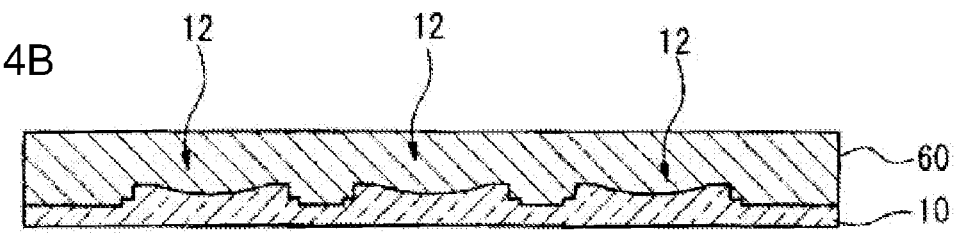
Figure 4C:
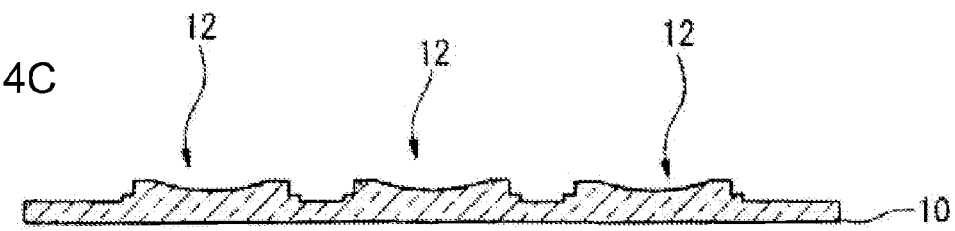

FIGS. 4A to 4C are diagrams illustrating the order of molding the lenses 12 on the substrate 10 using a mold 60.

As shown in FIG. 3, the molding material M is dropped on parts where the lenses are formed on the substrate 10, using a dispenser 50. Here, an amount of the molding material M corresponding to one lens 12 is supplied on one part.

After the molding material M is supplied to the substrate 10, and a mold 60 which is used for forming a lens is disposed over the substrate 10 as shown in FIG. 4A. The mold 60 has plural concave portions 62 for transferring the shape of a lens 12, according to a desirable number of the lenses 12.

As shown in FIG. 3, the molding material M is applied dropwise, using the dispenser 50, to portions of the substrate 10 on which the lenses 12 are to be formed. The molding material M in an amount necessary for forming one lens 12 is supplied to each of the portions on which the lenses are to be formed.

After the molding material M is supplied onto the substrate 10, the mold 60 for forming the lens 12 is disposed over the surface of the substrate 10, on which the molding material M has been supplied, as shown in FIG. 4A.

Concave portions 62 for transferring the shape of the lens 12 is provided in the mold 60 according to a desirable number of the lenses 12.

Subsequently, as shown in FIG. 4B, the mold 60 is pressed to the molding material M on the substrate 10, so that the molding material M is deformed according to the shape of the concave portions 62. Then, the molding material M is cured while the mold 60 is pressed to the molding material M, by irradiation of heat or ultraviolet light from the outside of the mold 60 when the molding material M is a thermosetting resin or an ultraviolet curable resin.

As the molding material M is cured, the substrate 10 and lenses 12 are released from the mold 60 as shown in FIG. 4C.

[Formation of a Light-Shielding Film]

Figure 5A:
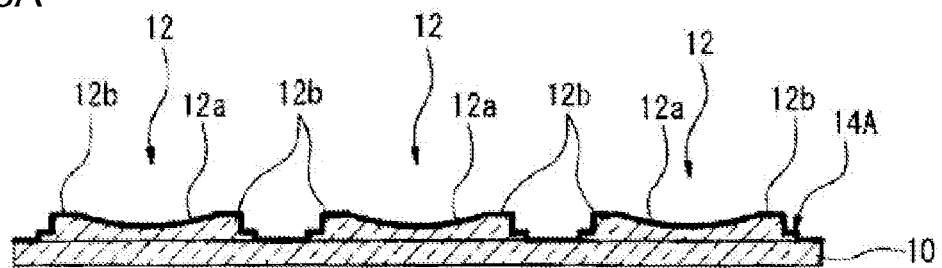
FIGS. 5A to 5C are schematic views showing the steps of forming a light-shielding film in a pattern shape, including the black curable composition of the present invention, on the substrate on which the lens is formed.
Figure 5B:
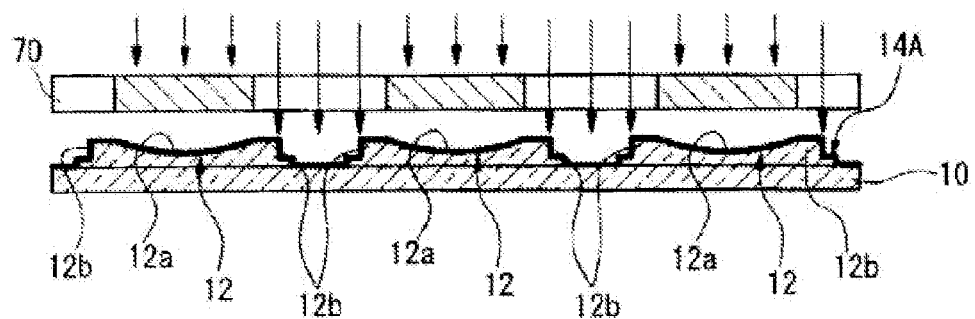
Figure 5C:
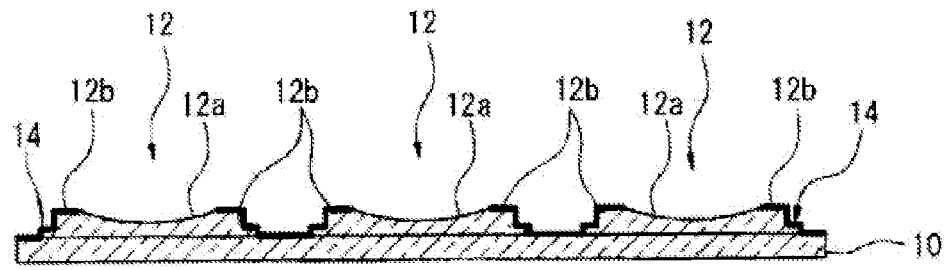

With reference to FIGS. 5A to 5C, a method of forming a light-shielding film 14 in the peripheral portion of the lenses 12 will be described.

FIGS. 5A to 5C are schematic cross-sectional views showing the steps of forming a light-shielding film 14 on the substrate 10 on which lenses 12 have been formed.

In the first and third aspect, the method of forming a light-shielding film 14 includes: applying the black curable composition of the invention onto the substrate 10 to form a light-shielding coating layer 14A (hereinafter, may be referred to as "light-shielding coating layer formation step" or "light-shielding curable composition coating layer formation step") (see FIG. 5A); pattern-exposing the light-shielding coating layer 14A through a mask 16 (hereinafter, may be referred to as "exposure step") (see FIG. 5B); and developing the light-shielding coating layer 14A after exposure, and removing an uncured portion thereof to form a patterned light-shielding film 14 (hereinafter, may referred to as "development step") (see FIG. 5C).

The patterned light-shielding film 14 may be arbitrary formed either before or after producing the lens 12. In the following, a method of forming a patterned light-shielding film after a lens 12 has been produced will be described.

Respective steps of the method of forming a light-shielding film 14 will be described below.

Black Curable Composition Coating Layer Formation Process

In the black curable composition coating layer formation process (or the light-shielding coating layer formation step), as shown in FIG. 5A, the black curable composition is applied on the substrate 10 to form a light-shielding coating layer 14A having a low light reflection ratio, which is formed from the black curable composition. In this case, the light-shielding coating layer 14A is formed so as to cover the surface of the substrate 10 and the lens face 12a of the lens 12 and the surface of the peripheral portion 12b of the lens.

The substrate 10 which can be used in this step is not specifically limited. Examples of the substrate 10 include soda glass, PYREX (registered mark) glass, quartz glass and a transparent resin. In the third aspect, in addition thereto, examples thereof include alkali-free glass.

In an embodiment in which the lens 12 and the substrate 10 are integrally formed, the "substrate 10" refers to have a configuration including both the lens 12 and the substrate 10.

On the substrate 10, an undercoating layer may be optionally provided for improvement of adhesion with an upper layer, prevention of diffusion of material or flattening the surface of the substrate 10.

Examples of a method of applying the black curable composition on the substrate 10 and the lens 12 include various coating methods such as slit coating, spray coating, an inkjet method, spin coating, cast coating, roll coating, or a screen printing method.

A film thickness immediately after applying the black curable composition is preferably from 0.1 μm to 10 μm, more preferably from 0.2 μm to 5 μm and even more preferably from 0.2 μm to 3 μm, from the viewpoints of thickness uniformity of the coating film, and ease of drying of the coating solvent.

The drying (prebaking) of the black layer (light-shielding curable composition coating layer) 14A coated on the substrate 10 may be performed using, for example, a hot plate or an oven at a temperature of from 50° C. to 140° C. for 10 seconds to 300 seconds.

The coating film thickness (hereinafter, also referred to as "dry film thickness") after drying the black curable composition can be arbitrary selected according to desired performances such as a light-shielding property, and is generally in a range of from 0.1 µm to less than 50 µm.

Exposure Process

In the exposure step, the light-shielding coating layer 14A formed in the light-shielding coating layer formation step is subjected to pattern exposure. The pattern exposure may be performed by scanning exposure, but as shown in FIG. 5B, exposure through a mask 70 having a prescribed mask pattern is preferred.

In the exposure step according to the first and third aspect, the light-shielding coating layer 14A is exposed to light through a mask having a prescribed mask pattern, whereby only a portion irradiated with light is cured in the light-shielding coating layer 14A. A mask pattern is used through which the surfaces of the lens peripheral portions 12b and the surface of the substrate 10 present between the lenses 12 are irradiated with light. Therefore, only the light-shielding coating layer 14A present at regions other than the lens faces 12a is cured by light irradiation, and the cured regions form a light-shielding film 14.

As radiation which can be used for the exposure, ultraviolet rays such as g-rays, h-rays, and i-rays are preferably used. The radiation may be from a light source of a single wavelength or may be from a light source including all wavelengths such as a high-pressure mercury vapor lamp.

Development Process

Subsequently, by performing an alkali development treatment (development step), a portion which has not been irradiated by light during the exposure, that is, an uncured portion of the light-shielding coating layer 14A, is eluted into an aqueous alkali solution, and only the cured portions of the light-shielding coating layer 14A remain in the light-irradiated regions.

Specifically, when the light-shielding coating layer 14A exposed as shown in FIG. 5B is developed, only portions of the light-shielding coating layer 14A formed on the lens faces 12a are removed, and a cured light-shielding film 14 is formed in the regions other than the regions from which the light-shielding coating layer 14A is removed, as shown in FIG. 5C.

An alkali agent contained in a developer (aqueous alkali solution) used in the development step may be any one of an organic alkali agent, an inorganic alkali agent, and a combination of an organic alkali agent and an inorganic alkali agent. It is preferable to use an organic alkali developer in forming the light-shielding film in the invention, from the viewpoints of reduced likelihood of impairing a peripheral circuit.

Examples of the alkali agent used in a developer include: organic alkali compounds (organic alkali agents) such as aqueous ammonia, ethyl amine, diethyl amine, dimethyl ethanol amine, tetramethyl ammonium hydroxide, tetraethyl ammonium hydroxide, choline, pyrrole, piperidine, or 1,8-diazabicyclo-[5,4,0]-7-undecene; and inorganic compounds (inorganic alkali agents) such as sodium hydroxide, potassium hydroxide, sodium hydrogen carbonate, or potassium hydrogen carbonate. An aqueous alkali solution diluted with pure water is used as the developer, such that the concentration of the alkali agent is from 0.001% by mass to 10% by mass, and preferably from 0.01% by mass to 1% by mass.

Development is carried out at a temperature of from 20° C. to 30° C. for 20 seconds to 90 seconds.

In a case in which a developer formed of the aqueous alkali solution is used, generally an unexposed portion of a coating film is removed by the developer, followed by washing (rinsing) with pure water. In other words, after a development treatment, excess developer is washed away and removed satisfactorily with pure water, and a drying step is subsequently performed.

In an embodiment, the production method may optionally include a step of curing the formed light-shielding film (light-shielding pattern) by heating (post-baking) and/or exposure, after performing the coating layer formation step, exposure step, and development step.

The post-baking is a heating treatment performed after development, for the purpose of complete curing, and is generally a heat curing treatment at 100° C. to 250° C. The conditions such as temperature and times of post-baking can be suitably set depending on the materials of the substrate 10 or the lens. For example, in a case in which the substrate 10 is a glass, the post-baking temperature is preferably from 180° C. to 240° C.

The post-baking treatment of a light-shielding film 14 formed by the development can be performed in a continuous system or a batch system using a heating apparatus such as a hot plate, a convection oven (hot air circulating dryer) or a radio-frequency heating apparatus so as to have the suitable conditions.

In the above, an embodiment in which the lens 12 has a concave shape is described. However, the shape of the lens is not specifically limited thereto, and the lens may have a convex or aspheric surface. Further, in the above, an embodiment in which a wafer level lens having plural lenses 12 formed on one side of a substrate 10 is described. However, a wafer level lens of the invention may have a configuration in which plural lenses 12 are formed on both sides of a substrate 10, and in this case, light-shielding layers 14 (for example, a patterned light-shielding film) are formed on both sides of the substrate 10 in regions other than the lens faces.

[Configuration and Production of Wafer Level Lens (2)]

Figure 6:
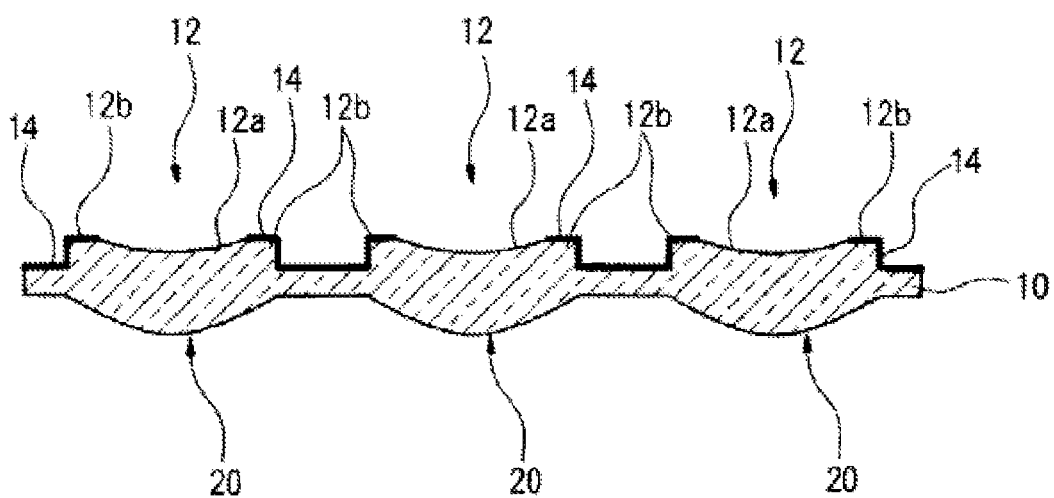
FIG. 6 is a view showing another example of a configuration of the wafer level lens array.

FIG. 6 is a cross-sectional view showing another configuration example of a wafer level lens array.

The wafer level lens array shown in FIG. 6 has a configuration (monolithic type) in which a substrate 10 and lenses 12 are formed at once using the same molding material.

Examples of molding materials used for forming such a wafer level lens array are the same as the molding materials described above. In this embodiment, plural concave lenses 12 are formed on one side (upper side in figure) of the substrate 10, and plural convex lenses 20 are formed on the other side (lower side in figure) of the substrate. A patterned light-shielding film 14 is formed in regions excluding the lens face 12a of the substrate 10; that is, a patterned light-shielding film 14 is formed on the surface of the substrate 10 and the surface of the lens peripheral portions 12b. As a patterning method used for forming the light-shielding film 14, any of the methods described above may be used.

[Configuration and Production of Wafer Level Lens (3)]

With reference to FIGS. 7A to 7C and FIGS. 8A to 8C, another configuration example of a wafer level lens array and the procedures for producing the same will be described below.

Figure 7A:
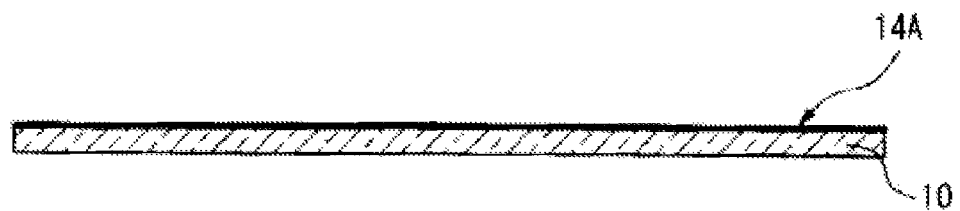
FIGS. 7A to 7C are schematic views showing another embodiment of the steps of forming a light-shielding film using the black curable composition of the present invention.
Figure 7B:
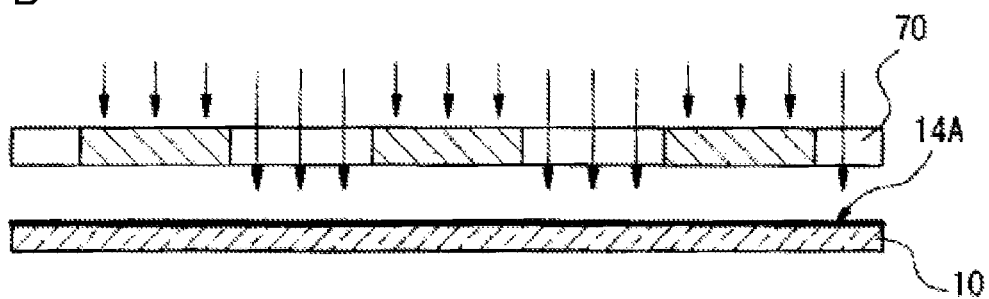
Figure 7C:
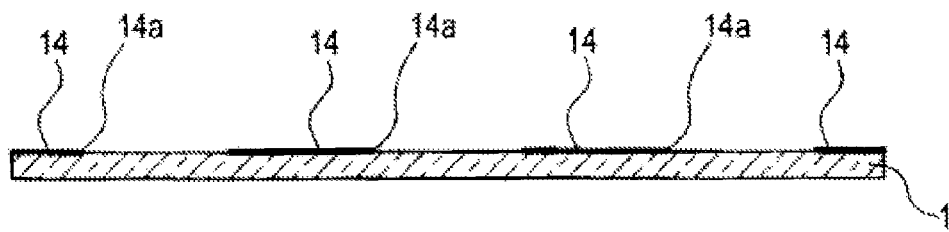

FIGS. 7A to 7C are schematic views showing another embodiment of processes for forming a patterned light-shielding film 14.

Figure 8A:
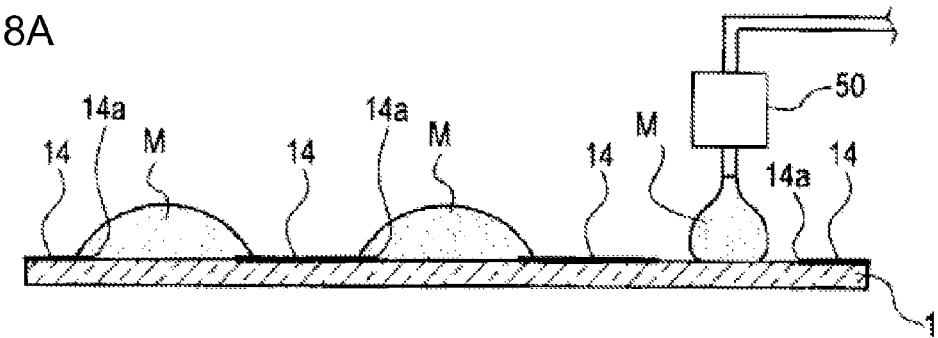
FIGS. 8A to 8C are schematic views showing the steps of molding a lens on a substrate having the light-shielding layer in the pattern shape formed by the black curable composition of the present invention.
Figure 8B:
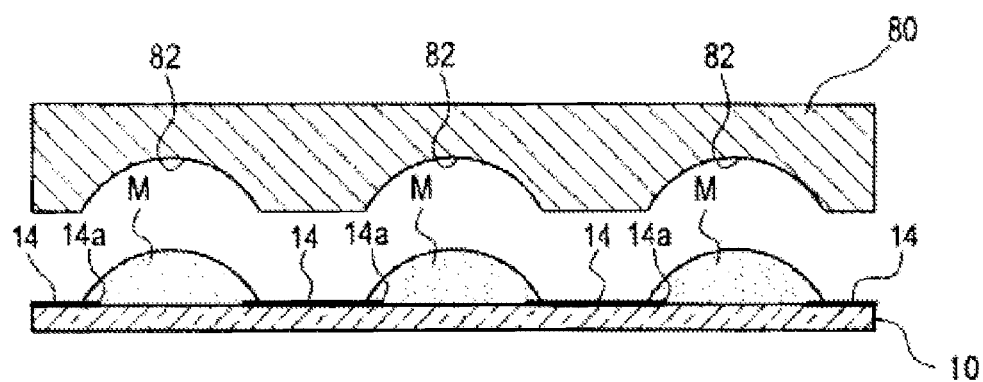
Figure 8C:
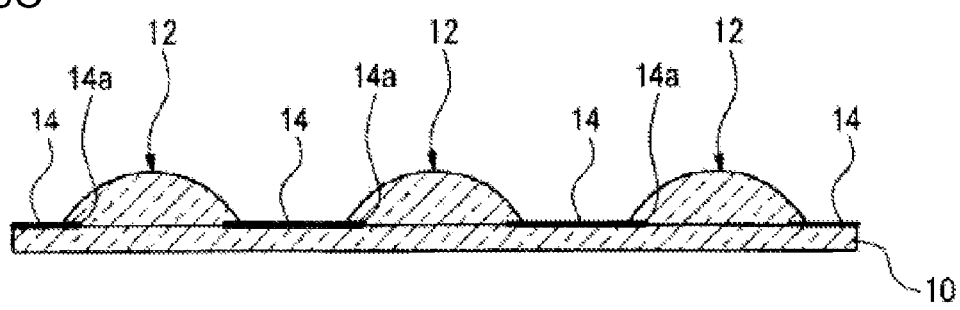

FIGS. 8A to 8C are schematic views showing processes of forming lenses 12 after the patterned light-shielding film 14 has been formed.

In the embodiment of the wafer level lens array shown in FIGS. 3 to 6, the patterned light-shielding film 14 is formed on the substrate 10 on which the lenses 12 have been formed. On the other hand, in the embodiment described below, first, a patterned light-shielding film 14 is formed on a substrate 10, and then lenses 12 are formed on the substrate 10.

[Formation of Light-Shielding Film]

First, as shown in FIG. 7A, a black curable composition is applied on the substrate 10 to form a light-shielding coating layer 14A (hereinafter, may be referred to as "light-shielding coating layer formation step").

Thereafter, the light-shielding coating layer 14A applied on the substrate 10 is dried using, for example, a hot plate or an oven at a temperature of from 50° C. to 140° C. for 10 seconds to 300 seconds. The dry film thickness of the light-shielding coating layer can be selected according to desired performances such as a light-shielding property, and is a range of from about 0.1 µm to about less than 50 µm.

Then, as shown in FIG. 7B, the light-shielding coating layer 14A formed in the light-shielding coating layer formation step is pattern-exposed through a mask 70. The mask 70 has a prescribed mask pattern.

During exposure in the present embodiment, the light-shielding coating layer 14 is pattern-exposed, and thus only a portion which is irradiated by light is cured in the light-shielding coating layer 14A. In this embodiment, a mask pattern is used which enables light irradiation at a portion of the light-shielding coating layer 14A in a region excluding the regions which serve as lens apertures 14a of lenses 12 when the lenses 12 are formed in the subsequent processes. In this way, the light-shielding coating layer 14A is cured by light-irradiation excluding portions thereof which are to become the lens apertures 14a of the lenses 12. Examples of radiation which can be used in the exposure preferably include ultraviolet rays such as g-rays, h-rays or i-rays, as in the above embodiments.

Next, by performing an alkali development treatment (developing step), only the light-shielding coating layer 14A in the region corresponding to the lens aperture 14a of the lens 12 which is an uncured region of the light-shielding coating layer 14A in the pattern exposure is eluted by an aqueous alkali solution. At this time, as shown in FIG. 7C, a photo-cured light-shielding coating layer 14A remains on the substrate 10 except for the region for the lens aperture 14a of the lens 12 to form a light-shielding film 14.

Examples of an alkaline agent included in the aqueous alkali solution serving as a developer are the same as those used in the embodiments described above.

Then, after the developing treatment, excess developer is washed and removed, followed by drying.

In the present embodiment, after performing of the coating layer formation step (light-shielding coating layer formation step), exposure step, and developing step, the formed light-shielding film may be optionally cured by post-baking and/or exposure as described above.

Formation of Lens

Next, a step of forming the lenses 12, which is performed after the light-shielding film 14 is formed, will be described.

As shown in FIG. 8A, a molding material M for lenses 12 is applied dropwise using a dispenser 50 onto a substrate 10 on which the patterned light-shielding film 14 has been formed. The molding material M for lenses 12 is supplied so as to cover regions corresponding to the lens apertures 14a of the lenses 12 and so as to also cover a portion of the end of the light-shielding film 14 adjacent to the apertures.

After the molding material M is supplied to the substrate 10, a mold 80 for forming a lens is disposed over the substrate at the side of the substrate 10 where the molding material M has been supplied, as shown in FIG. 8B. The mold 80 has plural concave sections 82 for transferring the shape of lens 12 according to the desirable number of lenses 12.

Then, the mold 80 is pressed onto the molding material M present on the substrate 10, so that the molding material M is deformed according to the shape of the concave sections. The molding material M is cured while the mold 80 is pressed onto the molding material M, by irradiation of heat or ultraviolet light from the outside of the mold when the molding material M is a thermosetting resin or an ultraviolet curable resin.

After the molding material M is cured, the substrate 10 and the lens 12 are released from the mold 80, thereby obtaining a wafer level lens array having a patterned light-shielding film 14 on the substrate 10, as shown in FIG. 8C.

As described above, the patterned light-shielding film 14 to be provided in a wafer level lens is formed not only in a region excluding the lens faces 10a of the lenses 12 as shown in FIG. 5, but the light-shielding film 14 may also be provided in a region excluding the lens apertures 14a of the lenses 12 as shown in FIG. 8C.

In the wafer level lens, generation of reflected light can be inhibited while light-shielding is sufficiently performed in a region other than at the lens face 12a or the lens aperture 14a of the lens 12 by the use of a light-shielding film 14 having a low light reflection ratio which is pattern-formed on at least one side of the substrate 10. Therefore, in a case in which the wafer level lens is applied to an imaging module having an imaging device, defects such as ghosting or flare caused by reflected light during imaging can be prevented.

Further, since the light-shielding film 14 is provided on the surface of the substrate, other light-shielding members need not be placed in the wafer level lens, and increases in production costs can be suppressed.

Further, as in the configuration described in International Application Publication No. 2008/102648 described above, in a case in which the surface around the lens has a concave and convex structure, incident light on the structure is reflected or diffused, and thus there is a risk of causing defects such as ghosting. In this regard, as shown in FIG. 2, when the patterned light-shielding film 14 is provided in a region excluding the lens face 10a of the lens 12, light can be shielded other than at the lens face 10a and the optical performance can be improved.

Light-Shielding Film According to Second Aspect

Next, a light-shielding film according to the second aspect of the invention is described.

The light-shielding film according to the second aspect of the invention is formed on the other surface of the silicon substrate having an imaging device unit on one surface, using the black curable composition according to the second aspect of the present invention. For this reason, the light-shielding film of the present invention has an excellent infrared light-shielding property. In addition, residues are reduced in the vicinity of the light-shielding film (regions where the light-shielding film is not formed on the silicon substrate) in the present invention. Also, the adhesion of the light-shielding film to the silicon substrate can be improved.

The film thickness of the light-shielding film is not particularly limited, and is preferably from 0.1 µm to 10 µm, more preferably from 0.3 µm to 5.0 µm, and most preferably from 0.5 µm to 3.0 µm, from the viewpoints of more efficiently achieving the effects of the present invention. The pattern size of the light-shielding film is not particularly limited, and is preferably 1000 µm or less, more preferably 500 µm or less, and most preferably 300 µm or less from the viewpoints of more efficiently achieving the effects according to the present invention. The lower limit thereof is preferably 1 μm.

A spectral characteristic of the light-shielding film of the present invention is not particularly limited, but a ratio $[OD_{1200}/OD_{365}]$ of the optical density $(OD_{365})$ at a wavelength of 365 nm to the optical density $(OD_{1200})$ at a wavelength of 1200 nm is preferably from 0.5 to 3 from the viewpoints of further improving the infrared light-shielding property, the balance of the light-shielding property of the visible region and the infrared region, and the like.

The optical density (OD) is obtained as an OD value by measuring a transmittance of an obtained film using UV-3600 made by Shimadzu Corporation and converting the obtained transmittance (% T) using the following Equation B.

$$OD\ value = -\mathrm{Log}(\%\ T/100) \quad \text{Equation B}$$

In the second aspect of the invention, the optical density at a wavelength λ nm is denoted by "$OD_\lambda$."

From the viewpoints of further improving the infrared light-shielding property, the balance of the light-shielding property of the visible region and the infrared region, the optical density of the light-shielding film satisfies the following conditions from the viewpoints of efficiently achieving the effects according to the present invention. That is to say:

The ratio $[OD_{1200}/OD_{365}]$ is more preferably from 1.0 to 2.5 and most preferably from 1.3 to 2.0.

The optical density $[OD_{1200}]$ of the light-shielding film at a wavelength of 1200 nm is preferably from 1.5 to 10, and more preferably from 2 to 10.

The optical density $(OD_{365})$ is preferably from 1 to 7, and more preferably 2 to 6 at a wavelength of 365 nm of the light-shielding film.

The optical density of the light-shielding film at a wavelength range of 900 nm to 1300 nm is preferably from 2 to 10, more preferably from 2 to 9, and most preferably from 2 to 8.

The ratio $[OD_{900}/OD_{365}]$ of the light-shielding film is preferably from 1.0 to 2.5, and more preferably from 1.1 to 2.5.

The ratio $[OD_{1100}/OD_{365}]$ of the light-shielding film is preferably from 0.6 to 2.5, and more preferably from 0.7 to 2.5.

The ratio $[OD_{1300}/OD_{365}]$ of the light-shielding film is preferably from 0.4 to 2.3, and more preferably from 0.5 to 2.0.

Detailed examples of the light-shielding film according to the second of the present invention described above include the light-shielding film described as an application of the black curable composition according to the second aspect of the invention.

Production Method of Light-Shielding Film According to Second Aspect

The light-shielding film according to the second aspect of the present invention is manufactured by: applying the black curable composition according to the second aspect of the invention described above on the other surface of a silicon substrate provided with an imaging device unit on one surface to form a black curable composition layer (hereinbelow, also referred to as "photosensor layer" or "photosensitive layer") (hereinbelow, also referred to as "photosensitive layer formation process"); subjecting the photosensitive layer to pattern exposure (hereinbelow, referred to as "exposure process"); and developing the photosensitive layer after the exposure to form a pattern (hereinbelow, also referred to as "development process").

According to the production method of the light-shielding film according to the second aspect of the invention, it is possible to reduce residues in regions other than regions where the light-shielding film is formed (hereinbelow, also referred to as "development residues") during the formation of the light-shielding film since the light-shielding film has an excellent infrared light-shielding property, and it is possible to manufacture the light-shielding film of which the adhesion to members in the silicon substrate side is improved.

Hereinbelow, each process in the production method of a light-shielding color filter of the present invention is described.

Photosensitive Layer Formation Process

In the photosensitive layer formation process, the black curable composition of the present invention is applied on the substrate to form a photosensitive layer.

Examples of a method of applying the black curable composition according to the second aspect of the invention on the silicon substrate include various coating methods such as slit coating, an inkjet method, spin coating, cast coating, roll coating, or a screen printing method The applied film thickness (dried film thickness) of the black curable composition is preferably from 0.35 μm to 3.0 μm, and more preferably from 0.50 μm to 2.5 μm, from the viewpoints of the resolution and the developability.

The black curable composition applied on the silicon substrate is typically dried under the conditions at temperatures of from 70° C. to 130° C. for two minutes to four minutes, and as a result, a photosensitive layer is formed.

Also, in a case in which the black curable composition of the present invention is attached to, for example, nozzles of ejectors of an application device, tubes of the application device, inside of the application device, and the like, it can be easily cleaned and removed using well-known cleaning liquids. In this case, for more efficient cleaning and removal, the solvent included in the black curable composition of the present invention, which is described above, is preferably used as cleaning liquid.

Also, the cleaning liquid disclosed in JP-A No. 7-128867, JP-A No. 7-146562, JP-A No. 8-278637, JP-A No. 2000-273370, JP-A No. 2006-85140, JP-A No. 2006-291191, JP-A No. 2007-2101, JP-A No. 2007-2102, JP-A No. 2007-281523, and so on, may be appropriately used as cleaning liquid for cleaning and removing the black curable composition of the present invention.

Alkyleneglycol monoalkyl ether carboxylate or alkylglycol monoalkyl ether is preferably used as the cleaning liquid.

The solvents used as the cleaning liquid may be used alone or in a mixture of two or more kinds thereof.

In a case of mixing two or more kinds of solvents, a mixed solvent obtained by mixing a solvent having a hydroxyl group and a solvent not having the hydroxyl group is preferable. A mass ratio between the solvent having the hydroxyl group and the solvent not having the hydroxyl group is 1/99 to 99/1, preferably 10/90 to 90/10, and more preferably 20/80 to 80/20. The mixed solvent uses a mixed solvent of propyleneglycol monomethyl ether acetate (PGMEA) and propyleneglycol monomethyl ether (PGME), and the ratio is most preferably 60/40.

In order to improve the permeability of the cleaning liquid to the black curable composition, the surfactant, described above, which is contained in the black curable composition may be added in the cleaning liquid.

Exposure Process

In the exposure process, the photosensitive layer formed in the photosensitive layer formation process is subjected to pattern exposure using, for example, a mask. When exposure is performed using a mask, the portion of the coating film which is irradiated with light is cured.

The exposure is preferably performed by irradiation of a radiation, and as the radiant rays used for the exposure, ultraviolet rays such as g rays, h rays, or i rays are preferably used, and a high pressure mercury or the like more preferably is used. The irradiation intensity is 5 mJ to 3000 mJ, more preferably 10 mJ to 2000 mJ, and most preferably 10 mJ to 1000 mJ.

Development Process

Following the exposure process, the photosensitive layer formed after the exposure is developed by, for example, alkali development treatment to form a pattern. In the development process, parts of the photosensitive layer to which light is not irradiated in the exposure process are dissolved in an alkali aqueous solution to leave light-irradiated parts.

A developer is preferably an organic alkali developer since it does not damage underlying circuits. The development temperature is typically 20° C. to 30° C., and the development time 20 to 240 seconds.

An aqueous alkali solution diluted with pure water is used as the developer, such that the concentration of an organic alkali compound is from 0.001% by mass to 10% by mass, and preferably from 0.01% by mass to 1% by mass. Examples of the organic alkali compound include aqueous ammonia, ethyl amine, diethyl amine, dimethylethanol amine, tetramethyl ammonium hydroxide, tetraethyl ammonium hydroxide, choline, pyrrole, piperidine, and 1,8-diazabicyclo[5,4,0]-7-undecene. In a case of using the alkaline aqueous solution as a developer, generally, cleaning (rinsing) with pure water is performed after the development.

In an embodiment, the production method according to the second aspect of the invention may optionally include a curing process in which the pattern obtained after the development is cured by heating and/or exposure, after the photosensitive layer formation process, the exposure process, and the development process.

Solid-State Imaging Device According to Second Aspect

A solid-state imaging device according to the second aspect of the present invention has the light-shielding film according to the second aspect of the present invention on the other surface of a silicon substrate provided with an imaging device unit on one surface.

That is to say, since the solid-state imaging device of the present invention has the light-shielding film formed using the black curable composition according to the second aspect of the present invention, noise caused by infrared light incident on the silicon substrate (a base body of the solid-state imaging device) from a surface opposite to the surface provided with the imaging device unit, or noise caused by residues are reduced.

A structure of the solid-state imaging device of the present invention is not particularly limited as long as the silicon substrate is provided with the imaging device unit (specifically, the imaging device unit has a configuration where plural imaging devices are arranged, for example, in a matrix) on one surface and the light-shielding film of the present invention on the other surface.

The imaging device may be a CCD or a CMOS.

Among them, as disclosed in JP-A No. 2009-99591 or JP-A No. 2009-158863, a structure of the solid-state imaging device having metal electrodes for connection to a mounting substrate (hereinbelow, also referred to as "circuit board") on a surface opposite to a surface where the imaging device unit is formed is suitable for a structure of the solid-state imaging device of the present invention.

In other words, a suitable embodiment of the solid-state imaging device of the present invention is a solid-state imaging device which has a silicon substrate having the imaging device unit on one surface (referred to as "first main surface" or "front face" in some cases), metal electrodes which are provided on the other surface (hereinbelow, also referred to as "second main surface") of the silicon substrate and are electrically connected to the imaging device unit, and the light-shielding film of the present invention which is provided on the surface where the metal electrodes of the silicon substrate are provided and is patterned to expose at least a portion of the metal electrodes.

First, for comparison with an embodiment described above, a solid-state imaging device in the related art having employed a wire bonding method is described.

The solid-state imaging device in the related art is connected to a circuit board by the wire bonding method.

Specifically, the solid-state imaging device is disposed on the circuit board, and electrodes for connection provide in the imaging device unit side of the silicon substrate and electrodes for connection on the circuit board are connected to each other by wires. In the structure employing the wire bonding method, an area of the bonding regions increases and thus it is difficult to minimize a camera module.

In contrast, the solid-state imaging device according to one embodiment described above is connected to a mounting substrate (hereinbelow, also referred to as "circuit board") via connection materials such as solder balls, not the wires.

The connection between the solid-state imaging device according to one embodiment described above and the circuit board is performed by arranging the solid-state imaging device and the circuit board such that the metal electrodes and the electrodes for connection on the circuit board are opposite to each other, and by connecting the metal electrodes to the electrodes for connection via the connection materials (for example, see FIGS. 9 and 10 described below).

Like the solid-state imaging device according to one embodiment described above (without using the wires), since the wire bonding space is saved by using the solid-state imaging device connected to the circuit board via the metal electrodes in the other surface, it is possible to greatly minimize the camera module (for example, see "Toshiba Corporation New Release "About reinforcement of CMOS image sensor business by CMOS camera module internal development promotion for cellular phones" [online] Oct. 1, 2007 [Searched on Nov. 12, 2009], Internet<URL: http://www.toshiba.co.jp/about/press/2007_10/pr_j0102.htm>").

However, in the case of using the solid-state imaging device connected to the circuit board via the metal electrodes on the other surface side, because of the thickness of the metal electrodes or the size of the connection materials (for example, solder balls 260), a gap between the solid-state imaging device and the circuit board is easily generated, and infrared light is easily incident on the silicon substrate through the gap.

Also, for example, in a case of a camera module 200 described below, it is provided with a light-shielding and electron shield 44, but it is very difficult to perfectly remove the gap S between the light-shielding and electron shield 244 and the circuit board 270, in terms of processing accuracy due to a volume unbalance of the solder balls 260.

For the reasons described above, the structure of the solid-state imaging device connected to the circuit board via the metal electrodes on the other surface has a great necessity for blocking infrared light incident from the other surface of the silicon substrate.

Therefore, in such a structure, the effects of the present invention (improvement of infrared light-shielding property and reduction in noise caused by infrared light) are further exerted.

The solid-state imaging device having the metal electrodes on the other surface has a structure where the metal electrodes are required to be connected to the circuit board via the connection materials for connection.

Therefore, in such a structure, the effects of the present invention (reduction in residues and reduction in noise caused by the residues) are further exerted.

In one embodiment described above, a protection insulating layer such as a solder resist layer may be formed on an overlying layer of the metal electrodes (a side apart from the silicon substrate) towards an underlying layer of the light-shielding film (a side close to the silicon substrate).

That is, one embodiment described above may have a form where the protection insulating layer provided on the second main surface where the metal electrodes are formed and patterned to expose at least a portion of the metal electrodes is formed, and the light-shielding film covers the protection insulating layer and is patterned to expose at least a portion of the metal electrodes.

In one embodiment described above, the meaning of "electrical connection" is not limited to direct connection, but includes indirect connection via peripheral circuits.

The solder resist may be arbitrarily selected depending on constituent components of the metal electrodes or the like, but examples thereof include a solder resist containing the following thermosetting resins.

Examples of the thermosetting resin which can be used include a radical polymerizable resin having an unsaturated double bond such as an epoxy resin, a phenol resin, a bismaleimide resin, a cyanate resin, a diallyl phthalate resin, an unsaturated polyester resin, a polyimide resin, a melamine resin, a urea resin, and an epoxy acrylate and the epoxy resin is preferred. The resin consisting of the solder resist may be used alone or in combination of an epoxy resin and other resins.

It is thought that when the thermosetting resin included in the solder resist contains the epoxy resin, thereby the adhesion of the light-shielding film to the silicon substrate side (solder resist) can be further improved as compared with when the solder resist does not contain the epoxy resin.

This is thought to be since the adhesion between the light-shielding film formed by the black curable composition and the solder resist increases due to the ring-opening polymerization reaction resulting from a strong acid group such as a phosphoric acid group or a sulfonic acid group included in the (2B) dispersion resin in the black curable composition.

The content of the epoxy resin in the solder resist is preferably 10% by mass to 80% by mass, and more preferably 30% by mass to 60% by mass, from the viewpoints of further improvement of the adhesion.

Examples of other components contained in the solder resist include well-known constituent materials such as an photopolymerization initiator, a sensitizer or a colorant.

Hereinbelow, although specific examples of one embodiment described above are described with reference to FIGS. 9 and 10, but the present invention is not limited to the following specific examples.

Figure 9:
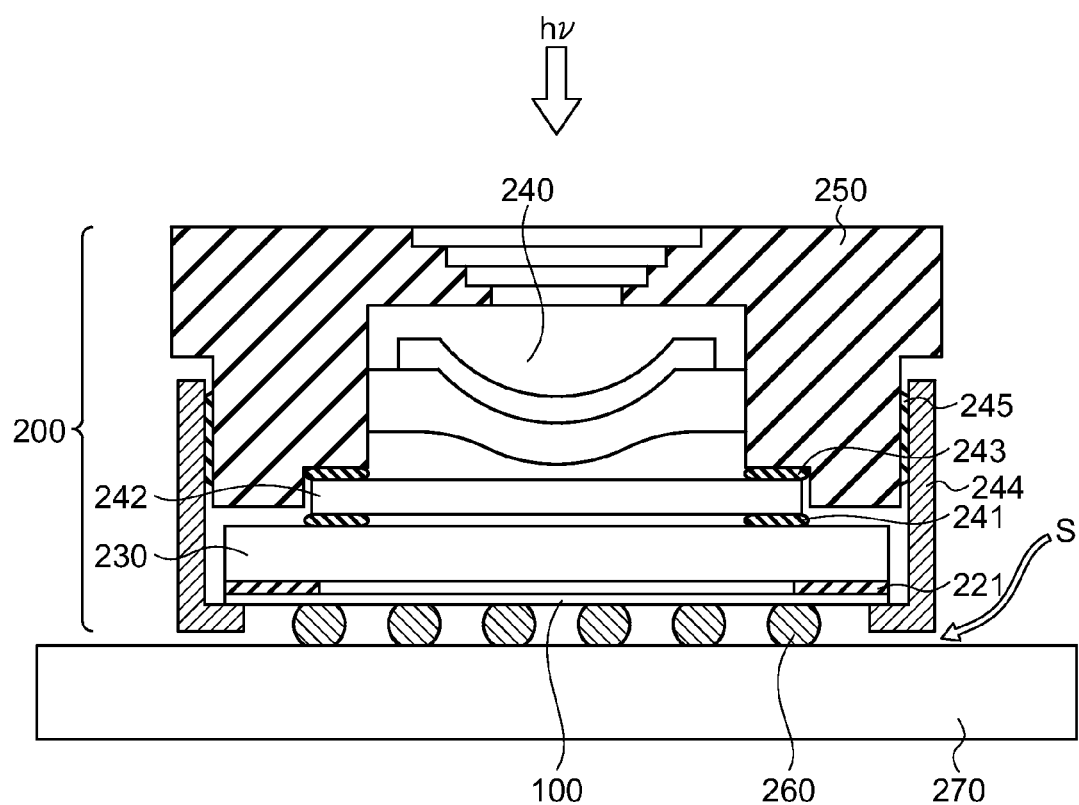
FIG. 9 is a schematic cross-sectional view showing the configuration of a camera module including the solid-state imaging device according to one example of the present invention.
Figure 10:
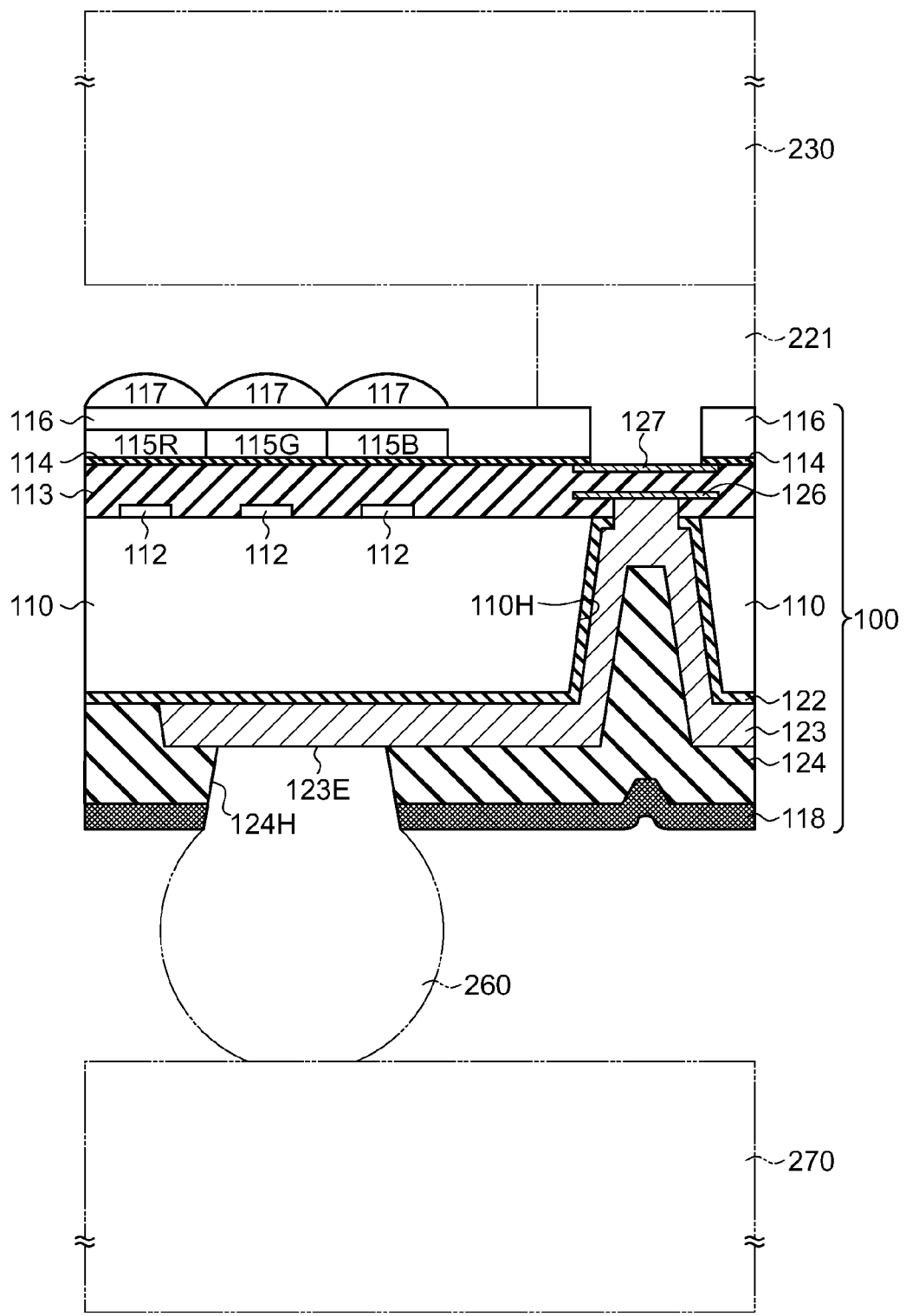
FIG. 10 is a schematic cross-sectional view of the solid-state imaging device according to one example of the second or third aspect of the present invention.

The same reference numerals are used to represent the parts through FIGS. 9 and 10.

In the description, "on," "over," and "upper side" indicate a far side when seen from a silicon substrate 110, and "down," "under," and "lower side" indicate a side close to the silicon substrate 110.

FIG. 9 is a schematic sectional view illustrating a configuration of a camera module having a solid-state imaging device related to the specific example of one embodiment described above.

A camera module 200 shown in FIG. 9 is connected to a circuit board 270 which is a mounting substrate via solder balls 260 which are connection members.

Specifically, the camera module 200 includes a solid-state imaging device substrate 100 having an imaging device unit on a first main surface of a silicon substrate, a glass substrate 230 (light transmissive substrate) disposed over the first main surface side of the solid-state imaging device substrate 100, an infrared light cut filter 242 disposed over the glass substrate 230, a lens holder 250 which is disposed over the glass substrate 230 and the infrared light cut filter 242 and has an imaging lens 240 in its inner space, and a light-shielding and electron shield 244 which is disposed to surround the periphery of the solid-state imaging device substrate 100 and the glass substrate 230. The members are adhered by the adhesives 221, 241, 243 and 245.

In the camera module 200, external incident light hv sequentially transmits the imaging lens 240, the infrared light cut filter 242, and glass substrate 230, and then reaches an imaging device unit of the solid-state imaging device substrate 100.

The camera module 200 is connected to the circuit board 270 in a second main surface side of the solid-state imaging device substrate 100 via the solder balls 260 (connection materials).

FIG. 10 is an enlarged sectional view of the solid-state imaging device substrate 100 in FIG. 9.

The solid-state imaging device substrate 100 includes a silicon substrate 110 as a base body, imaging devices 112, an interlayered insulating layer 113, a base layer 114, a red color filter 115R, a green color filter 115G, a blue color filter 115B, an overcoat 116, micro lenses 117, a light-shielding film 118, an insulating layer 122, a metal electrode 123, a solder resist layer 124, an internal electrode 126, and an element surface electrode 127.

However, the solder resist layer 124 may be omitted.

First, a configuration of the first main surface of the solid-state imaging device substrate 100 is mainly described.

As shown in FIG. 10, the imaging device unit where the imaging devices 112 such as CCD or CMOS are arranged in plurality in a two-dimensional manner are provided on the first main surface of the silicon substrate 110 which is a base body of the solid-state imaging device substrate 100.

On the imaging devices 112 in the imaging device unit, the interlayered insulating layer 113 is formed, and, the base layer 114 is formed on the interlayered insulating layer 113. Further, the red color filter 115R, the green color filter 115O and the blue color filter 115B (hereinbelow, collectively referred to as "color filters 115" in some cases) are respectively disposed on the base layer 114 to correspond to the imaging devices 112.

A light-shielding film (not shown) may be provided in the boundaries of the red color filter 115R, the green color filter 115O and the blue color filter 115B, and the periphery of the imaging device unit. This light-shielding film may be manufactured by, for example, a well-known black color resist.

The overcoat 116 is formed on the color filters 115, and the micro-lenses 117 are formed on the overcoat 116 to the imaging devices 112 (color filters 115).

Also, peripheral circuits (not shown) and the internal electrode 126 are provided in the periphery of the imaging device unit on the first main surface, and the internal electrode 126 is connected to the imaging devices 112 via the peripheral circuits.

The element surface electrode 127 is formed on the internal electrode 126 via the interlayered insulating layer 113. In the interlayered insulating layer 113 between the internal electrode 126 and the element surface electrode 127, a contact plug (not shown) for electrically connecting them to each other is formed. The element surface electrode 127 is used to apply voltages or to read signals via the contact plug and the internal electrode 126.

The base layer 114 is formed on the element surface electrode 127. The overcoat 116 is formed on the base layer 114. The base layer 114 and the overcoat 116 formed on the element surface electrode 127 are opened to form a pad aperture which exposes a portion of the element surface electrode 127.

The above description is for the configuration of the first main surface side of the solid-state imaging device substrate 100.

In the first main surface side of the solid-state imaging device substrate 100, an adhesive 221 is provided in the vicinity of the imaging device unit, and the solid-state imaging device substrate 100 is adhered to the glass substrate 230 via the adhesive 221.

The silicon substrate 110 has a through-hole penetrating the silicon substrate 110, and a penetrating electrode which is a portion of the metal electrode 123 is disposed in the through-hole. The imaging device unit is electrically connected to the circuit board 270 via the penetrating electrode.

Next, a configuration in the second main surface side of the solid-state imaging device substrate 100 is mainly described.

In the second main surface side, the insulating layer 122 is formed from the second main surface through the inner wall of the through-hole.

On the insulating layer 122, the patterned metal electrode 123 is provided from the region on the second main surface of the silicon substrate 110 to the inside of the through-hole. The metal electrode 123 is an electrode for connecting the imaging device unit of the solid-state imaging device substrate 100 to the circuit board 270.

The penetrating electrode is a part formed inside the through-hole, of the metal electrode 123. The penetrating electrode penetrates the silicon substrate 110 and a portion of the interlayered insulating layer, reaches the lower side of the internal electrode 126 and is electrically connected to the internal electrode 126.

Further, in the second main surface side, the solder resist layer 124 (protection insulating layer) is provided which covers the second main surface where the metal electrode 123 is formed, and has an aperture for exposing a portion of the metal electrode 123.

Also, in the second main surface side, the light-shielding film 118 is provided which covers the second main surface where the solder resist layer 124 is formed, and has the aperture for exposing a portion of the metal electrode 123.

As the light-shielding film 118, the light-shielding film of the present invention described above is used.

Thereby, it is possible to block infrared light incident on the silicon substrate 110 from the second main surface side (other surface side). Also, the development residues are suppressed in the aperture of the light-shielding film 118 (the part exposing the metal electrode 123). For these reasons, good connection between the metal electrode 123 and the solder balls 260, and further good connection between the imaging device unit constituted by the imaging devices 112 and the circuit board 270 are maintained.

Further, the adhesion of the light-shielding film 118 to the silicon substrate 110 side is improved.

In FIG. 10, although the light-shielding film 118 is patterned so as to cover a portion of the metal electrode 123 and expose the remaining portion, it may be patterned so as to expose the entire metal electrode 123 (this is true of the patterning of the solder resist layer 124).

Also, the solder resist layer 124 may be omitted, and the light-shielding film 118 may be directly formed on the second main surface where the metal electrode 123 is formed.

The solder ball 260 is provided as a connection member on the exposed metal electrode 123, and the metal electrode 123 of the solid-state imaging device substrate 100 is electrically connected to electrodes for connection (not shown) of the circuit board 270 via the solder ball 260.

In this way, although the configuration of the solid-state imaging device substrate 100 is described, each part excluding the light-shielding film 118 of the solid-state imaging device substrate 100 may be formed by a well-known method such as a method disclosed in paragraph [0033] to [0068] in JP-A No. 2009-158863 or a method disclosed in paragraph 0036 to 0065 in JP-A No. 2009-99591.

The light-shielding film 118 may be formed according to the production method of the light-shielding film of the present invention.

The interlayered insulating layer 113 is formed as a $SiO_2$ layer or a SiN layer by, for example, sputtering, CVD (chemical vapor deposition), or the like.

The color filters 115 are formed by a photolithography using, for example, a well-known color resist.

The overcoat 116 and the base layer 114 are formed by the photolithography using, for example, a well-known resist for forming an organic layer between layers.

The micro lenses 117 are formed by the photolithography using, for example, a styrene-based resin or the like.

The solder resist layer 124 is formed by the photolithography using, for example, a well-known solder resist such as a phenol-based resin, a polyimide-based resin, or an amine-based resin.

The solder balls 260 are formed as, for example, Sn—Pb (eutectic), 95 Pb—Sn (high-leaded high-melting-point solder), Pb-free solder, using Sn—Ag, Sn—Cu, Sn—Ag—Cu, or the like. The solder ball 260 is formed as a sphere with, for example, a diameter of 100 μm to 1000 μm (preferably, a diameter of 150 μm to 700 μm).

The internal electrode 126 and the element surface electrode 127 are formed as a metal electrode of Cu or the like, by, for example, CMP (Chemical Mechanical Polishing), or the photolithography and etching.

The metal electrode 123 is formed as a metal electrode of Cu, Au, Al, Ni, W, Pt, Mo, Cu compound, W compound, Mo compound, or the like, by, for example, sputtering, photolithography, etching, or electrolytic plating. The metal electrode 123 may be formed of a single layer or a multi-layer including two or more layers.

The film thickness of the metal electrode 123 is, for example, 0.1 μm to 20 μm (preferably, 0.1 μm to 10 μm). The silicon substrate 110 is not particularly limited, but may use a silicon substrate which is thinned by peeling the other surface. The thickness of the substrate is not limited, but may be a silicon wafer having the thickness of, for example, 20 μm to 200 μm (preferably, 30 to 150 μm).

The through-hole of the silicon substrate 110 is formed by, for example, the photolithography and an RIE (Reactive Ion Etching).

As described above, although the solid-state imaging device substrate 100 which is the specific example of one embodiment is described with reference to FIGS. 9 and 10, one embodiment described above is not limited to the form in FIGS. 9 and 10, and a configuration is not particularly limited as long as the configuration has the metal electrode and the light-shielding film in the other surface side.

Light-Shielding Color Filter for Solid-State Imaging Device and Production Method Thereof According to Third Aspect Next, a light-shielding color filter for a solid-state imaging device and a production method thereof according to the third aspect of the present invention is described.

The light-shielding color filter for a solid-state imaging device of the present invention has a pattern obtained by using the black curable composition of the present invention.

A production method of the light-shielding color filter for a solid-state imaging device of the present invention includes processes where the black curable composition of the present invention is applied on a support, which is then exposed via a mask and developed to form a pattern.

Specifically, the production method includes: applying the black curable composition according to the third aspect of the invention described above on a support to form a black curable composition layer (hereinbelow, properly referred to as "black curable composition layer formation process"); subjecting the black curable composition layer to light through a mask (hereinbelow, properly referred to as "exposure process"); and developing the black curable composition layer after the exposure to form a pattern (hereinbelow, properly referred to as "development process").

More specifically, the black curable composition according to the third aspect of the present invention is applied on a support (substrate) directly or via another layer to form a black curable composition layer (i.e., black curable composition layer formation process), only the portions of the black curable composition which are irradiated by light are cured using a predetermined mask pattern (i.e., exposure process), and development is carried out using a developer (i.e., development process), thereby forming a patterned film formed of black pixels, whereby a light-shielding color filter for a solid-state imaging device according to the third aspect of the invention is produced.

Hereinbelow, each process in the production method of the light-shielding color filter for a solid-state imaging device of the present invention is described.

[Black Curable Composition Layer Formation Process]

In the black curable composition layer formation process, the black curable composition of the present invention is applied on the support to form the black curable composition layer.

Examples of the support used in this process include soda glass used for a liquid crystal display, alkali-free glass, Pyrex (registered trademark) glass, quartz glass, and glass obtained by attaching a transparent conductive film to them, or a photoelectric conversion element substrate used for a solid-state imaging device or the like examples of which include silicon substrate or the like, and a complementary metal oxide semiconductor (CMOS).

An underlying layer may be provided in the support, optionally, for the purpose of improvement of adhesion to an overlying layer, prevention of diffusion of materials, or planarization of a substrate surface.

As the method of applying the black curable composition of the present invention on the support, various kinds of application methods such as a slit application, a spray application method, an inkjet method, a rotation application, a casting application, a roll application, a screen printing method, or the like may be used.

The applied film thickness of the black curable composition after drying is preferably from 0.35 µm to 1.5 µm, and more preferably from 0.40 µm to 1.0 µm, from the viewpoints of the resolution and the developability.

The black curable composition applied on the support is typically dried under the conditions at temperatures of 70° C. to 110° C. for two minutes to four minutes, and then forms the black curable composition layer.

[Exposure Process]

In the exposure process, the black curable composition layer formed in the black curable composition layer formation process is exposed using, for a mask, and then only applied parts which are irradiated by light are cured using a predetermined mask pattern.

The exposure is preferably performed by radiation, and as the radiant rays used during the exposure, particularly, ultraviolet rays such as g rays, h rays, or i rays are preferably used, and among them, the i rays are preferable, and the lithography is more preferably an i-ray stepper. An irradiation intensity is 5 mJ/cm$^2$ to 1500 mJ/cm$^2$, more preferably 10 mJ/cm$^2$ to 1000 mJ/cm$^2$, and most preferably 10 mJ/cm$^2$ to 800 mJ/cm$^2$.

[Development Process]

Following the exposure process, the black curable composition layer after the exposure is developed by alkali development treatment (development treatment) and parts thereof to which light is not irradiated in the exposure process are dissolved in an alkali aqueous solution. Thereby, only the light-cured parts remain.

A developer is preferably an organic alkali developer since it does not damage underlying circuits. The development temperature is typically 20° C. to 30° C., and the development time 20 to 90 seconds.

An aqueous alkali solution diluted with pure water is used as the developer, such that the concentration of an organic alkali compound is from 0.001% by mass to 10% by mass, and preferably from 0.01% by mass to 1% by mass. Examples of the organic alkali compound include aqueous ammonia, ethyl amine, diethyl amine, dimethylethanol amine, tetramethyl ammonium hydroxide, tetraethyl ammonium hydroxide, choline, pyrrole, piperidine, and 1,8-diazabicyclo[5,4,0]-7-undecene. In a case of using the alkaline aqueous solution as a developer, generally, cleaning (rinsing) with pure water is performed after the development.

Further, an inorganic alkali may be used in a developer. Preferable examples of the inorganic alkali include sodium hydroxide, potassium hydroxide, sodium carbonate, sodium hydrogen carbonate, sodium silicate, sodium metasilicate, and the like.

In an embodiment, the production method according to the third aspect of the invention may optionally include a curing process in which the thus-formed pattern is cured by heating and/or exposure, after the black curable composition layer formation process, the exposure process, and the development process.

The light-shielding color filter for a solid-state imaging device in the present invention can be manufactured through the black curable composition layer formation process, the exposure process, and the development (also, optionally, the curing process) described above.

Also, in the black curable composition layer formation process, the (A) inorganic pigment in the black curable composition may be changed to a colorant of a desired color (for example, a pigment or a dye of a chromatic color) and thereby a chromatic color curable composition may form chromatic color curable composition layers corresponding to RGB (hereinbelow, referred to as "chromatic color curable composition layer formation process").

Therefore, for example, in the light-shielding color filter for a solid-state imaging device obtained as described above, the chromatic color curable composition layer formation process, the exposure process, and the development process (further, optionally, the curing process) are repeated for a number of desired colors, and thereby color filters having chromatic color patterns of the desired colors are formed.

[Solid-State Imaging Device According to Third Aspect]

A solid-state imaging device in the present invention has the light-shielding color filter for a solid-state imaging device of the present invention. Since the light-shielding color filter for a solid-state imaging device in the present invention uses the black curable composition of the present invention, a formed pattern exhibits a high adhesion to the support, and since the cured black curable composition has an excellent development-resistance, the exposure sensitivity is good and thus the adhesion of the exposure portion to the substrate is good, and it is possible to form a high resolution pattern which gives a desired cross-sectional shape. Therefore, the solid-state imaging device is suitable for a high resolution CCD element or a CMOS or the like of which the resolution exceeds one million pixels.

The light-shielding color filter for a solid-state imaging device in the present invention may be used as, for example, a light-shielding color filter for a solid-state imaging device which is disposed between a light sensing unit of each pixel constituting a CCD and a micro lens for collecting light.

The black curable composition according to the third aspect of the present invention may be used to manufacture a solid-state imaging device. Specifically, in a case in which, in a silicon substrate having one surface (this surface is also referred to as "first main surface") and the other surface (this surface is also referred to as "second main surface"), an imaging device unit is formed on the one surface, and an infrared light-shielding film is formed on the other surface, the black curable composition according to the present invention may be used to form the infrared light-shielding film. In addition, the black curable composition according to the present invention may be used to manufacture a light-shielding color filter which is formed at a desired position on the first main surface where the imaging device unit of the solid-state imaging device is formed and has a function of blocking light entering unintentionally.

Hereinbelow, such an embodiment is described.

Solid-State Imaging Device According to Third Aspect

A solid-state imaging device according to the third aspect of the invention has the infrared light-shielding film according to the third aspect of the invention on the other surface of a silicon substrate provided with an imaging device unit on one surface.

That is to say, since the solid-state imaging device of the invention has the infrared light-shielding film formed using the photosensitive resin composition according to the third aspect of the present invention, noise caused by infrared light incident on the silicon substrate (a base body of the solid-state imaging device) from a surface opposite to the surface provided with the imaging device unit, or noise caused by residues are reduced.

A structure of the solid-state imaging device according to the third aspect of the invention is not particularly limited as long as the silicon substrate is provided with the imaging device unit (specifically, the imaging device unit has a configuration where plural imaging devices are arranged, for example, in a matrix) on one surface and the infrared light-shielding film according to the third aspect of the invention on the other surface.

The imaging device may be a CCD or a CMOS.

Among them, as disclosed in JP-A No. 2009-99591 or JP-A No. 2009-158863, a structure of the solid-state imaging device having metal electrodes for connection to a mounting substrate (hereinbelow, also referred to as "circuit board") on a surface opposite to a surface where the imaging device unit is formed is suitable for a structure of the solid-state imaging device according to the third aspect of the invention.

In other words, a suitable embodiment of the solid-state imaging device according to the third aspect of the invention is a solid-state imaging device which has a silicon substrate having the imaging device unit on one surface (referred to as "first main surface" or "front face" in some cases), metal electrodes which are provided on the other surface (hereinbelow, also referred to as "second main surface") of the silicon substrate and are electrically connected to the imaging device unit, and the infrared light-shielding film according to the third aspect of the invention which is provided on the surface where the metal electrodes of the silicon substrate are provided and is patterned to expose at least a portion of the metal electrodes.

First, for comparison with an embodiment described above, a solid-state imaging device in the related art having employed a wire bonding method is described.

The solid-state imaging device in the related art is connected to a circuit board by the wire bonding method.

Specifically, the solid-state imaging device is disposed on the circuit board, and electrodes for connection provide in the imaging device unit side of the silicon substrate and electrodes for connection on the circuit board are connected to each other by wires. In the structure employing the wire bonding method, an area of the bonding regions increases and thus it is difficult to minimize a camera module.

In contrast, the solid-state imaging device according to one embodiment described above is connected to a mounting substrate (hereinbelow, also referred to as "circuit board") via connection materials such as solder balls, not the wires.

The connection between the solid-state imaging device according to one embodiment described above and the circuit board is performed by arranging the solid-state imaging device and the circuit board such that the metal electrodes and the electrodes for connection on the circuit board are opposite to each other, and by connecting the metal electrodes to the electrodes for connection via the connection materials (for example, see FIGS. 9 and 10 described below).

Like the solid-state imaging device according to one embodiment described above (without using the wires), since the wire bonding space is saved by using the solid-state imaging device connected to the circuit board via the metal electrodes in the other surface, it is possible to greatly minimize the camera module (for example, see "Toshiba Corporation New Release "About reinforcement of CMOS image sensor business by CMOS camera module internal development promotion for cellular phones").

However, in the case of using the solid-state imaging device connected to the circuit board via the metal electrodes on the other surface side, because of the thickness of the metal electrodes or the size of the connection materials (for example, solder balls 260), a gap between the solid-state imaging device and the circuit board is easily generated, and infrared light is easily incident on the silicon substrate through the gap.

Also, for example, in a case of a camera module 200 described below, it is provided with a light-shielding and electron shield 44, but it is very difficult to perfectly remove the gap S between the light-shielding and electron shield 244 and the circuit board 270, in terms of processing accuracy due to a volume unbalance of the solder balls 260.

For the reasons described above, the structure of the solid-state imaging device connected to the circuit board via the metal electrodes on the other surface has a great necessity for blocking infrared light incident from the other surface of the silicon substrate.

Therefore, in such a structure, the effects of the present invention (improvement of infrared light-shielding property and reduction in noise caused by infrared light) are further exerted.

The solid-state imaging device having the metal electrodes on the other surface has a structure where the metal electrodes are required to be connected to the circuit board via the connection materials for connection.

Therefore, in such a structure, the effects of the present invention (reduction in residues and reduction in noise caused by the residues) are further exerted.

In one embodiment described above, a protection insulating layer such as a solder resist layer may be formed on an overlying layer of the metal electrodes (a side apart from the silicon substrate) towards an underlying layer of the infrared light-shielding film (a side close to the silicon substrate).

That is, one embodiment described above may have a form where the protection insulating layer provided on the second main surface where the metal electrodes are formed and patterned to expose at least a portion of the metal electrodes is formed, and the infrared light-shielding film covers the protection insulating layer and is patterned to expose at least a portion of the metal electrodes.

In one embodiment described above, the meaning of "electrical connection" is not limited to direct connection, but includes indirect connection via peripheral circuits.

Hereinbelow, although specific examples of one embodiment described above are described with reference to FIGS. 9 and 10, but the present invention is not limited to the following specific examples.

FIG. 9 is a schematic sectional view illustrating a configuration of a camera module having a solid-state imaging device related to the specific example of one embodiment described above.

FIG. 10 is an enlarged sectional view of the solid-state imaging device substrate 100 in FIG. 9.

The same reference numerals are used to represent the parts through FIGS. 9 and 10.

In the description, "on," "over," and "upper side" indicate a far side when seen from a silicon substrate 110, and "down," "under," and "lower side" indicate a side close to the silicon substrate 110.

A camera module 200 shown in FIG. 9 is connected to a circuit board 270 which is a mounting substrate via solder balls 260 which are connection members.

Specifically, the camera module 200 includes a solid-state imaging device substrate 100 having an imaging device unit on a first main surface of a silicon substrate, a glass substrate 230 (light transmissive substrate) disposed over the first main surface side of the solid-state imaging device substrate 100, an infrared light cut filter 242 disposed over the glass substrate 230, a lens holder 250 which is disposed over the glass substrate 230 and the infrared light cut filter 242 and has an imaging lens 240 in its inner space, and a light-shielding and electron shield 244 which is disposed to surround the periphery of the solid-state imaging device substrate 100 and the glass substrate 230. The members are adhered by the adhesives 221, 241, 243 and 245.

In the camera module 200, external incident light hv sequentially transmits the imaging lens 240, the infrared light cut filter 242, and glass substrate 230, and then reaches an imaging device unit of the solid-state imaging device substrate 100.

The camera module 200 is connected to the circuit board 270 in a second main surface side of the solid-state imaging device substrate 100 via the solder balls 260 (connection materials).

As shown in FIG. 10, the solid-state imaging device substrate 100 includes a silicon substrate 110 as a base body, imaging devices 112 formed on the first main surface of the silicon substrate 110, an interlayered insulating layer 113, a base layer 114, a red color filter 115R, a green color filter 115G, a blue color filter 115B, an overcoat 116, micro lenses 117, an internal electrode 126 and an element surface electrode 127, and an insulating layer 122, a metal electrode 123, a solder resist layer 124, and an infrared light-shielding film 118, which are formed in the second main surface of the silicon substrate 110. The internal electrode 126 and the metal electrode 123 are electrically connected at a portion at which a through-hole 110H that connects the first and second main surfaces is provided.

However, the solder' resist layer 124 may be omitted.

First, a configuration of the first main surface of the solid-state imaging device substrate 100 is mainly described.

As shown in FIG. 10, the imaging device unit where the imaging devices 112 such as CCD or CMOS are arranged in plurality in a two-dimensional manner are provided on the first main surface of the silicon substrate 110 which is a base body of the solid-state imaging device substrate 100.

On the imaging devices 112 in the imaging device unit, the interlayered insulating layer 113 is formed, and, the base layer 114 is formed on the interlayered insulating layer 113. Further, the red color filter 115R, the green color filter 115G, and the blue color filter 115B (hereinbelow, collectively referred to as "color filters 115" in some cases) are respectively disposed on the base layer 114 to correspond to the imaging devices 112.

A light-shielding film (not shown) may be provided in the boundaries of the red color filter 115R, the green color filter 115G, and the blue color filter 115B, and the periphery of the imaging device unit. This light-shielding film may be manufactured by, for example, a well-known black color resist.

The overcoat 116 is formed on the color filters 115, and the micro-lenses 117 are formed on the overcoat 116 to the imaging devices 112 (color filters 115).

Also, peripheral circuits (not shown) and the internal electrode 126 are provided in the periphery of the imaging device unit on the first main surface, and the internal electrode 126 is connected to the imaging devices 112 via the peripheral circuits.

The element surface electrode 127 is formed on the internal electrode 126 via the interlayered insulating layer 113. In the interlayered insulating layer 113 between the internal electrode 126 and the element surface electrode 127, a contact plug (not shown) for electrically connecting them to each other is formed. The element surface electrode 127 is used to apply voltages or to read signals via the contact plug and the internal electrode 126.

The base layer 114 is formed on the element surface electrode 127. The overcoat 116 is formed on the base layer 114. The base layer 114 and the overcoat 116 formed on the element surface electrode 127 are opened to form a pad aperture which exposes a portion of the element surface electrode 127.

The above description is for the configuration of the first main surface side of the solid-state imaging device substrate 100.

In the first main surface side of the solid-state imaging device substrate 100, an adhesive 221 is provided in the vicinity of the imaging device unit, and the solid-state imaging device substrate 100 is adhered to the glass substrate 230 via the adhesive 221.

The silicon substrate 110 has a through-hole penetrating the silicon substrate 110, and a penetrating electrode which is a portion of the metal electrode 123 is disposed in the through-hole. The imaging device unit is electrically connected to the circuit board 270 via the penetrating electrode.

Next, a configuration of the second main surface side of the solid-state imaging device substrate 100 is described.

On the second main surface of the silicon substrate 110, the insulating layer 122 is formed from the first main surface through the inner wall of the through-hole 110H.

On the insulating layer 122, the patterned metal electrode 123 is provided from the region on the second main surface of the silicon substrate 110 to the inside of the through-hole 110H. The metal electrode 123 is an electrode for connecting the imaging device unit of the solid-state imaging device substrate 100 to the circuit board 270.

The penetrating electrode is a part formed inside the through-hole 110H, of the metal electrode 123. The penetrating electrode penetrates the silicon substrate 110 and a portion of the interlayered insulating layer, reaches the lower side of the internal electrode 126 and is electrically connected to the internal electrode 126.

Further, on the second main surface, the solder resist layer 124 (protection insulating layer) is provided which covers the second main surface where the metal electrode 123 is formed, and has an aperture 124H for exposing a portion 123E of the metal electrode 123.

Also, the infrared light-shielding film 118 which covers the solder resist layer 124 excluding the aperture 124H is provided over the solder resist layer 124.

The infrared light-shielding film 118 is formed by a lithography using the black curable composition according to the present invention.

Thereby, infrared light incident on the silicon substrate 110 from the second main surface side is blocked. Also, the development residues are suppressed in the metal electrode 123. For this reason, good connection between the exposed portion 123E of the metal electrode 123 and the solder balls 260, and further good connection between the imaging device unit constituted by the imaging devices 112 and the circuit board 270 are maintained.

In FIG. 10, although the infrared light-shielding film 118 is patterned so as to cover the parts excluding the exposed part 123E of the metal electrode 123, it may be patterned so as to expose the entire metal electrode 123 (this is true of the patterning of the solder resist layer 124).

Also, the solder resist layer 124 may be omitted, and the infrared light-shielding film 118 may be directly formed over the metal electrode 123 so as to come into contact with the metal electrode 123.

The solder ball 260 is provided as a connection member on the exposed portion 123E of metal electrode 123, and the metal electrode 123 of the solid-state imaging device substrate 100 is electrically connected to electrodes for connection (not shown) of the circuit board 270 via the solder ball 260.

In this way, although the configuration of the solid-state imaging device substrate 100 is described, each part excluding the light-shielding film 118 of the solid-state imaging device substrate 100 may be formed by a well-known method such as a method disclosed in paragraph [0033] to [0068] in JP-A No. 2009-158863 or a method disclosed in paragraph 0036 to 0065 in JP-A No. 2009-99591.

The infrared light-shielding film 118 may be formed according to the production method of the infrared light-shielding film of the present invention.

The interlayered insulating layer 113 is formed as a $SiO_2$ layer or a SiN layer by, for example, sputtering, CVD (chemical vapor deposition), or the like.

The color filters 115 are formed by a photolithography using, for example, a well-known color resist.

The overcoat 116 and the base layer 114 are formed by the photolithography using, for example, a well-known resist for forming an organic layer between layers.

The micro lenses 117 are formed by the photolithography using, for example, a styrene-based resin or the like.

The solder resist layer 124 is formed by the photolithography using, for example, a well-known solder resist such as a phenol-based resin, a polyimide-based resin, or an amine-based resin.

The solder balls 260 are formed as, for example, Sn—Pb (eutectic), 95 Pb—Sn (high-leaded high-melting-point solder), Pb-free solder, using Sn—Ag, Sn—Cu, Sn—Ag—Cu, or the like. The solder ball 260 is formed as a sphere with, for example, a diameter of 100 μm to 1000 μm (preferably, a diameter of 150 μm to 700 μm).

The internal electrode 126 and the element surface electrode 127 are formed as a metal electrode of Cu or the like, by, for example, CMP (Chemical Mechanical Polishing), or the photolithography and etching.

The metal electrode 123 is formed as a metal electrode of Cu, Au, Al, Ni, W, Pt, Mo, Cu compound, W compound, Mo compound, or the like, by, for example, sputtering, photolithography, etching, or electrolytic plating. The metal electrode 123 may be formed of a single layer or a multi-layer including two or more layers.

The film thickness of the metal electrode 123 is, for example, 0.1 μm to 20 μm (preferably, 0.1 μm to 10 μm).

The silicon substrate may be a silicon wafer having the thickness of, for example, 10 μm to 10,000 μm (preferably, 100 to 1,000 μm).

The through-hole of the silicon substrate 10 is formed by, for example, the photolithography and an RIE (Reactive Ion Etching).

As described above, although the solid-state imaging device substrate 100 which is the specific example of one embodiment is described with reference to FIGS. 9 and 10, one embodiment described above is not limited to the form in FIGS. 9 and 10, and a configuration is not particularly limited as long as the configuration has the metal electrode and the light-shielding film in the other surface side.

Infrared Light-Shielding Film According to Third Aspect

The infrared light-shielding film is formed on the second main surface of the silicon substrate as described above.

For this reason, the infrared light-shielding film of the present invention has an excellent infrared light block property.

Also, residues are decreased in the vicinity (regions where the infrared light-shielding film is not formed on the silicon substrate) of the infrared light-shielding film of the present invention.

The film thickness of the infrared light-shielding film is not particularly limited, and is preferably 0.1 μm to 10 μm, more preferably 0.3 μm to 5.0 μm, and most preferably 0.5 μm to 3.0 μm, from the viewpoints of more efficiently achieving the effects of the present invention. The pattern size of the infrared light-shielding film is not particularly limited, and is preferably 1000 μm or less, more preferably 500 μm or less, and most preferably 300 μm or less from the viewpoints of efficiently achieving the effects according to the present invention. The lower limit thereof is preferably 1 µm.

A spectral characteristic of the light-shielding film of the present invention is not particularly limited, but a ratio [$OD_{1200}/OD_{365}$] of the optical density ($OD_{365}$) at a wavelength of 365 nm to the optical density ($OD_{1200}$) at a wavelength of 1200 nm is preferably from 0.5 to 3 from the viewpoints of further improving the infrared light-shielding property, the balance of the light-shielding property of the visible region and the infrared region, and the like.

The optical density (OD) is obtained as an OD value by measuring a transmittance of an obtained film using UV-3600 made by Shimadzu Corporation and converting the obtained transmittance (% T) using the following Equation B.

$$\text{OD value} = -\text{Log}(\% T/100) \qquad \text{Equation B}$$

In the third aspect of the invention, the optical density at a wavelength λ nm is denoted by "$OD_\lambda$."

From the viewpoints of further improving the infrared light-shielding property, the balance of the light-shielding property of the visible region and the infrared region, the optical density of the light-shielding film satisfies the following conditions from the viewpoints of efficiently achieving the effects according to the present invention. That is to say:

The ratio [$OD_{1200}/OD_{365}$] is more preferably from 1.0 to 2.5 and most preferably from 1.3 to 2.0.

The optical density [$OD_{1200}$] of the light-shielding film at a wavelength of 1200 nm is preferably from 1.5 to 10, and more preferably from 2 to 10.

The optical density ($OD_{365}$) is preferably from 1 to 7, and more preferably 2 to 6 at a wavelength of 365 nm of the light-shielding film.

The optical density of the light-shielding film at a wavelength range of 900 nm to 1300 nm is preferably from 2 to 10, more preferably from 2 to 9, and most preferably from 2 to 8.

The ratio [$OD_{900}/OD_{365}$] of the light-shielding film is preferably from 1.0 to 2.5, and more preferably from 1.1 to 2.5.

The ratio [$OD_{1100}/OD_{365}$] of the light-shielding film is preferably from 0.6 to 2.5, and more preferably from 0.7 to 2.5.

The ratio [$OD_{1300}/OD_{365}$] of the light-shielding film is preferably from 0.4 to 2.3, and more preferably from 0.5 to 2.0.

Detailed examples of the infrared light-shielding film according to the third aspect of the present invention described above include the titanium black dispersion and the infrared light-shielding film described as an application of the photosensitive resin composition according to the third aspect of the invention.

Production Method of Infrared Light-Shielding Film According to Third Aspect

The light-shielding film according to the third aspect of the invention is manufactured by: applying the black curable composition according to the third aspect of the invention described above on the second main surface of a silicon substrate provided with an imaging device unit on the first main surface to form a photosensitive layer (hereinbelow, also referred to as "photosensitive layer formation process"); subjecting the photosensitive layer to pattern exposed (hereinbelow, referred to as "exposure process"); and developing the photosensitive layer after the exposure to form a pattern (hereinbelow, also referred to as "development process").

According to the production method of the light-shielding film according to the third aspect of the invention, it is possible to reduce residues in regions other than regions where the light-shielding film is formed (hereinbelow, also referred to as "development residues") during the formation of the light-shielding film since the light-shielding film has an excellent infrared light-shielding property.

Hereinbelow, each process in the production method of a light-shielding color filter of the present invention is described.

Photosensitive Layer Formation Process

In the photosensitive layer formation layer, an organic solvent solution (hereinbelow, simply referred to as "coating liquid") of the black curable composition according to the present invention is applied on the silicon substrate to remove an organic solvent, thereby forming the photosensitive layer. During the removal of the organic solvent, a means for alleviating the removal of the organic solvent, for example, blowing heated air, may be considered.

Examples of a method of applying the coating liquid on the silicon substrate include various coating methods such as slit coating, an inkjet method, spin coating, cast coating, roll coating, or a screen printing method The applied film thickness (dried film thickness) of the black curable composition is preferably from 0.35 µm to 3.0 µm, and more preferably from 0.50 µm to 2.5 µm, from the viewpoints of the resolution and the developability.

The photosensitive resin composition applied on the silicon substrate is typically dried under the conditions at temperatures of from 70° C. to 130° C. for two minutes to four minutes, and as a result, a photosensitive layer is formed.

Exposure Process

In the exposure process, the photosensitive layer formed in the photosensitive layer formation process is subjected to pattern exposure using, for example, a mask. When exposure is performed using a mask, the portion of the coating film which is irradiated with light is cured.

The exposure is preferably performed by irradiation of radiation, and as the radiant rays used for the exposure, ultraviolet rays such as g rays, h rays, or i rays are preferably used, and a high pressure mercury or the like more preferably is used. The irradiation intensity is 5 mJ to 3000 mJ, more preferably 10 mJ to 2000 mJ, and most preferably 10 mJ to 1000 mJ.

Development Process

Following the exposure process, the photosensitive layer formed after the exposure is developed by, for example, alkali development treatment to form a pattern. In the development process, parts of the photosensitive layer to which light is not irradiated in the exposure process are dissolved in an alkali aqueous solution to leave light-irradiated parts.

A developer is preferably an organic alkali developer since it does not damage underlying circuits. The development temperature is typically 20° C. to 30° C., and the development time 20 to 240 seconds.

An aqueous alkali solution diluted with pure water is used as the developer, such that the concentration of an organic alkali compound is from 0.001% by mass to 10% by mass, and preferably from 0.01% by mass to 1% by mass. Examples of the organic alkali compound include aqueous ammonia, ethyl amine, diethyl amine, dimethylethanol amine, tetramethyl ammonium hydroxide, tetraethyl ammonium hydroxide, choline, pyrrole, piperidine, and 1,8-diazabicyclo[5,4,0]-7-undecene. In a case of using the alkaline aqueous solution as a developer, generally, cleaning (rinsing) with pure water is performed after the development.

In an embodiment, the production method according to the third aspect of the invention may optionally include a curing process in which the pattern obtained after the development is cured by heating and/or exposure, after the photosensitive layer formation process, the exposure process, and the development process.

<<Light-Shielding Color Filter>>

The black curable composition according to the third aspect of the invention may be used to manufacture a light-shielding color filter which is formed at a desired position on the first main surface where the imaging device unit of the solid-state imaging device is formed and has a function of blocking light entering unintentionally. This light-shielding color filter is manufactured in the same manner as the manufacturing of the infrared light-shielding film, and thus the description thereof is omitted.

EXAMPLES

Hereinbelow, the present invention is described in detail with respect to specific examples, but the present invention is not limited to these Examples. Unless otherwise specified, "parts" are based on mass, and "room temperature" means 25° C.

Examples According to First Aspect

Synthesis Example 1-1

Synthesis of Resin (1-1)

According to the following scheme, a phosphoric acid group-containing monomer (1-1) and a macromonomer (1-1) were used to synthesize Resin (1-1) which is a (B1) specific resin according to the first aspect of the present invention.

Resin (1-1) had a weight average molecular weight by means of GPC measurement of 25,000, a number average molecular weight of 11,000, and an acid value of 150 mgKOH/g.

Synthesis Examples 1-2 to 1-9

Synthesis of Resin (1-2) to (1-9)

Resins (1-2) to (1-9) were obtained in the same manner as in Synthesis Example 1-1, except that the monomers and macromonomers shown in Table 1 were used. The weight average molecular weights, number average molecular weights, and acid values of the obtained resins are shown in Table 1.

Synthesis Example 1-10

Synthesis of Resin (1-10)

According to the following scheme, a phosphoric acid group-containing monomer (1-5) and a macromonomer (1-3) were used to synthesize Resin (1-10) which is a (B1) specific resin according to the first aspect of the present invention.

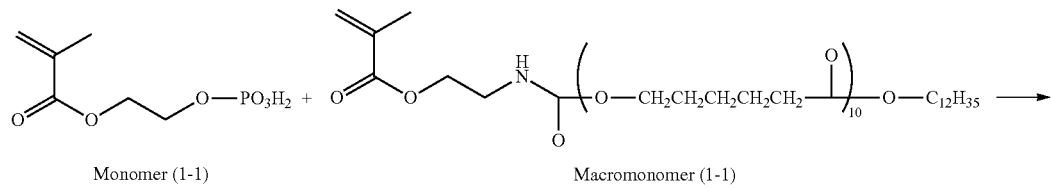

Monomer (1-1)  Macromonomer (1-1)

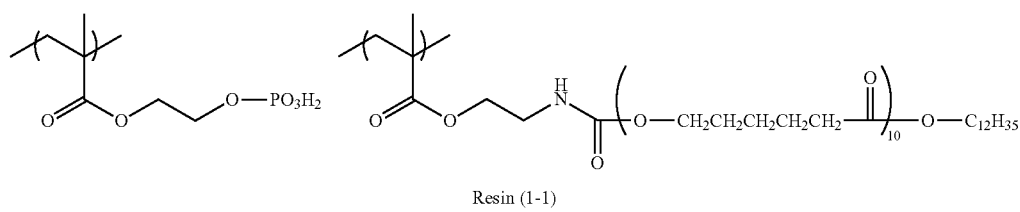

Resin (1-1)

Then, 30 g (0.143 mol) of the monomer (1-1) (PHOSMER M (trade name), manufactured by Unichemical Co., Ltd.), 70 g (0.047 mol, weight average molecular weight (in terms of polystyrene) by means of GPC: 3,100) of the macromonomer (1-1) were added to 233 g of 1-methoxy-2-propanol, followed by heating at 80° C. under a nitrogen air flow. Then, 1.54 g (7.6 mmol) of dodecane thiol and 0.5 g of dimethyl 2,2'-bisobutyrate (V-601 (trade name), manufactured by Wako Pure Chemical Industries, Ltd.) were added thereto, followed by stirring for 2 hours. Then, 0.5 g of dimethyl 2,2'-bisobutyrate (V-601 (trade name), manufactured by Wako Pure Chemical Industries, Ltd.) was added thereto, followed by stirring for 2 hours. Then, 0.5 g of dimethyl 2,2'-bisobutyrate (V-601, manufactured by Wako Pure Chemical Industries, Ltd.) was added thereto, followed by elevating the temperature to 90° C. and stirring for 2 hours, thereby obtaining a 30% by mass solution of Resin (1-1) in 1-methoxy-2-propanol.

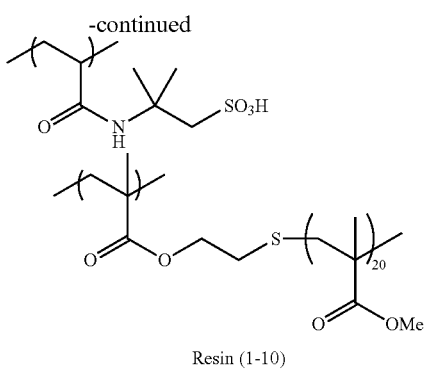

Resin (1-10)

Then, 30 g (0.143 mol) of the monomer (1-5) (manufactured by Tokyo Chemical Industries Co., Ltd.), 70 g (0.017 mol, weight average molecular weight (in terms of polystyrene) by means of GPC: 4,600) of the macromonomer (1-3) were added to 233 g of 1-methoxy-2-propanol, followed by heating at 80° C. under a nitrogen air flow. Then, 1.54 g (7.6 mmol) of dodecane thiol and 0.5 g of dimethyl 2,2'-bisobutyrate (V-601 (trade name), manufactured by Wako Pure Chemical Industries, Ltd.) were added thereto, followed by stirring for 2 hours. Then, 0.5 g of dimethyl 2,2'-bisobutyrate (V-601 (trade name), manufactured by Wako Pure Chemical Industries, Ltd.) was added thereto, followed by stirring for 2 hours. Then, 0.5 g of dimethyl 2,2'-bisobutyrate (V-601, manufactured by Wako Pure Chemical Industries, Ltd.) was added thereto, followed by elevating the temperature to 90° C. and stirring for 2 hours, thereby obtaining a 30% by mass solution of Resin (1-10) in 1-methoxy-2-propanol.

Resin (1-10) had a weight average molecular weight by means of GPC measurement of 31,000, a number average molecular weight of 14,000, and an acid value of 82 mgKOH/g.

Resin (1-1) to Resin (1-10) are resins belonging to the (B1-1) copolymer among the (B1) specific resins according to the first aspect of the invention.

The comparative resin (1-1) is a resin not having any of a phosphoric acid group and a sulfonic acid group in the molecule.

Hereinbelow, the structures of the raw material monomers used in the synthesis are shown.

TABLE 1

| | | Raw material monomers and feed ratios | | | (B1) Physical properties of specific resin | | |
|---|---|---|---|---|---|---|---|
| | | Acid group-containing monomer | Macromonomer | Other monomers | Weight average molecular weight | Number average molecular weight | Acid value (mgKOH/g) |
| Synthesis Example 1-1 | Resin (1-1) | Monomer (1-1)-30 g | Macromonomer (1-1)-70 g | — | 25,000 | 11,000 | 150 |
| Synthesis Example 1-2 | Resin (1-2) | Monomer (1-2)-30 g | Macromonomer (1-1)-70 g | — | 27,000 | 12,000 | 95 |
| Synthesis Example 1-3 | Resin (1-3) | Monomer (1-3)-30 g | Macromonomer (1-1)-70 g | — | 24,000 | 13,000 | 73 |
| Synthesis Example 1-4 | Resin (1-4) | Monomer (1-1)-30 g | Macromonomer (1-2)-70 g | — | 34,000 | 12,000 | 148 |
| Synthesis Example 1-5 | Resin (1-5) | Monomer (1-1)-30 g | Macromonomer (1-3)-70 g | — | 33,000 | 13,000 | 149 |
| Synthesis Example 1-6 | Resin (1-6) | Monomer (1-1)-20 g | Macromonomer (1-1)-70 g | Methacrylic acid 10 g | 22,000 | 10,000 | 159 |
| Synthesis Example 1-7 | Resin (1-7) | Monomer (1-1)-20 g | Macromonomer (1-1)-70 g | Monomer (1-4) 10 g | 23,000 | 11,000 | 106 |
| Synthesis Example 1-8 | Resin (1-8) | Monomer (1-1)-50 g | Macromonomer (1-1)-50 g | — | 19,000 | 8,000 | 255 |
| Synthesis Example 1-9 | Resin (1-9) | Monomer (1-1)-5 g | Macromonomer (1-1)-95 g | — | 42,000 | 20,000 | 23 |
| Synthesis Example 1-10 | Resin (1-10) | Monomer (1-5)-30 g | Macromonomer (1-3)-70 g | — | 31,000 | 14,000 | 82 |
| Synthesis Example 1-11 | Comparative resin (1-1) | Methacrylic acid 30 g | Macromonomer (1-3)-70 g | — | 28,000 | 13,000 | 195 |

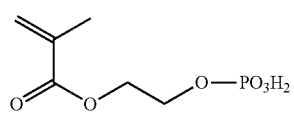

(Monomer (1-1))

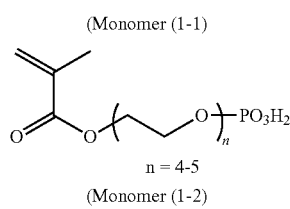

n = 4-5

(Monomer (1-2))

TABLE 1-continued

| | Raw material monomers and feed ratios | | | (B1) Physical properties of specific resin | | |
|---|---|---|---|---|---|---|
| | Acid group-containing monomer | Macromonomer | Other monomers | Weight average molecular weight | Number average molecular weight | Acid value (mgKOH/g) |

Monomer (1-3), n = 5-6

Monomer (1-4)

Monomer (1-5)

Macromonomer (1-1)

Macromonomer (1-2)

Macromonomer (1-3)

Next, among the (B1) specific resins, the methods for synthesizing the resins belonging to the (B1-2) resin is described. Resin (1-11) which is a (B1-2) resin is synthesized according to the following scheme.

Synthesis Example 1-11

Synthesis of Resin (1-11)

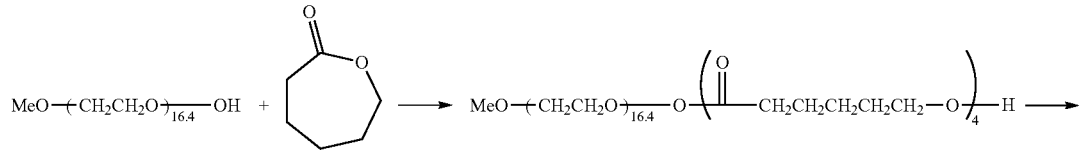

-continued

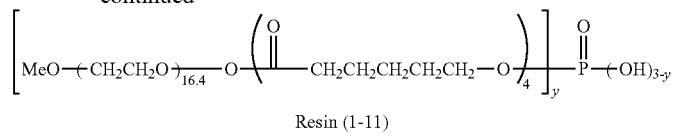

Resin (1-11)

Under a nitrogen atmosphere, 112.5 g (0.15 mol) of polyethylene glycol monomethyl ether having a number average molecular weight of 750, 68.4 g (0.60 mol) ε-caprolactone, and 0.18 g of dibutyl tin laurate were heated at 160° C. for 20 hours to obtain a polyether-polyester monohydroxyl product. The weight average molecular weight by means of GPC measurement thereof was 2,300, and the number average molecular weight thereof was 1,100. Then, 7.0 g of polyphosphoric acid containing 84% phosphorous pentoxide was added to 100 g of the obtained polyether-polyester monohydroxyl product, and then reacted at 80° C. for 5 hours while removing water, thereby obtaining Resin (1-11).

The obtained resin (1-11) had a weight average molecular weight by means of GPC measurement of 2,500 and a number average molecular weight of 1,200. The existence ratio of the phosphoric acid monoester to the phosphoric acid diester (i.e., phosphoric acid monoester: phosphoric acid diester) was found to be 88:12 from $^{31}$P NMR.

Synthesis Example 1-12

Synthesis of Resin (1-12)

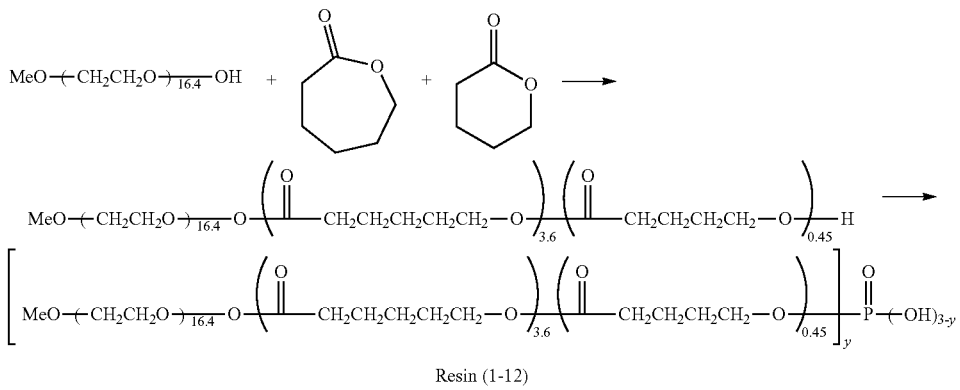

Resin (1-12)

Under a nitrogen atmosphere, 112.5 g (0.15 mol) of polyethylene glycol monomethyl ether having a number average molecular weight of 750, 61.6 g (0.54 mol) of ε-caprolactone, 6.8 g (0.068 mol) of δ-valerolactone, and 0.18 g of dibutyl tin laurate were heated at 160° C. for 20 hours to obtain a polyether-polyester monohydroxyl product. The weight average molecular weight by means of GPC measurement thereof was 2,200, and the number average molecular weight thereof was 1,100. Then, 7.0 g of polyphosphoric acid containing 84% phosphorous pentoxide was added to 100 g of the obtained polyether-polyester monohydroxyl product, and then reacted at 80° C. for 5 hours while removing water, thereby obtaining Resin (1-12).

The obtained resin (1-12) had a weight average molecular weight by means of GPC measurement of 2,400 and a number average molecular weight of 1,300. The existence ratio of the phosphoric acid monoester to the phosphoric acid diester (i.e., phosphoric acid monoester: phosphoric acid diester) was found to be 89:11 from $^{31}$P NMR.

Example 1-1 to Example 1-18 and Comparative Example 1-1

Preparation of Black Curable Composition

1. Preparation of (A1) Inorganic Pigment Dispersion

The components shown in the following composition 1-I were subjected to a high-viscosity distribution process with two rolls to obtain a dispersion. Further, kneading for 30 minutes with a kneader may be carried out before the high-viscosity distribution process.

(Composition 1-I)

| | |
|---|---|
| Titanium black having average primary particle diameter 40 nm (manufactured by Mitsubishi Materials Corporation) (PIGMENT BLACK 35 (trade name)) | 40 parts |
| 30% by mass solution of (B1) specific resin or Comparative Example resin in propylene glycol 1-monomethyl ether 2-acetate | 5 parts |

(The Types of the Resins Used are as Shown in Table 2)

The components shown in the following Composition 1-II were added to the obtained dispersion, followed by stirring for 3 hours using a homogenizer under a condition of 3,000 rpm. The obtained mixed solution was then finely dispersed using a dispersing device (trade name: DISPERMAT, manufactured by VMA-GETZMANN GMBH) with 0.3 mm zirconia beads for 4 hours, thereby obtaining a titanium black dispersion (hereinafter referred to as TB dispersion 1).

(Composition 1-II)

| | |
|---|---|
| 30% by mass solution of any one of Resins (1-1) to (1-12) and Comparative Example resin in propylene glycol 1-monomethyl ether 2-acetate | 20 parts |
| Propylene glycol monomethyl ether acetate | 150 parts |

2. Preparation of Curable Composition

The following composition components were mixed with a mixer to manufacture black curable compositions [(B1-1) to (B1-18), and (B1-21)] of Examples 1-1 to 1-18 and Comparative Example 1-1.

| | |
|---|---|
| 30% by mass solution of alkali-soluble resin (the compound shown in Table 2) in propylene glycol 1-monomethyl ether 2-acetate [(E1) Alkali-soluble resin] | 10 parts |
| Dipentaerythritol hexaacrylate [(C1) polymerizable compound] | 2.0 parts |
| Pentaerythritol triacrylate [(C1) polymerizable compound] | 1.0 part |
| Polymerization initiator (the compound shown in Table 2) [(B1) photopolymerization initiator] | 0.3 part |
| TB dispersion (the dispersion obtained above) | 24 parts |
| Propylene glycol monomethyl ether acetate | 10 parts |
| Ethyl-3-ethoxypropionate | 8 parts |
| γ-Methacryloxy propyltrimethoxysilane | 0.1 part |

Example 1-19

[Preparation of Black Curable Composition (B1-19)]
Preparation of Silver Tin Composition A solution in which 15 g of a tin colloid (average particle: 20 nm, solid content: 20% by weight, manufactured by Sumitomo Osaka Cement Co., Ltd.), 60 g of a silver colloid (average particle: 7 nm, solid content: 20% by weight, manufactured by Sumitomo Osaka Cement Co., Ltd.), and 0.75 g of polyvinyl pyrrolidone were dissolved in 100 ml of water was added to 200 ml of pure water that had been warmed to 60° C., thereby obtaining a colloid solution.

Then, this colloidal solution was stirred for 60 minutes while being maintaining at 60° C., and then irradiated with ultrasonic waves for 5 minutes. Then, this colloidal solution was concentrated by centrifugation to obtain a solution A having a solid content of 25%. The solution A was dried by a freeze-drying method to obtain a silver tin powder sample.

Black curable'compositions (B1-19) of Example 1-19 was prepared in the same manner as in Example 1-1, except that the obtained silver tin powder, instead of titanium black, was dispersed using Resin (1-1) to produce a silver tin dispersion.

Example 1-20

Preparation of Black Curable Composition (B1-20)

Preparation of Ti Black-Red Pigment Composition
(Preparation of Red Pigment Dispersion)

The following composition was subjected to a fine dispersion treatment for 4 hours using 0.3 mm zirconium oxide beads with a dispersing machine (trade name: DISPERMAT, manufactured by VMA-GETZMANN GMBH) to manufacture a red pigment dispersion.

| | |
|---|---|
| C. I. pigment red 254 [(F1) colored component] (recited as PR254 in Table 2) | 30 parts by mass |
| Resin solution (benzyl methacrylate/methacrylic acid/hydroxyethyl methacrylate copolymer, molar ratio: 80/10/10, Mw: 10000, solvent: propylene glycol methyl ether acetate 60%, resin solid content concentration: 40%) | 10 parts by mass |
| Solvent: propylene glycol methyl ether acetate | 200 parts by mass |
| Dispersant: 30% by mass solution of Resin (1-1) in propylene glycol 1-methyl ether 2-acetate | 30 parts by mass |

(Preparation of Curable Composition)

Black curable composition (B1-20) of Example 20 was prepared in the same manner as in Example 1-1, except that a mixture of 20 parts of the titanium black pigment dispersion obtained by using Resin (1-1) and 4 parts of the red pigment dispersion was used instead of the TB dispersion.

Comparative Example 1-2

Preparation of Black Curable Composition Using Carbon Black

Black curable composition (B1-22) was prepared in the same manner as in Example 1-1, except that the titanium black used in Example 1-1 was changed to carbon black (TOKAI BLACK #7400 (trade name) manufactured by Tokai Carbon Co., Ltd., average primary particle diameter: 28 nm), to prepare a carbon black (CB) dispersion.

The structures of the polymerization initiators (I-1) to (I-6) and the alkali-soluble resins (D-1), (D-2) shown in Table 2 are shown below.

TABLE 2

| | Black curable composition | (A1) Inorganic pigment | (B1) Specific resin | (E1) Alkali-soluble resin | (D1) Polymerization initiator |
|---|---|---|---|---|---|
| Example 1-1 | (B1-1) | Titanium black | Resin (1-1) | (D-1) | (I-1) |
| Example 1-2 | (B1-2) | Titanium black | Resin (1-2) | (D-1) | (I-1) |
| Example 1-3 | (B1-3) | Titanium black | Resin (1-3) | (D-1) | (I-1) |
| Example 1-4 | (B1-4) | Titanium black | Resin (1-5) | (D-1) | (I-1) |
| Example 1-5 | (B1-5) | Titanium black | Resin (1-5) | (D-1) | (I-1) |
| Example 1-6 | (B1-6) | Titanium black | Resin (1-6) | (D-1) | (I-1) |
| Example 1-7 | (B1-7) | Titanium black | Resin (1-7) | (D-1) | (I-1) |
| Example 1-8 | (B1-8) | Titanium black | Resin (1-8) | (D-1) | (I-1) |
| Example 1-9 | (B1-9) | Titanium black | Resin (1-9) | (D-1) | (I-1) |
| Example 1-10 | (B1-10) | Titanium black | Resin (1-10) | (D-1) | (I-1) |
| Example 1-11 | (B1-11) | Titanium black | Resin (1-11) | (D-1) | (I-1) |
| Example 1-12 | (B1-12) | Titanium black | Resin (1-12) | (D-1) | (I-1) |
| Example 1-13 | (B1-13) | Titanium black | Resin (1-1) | (D-1) | (I-2) |
| Example 1-14 | (B1-14) | Titanium black | Resin (1-1) | (D-1) | (I-3) |
| Example 1-15 | (B1-15) | Titanium black | Resin (1-1) | (D-1) | (I-4) |
| Example 1-16 | (B1-16) | Titanium black | Resin (1-1) | (D-1) | (I-5) |
| Example 1-17 | (B1-17) | Titanium black | Resin (1-1) | (D-1) | (I-6) |
| Example 1-18 | (B1-18) | Titanium black | Resin (1-1) | (D-2) | (I-1) |

TABLE 2-continued

| Black curable composition | | (A1) Inorganic pigment | (B1) Specific resin | (E1) Alkali-soluble resin | (D1) Polymerization initiator |
|---|---|---|---|---|---|
| Example 1-19 | (B1-19) | Silver-zinc | Resin (1-1) | (D-1) | (I-1) |
| Example 1-20 | (B1-20) | Titanium black/PR254 | Resin (1-1) | (D-1) | (I-1) |
| Comparative Example 1-1 | (B1-21) | Titanium black | Comparative resin (1-1) | (D-1) | (I-1) |
| Comparative Example 1-2 | (B1-22) | Carbon black | Resin (1-1) | (D-1) | (I-1) |

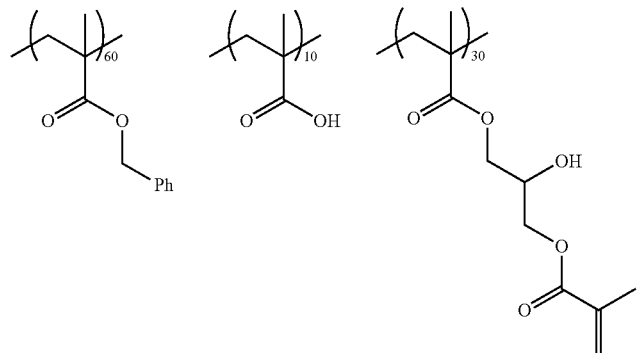

Resin (D-1)
Mw 15,000; Mn 9,000

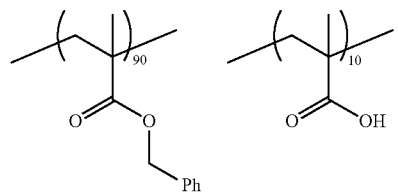

Resin (D-2)
Mw 14,000; Mn 8,000

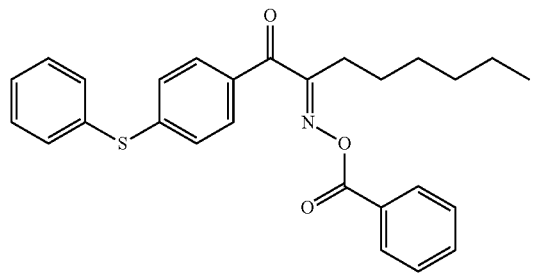

(I-1)
IRUGACURE OXE01
(Ciba Specialty Chemicals Corp.)

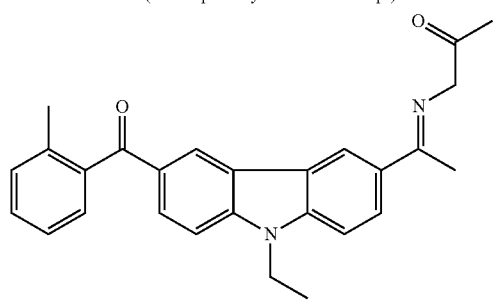

(I-2)
IRUGACURE OXE02
(Ciba Specialty Chemicals Corp.)

TABLE 2-continued

| Black curable composition | (A1) Inorganic pigment | (B1) Specific resin | (E1) Alkali-soluble resin | (D1) Polymerization initiator |
|---|---|---|---|---|

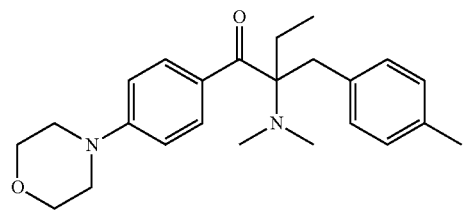

(I-3)
IRUGACURE OXE379
(Ciba Specialty Chemicals Corp.)

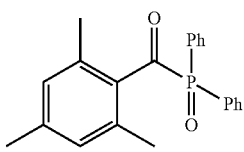

(I-4) DAROCUR TPO
(Ciba Specialty Chemicals Corp.

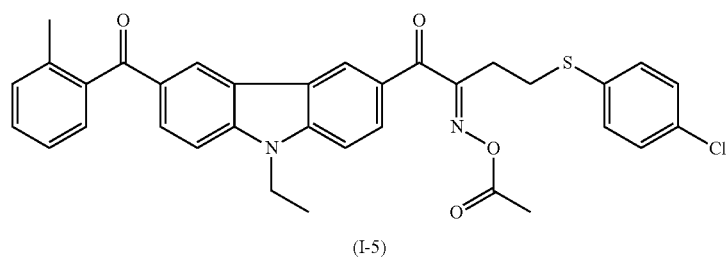

(I-5)

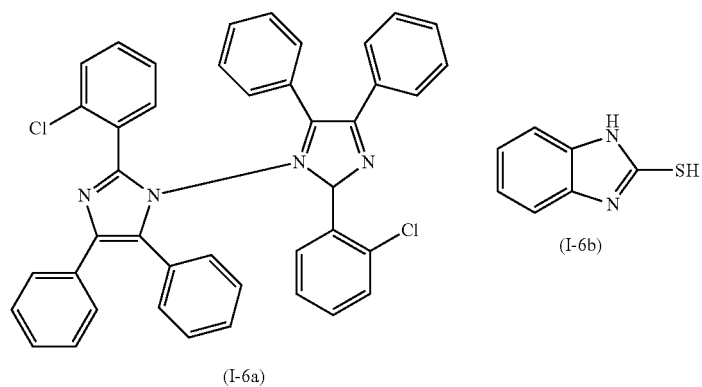

(I-6a)

(I-6):(I-6a)/(I-6b) = 20/10 (mass ratio)

Manufacture and Evaluation of Light-Shielding Film for Wafer Level Lens

By the following procedure, a resin film for formation of a lens was formed using the resin for formation of a lens in order to evaluate the adhesiveness to a lens film or the like.

<1. Formation of Thermosetting Resin Film>

The curable compositions 1 to 4 (2 mL) including the components shown in Table 3 were coated on a 5 cm×5 cm glass substrate (thickness 1 mm, BK7, manufactured by Schott Glass Technologies, Inc.), heated at 200° C. for 1 minute, and cured to form resin films for formation of a lens (films 1 to 4), which enable evaluation of the residues on the lens.

<2. Formation of Photocurable Resin Film>

The curable compositions 5 and 6 (2 mL) shown in Table 3 were coated on a 5 cm×5 cm glass substrate, and cured by irradiation of light at 3000 mJ/cm$^2$ with a metal halide lamp to form resin films for formation of a lens (films 5 and 6), which enable evaluation of the residues on the lens.

TABLE 3

|  |  | Component 1 | Component 2 | Kind of the formed film |
|---|---|---|---|---|
| Film 1 | Curable composition 1 | DOW CORNING(R) SR 7010 (trade name) (manufactured by Dow Corning Toray Co., Ltd.) |  | Thermocurable silicon resin film |
| Film 2 | Curable composition 2 | 1,10-Decanediol diacrylate (NKESTER A-DOG (trade name) manufactured by Shin Nakamura Chemical Co., Ltd.) | Di-t-butyl peroxide(1% by mass) | Thermocurable acryl resin film |
| Film 3 | Curable composition 3 | Alicyclic bisphenol A Liquid epoxy resin (YX8000 (trade name) manufactured by Mitsubishi chemical corporation) |  | Thermocurable epoxy resin film |
| Film 4 | Curable composition 4 | Polydiallyl phthalate (BA901 (trade name) manufactured by Showa Denko K. K.) |  | Thermocurable allyl resin film |
| Film 5 | Curable composition 5 | Trimethylolpropane(meth)acrylate (ARONIX M-309 (trade name) manufactured by Toagosei Co., Ltd.) | 1-Hydroxycyclohexylphenylketone (0.1% by mass) | Thermocurable acryl resin film |
| Film 6 | Curable composition 6 | Alicyclic epoxy resin (EHPE-3150 (trade name) manufactured by Dicel Chemical Industries Ltd.) | Arylsulfonium salt derivative (1% by mass) (SP-172 (trade name) manufactured by ADEKA Corporation) | Thermocurable epoxy resin film |

<3. Evaluation on Resin Film for Formation of Lens>

The coating rotation number of the spin coating was adjusted such that the film thickness after the coating/heating treatment was 2.0 μm, and black curable compositions (B1-1) to (B1-22) were uniformly coated on a glass wafer [support] on which the resin film for formation of a lens (film 5) had been formed, and subjected to a heating treatment on a hot plate at a surface temperature of 120° C. for 120 seconds. Thus, a coated film [black curable composition layer] having a film thickness of 2.0 μm was obtained. Further, for black curable composition (B1-17) obtained in Example 1-17, the resin film for formation of a lens (film 5) was subjected to the same evaluation instead of each of the film 1 to the film 4, and the film 6, and the results are shown in Table 4 below as Example 1-17-1 to Example 1-17-6.

Further, in the Table, for example, the "film 1" is denoted as "1".

[Exposure Step]

Next, the obtained coated layer was subjected to exposure by varying an exposure amount in the range from 100 mJ/cm$^2$ at an interval of 50 mJ/cm$^2$ through a photomask having a 10-mm hole pattern, using a high-pressure mercury lamp.

[Development Step]

The coated layer after exposure above was subjected to a paddle development at 23° C. for 60 seconds using a 0.3% aqueous tetramethyl ammonium hydroxide solution, then rinsed with a spin shower, and then washed with pure water to obtain a light-shielding film having a pattern shape.

The formed light-shielding film was evaluated according to the following criteria, and the results are shown in Table 4 below.

Evaluation of Developability on Resin Film for Formation of Lens

The developed portion of the 10 mm-hole pattern was observed by means of SEM and the number of the residues was determined. A smaller number of the residue indicates better developability.

Evaluation of Adhesion Sensitivity by Exposure

A minimum exposure amount such that the peeling-off did not occur from the substrate in the formed light-shielding film was evaluated as an adhesion sensitivity. A smaller value of the sensitivity indicates that a cured film adhered to the substrate is formed with high sensitivity.

Evaluation of Adhesion to Resin Film for Formation of Lens

The evaluation was performed according to a grid test based on ISO 2409 (1992).

Resins for formation of a lens (films 1 to films 5) were formed by the method on 10×10 cm glass substrates. Then, black curable composition (B1-1) to (B1-22) were coated on the resin films for formation of a lens shown in Table 4 to a film thickness of 2 μm, and irradiated at 1000 mJ/cm$^2$ using a high-pressure mercury lamp to form light-shielding films on the resin films for formation of a lens. Then, 10×10 squares at an interval of 1.0 mm were prepared, attached to a cellophane tape, and pulled upward to check the status of peeling. The squares not peeled-off were checked. A higher number of the remaining squares is evaluated as better adhesion.

Evaluation of Light-Shielding Property

The light-shielding property denotes a maximum transmittance with light at a wavelength of 400 nm to 800 nm in a light-shielding film having a thickness of 2 μm. A lower value is evaluated as a better light-shielding property, and thus, a transmittance of less than 1% is practically is judged as a good level.

TABLE 4

|  | Black curable composition | Lens film | Developability | Adhesion sensitivity (mJ/cm$^2$) | Adhesion (Number of remaining squares) | Light-shielding property (%) |
|---|---|---|---|---|---|---|
| Example 1-1 | (B1-1) | 5 | 1 | 150 | 100 | 0.6 |
| Example 1-2 | (B1-2) | 5 | 2 | 150 | 100 | 0.6 |
| Example 1-3 | (B1-3) | 5 | 1 | 150 | 100 | 0.6 |
| Example 1-4 | (B1-4) | 5 | 1 | 150 | 100 | 0.6 |
| Example 1-5 | (B1-5) | 5 | 6 | 150 | 100 | 0.6 |
| Example 1-6 | (B1-6) | 5 | 1 | 150 | 100 | 0.6 |
| Example 1-7 | (B1-7) | 5 | 2 | 150 | 100 | 0.6 |
| Example 1-8 | (B1-8) | 5 | 1 | 150 | 100 | 0.6 |
| Example 1-9 | (B1-9) | 5 | 6 | 150 | 98 | 0.6 |
| Example 1-10 | (B1-10) | 5 | 4 | 200 | 98 | 0.6 |
| Example 1-11 | (B1-11) | 5 | 0 | 100 | 100 | 0.6 |

TABLE 4-continued

| | Black curable composition | Lens film | Developability | Adhesion sensitivity (mJ/cm²) | Adhesion (Number of remaining squares) | Light-shielding property (%) |
|---|---|---|---|---|---|---|
| Example 1-12 | (B1-12) | 5 | 0 | 100 | 100 | 0.6 |
| Example 1-13 | (B1-13) | 5 | 1 | 150 | 100 | 0.6 |
| Example 1-14 | (B1-14) | 5 | 3 | 300 | 98 | 0.6 |
| Example 1-15 | (B1-15) | 5 | 4 | 300 | 98 | 0.6 |
| Example 1-16 | (B1-16) | 5 | 1 | 150 | 100 | 0.6 |
| Example 1-17-1 | (B1-17) | 5 | 0 | 100 | 100 | 0.6 |
| Example 1-17-2 | (B1-17) | 1 | 0 | 100 | 98 | 0.6 |
| Example 1-17-3 | (B1-17) | 2 | 0 | 100 | 100 | 0.6 |
| Example 1-17-4 | (B1-17) | 3 | 0 | 100 | 100 | 0.6 |
| Example 1-17-5 | (B1-17) | 4 | 0 | 100 | 100 | 0.6 |
| Example 1-17-6 | (B1-17) | 6 | 0 | 100 | 100 | 0.6 |
| Example 1-18 | (B1-18) | 5 | 3 | 350 | 97 | 0.6 |
| Example 1-19 | (B1-19) | 5 | 1 | 500 | 95 | 0.4 |
| Example 1-20 | (B1-20) | 5 | 1 | 150 | 100 | 0.4 |
| Comparative Example 1-1 | (B1-21) | 5 | 10 | 600 | 84 | 0.6 |
| Comparative Example 1-2 | (B1-22) | 5 | 2 | 800 | 62 | 1.0 |

From Table 4, it can be seen that the light-shielding film formed from the black curable composition for a wafer level lens of the present invention has excellent developability, a good pattern forming property, and excellent adhesion sensitivity and adhesion on a resin film for formation of a lens, and thus, excellent adhesion with a lens. Further, all of the formed light-shielding films had excellent light-shielding properties.

Examples According to Second Aspect

Preparation of Black Curable Composition
Preparation of (B2) Dispersion Resin

Synthesis Example 2-1

Synthesis of Resin (2-1)

According to the following scheme, a phosphoric acid group-containing monomer (2-1) and a macromonomer (2-1) were used to synthesize Resin (2-1) which is a (B2) specific resin according to the second aspect of the invention.

Then, 15 g (0.072 mol) of the monomer (2-1) (PHOSMER M (trade name), manufactured by Unichemical Co., Ltd.), 85 g (0.057 mol, weight average molecular weight (in terms of polystyrene) by means of GPC: 3,100) of the macromonomer (2-1) were added to 233 g of 1-methoxy-2-propanol, followed by heating at 80° C. under a nitrogen air flow. Then, 1.54 g (7.6 mmol) of dodecane thiol and 0.5 g of dimethyl 2,2'-bisobutyrate (V-601 (trade name), manufactured by Wako Pure Chemical Industries, Ltd.) were added thereto, followed by stirring for 2 hours. Then, 0.5 g of dimethyl 2,2'-bisobutyrate (V-601 (trade name), manufactured by Wako Pure Chemical Industries, Ltd.) was added thereto, followed by stirring for 2 hours. Then, 0.5 g of dimethyl 2,2'-bisobutyrate (V-601, manufactured by Wako Pure Chemical Industries, Ltd.) was added thereto, followed by elevating the temperature to 90° C. and stirring for 2 hours, thereby obtaining a 30% by mass solution of Resin (2-1) in 1-methoxy-2-propanol.

Resin (2-1) had a weight average molecular weight by means of GPC measurement of 25,000, a number average molecular weight of 11,000, and an acid value (first dissociation) of 40 mgKOH/g.

Synthesis Examples 2-2 to 2-9

Synthesis of Resin (2-2) to Resin (2-9)

Resin (2-2) to Resin (2-9) were obtained in the same manner as in Synthesis Example 2-1, except that the monomers

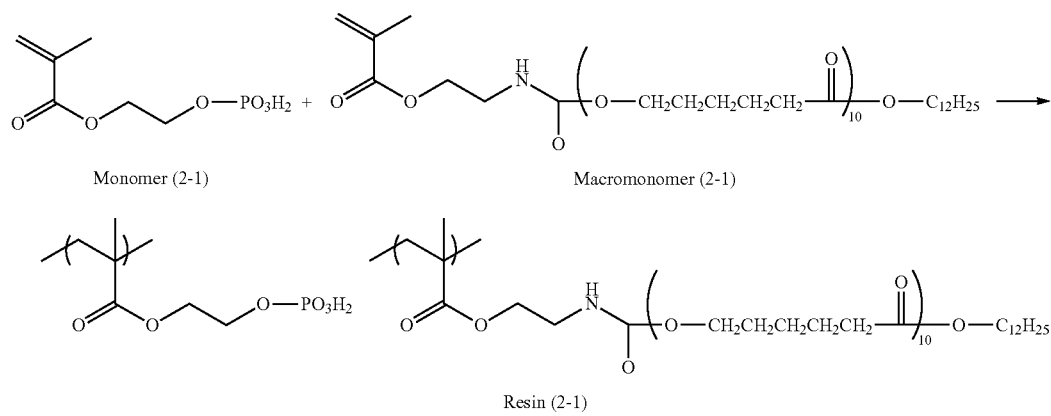

Monomer (2-1)   Macromonomer (2-1)

Resin (2-1)

and the macromonomers shown in Table 5 were used. The weight average molecular weights, the number average molecular weights, and the acid values (first dissociation value when the phosphoric acid is contained) of the obtained resins are shown in Table 5.

The weight average molecular weight of the macromonomer (2-1) was 3,100 as described above, and the weight average molecular weight of the macromonomer (2-3) was 4,600 as described below.

Synthesis Example 2-10

Synthesis of Resin (2-10)

According to the following scheme, a phosphoric acid group-containing monomer (2-5) and a macromonomer (2-3) were used to synthesize Resin (2-10) which is a (B1) specific resin according to the second aspect of the present invention.

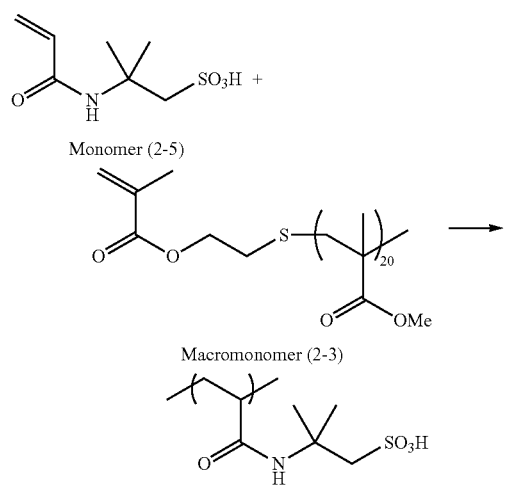

Then, 15 g (0.072 mol) of the monomer (2-5), 85 g (0.021 mol, weight average molecular weight (in terms of polystyrene) by means of GPC: 4,600) of the macromonomer (2-3) were added to 233 g of N-methyl-2-pyrrolidone, followed by heating at 80° C. under a nitrogen air flow. Then, 1.54 g (7.6 mmol) of dodecane thiol and 0.5 g of dimethyl 2,2'-bisobutyrate (V-601 (trade name), manufactured by Wako Pure Chemical Industries, Ltd.) were added thereto, followed by stirring for 2 hours. Then, 0.5 g of dimethyl 2,2'-bisobutyrate (V-601 (trade name), manufactured by Wako Pure Chemical Industries, Ltd.) was added thereto, followed by stirring for 2 hours. Then, 0.5 g of dimethyl 2,2'-bisobutyrate (V-601, manufactured by Wako Pure Chemical Industries, Ltd.) was added thereto, followed by elevating the temperature to 90° C. and stirring for 2 hours, and the polymerization solution was subjected to re-precipitation with 2 L of water, followed by drying. The obtained resin was dissolved in 1-methoxy-2-propanol, thereby obtaining a 30% by mass solution of Resin (2-10) in 1-methoxy-2-propanol.

Resin (2-10) had a weight average molecular weight by means of GPC measurement of 31,000, a number average molecular weight of 14,000, and an acid value of 41 mgKOH/g.

The weight average molecular weight, the number average molecular weight, and the acid value (first dissociation value when the phosphoric acid is contained) of the obtained resin is shown in Table 5.

Resin (2-1) to Resin (2-10) are resins belonging to the (B2-1) copolymer among the (B2) specific resins according to the second aspect of the present invention.

Synthesis Example 2-11

Synthesis of Resin (2-11)

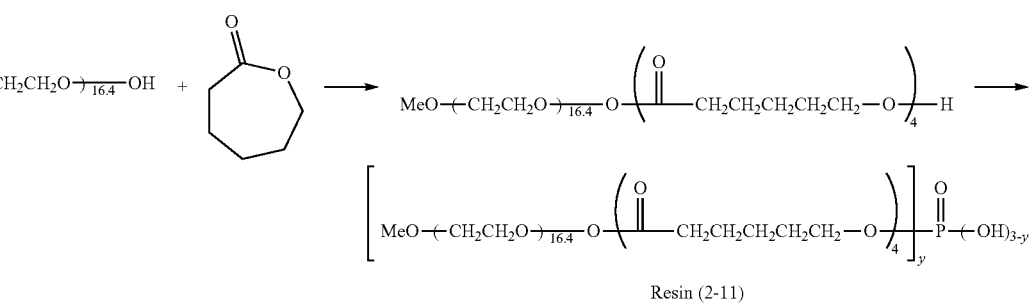

Under a nitrogen atmosphere, 112.5 g (0.15 mol) of polyethylene glycol monomethyl ether having a number average molecular weight of 750, 68.4 g (0.60 mol) of ε-caprolactone, and 0.18 g of dibutyl tin laurate were heated at 160° C. for 20 hours to obtain a polyether-polyester monohydroxyl product. The weight average molecular weight by means of GPC measurement thereof was 2,300, and the number average molecular weight thereof was 1,100. Then, 7.0 g of polyphosphoric acid containing 84% phosphorous pentoxide was added to 100 g of the obtained polyether-polyester monohydroxyl product, and then reacted at 80° C. for 5 hours while removing water, thereby obtaining Resin (2-11).

The obtained resin (2-11) had a weight average molecular weight by means of GPC measurement of 2,500 and a number average molecular weight of 1,200. The content ratio of the phosphoric acid monoester and the phosphoric acid diester (phosphoric acid monoester: the phosphoric acid diester) was 88:12 from $^{31}$P NMR. The acid value was 50 mgKOH/g (a first dissociation value when phosphoric acid is included). The acid value (a first dissociation value when phosphoric acid is included) of the obtained resin is shown in Table 5.

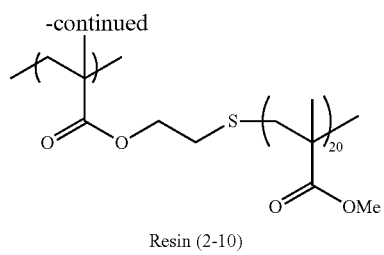

Resin (2-10)

Synthesis Example 2-12
Synthesis of Resin (2-12)

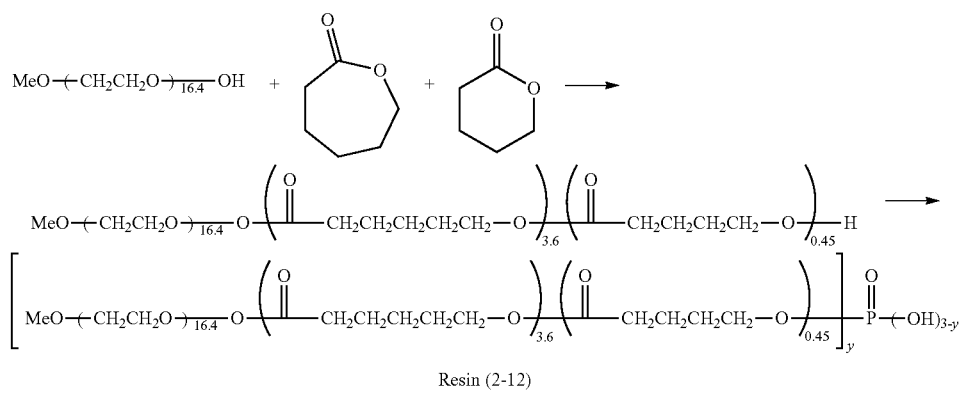

Resin (2-12)

Under a nitrogen atmosphere, 112.5 g (0.15 mol) of polyethylene glycol monomethyl ether having a number average molecular weight of 750, 1.6 g (0.54 mol) of ε-caprolactone, 6.8 g (0.068 mol) of δ-valerolactone, and 0.18 g of dibutyl tin laurate were heated at 160° C. for 20 hours to obtain a polyether-polyester monohydroxyl product. The weight average molecular weight by means of GPC measurement thereof was 2,200, and the number average molecular weight thereof was 1,100. Then, 7.0 g of polyphosphoric acid containing 84% phosphorous pentoxide was added to 100 g of the obtained polyether-polyester monohydroxyl product, and then reacted at 80° C. for 5 hours while removing water, thereby obtaining Resin (2-12).

The obtained resin (2-12) had a weight average molecular weight by means of GPC measurement of 2,400 and a number average molecular weight of 1,300. The existence ratio of the phosphoric acid monoester to the phosphoric acid diester (i.e., phosphoric acid monoester: phosphoric acid diester) was found to be 89:11 from $^{31}$P NMR. The acid value was 48 mgKOH/g (a first dissociation value when phosphoric acid is included). The acid value (a first dissociation value when phosphoric acid is included) of the obtained resin is shown in Table 5.

Synthesis Examples 2-13, 2-14, 2-16, 2-17, 2-22, and 2-23
Synthesis of Resins (2-13), (2-14), (2-16), (2-17), (2-22), and (2-23)

Resins (2-13), (2-14), (2-16), (2-17), (2-22), and (2-23) were synthesized in the same manner as in Synthesis Example 2-1, except that the amounts of the monomer (2-1) and macromonomer (2-1) used were changed to those shown in Table 5.

Synthesis Example 2-15
Synthesis of Resin (2-15)

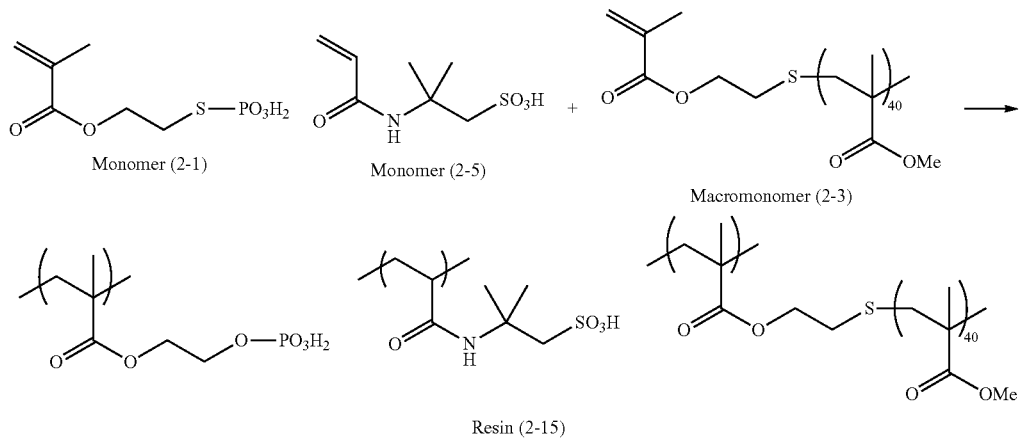

Resin (2-15)

First, 5 g (0.024 mol) of the monomer (2-1) (PHOSMER M (trade name), manufactured by Unichemical Co., Ltd.), 10 g (0.048 mol) of the monomer (2-5) (product of Tokyo Chemical Industry Co., Ltd.), and 85 g (0.021 mol, weight average molecular weight by means of GPC (in terms of polystyrene): 4,600) of the macromonomer (2-3) were added to 233 g of N-methyl-2-pyrrolidone, followed by heating at 80° C. under a nitrogen air flow. Then, 1.54 g (7.6 mmol) of dodecane thiol and 0.5 g of dimethyl 2,2'-bisisobutyrate (V-601 (trade name), manufactured by Wako Pure Chemical Industries, Ltd.) were added thereto, followed by stirring for 2 hours. Then, 0.5 g of dimethyl 2,2'-bisisobutyrate (V-601 (trade name), manufactured by Wako Pure Chemical Industries, Ltd.) was added thereto, followed by further stirring for 2 hours. Then, 0.5 g of dimethyl 2,2'-bisisobutyrate (V-601, manufactured by Wako Pure Chemical Industries, Ltd.) was added thereto, followed by elevating the temperature to 90° C. and stirring for 2 hours, and the polymerization solution was re-precipitated with 2 L of water, followed by drying. The obtained resin was dissolved in 1-methoxy-2-propanol, thereby obtaining a 30% by mass solution of Resin (2-15) in 1-methoxy-2-propanol. The weight average molecular weight by means of GPC measurement was 29,000, the number average molecular weight was 12,000 and the acid value was 39 mgKOH/g.

Synthesis Examples 2-18 to 2-21

Synthesis of Resin (2-18) to Resin (2-21)

Resin (2-18) to Resin (2-21) were synthesized in the same manner as in Synthesis Example 2-1, except that the macromonomer (2-4) to the macromonomer (2-7) as described below were used, respectively, instead of the macromonomer (2-1) used in Synthesis Example 2-1.

TABLE 5

| | (B2) Specific resin or comparative resin | | Feed ratio of raw material monomers | | | | Physical properties of (B2) specific resin | | |
|---|---|---|---|---|---|---|---|---|---|
| | | | Acid group-containing monomer | Macromonomer | Weight average molecular weight | Other monomers | Weight average molecular weight | Number average molecular weight | Acid value (mgKOH/g) |
| Synthesis Example 2-1 | Resin (2-1) | (B2-1) Copolymer | Monomer (2-1) 15 g | Macromonomer (2-1) 85 g | 3,100 | — | 25,000 | 11,000 | 40 |
| Synthesis Example 2-2 | Resin (2-2) | | Monomer (2-2) 20 g | Macromonomer (2-1) 80 g | 3,100 | — | 27,000 | 12,000 | 33 |
| Synthesis Example 2-3 | Resin (2-3) | | Monomer (2-3) 30 g | Macromonomer (2-1) 70 g | 3,100 | — | 24,000 | 13,000 | 37 |
| Synthesis Example 2-4 | Resin (2-4) | | Monomer (2-1) 15 g | Macromonomer (2-2) 85 g | 9,200 | — | 34,000 | 12,000 | 39 |
| Synthesis Example 2-5 | Resin (2-5) | | Monomer (2-1) 15 g | Macromonomer (2-3) 85 g | 4,600 | — | 33,000 | 13,000 | 41 |
| Synthesis Example 2-6 | Resin (2-6) | | Monomer (2-1) 15 g | Macromonomer (2-1) 70 g | 3,100 | Benzyl methacrylate 15 g | 22,000 | 10,000 | 40 |
| Synthesis Example 2-7 | Resin (2-7) | | Monomer (2-1) 20 g | Macromonomer (2-1) 70 g | 3,100 | Monomer (2-4) 10 g | 23,000 | 11,000 | 53 |
| Synthesis Example 2-8 | Resin (2-8) | | Monomer (2-1) 28 g | Macromonomer (2-1) 72 g | 3,100 | — | 19,000 | 8,000 | 75 |
| Synthesis Example 2-9 | Resin (2-9) | | Monomer (2-1) 11 g | Macromonomer (2-1) 89 g | 3,100 | — | 42,000 | 20,000 | 11 |
| Synthesis Example 2-10 | Resin (2-10) | | Monomer (2-5) 15 g | Macromonomer (2-3) 85 g | 4,600 | — | 31,000 | 14,000 | 41 |
| Synthesis Example 2-11 | Resin (2-11) | (B2-2) Resin | — | — | — | — | — | — | 50 |
| Synthesis Example 2-12 | Resin (2-12) | | — | — | — | — | — | — | 48 |
| Synthesis Example 2-13 | Resin (2-13) | (B2-1) Copolymer | Monomer (2-1) 37 g | Macromonomer (2-1) 63 g | 3,100 | — | 23,000 | 13,000 | 100 |
| Synthesis Example 2-14 | Resin (2-14) | | Monomer (2-1) 32 g | Macromonomer (2-1) 68 g | 3,100 | — | 24,000 | 12,000 | 90 |
| Synthesis Example 2-15 | Resin (2-15) | | Monomer (2-1) 5 g Monomer (2-5) 10 g | Macromonomer (2-3) 85 g | 4,600 | — | 29,000 | 12,000 | 39 |
| Synthesis Example 2-16 | Resin (2-16) | | Monomer (2-1) 8 g | Macromonomer (2-1) 92 g | 3,100 | — | 35,000 | 19,000 | 20 |
| Synthesis Example 2-17 | Resin (2-17) | | Monomer (2-1) 25 g | Macromonomer (2-1) 75 g | 3,100 | — | 22,000 | 10,000 | 70 |
| Synthesis Example 2-18 | Resin (2-18) | | Monomer (2-1) 15 g | Macromonomer (2-4) 85 g | 1,200 | — | 15,000 | 8,500 | 40 |
| Synthesis Example 2-19 | Resin (2-19) | | Monomer (2-1) 15 g | Macromonomer (2-5) 85 g | 28,000 | — | 59,000 | 24,000 | 39 |
| Synthesis Example 2-20 | Resin (2-20) | | Monomer (1) 15 g | Macromonomer (2-6) 85 g | 800 | — | 9,500 | 4,000 | 41 |
| Synthesis Example 2-21 | Resin (2-21) | | Monomer (2-1) 15 g | Macromonomer (2-7) 85 g | 32,000 | — | 68,000 | 28,000 | 43 |
| Synthesis Example 2-22 | Resin (2-22) | | Monomer (2-1) 40 g | Macromonomer (2-1) 60 g | 3,100 | — | 19,000 | 9,000 | 110 |
| Synthesis Example 2-23 | Resin (2-23) | | Monomer (2-1) 2 g | Macromonomer (2-1) 98 g | 3,100 | — | 28,000 | 15,000 | 5 |

The structures of the raw material monomers used in the synthesis of the (B2) specific resins and the comparative resins are shown below.

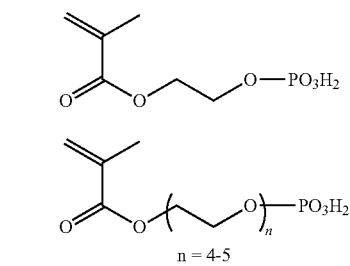
Monomer (2-1)

Monomer (2-2)

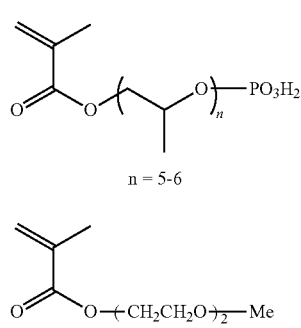
n = 4-5

Monomer (2-3)

n = 5-6

Monomer (2-4)

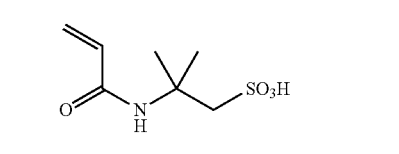

Monomer (2-5)

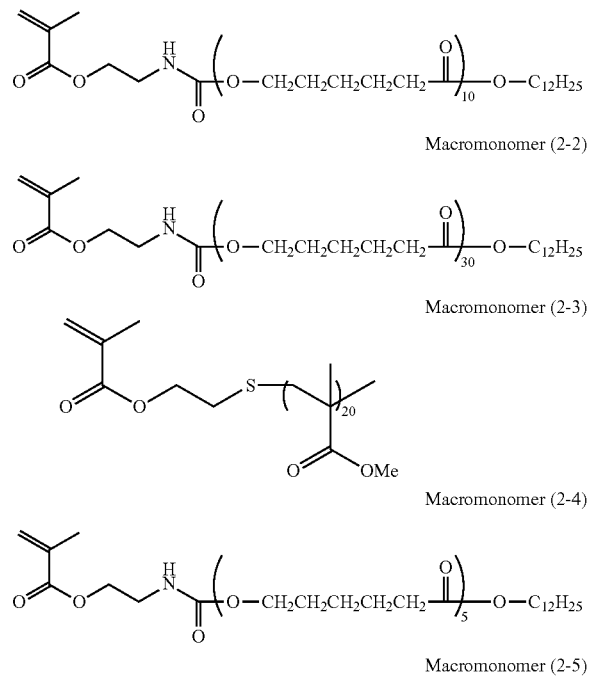

Macromonomer (2-1)

Macromonomer (2-2)

Macromonomer (2-3)

Macromonomer (2-4)

Macromonomer (2-5)

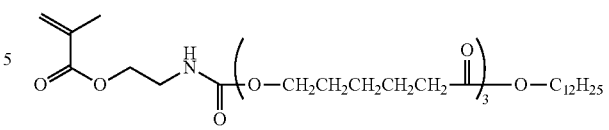
Macromonomer (2-6)

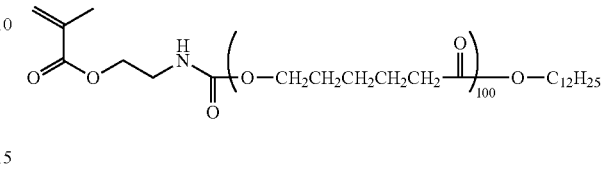
Macromonomer (2-7)

Example 2-1 to Example 2-37, and Comparative Example 2-1 to Comparative Example 2-3

Preparation of Black Curable Composition
[Preparation of Inorganic Pigment Dispersion A]

The components shown in the following composition 2-I were subjected to a high-viscosity distribution process with two rolls to obtain a dispersion. Further, kneading for 30 minutes with a kneader may be carried out before the high-viscosity distribution process.

(Composition 2-I)

| | |
|---|---|
| Titanium black A or titanium black B | 40 parts |
| 30% by mass solution of the specific resin or comparative resin in propylene glycol 1-monomethyl ether 2-acetate | 5 parts |

(The kinds of the specific resin or comparative resin are as described in Table 6).

The titanium black A was TITANIUM BLACK 12S (trade name) manufactured by Mitsubishi Materials Corporation (average primary particle diameter: 60 nm) and the titanium black B was TITANIUM BLACK 13 MT (trade name) manufactured by Mitsubishi Materials Co., Ltd. (average primary particle diameter: 90 nm). DISPERBYK-180 (trade name) which was a comparative resin of Comparative Example 2-1 is a dispersant manufactured by BYK Additives & Instruments and is a resin not including both of a phosphoric acid group and a sulfonic acid group.

The components shown in the following composition 2-11 were added to the obtained dispersion, followed by stirring under the condition of 3,000 rpm for 3 hours using a homogenizer. The obtained mixed solution was subjected to a fine dispersion treatment for 4 hours using 0.3 mm zirconia beads with a dispersing machine (trade name: DISPERMAT (trade name), manufactured by VMA-GETZMANN GMBH) to manufacture a titanium black dispersion (hereinafter referred to as TB dispersion A).

(Composition 2-II)

| | |
|---|---|
| 30% by mass solution of resins (2-1) to (2-23) in propylene glycol 1-monomethyl ether 2-acetate | 30 parts |
| Propylene glycol monomethyl ether acetate | 150 parts |

[Preparation of Inorganic Pigment Dispersions 2-B to 2-F]

Inorganic pigment dispersions 2-B to 2-F were prepared in the same manner as in the preparation of the inorganic pigment dispersion A, except that the amounts of the titanium black A or the titanium black B, and the specific resin or comparative resin in the composition 2-I used in the preparation of the inorganic pigment dispersion A were changed such that the mass ratios of the specific resins to the titanium black A or the titanium black B were the values shown in Table 6.

Preparation of Black Curable Composition

The components in the following composition were mixed with a stirrer to manufacture black curable compositions (B2-1) to (B2-19), (B2-22) to (B2-36), (B2-39), and (B2-40) (see Table 6).

| | |
|---|---|
| 30% by mass solution of alkali-soluble resin (compound shown in Table 6) in propylene glycol 1-monomethyl ether 2-acetate | 10 parts |
| Dipentaerythritol hexaacrylate [(C2) polymerizable compound] | 2.0 parts |
| Pentaerythritol triacrylate [(C2) polymerizable compound] | 1.0 part |
| Polymerization initiator (compound described in Table 6) [(B2) photopolymerization initiator] | 0.3 part |
| Inorganic pigment dispersion (inorganic pigment dispersion as described above) | 24 parts |
| Propylene glycol monomethyl ether acetate | 10 parts |
| Ethyl-3-ethoxypropionate | 8 parts |
| γ-Methacryloxypropyl trimethoxysilane | 0.1 part |

[Preparation of Black Curable Composition]

Black curable composition (B2-37) was prepared in the same manner as in the preparation of black curable composition (B2-1), except that the amounts of dipentaerythritol hexaacrylate and pentaerythritol triacrylate which were the (C2) polymerizable compounds used in the preparation of black curable composition (B2-1) were changed to 0.5 part, respectively, and the amount of the alkali-soluble resin used was changed to 16.7 parts, such that the content of the (C2) polymerizable compounds included in the black curable composition was changed to 9% by mass.

Further, black curable composition (B2-38) was prepared in the same manner as in the preparation of black curable composition (B2-1), except that the amounts of dipentaerythritol hexaacrylate and pentaerythritol triacrylate which were the (C2) polymerizable compounds used in the preparation of the black curable composition (B2-1) were changed 3 parts, respectively, and the alkali-soluble resin was not added, such that the content of the (C2) polymerizable compounds included in the black curable composition was changed to 51% by mass.

[Preparation of Black Curable Composition (B2-20)]
<Preparation of Silver Tin Composition>

A solution in which 15 g of a tin colloid (average particle: 20 nm, solid content: 20% by weight, manufactured by Sumitomo Osaka Cement Co., Ltd.), 60 g of a silver colloid (average particle: 7 nm, solid content: 20% by weight, manufactured by Sumitomo Osaka Cement Co., Ltd.), and 0.75 g of polyvinyl pyrrolidone were dissolved in 100 ml of water was added to 200 ml of pure water that had been warmed to 60° C., thereby obtaining a colloid solution.

Then, this colloid solution was stirred for 60 minutes while being maintained at 60° C., and then irradiated with an ultrasonic wave for 5 minutes. Then, this colloid solution was concentrated by centrifugation to obtain a solution A having a solid content of 25%. The solution A was dried by a frozen-drying method to obtain a silver tin powder sample.

Black curable composition (B2-20) was prepared in the same manner as in the preparation of black curable composition (B2-1), except that the obtained silver tin powder, instead of titanium black, was dispersed using Resin (2-1) to produce a silver tin dispersion.

[Preparation of Black Curable Composition (B2-21)]

Black curable composition (B2-21) was obtained in the same manner as in the preparation of black curable composition (B2-11), except that the amount of Resin (2-11) used in the composition (2-II) was changed to 50 parts, and the amount of the alkali-soluble resin added was changed to 3 parts.

Resin (D-1) and Resin (D-2) which were the alkali-soluble resins shown in Table 6 below, and the initiator (1-1) to the initiator (1-6) are the same as those used in Examples according to the first aspect.

TABLE 6

| | | | | | | | |
|---|---|---|---|---|---|---|---|
| | | Black curable composition | | | | | |
| | | Inorganic pigment dispersion | | | | | |
| | | Inorganic pigment | (B2) Specific resin or comparative resin | Mass ratio of (B2) specific resin to inorganic pigment | Content of polymerizable compound | Alkali-soluble resin | Initiator |
| Example 2-1 | (B2-1) | Titanium black A | Resin (2-1) | 0.26 | 26% by mass | (D-1) | (I-1) |
| Example 2-2 | (B2-2) | Titanium black A | Resin (2-2) | 0.26 | 26% by mass | (D-1) | (I-1) |
| Example 2-3 | (B2-3) | Titanium black A | Resin (2-3) | 0.26 | 26% by mass | (D-1) | (I-1) |
| Example 2-4 | (B2-4) | Titanium black A | Resin (2-4) | 0.26 | 26% by mass | (D-1) | (1-1) |
| Example 2-5 | (B2-5) | Titanium black A | Resin (2-5) | 0.26 | 26% by mass | (D-1) | (I-1) |
| Example 2-6 | (B2-6) | Titanium black A | Resin (2-6) | 0.26 | 26% by mass | (D-1) | (I-1) |
| Example 2-7 | (B2-7) | Titanium black A | Resin (2-7) | 0.26 | 26% by mass | (D-1) | (I-1) |
| Example 2-8 | (B2-8) | Titanium black A | Resin (2-8) | 0.26 | 26% by mass | (D-1) | (I-1) |
| Example 2-9 | (B2-9) | Titanium black A | Resin (2-9) | 0.26 | 26% by mass | (D-1) | (I-1) |
| Example 2-10 | (B2-10) | Titanium black A | Resin (2-10) | 0.26 | 26% by mass | (D-1) | (I-1) |
| Example 2-11 | (B2-11) | Titanium black A | Resin (2-11) | 0.26 | 26% by mass | (D-1) | (I-1) |
| Example 2-12 | (B2-12) | Titanium black A | Resin (2-12) | 0.26 | 26% by mass | (D-1) | (I-1) |
| Example 2-13 | (B2-13) | Titanium black A | Resin (2-11) | 0.26 | 26% by mass | (D-1) | (I-2) |
| Example 2-14 | (B2-14) | Titanium black A | Resin (2-11) | 0.26 | 26% by mass | (D-1) | (I-3) |
| Example 2-15 | (B2-15) | Titanium black A | Resin (2-11) | 0.26 | 26% by mass | (D-1) | (I-4) |
| Example 2-16 | (B2-16) | Titanium black A | Resin (2-11) | 0.26 | 26% by mass | (D-1) | (I-5) |
| Example 2-17 | (B2-17) | Titanium black A | Resin (2-11) | 0.26 | 26% by mass | (D-1) | (I-6) |
| Example 2-18 | (B2-18) | Titanium black A | Resin (2-11) | 0.26 | 26% by mass | (D-2) | (I-1) |
| Example 2-19 | (B2-19) | Titanium black B | Resin (2-11) | 0.26 | 26% by mass | (D-1) | (I-1) |
| Example 2-20 | (B2-20) | silver-zinc | Resin (2-11) | 0.26 | 26% by mass | (D-1) | (I-1) |
| Example 2-21 | (B2-21) | Titanium black A | Resin (2-11) | 0.26 | 26% by mass | (D-1) | (I-1) |
| Example 2-22 | (B2-23) | Titanium black A | Resin (2-13) | 0.26 | 26% by mass | (D-1) | (I-1) |
| Example 2-23 | (B2-24) | Titanium black A | Resin (2-14) | 0.26 | 26% by mass | (D-1) | (I-1) |
| Example 2-24 | (B2-25) | Titanium black A | Resin (2-15) | 0.26 | 26% by mass | (D-1) | (I-1) |

TABLE 6-continued

Black curable composition

Inorganic pigment dispersion

| | | Inorganic pigment | (B2) Specific resin or comparative resin | Mass ratio of (B2) specific resin to inorganic pigment | Content of polymerizable compound | Alkali-soluble resin | Initiator |
|---|---|---|---|---|---|---|---|
| Example 2-25 | (B2-26) | Titanium black A | Resin (2-16) | 0.26 | 26% by mass | (D-1) | (I-1) |
| Example 2-26 | (B2-27) | Titanium black A | Resin (2-17) | 0.26 | 26% by mass | (D-1) | (1-1) |
| Example 2-27 | (B2-28) | Titanium black A | Resin (2-18) | 0.26 | 26% by mass | (D-1) | (I-1) |
| Example 2-28 | (B2-29) | Titanium black A | Resin (2-19) | 0.26 | 26% by mass | (D-1) | (I-1) |
| Example 2-29 | (B2-30) | Titanium black A | Resin (2-20) | 0.26 | 26% by mass | (D-1) | (I-1) |
| Example 2-30 | (B2-31) | Titanium black A | Resin (2-21) | 0.26 | 26% by mass | (D-1) | (I-1) |
| Example 2-31 | (B2-32) | Titanium black A | Resin (2-1) | 0.20 | 26% by mass | (D-1) | (I-1) |
| Example 2-32 | (B2-33) | Titanium black A | Resin (2-1) | 0.30 | 26% by mass | (D-1) | (I-1) |
| Example 2-33 | (B2-34) | Titanium black A | Resin (2-1) | 0.40 | 26% by mass | (D-1) | (I-1) |
| Example 2-34 | (B2-35) | Titanium black A | Resin (2-1) | 0.15 | 26% by mass | (D-1) | (I-1) |
| Example 2-35 | (B2-36) | Titanium black A | Resin (2-1) | 0.50 | 26% by mass | (D-1) | (I-1) |
| Example 2-36 | (B2-37) | Titanium black A | Resin (2-1) | 0.26 | 26% by mass | (D-1) | (I-1) |
| Example 2-37 | (B2-38) | Titanium black A | Resin (2-1) | 0.26 | 9% by mass | (D-1) | (I-1) |
| Comparative Example 2-1 | (B2-22) | Titanium black B | Disperbyk-180 | 0.26 | 26% by mass | (D-1) | (I-1) |
| Comparative Example 2-2 | (B2-39) | Titanium black A | Resin (2-22) | 0.26 | 26% by mass | (D-1) | (I-1) |
| Comparative Example 2-3 | (B2-40) | Titanium black A | Resin (2-23) | 0.26 | 26% by mass | (D-1) | (I-1) |

Manufacturing of Light-Shielding Film and Solid-State Imaging Device

<Manufacturing of Substrate A and Substrate B>

(Manufacturing of Substrate A)

The substrate A was manufactured in the following manner for validation of the development residues in the solid-state imaging device (a form in which there is no solder resist layer on the back side) of one embodiment as above.

That is, by a microprocessing (photolithography) technique, a sputtering method, and an electroplating technique, a copper (Cu)-made circular metal electrode having a thickness of 5 μm and a diameter of 10 μm was obtained on a silicon substrate.

Figure 11:
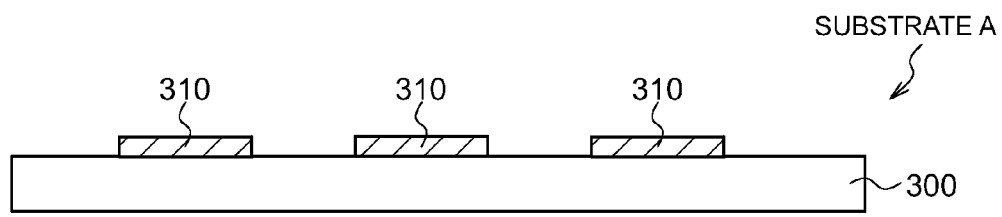
FIG. 11 is a schematic cross-sectional view of the substrate A used in Example 2-2 and Comparative Example 2-2 of the second aspect or in Examples 3-118 to 3-172 and Comparative Examples 3-7 to 3-9 of the third aspect.

Thus, as shown in the schematic cross-sectional view of FIG. 11, the substrate A having plural circular metal electrodes 310 was obtained on the silicon substrate 300.

(Manufacturing of Substrate B)

The substrate B was manufactured in the following manner for validation of the development residues in the solid-state imaging device (a form in which there is a solder resist layer on the back side) of one embodiment as above.

A solder resist layer having a 10-μm circular pattern was formed on the side on which the circular metal electrode of the substrate A had been formed by photolithography using the following solder resist.

Figure 13:
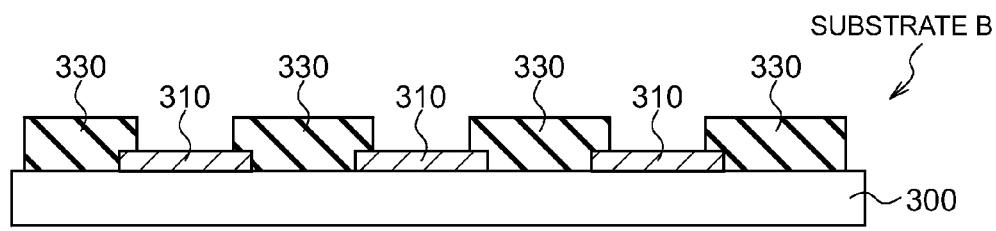
FIG. 13 is a schematic cross-sectional view of the substrate B used in Example 2-3 and Comparative Example 2-3 of the second aspect or in Examples 3-118 to 3-172 and Comparative Examples 3-7 to 3-9 of the third aspect.

As the pattern of the solder resist layer, a pattern having an opening which exposes a part of the metal electrode as shown in FIG. 13 was taken.

Thus, as shown in the schematic cross-sectional view of FIG. 13, the substrate B with a constitution having the circular metal electrodes 310 and the solder resist layers 330 was obtained on the silicon substrate 300.

The components of the solder resist are as follows.

| | |
|---|---|
| Resin solution below | 155 parts by mass |
| 2-(Acetyloxyiminomethyl)thioxanthen-9-one (photopolymerization initiator) | 2 parts by mass |
| 2-Methyl-1-[4-(methylthiophenyl)]-2-morpholinopropan-1-one (photopolymerization initiator) | 6 parts by mass |

-continued

| | |
|---|---|
| 2,4-Diethylthioxanthone (sensitizer) | 1 part by mass |
| C. I. pigment blue 15:6 (colorant) | 0.9 part by mass |
| C. I. pigment yellow 199 (colorant) | 2.3 parts by mass |
| Dipentaerythritol hexaacrylate (monomer) | 20 parts by mass |
| Trimethylolpropane triacrylate (monomer) | 10 parts by mass |
| Barium sulfate (filler) | 130 parts by mass |
| Phenol novolak epoxy resin (EPPN-201 manufactured by Nippon Kayaku Co., Ltd.) (thermosetting component) | 15 parts by mass |
| Bixylenolepoxy resin (YX-4000 (trade name) manufactured by Epoxy Resins Co., Ltd.) | 30 parts by mass |
| Melamine | 3 parts by mass |
| Dipropyleneglycol methyl ether acetate | 5 parts by mass |
| #150 (trade name) (Aromatic organic solvent manufactured by Idemitsu Petrochemical Co., Ltd.) | 5 parts by mass |

(Preparation of Resin Solution)

First, 660 g of a cresol novolak epoxy resin (EOCN-104S (trade name) manufactured by Nippon Kayaku Co., Ltd.), 421.3 g of carbitol acetate, and 180.6 g of a solvent naphtha, were charged, followed by heating/stirring at 90° C. for dissolution. Then, the mixture was cooled to 60° C., and 216 g of acrylic acid, 4.0 g of triphenylphosphine, and 1.3 g of p-methoxy phenol were added thereto, followed by performing a reaction at 100° C. for 12 hours. At this time, the acid value was 0.3 mgKOH/g. Then, 241.7 g of tetrahydrophthalic anhydride was added thereto, followed by heating to 90° C. and performing a reaction for 6 hours. As a result, a resin solution having a solid content concentration of 65% by mass, a solid content acid value of 77 mgKOH/g, a double bond equivalent (amount of resin by weight (g) per mole of unsaturated group) of 400 g/equivalent, and a weight average molecular weight of 8,000 was obtained.

<Manufacturing of Light-Shielding Film>

The black curable compositions prepared above in Examples and Comparative Examples with the combinations shown in Table 7 were spin-coated on the surface of the substrate A to the substrate B on which the metal electrodes had been formed, and then heated at 120° C. for 2 minutes on a hot plate to obtain a black curable composition-coated layer.

Then, the obtained coated layer was exposed by varying the exposure amount in the range from 100 mJ/cm² to 1000 mJ/cm² at an interval of 50 mJ/cm² through a photomask for formation of a 10-μm circular pattern using an i-ray stepper exposure device.

Next, the coated layer after exposure was subjected to a paddle development at 23° C. for 60 seconds using a 0.3% aqueous tetramethyl ammonium hydroxide solution, then rinsed with a spin shower, and then washed with pure water to obtain a light-shielding film having a pattern shape.

Figure 12:
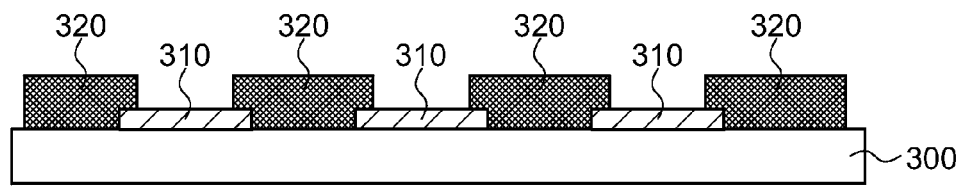
FIG. 12 is a schematic cross-sectional view showing a state in which the light-shielding film is formed on the substrate A.

Here, the light-shielding film was formed to have a pattern having an opening which exposes a part of the metal electrode 310 as shown in FIG. 12 (light-shielding film 320 in FIG. 12).

Figure 14:
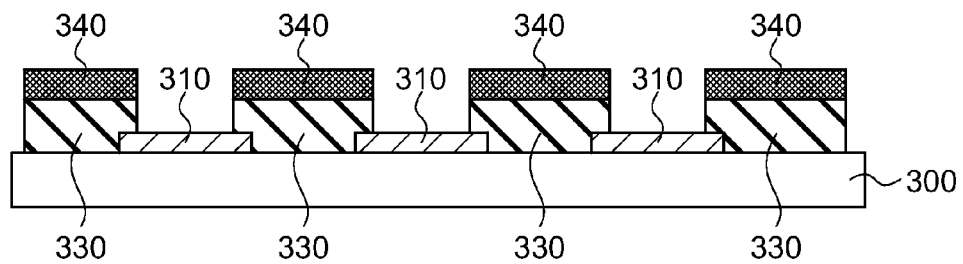
FIG. 14 is a schematic cross-sectional view showing a state in which the light-shielding film is formed on the substrate B.

Here, the light-shielding film was formed to have a pattern having an opening which exposes a part of the metal electrode 310 as shown in FIG. 14 (specifically, a pattern overlapping the solder resist layer when seen in the normal direction to the substrate; the light-shielding film 340 in FIG. 14).

Evaluation

The light-shielding films manufactured in Examples and Comparative Examples were evaluated in the following manner. The evaluation results are shown in Table 7.

(Evaluation of Adhesion)

For the light-shielding film formed in each of Examples and Comparative Examples, a minimum exposure amount such that the peeling-off did not occur on the silicon substrate side was evaluated as adhesion sensitivity. A smaller value of the adhesion sensitivity indicates higher substrate adhesion.

A smaller value of the adhesion sensitivity indicates a higher substrate adhesion.

Further, for the minimum exposure amount such that the peeling-off did not occur, the exposure amount during the development was increased stepwise, irradiation with an exposure amount corresponding to each step was performed, and in this regard, a case where, when the region at vertical 100 μm× horizontal 100 μm was observed by means of SEM, all patterns could be formed without defects was denoted as "the peeling-off did not occur" and the exposure amount at this irradiation was denoted as the "minimum exposure amount such that the peeling-off did not occur".

(Evaluation of Step)

In Examples and Comparative Examples, 20 cross-sections of the light-shielding films manufactured on the substrate A to the substrate B when development was carried out for the minimum exposure amount such that the peeling-off did not occur on the silicon substrate side of the light-shielding film were observed by means of SEM, and the width of the step region was measured as the average value. A narrower width of the step region indicates a superior light-shielding ability in the center portion and the peripheral portion.

Further, the region in which the film thickness became 90% or less of the center portion of the light-shielding film was measured as a step region.

(Evaluation of Residues)

In Examples and Comparative Examples, a range of 500 μm×500 μm on the exposed metal which is a region outside the subject in which the light-shielding film had been formed when development was carried out for the minimum exposure amount such that the peeling-off did not occur on the silicon substrate side of the light-shielding film was observed by means of SEM, and the number of the residues was counted. A smaller number of the residues indicates better developability.

(Evaluation of Light-Shielding Property)

In Examples and Comparative Examples, a maximum transmittance in the wavelength region of 700 nm to 1200 nm was measured with a spectrophotometer (UV23600 (trade name), manufactured by Shimadzu Corporation) using the light-shielding film before development that had been prepared on the substrate A to the substrate B. A smaller numeral value indicates better results. A case where the maximum transmittance is less than 1% indicates a good light-shielding property.

TABLE 7

| | Black curable composition | Adhesion sensitivity | | Step | | Residue | | Light-shielding Property | |
|---|---|---|---|---|---|---|---|---|---|
| | | Substrate A | Substrate B | Substrate A | Substrate B | Substrate A | Substrate B | Substrate A | Substrate B |
| Example 2-1 | (B2-1) | 500 | 550 | 0.10 | 0.09 | 2 | 1 | 0.5% | 0.5% |
| Example 2-2 | (B2-2) | 500 | 550 | 0.10 | 0.11 | 1 | 3 | 0.5% | 0.5% |
| Example 2-3 | (B2-3) | 500 | 550 | 0.10 | 0.11 | 1 | 2 | 0.5% | 0.5% |
| Example 2-4 | (B2-4) | 500 | 550 | 0.12 | 0.13 | 2 | 1 | 0.5% | 0.5% |
| Example 2-5 | (B2-5) | 550 | 600 | 0.13 | 0.12 | 1 | 2 | 0.5% | 0.5% |
| Example 2-6 | (B2-6) | 550 | 600 | 0.11 | 0.11 | 2 | 1 | 0.5% | 0.5% |
| Example 2-7 | (B2-7) | 500 | 550 | 0.10 | 0.10 | 1 | 2 | 0.5% | 0.5% |
| Example 2-8 | (B2-8) | 700 | 750 | 0.21 | 0.23 | 7 | 6 | 0.5% | 0.5% |
| Example 2-9 | (B2-9) | 700 | 750 | 0.22 | 0.21 | 8 | 8 | 0.5% | 0.5% |
| Example 2-10 | (B2-10) | 700 | 750 | 0.16 | 0.17 | 4 | 3 | 0.5% | 0.5% |
| Example 2-11 | (B2-11) | 400 | 500 | 0.05 | 0.05 | 0 | 0 | 0.5% | 0.5% |
| Example 2-12 | (B2-12) | 400 | 450 | 0.05 | 0.05 | 0 | 0 | 0.5% | 0.5% |
| Example 2-13 | (B2-13) | 400 | 500 | 0.06 | 0.05 | 0 | 0 | 0.5% | 0.5% |
| Example 2-14 | (B2-14) | 600 | 650 | 0.22 | 0.23 | 3 | 3 | 0.5% | 0.5% |
| Example 2-15 | (B2-15) | 600 | 700 | 0.23 | 0.25 | 4 | 3 | 0.5% | 0.5% |
| Example 2-16 | (B2-16) | 300 | 350 | 0.01 | 0.02 | 0 | 0 | 0.5% | 0.5% |
| Example 2-17 | (B2-17) | 300 | 350 | 0.02 | 0.01 | 0 | 0 | 0.5% | 0.5% |
| Example 2-18 | (B2-18) | 550 | 600 | 0.25 | 0.26 | 7 | 8 | 0.5% | 0.5% |
| Example 2-19 | (B2-19) | 450 | 500 | 0.12 | 0.13 | 1 | 2 | 0.5% | 0.5% |
| Example 2-20 | (B2-20) | 600 | 650 | 0.32 | 0.33 | 3 | 2 | 0.7% | 0.7% |
| Example 2-21 | (B2-21) | 650 | 700 | 0.21 | 0.23 | 5 | 7 | 0.5% | 0.5% |
| Example 2-22 | (B2-23) | 800 | 850 | 0.31 | 0.32 | 9 | 9 | 0.5% | 0.5% |
| Example 2-23 | (B2-24) | 750 | 750 | 0.26 | 0.27 | 9 | 9 | 0.5% | 0.5% |
| Example 2-24 | (B2-25) | 600 | 650 | 0.15 | 0.16 | 3 | 3 | 0.5% | 0.5% |
| Example 2-25 | (B2-26) | 650 | 650 | 0.13 | 0.12 | 4 | 5 | 0.5% | 0.5% |
| Example 2-26 | (B2-27) | 650 | 650 | 0.14 | 0.12 | 5 | 4 | 0.5% | 0.5% |
| Example 2-27 | (B2-28) | 600 | 600 | 0.13 | 0.14 | 3 | 3 | 0.5% | 0.5% |
| Example 2-28 | (B2-29) | 600 | 650 | 0.14 | 0.14 | 4 | 3 | 0.5% | 0.5% |
| Example 2-29 | (B2-30) | 700 | 750 | 0.22 | 0.21 | 7 | 6 | 0.5% | 0.5% |

TABLE 7-continued

| | Black curable composition | Adhesion sensitivity | | Step | | Residue | | Light-shielding Property | |
|---|---|---|---|---|---|---|---|---|---|
| | | Substrate A | Substrate B | Substrate A | Substrate B | Substrate A | Substrate B | Substrate A | Substrate B |
| Example 2-30 | (B2-31) | 700 | 700 | 0.18 | 0.19 | 7 | 8 | 0.5% | 0.5% |
| Example 2-31 | (B2-32) | 500 | 550 | 0.10 | 0.10 | 1 | 1 | 0.4% | 0.4% |
| Example 2-32 | (B2-33) | 500 | 550 | 0.10 | 0.11 | 1 | 1 | 0.5% | 0.5% |
| Example 2-33 | (B2-34) | 500 | 550 | 0.09 | 0.10 | 1 | 1 | 0.6% | 0.6% |
| Example 2-34 | (B2-35) | 600 | 700 | 0.21 | 0.22 | 1 | 1 | 0.4% | 0.4% |
| Example 2-35 | (B2-36) | 600 | 700 | 0.10 | 0.10 | 9 | 8 | 0.7% | 0.7% |
| Example 2-36 | (B2-37) | 700 | 750 | 0.29 | 0.27 | 1 | 1 | 0.5% | 0.5% |
| Example 2-37 | (B2-38) | 450 | 500 | 0.10 | 0.11 | 8 | 9 | 0.5% | 0.5% |
| Comparative Example 2-1 | (B2-22) | 600 | 650 | 0.66 | 0.65 | 22 | 15 | 0.5% | 0.5% |
| Comparative Example 2-2 | (B2-39) | 900 | 950 | 1.12 | 1.26 | 2 | 1 | 0.5% | 0.5% |
| Comparative Example 2-3 | (B2-40) | 500 | 550 | 0.11 | 0.12 | 35 | 40 | 0.5% | 0.5% |

From Table 7 above, it can be seen that by using the black curable composition of the present invention, the infrared light-shielding ability is excellent, the residues in the unexposed portion (the residues outside the region in which the light-shielding film is formed) can be reduced, the adhesion to a silicon substrate is excellent, and the steps are reduced.

Furthermore, improvement of adhesion to a silicon substrate, and reduction in the residue can be promoted in Examples 2-1 to 2-7 using the specific resins having an acid value of 20 mgKOH/g to 70 mgKOH/g, particularly reduction in the steps, as compared with Examples 2-8 and 2-9 in which the same monomers and macromonomers were used for preparation and the specific resins having an acid value outside the range from 20 mgKOH/g to 70 mgKOH/g were used.

In addition, inhibition of the steps and the residues are further improved in Example 2-11 and Example 2-12 in which the specific resin having a structure of Formula (I) was used, as compared with Example 2-1 to Example 2-10 in which the same components were used for the preparation except that the specific resin having a structure of Formula (I) was not used.

Example 2-38

Manufacturing and Evaluation of Solid-State Imaging Device

<Manufacturing of Solid-State Imaging Device>
Preparation of Chromatic Curable Composition Red (R) chromatic curable composition 2-C-1, green (G) chromatic curable composition 2-C-2, and blue (B) chromatic curable composition 2-C-3 were prepared in the same manner as in Example 2-1, except that the titanium black 12S (manufactured by Mitsubishi Materials Co., Ltd.), which is black pigment, used in black curable composition (B2-1) used in Example 2-1 was changed to the following chromatic pigments, respectively.

Chromatic Pigment for Forming Chromatic Pixels of Each of RGB

Red (R) pigment: C. I. pigment red 254

Green (G) pigment: 70/30 [by mass ratio] mixture of C. I. pigment green 36 and C. I. pigment yellow 139

Blue (B) pigment: 70/30 [by mass ratio] mixture of C. I. pigment blue 15:6 and C. I. pigment violet 23

Manufacturing of Full-Color Color Filter for Solid-State Imaging Device

A 1.0 μm×1.0 μm green (G) colored pattern was formed on the side on which the light-shielding film of the substrate B manufactured in Example 2-1 had been not formed in the same manner as the method described in Example 2-4, except that a photomask for a 1.0 μm×1.0 μm Bayer pattern was used by using the green (G) chromatic curable composition 2-C-2. Furthermore, in the same manner except that a photomask for a 1.0 μm×1.0 μm island pattern was used, a red (R) chromatic pattern and a blue (B) chromatic pattern were formed sequentially, thereby manufacturing a full-color color filter for a solid-state imaging device.

Evaluation

The obtained full-color color filter for a solid-state imaging device was incorporated into the solid-state imaging device, and it was found that the solid-state imaging device had high resolution and excellent color isolation. Further, as described above, it is thought that since the light-shielding films manufactured in the Examples have excellent infrared light-shielding performance and can promote reduction in the residues, the reduction in noise due to infrared light and reduction in noise due to the residues can also be promoted.

Examples According to Third Aspect

Synthesis Example 3-1

Synthesis of Resin (3-1) (P-Q type)

To 233 g of propylene glycol monomethyl ether acetate (hereinafter referred to as PGMEA) were added 56 g (0.56 mol) of methyl methacrylate and 6.39 g (0.029 mol) of a chain transfer agent (a), followed by heating at 80° C. for 1 hour under a nitrogen air flow. Then, 1.48 g (0.0090 mol) of azobisisobutyronitrile was added thereto, followed by heating and stirring for 3 hours and then further heating at 120° C. for 2 hours. At this time, the weight average molecular weight (Mw) of the resin (corresponding to a solvent-compatible moiety) was 2,500. Then, 44 g (0.28 mol) of 2-dimethylaminoethyl methacrylate were added, and further 1.48 g (0.0090 mol) of azobisisobutyronitrile was added thereto, followed by stirring for 3 hours and then heating at 120° C. for 2 hours, thereby obtaining a 30% by mass solution of Resin (3-1) in PGMEA. The weight average molecular weight (Mw) was 4,600 and the Mw/Mn was 1.3. Further, the weight average molecular weight (Mw) of the pigment-adsorbing moiety was 2,100, which equals [4,600 (the weight average molecular weight of Resin (3-1))–2,500 (the weight average molecular weight of the solvent-compatible moiety)]. The amine value (titration) was 159 mgKOH/g. The synthesis scheme is shown below.

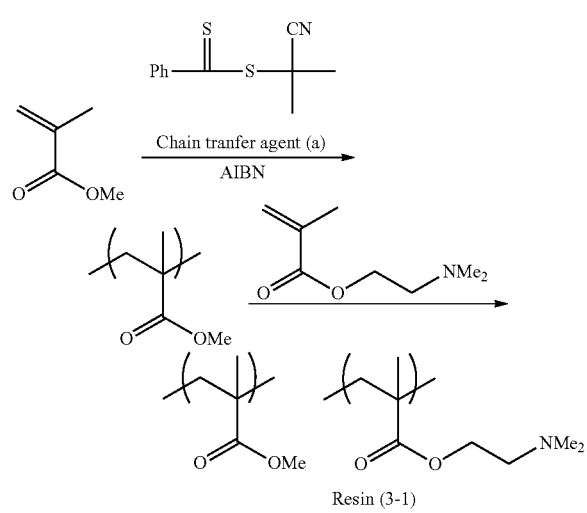

Resin (3-1)

Synthesis Examples 3-2 to 3-44

Synthesis of Resins (3-2) to (3-44)

Next, 30% by mass solutions of Resins (3-2) to (3-44) in PGMEA were produced in the same manner as in Synthesis Example 3-1, except that the monomers and chain transfer agent used in Synthesis Example 3-1 were changed to the kinds and amounts of the monomers used in the solvent-compatible moieties, the monomer and the chain transfer agents used in the pigment-adsorbing moieties as shown in Table 8 or Table 9, respectively.

In Tables 8 and 9, "P(Mw)" represents the weight average molecular weight of the solvent-compatible moiety, and "Q(Mw)" represents the weight average molecular weight of the pigment-adsorbing moiety. Further, the "Resin (Mw)" represents the weight average molecular weight of each of the obtained resins, and the "Amine value" represents the amine value of each of the resins.

TABLE 8

| Synthesis Example | Resin | Monomer used in solvent-compatible moiety | | | Monomer used in pigment-adsorbing moiety | | Chain transfer agent | | P (Mw) | Q (Mw) | Resin (Mw) | Amine value |
| --- | --- | --- | --- | --- | --- | --- | --- | --- | --- | --- | --- | --- |
| | | Kind | I/O value | Feed amount (g) | Kind | Feed amount (g) | Kind | Feed amount (g) | | | | |
| 3-1 | Resin (3-1) | Methyl methacrylate | 0.6 | 56 | Dimethylaminoethyl methacrylate | 44 | (a) | 6.39 | 2500 | 2100 | 4600 | 159 |
| 3-2 | Resin (3-2) | Methyl methacrylate | 0.6 | 67 | Dimethylaminoethyl methacrylate | 33 | (a) | 4.80 | 000 | 2200 | 6200 | 119 |
| 3-3 | Resin (3-3) | Methyl methacrylate | 0.6 | 83 | Dimethylaminoethyl methacrylate | 17 | (a) | 2.40 | 10700 | 2000 | 12700 | 60 |
| 3-4 | Resin (3-4) | Methyl methacrylate | 0.6 | 88 | Dimethylaminoethyl methacrylate methacrylic acid | 10 2 | (a) | 1.44 | 18000 | 2100 | 20100 | 36 |
| 3-5 | Resin (3-5) | Methyl methacrylate | 0.6 | 91 | Dimethylaminoethyl methacrylate | 9 | (a) | 1.25 | 21000 | 2000 | 23000 | 31 |
| 3-6 | Resin (3-6) | Methyl methacrylate | 0.6 | 93 | Dimethylaminoethyl methacrylate | 7 | (a) | 2.66 | 11300 | 800 | 12100 | 26 |
| 3-7 | Resin (3-7) | Methyl methacrylate | 0.6 | 74 | Dimethylaminoethyl methacrylate | 26 | (a) | 2.13 | 9000 | 3500 | 12500 | 93 |
| 3-8 | Resin (3-8) | Butyl methacrylate | 0.429 | 83 | Dimethylaminoethyl methacrylate | 17 | (a) | 2.40 | 11000 | 2000 | 13000 | 60 |
| 3-9 | Resin (3-9) | Benzyl methacrylate | 0.341 | 83 | Dimethylaminoethyl methacrylate | 17 | (a) | 2.40 | 12000 | 2100 | 14100 | 60 |
| 3-10 | Resin (3-10) | Octyl methacrylate | 0.273 | 83 | Dimethylaminoethyl methacrylate | 17 | (a) | 2.40 | 11000 | 2200 | 13200 | 61 |
| 3-11 | Resin (3-11) | Dodecyl methacrylate | 0.2 | 83 | Dimethylaminoethyl methacrylate | 17 | (a) | 2.40 | 10000 | 2000 | 12000 | 61 |
| 3-12 | Resin (3-12) | Styrene | 0.094 | 83 | Dimethylaminoethyl methacrylate | 17 | (b) | 3.48 | 9100 | 2100 | 11200 | 61 |
| 3-13 | Resin (3-13) | Butyl methacrylate | 0.429 | 83 | Dimethylaminoethyl methacrylate | 17 | (a) | 2.40 | 11500 | 2100 | 13600 | 61 |
| 3-14 | Resin (3-14) | Monomer a | 1.28 | 83 | Dimethylaminoethyl methacrylate | 17 | (a) | 2.40 | 10500 | 2300 | 12800 | 61 |
| 3-15 | Resin (3-15) | Monomer b | 1.36 | 83 | Dimethylaminoethyl methacrylate | 17 | (a) | 2.40 | 10900 | 2400 | 13300 | 60 |
| 3-16 | Resin (3-16) | Methyl methacrylate | 0.6 | 83 | Dimethylaminoethyl acrylate | 17 | (a) | 2.40 | 9100 | 2100 | 11200 | 65 |
| 3-17 | Resin (3-17) | 2-Hydroxyethyl methacrylate Methyl methacrylate | 1.33 0.6 | 17 66 | Dimethylaminoethyl methacrylate | 17 | (a) | 2.40 | 11000 | 2000 | 13000 | 56 |
| 3-18 | Resin (3-18) | Methyl methacrylate | 0.6 | 83 | N-(3-Dimethylamino-propyl)methacrylamide | 17 | (a) | 2.40 | 12300 | 2200 | 14500 | 56 |
| 3-19 | Resin (3-19) | Methyl methacrylate | 0.6 | 83 | Monomer c | 17 | (a) | 2.40 | 9200 | 2400 | 11600 | 52 |

TABLE 8-continued

| Synthesis Example | Resin | Monomer used in solvent-compatible moiety | | | Monomer used in pigment-adsorbing moiety | | Chain transfer agent | | P (Mw) | Q (Mw) | Resin (Mw) | Amine value |
|---|---|---|---|---|---|---|---|---|---|---|---|---|
| | | Kind | I/O value | Feed amount (g) | Kind | Feed amount (g) | Kind | Feed amount (g) | | | | |
| 3-20 | Resin (3-20) | Methyl methacrylate | 0.6 | 83 | 4-Vinylpyridine | 17 | (b) | 3.92 | 11300 | 2100 | 13400 | 89 |
| 3-21 | Resin (3-21) | Methyl methacrylate | 0.6 | 83 | Dimethylaminoethyl methacrylate | 17 | (b) | 3.92 | 11000 | 2300 | 13300 | 60 |

TABLE 9

| Synthesis Example | Resin | Monomer used in solvent-compatible moiety | | | Monomer used in pigment-adsorbing moiety | | Chain transfer agent | | P (Mw) | Q (Mw) | Resin (Mw) | Acid value |
|---|---|---|---|---|---|---|---|---|---|---|---|---|
| | | Kind | I/O value | Feed amount (g) | Kind | Feed amount (g) | Kind | Feed amount (g) | | | | |
| 3-22 | Resin (3-22) | Methyl methacrylate | 0.60 | 56 | Monomer-d | 44 | (a) | 6.39 | 2700 | 1900 | 4600 | 117 |
| 3-23 | Resin (3-23) | Methyl methacrylate | 0.60 | 67 | Monomer-d | 33 | (a) | 4.80 | 3900 | 2100 | 6000 | 87 |
| 3-24 | Resin (3-24) | Methyl methacrylate | 0.60 | 83 | Monomer-d | 17 | (a) | 2.40 | 11000 | 2200 | 13200 | 44 |
| 3-25 | Resin (3-25) | Methyl methacrylate | 0.60 | 90 | Monomer-d | 10 | (a) | 1.44 | 19000 | 2200 | 21200 | 26 |
| 3-26 | Resin (3-26) | Methyl methacrylate | 0.60 | 91 | Monomer-d | 9 | (a) | 1.25 | 22000 | 2400 | 24400 | 23 |
| 3-27 | Resin (3-27) | Methyl methacrylate | 0.60 | 93 | Monomer-d | 7 | (a) | 2.66 | 9500 | 700 | 10200 | 19 |
| 3-28 | Resin (3-28) | Methyl methacrylate | 0.60 | 74 | Monomer-d | 26 | (a) | 2.13 | 9800 | 3600 | 13400 | 68 |
| 3-29 | Resin (3-29) | Butyl methacrylate | 0.43 | 83 | Monomer-d | 17 | (a) | 2.40 | 10100 | 1900 | 12000 | 44 |
| 3-30 | Resin (3-30) | Benzyl methacrylate | 0.34 | 83 | Monomer-d | 17 | (a) | 2.40 | 11200 | 1800 | 13000 | 4 |
| 3-31 | Resin (3-31) | Octyl methacrylate | 0.27 | 83 | Monomer-d | 17 | (a) | 2.40 | 11000 | 2100 | 13100 | 45 |
| 3-32 | Resin (3-32) | Dodecyl methacrylate | 0.20 | 83 | Monomer-d | 17 | (a) | 2.40 | 10900 | 2200 | 13100 | 46 |
| 3-33 | Resin (3-33) | Styrene Methacrylic acid | 0.09 4.375 | 82 1 | Monomer-d | 17 | (b) | 3.48 | 9800 | 2100 | 11900 | 44 |
| 3-34 | Resin (3-34) | Butyl acrylate | 0.43 | 83 | Monomer-d | 17 | (a) | 2.40 | 9800 | 2000 | 11800 | 45 |
| 3-35 | Resin (3-35) | Monomer a | 1.28 | 83 | Monomer-d | 17 | (a) | 2.40 | 10500 | 1900 | 12400 | 45 |
| 3-36 | Resin (3-36) | Monomer b | 1.36 | 83 | Monomer-d | 17 | (a) | 2.40 | 9900 | 2300 | 12200 | 44 |
| 3-37 | Resin (3-37) | Ethyl methacrylate | 0.50 | 83 | Monomer-d | 17 | (a) | 2.40 | 10300 | 2000 | 12300 | 45 |
| 3-38 | Resin (3-38) | Methyl methacrylate | 0.60 | 83 | Methacrylic acid | 17 | (a) | 2.40 | 10000 | 2400 | 12400 | 111 |
| 3-39 | Resin (3-39) | Methyl methacrylate | 0.60 | 83 | Monomer-e | 17 | (a) | 2.40 | 9900 | 2300 | 12200 | 43 |
| 3-40 | Resin (3-40) | Methyl methacrylate | 0.60 | 83 | Monomer-f | 17 | (a) | 3.92 | 10300 | 2200 | 12500 | 56 |
| 3-41 | Resin (3-41) | Methyl methacrylate | 0.60 | 83 | Monomer-g | 17 | (b) | 3.48 | 11000 | 2500 | 13500 | 36 |
| 3-42 | Resin (3-42) | Methyl methacrylate | 0.60 | 83 | Monomer-h | 17 | (b) | 3.48 | 10800 | 2400 | 13200 | 64 |
| 3-43 | Resin (3-43) | Methyl methacrylate | 0.60 | 83 | Monomer-i | 17 | (b) | 3.48 | 10500 | 3200 | 13700 | 52 |
| 3-44 | Resin (3-44) | Methyl methacrylate | 0.60 | 83 | Monomer-d | 17 | (b) | 3.48 | 11000 | 2400 | 13400 | 71 |

The monomers a to i, and the chain transfer agent (b) used in Synthesis Example 3-1 to 3-44 are as follows. The chain transfer agent (a) is the chain transfer agent (a) used in Synthesis Example 3-1.

Monomer a
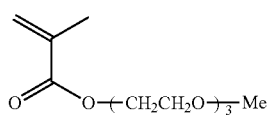

Monomer b
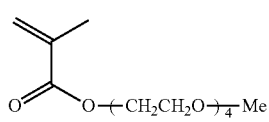

Monomer c
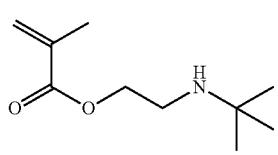

Chain transfer agent (b)
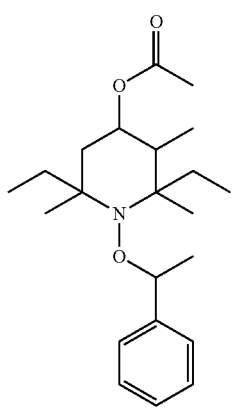

Monomer d
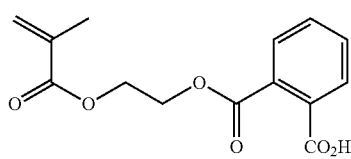

Monomer e
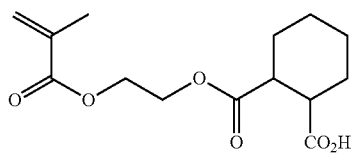

Monomer f
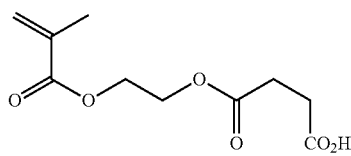

Monomer g
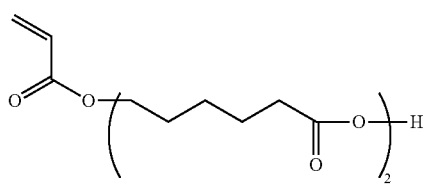

Monomer h
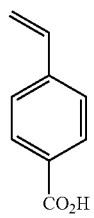

Monomer i
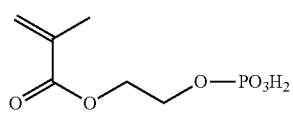

Synthesis Example 3-45

Synthesis of Resin (3-45) (P-Q-P type)

To 233 g of PGMEA were added 41.5 g (0.415 mol) of methyl methacrylate and 2.40 g (0.011 mol) of a chain transfer agent (a), followed by heating at 80° C. for 1 hour under a nitrogen air flow. Then, 1.48 g (0.0090 mol) of azobisisobutyronitrile was added thereto, followed by heating and stirring for 3 hours and then further heating at 120° C. for 2 hours. At this time, the weight average molecular weight (Mw) of the resin (corresponding to a solvent-compatible moiety) was 4,700. Then, 17 g (0.11 mol) of 2-dimethylaminoethyl methacrylate were added, and further 1.48 g (0.0090 mol) of azobisisobutyronitrile was added thereto, followed by stirring for 3 hours. At this time, the weight average molecular weight of the resin was 7,000, and therefore, the weight average molecular weight of the pigment-absorbing moiety was 2,300, which equals [7,000–4,700]. Further, 41.5 g (0.415 mol of methyl methacrylate was added thereto, and further 1.48 g (0.0090 mol) of azobisisobutyronitrile was added thereto, followed by stirring for 3 hours and then heating at 120° C. for 2 hours, thereby obtaining a 30% by mass solution of Resin (3-45) in PGMEA. The weight average molecular weight (Mw) was 12,000 and the degree of dispersion was 1.3. Further, the weight average molecular weight of the solvent-compatible moiety was [12,000–7,000]=5,000. The amine value (titration) was 61 mgKOH/g. The synthesis scheme is shown below.

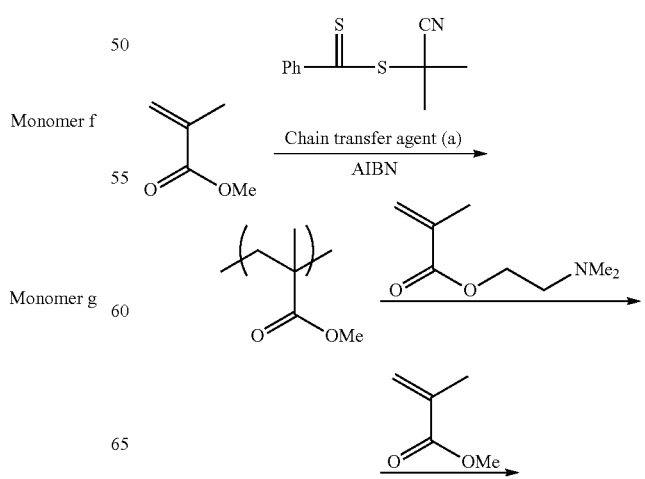

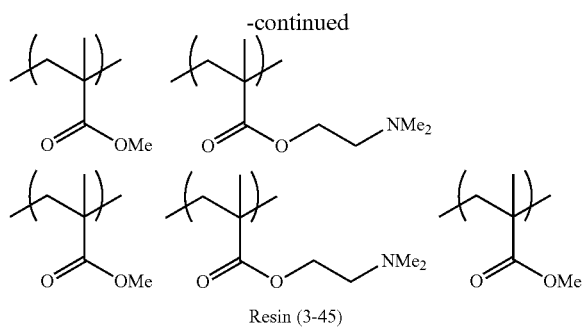

Resin (3-45)

Synthesis Example 3-46

Synthesis of Resin (3-46) (P-Q-P type)

To 233 g of PGMEA were added 41.5 g (0.415 mol) of methyl methacrylate and 2.40 g (0.011 mol) of a chain transfer agent (a), followed by heating at 80° C. for 1 hour under a nitrogen air flow. Then, 1.48 g (0.0090 mol) of azobisisobutyronitrile was added thereto, followed by heating and stirring for 3 hours. At this time, the weight average molecular weight of the resin (corresponding to a solvent-compatible moiety) was 4,900. Then, 17 g (0.079 mol) of monomer d were added, and further 1.48 g (0.0090 mol) of azobisisobutyronitrile was added thereto, followed by stirring for 3 hours. At this time, the weight average molecular weight of the resin was 7,800, and therefore, the weight average molecular weight of the pigment-absorbing moiety was 2,900, which equals [7,800–4,900]. Further, 41.5 g (0.415 mol of methyl methacrylate was added thereto, and further 1.48 g (0.0090 mol) of azobisisobutyronitrile was added thereto, followed by stirring for 3 hours, thereby obtaining a 30% by mass solution of Resin (3-46) in PGMEA. The weight average molecular weight (Mw) was 13,000 and the degree of dispersion was 1.3. Further, the weight average molecular weight of the solvent-compatible moiety was [13,000–7,800]=5,200. The amine value (titration) was 47 mgKOH/g. The synthesis scheme is shown below.

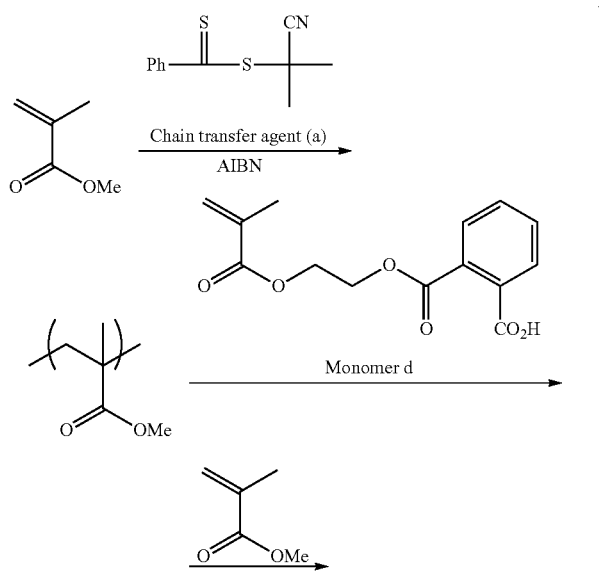

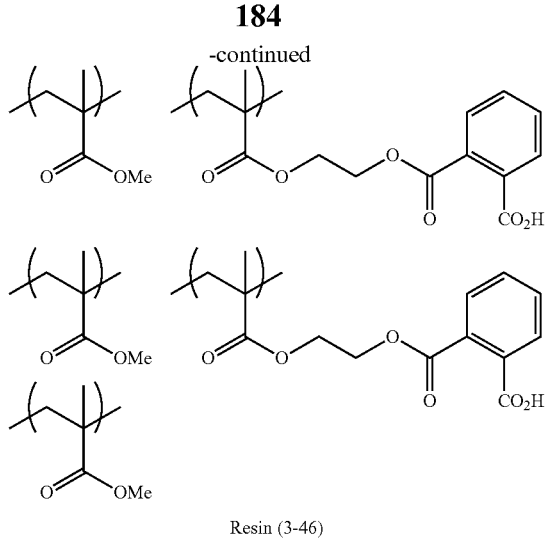

Resin (3-46)

Comparative Synthesis Example 3-1

Synthesis of Resin (3-47)

First, 25 g (0.16 mol) of 2-dimethylaminoethyl methacrylate, 75 g (0.75 mol) of methyl methacrylate, and 2.0 g (0.0099 mol) of dodecyl mercaptan were added to 233 g of PGMEA, followed by heating to 75° C. under a nitrogen air flow. Then, 1.48 g (0.0090 mol) of azobisobutyronitrile was added thereto, followed by heating for 2 hours. Furthermore, 1.48 g (0.0090 mol) of azobisobutyronitrile was added thereto, followed by heating for 2 hours, then elevating the temperature to 90° C., and heating for 1 hour. The obtained solution was left to be cooled, thereby obtaining a 30% by mass solution of the resin (3-47) in PGMEA. Resin (3-47) had an amine value of 85 mgKOH/g, a weight average molecular weight of 19,000, and a weight average molecular weight/number average molecular weight of 2.7. The synthesis scheme is shown below.

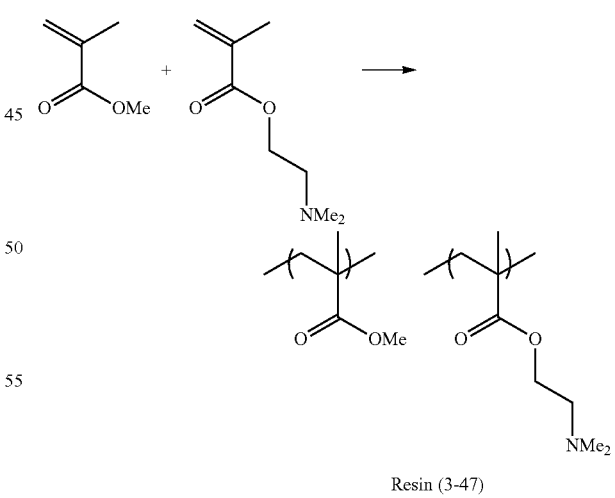

Resin (3-47)

Comparative Synthesis Example 3-2

Synthesis of Resin (3-48)

First, 15 g (0.17 mol) of methacrylic acid, 85 g (0.85 mol) of methyl methacrylate, and 2.0 g (0.0099 mol) of dodecyl mercaptan were added to 233 g of PGMEA, followed by heating to 75° C. under a nitrogen air flow. Then, 1.48 g (0.0090 mol) of azobisobutyronitrile was added thereto, followed by heating for 2 hours. Furthermore, 1.48 g (0.0090 mol) of azobisobutyronitrile was added thereto, followed by heating for 2 hours, then elevating the temperature to 90° C., and heating for 1 hour. The obtained solution was left to be cooled, thereby obtaining a 30% by mass solution of the resin (3-48) in PGMEA. Resin (3-48) had an acid value of 100 mgKOH/g, a weight average molecular weight of 21,000, and a weight average molecular weight/number average molecular weight of 2.7. The synthesis scheme is shown below.

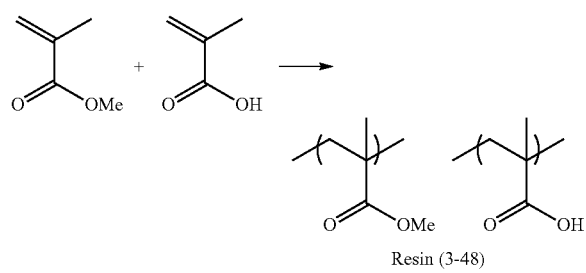

Resin (3-48)

Preparation of Black Curable Composition Using Titanium Black of Example 3-1 to Example 3-52

(Preparation of Dispersion)

The components shown in the following (composition 3-1) were subjected to a high-viscosity distribution process with two rolls to obtain a dispersion. Further, kneading for 30 minutes with a kneader may be carried out before the high-viscosity distribution process.

(Composition 3-I)

| | |
|---|---|
| Titanium black having an average primary particle diameter of 75 nm (13MT (trade name) manufactured by Mitsubishi Materials Co., Ltd.) (Pigment Black 35) | 40 parts |
| 30% by mass solution of each of Resins (3-1) to (3-48) in PGMEA | 5 parts |

The components shown in the following (composition 3-II) were added to the obtained dispersion, followed by stirring for 3 hours using a homogenizer under a condition of 3,000 rpm. The obtained mixed solution was finely dispersed using a dispersing device (trade name: DISPERMAT, manufactured by VMA-GETZMANN GMBH) with 0.3 mm zirconia beads for 4 hours to obtain a titanium black dispersion.

(Composition 3-II)

| | |
|---|---|
| 30% by mass solution of each of Resins (3-1) to (3-48) in PGMEA | 20 parts |
| Solvent: PGMEA | 150 parts |

(Preparation of Black Curable Composition Using Titanium Black)

The compositions of (composition 3-III) as below were mixed with a stirrer to manufacture each of the black curable compositions using titanium black of Example 3-1 to Example 3-52.

(Composition 3-III)

| | |
|---|---|
| Alkali-soluble resin: all 30% by mass solutions of Resin 3-D-1 or Resin 3-D-2 described in Table 10 and Table 11 (the structures are shown below) in PGMEA | 10 parts |
| Polymerizable compound: Dipentaerythritol hexaacrylate | 2.0 parts |
| Polymerizable compound: Pentaerythritol triacrylate | 1.0 part |
| Polymerization initiator: Compound described in Table 10 and Table 11 (the structures are shown below) | 0.3 part |
| Dispersion: each dispersion shown in Table 10 and Table 11 | 24 parts |
| Solvent: PGMEA | 10 parts |
| Solvent: Ethyl-3-ethoxypropionate (referred to as EEP) | 8 parts |
| γ-Methacryloxypropyl trimethoxysilane | 0.1 part |
| MEGAFAC F171 | 0.05 part |

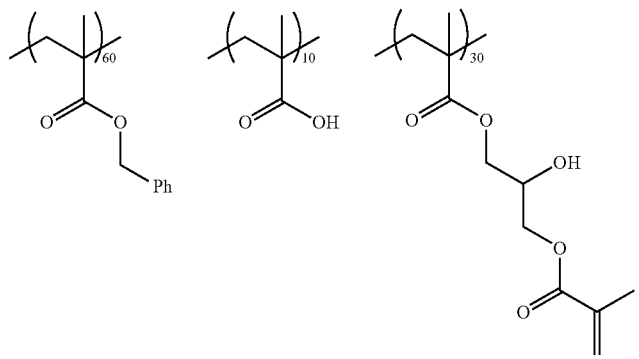

Resin (3-D-1)
Mw 15,000 Mn 9,000

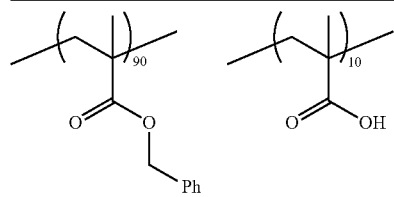

Resin (3-D-2)
Mw 14,000 Mn 8,000

Preparation of Black Curable Composition Using Silver Tin Composition of Example 3-53

A solution in which 15 g of a tin colloid (average particle system: 20 nm, solid content: 20% by mass, manufactured by Sumitomo Osaka Cement Co., Ltd.), 60 g of a silver colloid (average particle: 7 nm, solid content: 20% mass, manufactured by Sumitomo Osaka Cement Co., Ltd.), and 0.75 g of polyvinyl pyrrolidone were dissolved in 100 ml of water was added to 200 ml of pure water that had been warmed to 60° C., thereby obtaining a colloid solution.

Then, this colloid solution was stirred for 60 minutes while being maintained at 60° C., and then irradiated with ultrasonic waves for 5 minutes. Then, this colloidal solution was concentrated by centrifugation to obtain a solution A having a solid content of 25%. The solution A was dried by a frozen-drying method to obtain a powder sample.

A silver tin dispersion was prepared in the same manner as in the preparation of the titanium black dispersion, except that the above powder sample was used instead of titanium black, and Resin (3-3) was used as the resin. Then, black curable composition containing a silver tin composition was prepared in the same manner as in Example 3-1, except that the silver tin dispersion was used instead of the titanium black dispersion used in the preparation of the black curable composition containing titanium black of Example 3-1.

Preparation of Black Curable Composition of Example 3-54

A black curable composition of Example 3-54 was obtained in the same manner as in Example 3-53, except that Resin (3-24) was used instead of Resin (3-3) used in Example 3-53.

Preparation of Mixed Black Curable Compositions of Titanium Black-Red Pigments of Examples 3-55 and 3-56

(Preparation of Red Pigment Dispersion)

The following composition was subjected to a fine dispersion treatment for 4 hours using 0.3 mm zirconium oxide beads with a dispersing machine (trade name: DISPERMAT, manufactured by VMA-GETZMANN GMBH) to manufacture a red pigment dispersion.

| | |
|---|---|
| Organic pigment: C. I. pigment red 254 | 30 parts |
| Resin solution (benzyl methacrylate/methacrylic acid/hydroxyethyl methacrylate copolymer, molar ratio: 80/10/10, Mw: 10000, resin solid content concentration: 40% solution in PGMEA) | 10 parts |
| Solvent: PGMEA | 200 parts |
| Dispersant: 30% solution of Resin (3-3) in PGMEA | 30 parts |

(Preparation of Curable Composition)

A black curable composition was prepared in the same manner as in Example 3-1, except that a mixture of 20 parts of the titanium black dispersion obtained using Resin (3-3), and 4 parts of the red pigment dispersion was used in the dispersion of the composition (3-III). Note that, Resin (3-3) was used in Example 3-55, and Resin (3-24) was used in Example 3-56.

Preparation of Black Curable Composition Using Titanium Black Using Comparative Examples 3-1 and 3-2

Black curable compositions of Comparative Example 3-1 and Comparative Example 3-2 were prepared in the same manner as in Example 3-1, except that Resin (3-1) used in Example 3-1 was changed to Resin (3-47) or Resin (3-48) obtained in Comparative Synthesis Examples.

Preparation of Black Curable Composition Using Carbon Black of Comparative Example 3-3

A black curable composition of Comparative Example 3-3 was prepared in the same manner as in Example 3-1, except that the titanium black used in Example 3-1 was changed to carbon black (TOKA BLACK #7400 (trade name) manufactured by Tokai Carbon Co., Ltd., average primary particle diameter: 28 nm).

The specific resins or comparative resins, the alkali-soluble resins, and the polymerization initiators used in the black curable compositions of Examples 3-1 to 3-56, and Comparative Examples 3-1 to 3-3 are shown in Table 10 and Table 11.

The polymerization initiators (I-1) to (I-6) used in Examples 3-1 to 3-56, and Comparative Examples 3-1 to 3-3 are the same as those used in Examples according to the first aspect of the invention.

TABLE 10

| | Curable composition | Pigment | Specific resin or comparative resin | Alkali-soluble resin | Polymerization initiator |
|---|---|---|---|---|---|
| Example 3-1 | (B3-1) | Titanium black | (3-1) | D3-1 | I-1 |
| Example 3-2 | (B3-2) | Titanium black | (3-2) | D3-1 | I-1 |

TABLE 10-continued

| | Curable composition | Pigment | Specific resin or comparative resin | Alkali-soluble resin | Polymerization initiator |
|---|---|---|---|---|---|
| Example 3-3 | (B3-3) | Titanium black | (3-3) | D3-1 | I-1 |
| Example 3-4 | (B3-4) | Titanium black | (3-4) | D3-1 | I-1 |
| Example 3-5 | (B3-5) | Titanium black | (3-5) | D3-1 | I-1 |
| Example 3-6 | (B3-6) | Titanium black | (3-6) | D3-1 | I-1 |
| Example 3-7 | (B3-7) | Titanium black | (3-7) | D3-1 | I-1 |
| Example 3-8 | (B3-8) | Titanium black | (3-8) | D3-1 | I-1 |
| Example 3-9 | (B3-9) | Titanium black | (3-9) | D3-1 | I-1 |
| Example 3-10 | (B3-10) | Titanium black | (3-10) | D3-1 | I-1 |
| Example 3-11 | (B3-11) | Titanium black | (3-11) | D3-1 | I-1 |
| Example 3-12 | (B3-12) | Titanium black | (3-12) | D3-1 | I-1 |
| Example 3-13 | (B3-13) | Titanium black | (3-13) | D3-1 | I-1 |
| Example 3-14 | (B3-14) | Titanium black | (3-14) | D3-1 | I-1 |
| Example 3-15 | (B3-15) | Titanium black | (3-15) | D3-1 | I-1 |
| Example 3-16 | (B3-16) | Titanium black | (3-16) | D3-1 | I-1 |
| Example 3-17 | (B3-17) | Titanium black | (3-17) | D3-1 | I-1 |
| Example 3-18 | (B3-18) | Titanium black | (3-18) | D3-1 | I-1 |
| Example 3-19 | (B3-19) | Titanium black | (3-19) | D3-1 | I-1 |
| Example 3-20 | (B3-20) | Titanium black | (3-20) | D3-1 | I-1 |
| Example 3-21 | (B3-21) | Titanium black | (3-21) | D3-1 | I-1 |
| Example 3-22 | (B3-22) | Titanium black | (3-22) | D3-1 | I-1 |
| Example 3-23 | (B3-23) | Titanium black | (3-23) | D3-1 | I-1 |
| Example 3-24 | (B3-24) | Titanium black | (3-24) | D3-1 | I-1 |
| Example 3-25 | (B3-25) | Titanium black | (3-25) | D3-1 | I-1 |
| Example 3-26 | (B3-26) | Titanium black | (3-26) | D3-1 | I-1 |
| Example 3-27 | (B3-27) | Titanium black | (3-27) | D3-1 | I-1 |
| Example 3-28 | (B3-28) | Titanium black | (3-28) | D3-1 | I-1 |
| Example 3-29 | (B3-29) | Titanium black | (3-29) | D3-1 | I-1 |
| Example 3-30 | (B3-30) | Titanium black | (3-30) | D3-1 | I-1 |

TABLE 11

| | Curable composition | Pigment | Specific resin or comparative resin | Alkali-soluble resin | polymerization initiator |
|---|---|---|---|---|---|
| Example 3-31 | (B3-31) | Titanium black | (3-31) | D3-1 | I-1 |
| Example 3-32 | (B3-32) | Titanium black | (3-32) | D3-1 | I-1 |
| Example 3-33 | (B3-33) | Titanium black | (3-33) | D3-1 | I-1 |
| Example 3-34 | (B3-34) | Titanium black | (3-34) | D3-1 | I-1 |
| Example 3-35 | (B3-35) | Titanium black | (3-35) | D3-1 | I-1 |
| Example 3-36 | (B3-36) | Titanium black | (3-36) | D3-1 | I-1 |
| Example 3-37 | (B3-37) | Titanium black | (3-37) | D3-1 | I-1 |
| Example 3-38 | (B3-38) | Titanium black | (3-38) | D3-1 | I-1 |
| Example 3-39 | (B3-39) | Titanium black | (3-39) | D3-1 | I-1 |
| Example 3-40 | (B3-40) | Titanium black | (3-40) | D3-1 | I-1 |
| Example 3-41 | (B3-41) | Titanium black | (3-41) | D3-1 | I-1 |
| Example 3-42 | (B3-42) | Titanium black | (3-42) | D3-1 | I-1 |
| Example 3-43 | (B3-43) | Titanium black | (3-43) | D3-1 | I-1 |
| Example 3-44 | (B3-44) | Titanium black | (3-44) | D3-1 | I-1 |
| Example 3-45 | (B3-45) | Titanium black | (3-45) | D3-1 | I-1 |
| Example 3-46 | (B3-46) | Titanium black | (3-46) | D3-1 | I-1 |
| Example 3-47 | (B3-47) | Titanium black | (3-3) | D3-2 | I-1 |
| Example 3-48 | (B3-48) | Titanium black | (3-3) | D3-1 | I-1 |
| Example 3-49 | (B3-49) | Titanium black | (3-3) | D3-1 | I-3 |
| Example 3-50 | (B3-50) | Titanium black | (3-3) | D3-1 | I-4 |
| Example 3-51 | (B3-51) | Titanium black | (3-3) | D3-1 | I-5 |
| Example 3-52 | (B3-52) | Titanium black | (3-3) | D3-1 | I-6 |
| Example 3-53 | (B3-53) | Silver-zinc tin | (3-3) | D3-1 | I-1 |
| Example 3-54 | (B3-54) | Silver-zinc tin | (3-24) | D3-1 | I-1 |
| Example 3-55 | (B3-55) | Titanium black/PR254 | (3-3) | D3-1 | I-1 |
| Example 3-56 | (B3-56) | Titanium black/PR254 | (3-24) | D3-1 | I-1 |
| Comparative Example 3-1 | (B3-57) | Titanium black | (3-47) | D3-1 | I-1 |
| Comparative Example 3-2 | (B3-58) | Titanium black | (3-48) | D3-1 | I-1 |
| Comparative Example 3-3 | (B3-59) | Carbon black | (3-3) | D3-1 | I-1 |

[Preparation and Evaluation of Light-Shielding Color Filter for Solid-State Imaging Device]

(Step of Forming Black Curable Composition Layer)

The coating rotation number of the spin coating was adjusted such that the film thickness after the coating/heating treatment was 2.0 and each of the black curable compositions of Examples 3-1 to 3-56, and Comparative Examples 3-1 to 3-3 was uniformly coated on a silicon wafer (substrate), and subjected to a heating treatment on a hot plate at a surface temperature of 120° C. for 120 seconds. Thus, a black curable composition layer having a film thickness of 2.0 μm was obtained.

(Exposure Step)

Then, the obtained coated layer was irradiated (exposed) by varying the exposure amount in the range from 100 mJ/cm² to 5000 mJ/cm² at an interval of 50 mJ/cm² through a photomask for formation of a 20.0-μm line-and-space pattern, using an i-ray stepper exposure device, FPA-3000 iS+ (manufactured by Canon Inc.).

(Development Step)

After irradiation (exposure), a puddle development was carried out at 23° C. for 60 seconds using a 0.3% aqueous tetramethyl ammonium hydroxide (TMAH) solution, and then rinsing using pure water with a spin shower for 20 seconds and further washing with pure water were carried out.

Thereafter, the water droplets adhered were removed with high-grade air and the substrate was dried to obtain a black image pattern (a 20.0 μm line-and-space pattern) was obtained.

Thus, a light-shielding color filter for a solid-state imaging device was obtained.

[Evaluation]

Each of the black curable compositions obtained as above, and each of the light-shielding color filters for a solid-state imaging'device were evaluated in the following manner. The evaluation results are summarized in Table 12 and Table 13.

(Storage Stability)

The black curable composition was made into a solution, and the viscosities after 1 day and 1 month (storage temperature: 10° C.) were measured at 25° C. using an E-type viscometer (TV-22-type viscometer cone-plate type, manufactured by Toki Sangyo Co., Ltd.), and the difference was taken as storage stability. A smaller difference in the viscosities indicates better storage stability.

(Evaluation of Substrate Adhesion)

A minimum exposure amount such that the peeling-off did not occur from the substrate in the SEM observation was evaluated as sensitivity. A smaller value of the sensitivity indicates a higher substrate adhesion.

(Evaluation of Light-shielding Property)

A maximum transmittance in the wavelength region of 400 nm to 800 nm was measured with a spectrophotometer (UV23600, manufactured by Shimadzu) using the obtained light-shielding color filter. A smaller numeral value indicates better results. A case where the maximum transmittance is less than 1% indicates a good light-shielding property.

TABLE 12

| | Curable composition | Storage stability (mPa · s) | Substrate adhesion (mJ/cm$^2$) | Transmittance (%) |
|---|---|---|---|---|
| Example 3-1 | (B3-1) | 3 | 450 | 0.6 |
| Example 3-2 | (B3-2) | 2.1 | 300 | 0.6 |
| Example 3-3 | (B3-3) | 1.2 | 200 | 0.6 |
| Example 3-4 | (B3-4) | 2.2 | 300 | 0.6 |
| Example 3-5 | (B3-5) | 3.1 | 400 | 0.6 |
| Example 3-6 | (B3-6) | 3.2 | 450 | 0.6 |
| Example 3-7 | (B3-7) | 2.3 | 300 | 0.6 |
| Example 3-8 | (B3-8) | 1.1 | 250 | 0.6 |
| Example 3-9 | (B3-9) | 1.3 | 200 | 0.6 |
| Example 3-10 | (B3-10) | 3.2 | 300 | 0.6 |
| Example 3-11 | (B3-11) | 4.5 | 300 | 0.6 |
| Example 3-12 | (B3-12) | 5 | 350 | 0.6 |
| Example 3-13 | (B3-13) | 2.1 | 250 | 0.6 |
| Example 3-14 | (B3-14) | 1.1 | 200 | 0.6 |
| Example 3-15 | (B3-15) | 5.2 | 350 | 0.6 |
| Example 3-16 | (B3-16) | 1.2 | 200 | 0.6 |
| Example 3-17 | (B3-17) | 2.1 | 300 | 0.6 |
| Example 3-18 | (B3-18) | 1.4 | 200 | 0.6 |
| Example 3-19 | (B3-19) | 2.6 | 300 | 0.6 |
| Example 3-20 | (B3-20) | 3.9 | 450 | 0.6 |
| Example 3-21 | (B3-21) | 1.3 | 200 | 0.6 |
| Example 3-22 | (B3-22) | 2.9 | 350 | 0.6 |
| Example 3-23 | (B3-23) | 2.8 | 200 | 0.6 |
| Example 3-24 | (B3-24) | 0.8 | 150 | 0.6 |
| Example 3-25 | (B3-25) | 1.2 | 250 | 0.6 |
| Example 3-26 | (B3-26) | 2.2 | 300 | 0.6 |
| Example 3-27 | (B3-27) | 2.3 | 300 | 0.6 |
| Example 3-28 | (B3-28) | 1.5 | 250 | 0.6 |
| Example 3-29 | (B3-29) | 0.8 | 150 | 0.6 |
| Example 3-30 | (B3-30) | 0.6 | 150 | 0.6 |
| Example 3-31 | (B3-31) | 3.1 | 200 | 0.6 |
| Example 3-32 | (B3-32) | 3.5 | 250 | 0.6 |
| Example 3-33 | (B3-33) | 3.9 | 250 | 0.6 |
| Example 3-34 | (B3-34) | 0.6 | 150 | 0.6 |
| Example 3-35 | (B3-35) | 1.3 | 150 | 0.6 |
| Example 3-36 | (B3-36) | 3.8 | 250 | 0.6 |
| Example 3-37 | (B3-37) | 0.8 | 150 | 0.6 |
| Example 3-38 | (B3-38) | 2.6 | 250 | 0.6 |
| Example 3-39 | (B3-39) | 0.8 | 150 | 0.6 |
| Example 3-40 | (B3-40) | 0.4 | 150 | 0.6 |

TABLE 13

| | Curable composition | Storage stability (mPa · s) | Substrate adhesion (mJ/cm$^2$) | Transmittance (%) |
|---|---|---|---|---|
| Example 3-41 | (B3-41) | 0.4 | 150 | 0.6 |
| Example 3-42 | (B3-42) | 0.4 | 150 | 0.6 |
| Example 3-43 | (B3-43) | 0.8 | 150 | 0.6 |
| Example 3-44 | (B3-44) | 0.5 | 150 | 0.6 |
| Example 3-45 | (B3-45) | 2.2 | 200 | 0.6 |
| Example 3-46 | (B3-46) | 1.2 | 150 | 0.6 |
| Example 3-47 | (B3-47) | 1.3 | 450 | 0.6 |
| Example 3-48 | (B3-48) | 1.4 | 200 | 0.6 |
| Example 3-49 | (B3-49) | 1.3 | 450 | 0.6 |
| Example 3-50 | (B3-50) | 1.2 | 450 | 0.6 |
| Example 3-51 | (B3-51) | 1.1 | 250 | 0.6 |
| Example 3-52 | (B3-52) | 1.3 | 100 | 0.6 |
| Example 3-53 | (B3-53) | 2.3 | 400 | 0.4 |
| Example 3-54 | (B3-54) | 1.1 | 350 | 0.4 |
| Example 3-55 | (B3-55) | 2.4 | 250 | 0.4 |
| Example 3-56 | (B3-56) | 1.2 | 200 | 0.4 |
| Comparative Example 3-1 | (B3-57) | 15.2 | 750 | 0.6 |
| Comparative Example 3-2 | (B3-58) | 14.5 | 700 | 0.6 |
| Comparative Example 3-3 | (B3-59) | 1.3 | 1200 | 1 |

From Table 12 and Table 13, it can be seen that the black curable composition of the present invention has good storage stability and substrate adhesion, and an excellent light-shielding property.

Examples 3-57 to 3-117 and Comparative Examples 3-4 to 3-6

Preparation and Evaluation of Light-Shielding Film for Wafer Level Lens

By the following procedure, a resin film using the curable composition for a lens film was formed.

This resin film was used and subjected to simulation evaluation of adhesion between the black curable composition and the lens.

(Formation of Thermosetting Resin Film for Lens Film)

Only the amounts shown in the column on the component 2 of the compounds of the component 2 shown in Table 14 were added to the component 1 to manufacture curable compositions 3-1 to 3-6 for a lens film. The curable compositions for a lens film, having blank columns on the component 2, used the component 1 alone.

The curable compositions 3-1 to 3-4 (2 mL) shown in Table 14 were coated on a 5 cm×5 cm glass substrate (thickness 1 mm, BK7, manufactured by Schott Glass Technologies, Inc.), heated at 200° C. for 1 minute, and cured to form a lens film (films 1 to 4), which can be evaluated on the residues on the lens.

(Formation of Photocurable Resin Film for Lens Film)

The curable compositions 3-5 and 3-6 (2 mL) shown in Table 14 were coated on a 5 cm×5 cm glass substrate (thickness 1 mm, BK7 (trade name), manufactured by Schott Glass Technologies, Inc.), and cured by irradiation of light at 3000 mJ/cm$^2$ with a metal halide lamp to form a lens film (films 3-5 and 3-6), which can be evaluated in terms of the residues on the lens.

TABLE 14

| Curable composition for lens film | Component 1 | Component 2 | Kind of formed film |
|---|---|---|---|
| 3-1 | DOW CORNING(R) SR 7010 (trade name) (manufactured by Dow Corning Toray Co., Ltd.) | | Thermosetting silicone resin film |
| 3-2 | 1,10-Decanediol diacrylate (NKESTER A-DOG (trade name) manufactured by Shin Nakamura Chemical Co., Ltd.) | Di-t-butyl peroxide (1% by mass) | Thermosetting acryl resin film |
| 3-3 | Alicyclic bisphenol A liquid epoxy resin (YX8000 (trade name) manufactured by Japan Epoxy Resin Co., Ltd.) | | Thermosetting epoxy resin film |

TABLE 14-continued

| Curable composition for lens film | Component 1 | Component 2 | Kind of formed film |
|---|---|---|---|
| 3-4 | Polydiallyl phthalate (BA901 (trade name) manufactured by Showa Denko K. K.) | | Thermosetting allyl resin film |
| 3-5 | Trimethylolpropane(meth)acrylate (ARONIX (trade name) M-309 manufactured by Toagosei Co., Ltd.) | 1-Hydroxycyclohexylphenylketone (0.1% by mass) | Photo-curable acryl resin film |
| 3-6 | Alicyclic epoxy resin (EHPE-3150 (trade name) manufactured by Dicel Chemical Industries Co., Ltd.) | Arylsulfonium salt derivative (1% by mass) (SP-172 (trade name) manufactured by Asahi Denka Corporation) | Photo-curable epoxy resin film |

(Formation of Black Curable Composition Layer on Lens)

The coating rotation number of the spin coating was adjusted such that the film thickness after the coating/heating treatment was 2.0 µm, and the black curable compositions (B3-1) to (B3-59) used in Examples 3-1 to 3-56 and Comparative Examples 1 to 3 were uniformly coated, on a glass wafer substrate on which the resin film had been formed by the curable compositions 3-1 to 3-6 for a lens film, and subjected to a heating treatment on a hot plate at a surface temperature of 120° C. for 120 seconds. Thus, a black curable composition layer having a film thickness of 2.0 µm was obtained. Further, the curable compositions 3-1 to 3-6 for a lens film, and the black curable compositions (B3-1) to (B3-59) used in each of Examples and Comparative Examples are shown in Table 15 and Table 16.

(Exposure Step)

Next, the obtained black curable composition layer was subjected to exposure by varying an exposure amount in the range from 100 mJ/cm$^2$ to 1000 mJ/cm$^2$ at an interval of 50 mJ/cm$^2$ through a photomask having a 10-mm hole pattern, using a high-pressure mercury lamp.

(Development Step)

The black curable composition layer after the exposure was subjected to a paddle development at 23° C. for 60 seconds using a 0.3% aqueous tetramethyl ammonium hydroxide solution, then rinsed with a spin shower, and then washed with pure water to obtain a light-shielding film having a pattern shape.

The black curable composition layer was formed on a glass wafer on which a resin film obtained from the curable composition for a lens film had been formed, and subjected to exposure/development/rinsing, and the obtained substrate having the light-shielding film was used to carry out evaluation. The evaluation results are summarized in Table 15 and Table 16.

(Evaluation of Adhesion on Lens)

A minimum exposure amount such that the peeling-off did not occur from the resin film obtained from the curable composition for a lens film was evaluated as an index of adhesion to a lens. A smaller value of the minimum exposure amount indicates higher adhesion with a lens.

(Formation of Black Curable Composition Layer on Glass Wafer)

The coating rotation number of the spin coating was adjusted such that the film thickness after the coating/heating treatment was 2.0 µm, and the black curable compositions (B3-1) to (B3-59) were uniformly coated on a glass wafer substrate (thickness 1 mm, BK7, manufactured by Schott Glass Technologies, Inc.) and subjected to a heating treatment on a hot plate at a surface temperature of 120° C. for 120 seconds. Thus, a black curable composition layer having a film thickness of 2.0 µm was obtained.

(Exposure Step)

Next, the obtained coated layer was subjected to exposure by varying an exposure amount in the range from 100 mJ/cm$^2$ to 1000 mJ/cm$^2$ at an interval of 50 mJ/cm$^2$ through a photomask having a 5.0-mm hole pattern, using a high-pressure mercury lamp.

(Development Step)

The black curable composition layer after exposure above was subjected to a paddle development at 23° C. for 60 seconds using a 0.3% aqueous tetramethyl ammonium hydroxide solution, then rinsed with a spin shower, and then washed with pure water to obtain a light-shielding film having a pattern shape.

(Evaluation of Adhesion on Glass Wafer)

The black curable composition layer was formed on a glass wafer and subjected to exposure/development/rinsing, and the obtained substrate having the light-shielding film was used to carry out evaluation.

A minimum exposure amount such that the peeling-off did not occur from the glass wafer substrate was evaluated as an index of adhesion to a glass wafer. A smaller value of the minimum exposure amount indicates higher adhesion onto the glass wafer.

(Evaluation of Light-Shielding Property)

A maximum transmittance in the wavelength region of 400 nm to 800 nm was measured with a spectrophotometer (UV23600, manufactured by Shimadzu) using the obtained light-shielding color filter. A smaller numeral value indicates better results. In a case of the maximum transmittance of 1% below, it represents that the light-shielding property is good.

The evaluation results are summarized in Table 15 and Table 16.

TABLE 15

| | Black curable composition | Curable composition for lens | Adhesion on lens (mJ/cm$^2$) | Adhesion on glass wafer (mJ/cm$^2$) | Transmittance (%) |
|---|---|---|---|---|---|
| Example 3-57 | (B3-1) | 3-1 | 250 | 250 | 0.6 |
| Example 3-58 | (B3-2) | 3-1 | 200 | 200 | 0.6 |
| Example 3-59 | (B3-3) | 3-1 | 100 | 100 | 0.6 |
| Example 3-60 | (B3-4) | 3-1 | 200 | 200 | 0.6 |
| Example 3-61 | (B3-5) | 3-1 | 250 | 250 | 0.6 |
| Example 3-62 | (B3-6) | 3-1 | 300 | 300 | 0.6 |
| Example 3-63 | (B3-7) | 3-1 | 200 | 200 | 0.6 |
| Example 3-64 | (B3-8) | 3-1 | 150 | 150 | 0.6 |
| Example 3-65 | (B3-9) | 3-1 | 150 | 150 | 0.6 |
| Example 3-66 | (B3-10) | 3-1 | 200 | 200 | 0.6 |
| Example 3-67 | (B3-11) | 3-1 | 200 | 200 | 0.6 |
| Example 3-68 | (B3-12) | 3-1 | 200 | 200 | 0.6 |
| Example 3-69 | (B3-13) | 3-1 | 150 | 150 | 0.6 |
| Example 3-70 | (B3-14) | 3-1 | 100 | 100 | 0.6 |
| Example 3-71 | (B3-15) | 3-1 | 200 | 200 | 0.6 |
| Example 3-72 | (B3-16) | 3-1 | 150 | 150 | 0.6 |

TABLE 15-continued

| | Black curable composition | Curable composition for lens | Adhesion on lens (mJ/cm$^2$) | Adhesion on glass wafer (mJ/cm$^2$) | Transmittance (%) |
|---|---|---|---|---|---|
| Example 3-73 | (B3-17) | 3-1 | 200 | 200 | 0.6 |
| Example 3-74 | (B3-18) | 3-1 | 100 | 100 | 0.6 |
| Example 3-75 | (B3-19) | 3-1 | 200 | 200 | 0.6 |

TABLE 16

| | Black curable composition | Curable composition for lens | Adhesion on lens (mJ/cm$^2$) | Adhesion on glass wafer (mJ/cm$^2$) | Transmittance (%) |
|---|---|---|---|---|---|
| Example 3-76 | (B3-20) | 3-1 | 300 | 300 | 0.6 |
| Example 3-77 | (B3-21) | 3-1 | 100 | 100 | 0.6 |
| Example 3-78 | (B3-22) | 3-1 | 300 | 300 | 0.6 |
| Example 3-79 | (B3-23) | 3-1 | 200 | 200 | 0.6 |
| Example 3-80 | (B3-24) | 3-1 | 150 | 150 | 0.6 |
| Example 3-81 | (B3-25) | 3-1 | 200 | 200 | 0.6 |
| Example 3-82 | (B3-26) | 3-1 | 250 | 250 | 0.6 |
| Example 3-83 | (B3-27) | 3-1 | 250 | 250 | 0.6 |
| Example 3-84 | (B3-28) | 3-1 | 250 | 250 | 0.6 |
| Example 3-85 | (B3-29) | 3-1 | 150 | 150 | 0.6 |
| Example 3-86 | (B3-30) | 3-1 | 150 | 150 | 0.6 |
| Example 3-87 | (B3-31) | 3-1 | 150 | 150 | 0.6 |
| Example 3-88 | (B3-32) | 3-1 | 200 | 200 | 0.6 |
| Example 3-89 | (B3-33) | 3-1 | 300 | 300 | 0.6 |
| Example 3-90 | (B3-34) | 3-1 | 150 | 150 | 0.6 |
| Example 3-91 | (B3-35) | 3-1 | 200 | 200 | 0.6 |
| Example 3-92 | (B3-36) | 3-1 | 350 | 350 | 0.6 |
| Example 3-93 | (B3-37) | 3-1 | 150 | 150 | 0.6 |
| Example 3-94 | (B3-38) | 3-1 | 300 | 300 | 0.6 |
| Example 3-95 | (B3-39) | 3-1 | 150 | 150 | 0.6 |
| Example 3-96 | (B3-40) | 3-1 | 150 | 150 | 0.6 |
| Example 3-97 | (B3-41) | 3-1 | 150 | 150 | 0.6 |
| Example 3-98 | (B3-42) | 3-1 | 150 | 150 | 0.6 |
| Example 3-99 | (B3-43) | 3-1 | 150 | 150 | 0.6 |
| Example 3-100 | (B3-44) | 3-1 | 150 | 150 | 0.6 |
| Example 3-101 | (B3-45) | 3-1 | 150 | 150 | 0.6 |
| Example 3-102 | (B3-46) | 3-1 | 150 | 150 | 0.6 |
| Example 3-103 | (B3-47) | 3-1 | 300 | 300 | 0.6 |
| Example 3-104 | (B3-48) | 3-1 | 150 | 150 | 0.6 |
| Example 3-105 | (B3-49) | 3-1 | 300 | 300 | 0.6 |
| Example 3-106 | (B3-50) | 3-1 | 300 | 300 | 0.6 |
| Example 3-107 | (B3-51) | 3-1 | 150 | 150 | 0.6 |
| Example 3-108 | (B3-52) | 3-1 | 100 | 100 | 0.6 |
| Example 3-109 | (B3-53) | 3-1 | 250 | 250 | 0.4 |
| Example 3-110 | (B3-54) | 3-1 | 250 | 250 | 0.4 |
| Example 3-111 | (B3-55) | 3-1 | 150 | 240 | 0.4 |
| Example 3-112 | (B3-56) | 3-1 | 150 | 150 | 0.4 |
| Example 3-113 | (B3-1) | 3-2 | 250 | 250 | 0.6 |
| Example 3-114 | (B3-1) | 3-3 | 250 | 250 | 0.6 |
| Example 3-115 | (B3-1) | 3-4 | 250 | 250 | 0.6 |
| Example 3-116 | (B3-1) | 3-5 | 200 | 250 | 0.6 |
| Example 3-117 | (B3-1) | 3-6 | 200 | 250 | 0.6 |
| Comparative Example 3-4 | (B3-57) | 3-1 | 450 | 500 | 0.6 |
| Comparative Example 3-5 | (B3-58) | 3-1 | 400 | 450 | 0.6 |
| Comparative Example 3-6 | (B3-59) | 3-1 | 700 | 700 | 1 |

From Table 15 and Table 16, it can be seen that the black curable composition of the present invention has excellent adhesion on lenses which are important in the applications regarding wafer level lenses and on glass wafer substrates.

From the above description, it can be seen that the black curable composition of the present invention has excellent adhesion on a silicon wafer under irradiation with exposure using an i-ray stepper exposure device which is required during formation of a light-shielding film used for a solid-state imaging device, and highly excellent adhesion on a lens and a glass substrate under irradiation with a mercury lamp which is required during formation of a light-shielding film used for a wafer level lens.

Example 3-118

A curable resin layer was formed on a glass substrate using the curable composition 5 for a lens film, its shape was transcribed to a quartz mold having a lens shape, and cured at an exposure amount of 3000 mJ/cm$^2$ with a high-pressure mercury lamp to form a lens. Then, the black curable composition (B3-1) of Example 3-1 was coated, and exposed with a high-pressure mercury lamp through a photomask having a 0.5-mm hole pattern, and the unexposed portion was removed with a 0.3% aqueous tetramethyl ammonium hydroxide solution to form a light-shielding film on the outside and outer edge of the lens, thereby manufacturing a wafer level lens array having plural wafer level lenses.

The manufactured wafer level lens array was cut, and a lens module was manufactured therewith, and then equipped with an imaging device and a sensor substrate to manufacture an imaging unit.

The wafer level lens obtained in Example 3-118 had no residue in the opening of the lens and good transmission, as well as high uniformity on the coated side in the portion of the light-shielding layer, no peeling-off of the light-shielding section observed, and a high light-shielding property.

Examples 3-119 to 3-172 and Comparative Examples 3-7 to 3-9

Preparation and Evaluation of Infrared Ray-Shielding Film for Solid-State Imaging Device <Manufacturing of Substrate A and Substrate B>
(Manufacturing of Substrate A)

The substrate A was manufactured in the following manner for validation of the development residues in the solid-state imaging device (a form in which there is no solder resist layer on the back side) of one embodiment as above.

That is, by a microprocessing (photolithography) technique, a sputtering method, and an electroplating technique, a copper (Cu)-made circular metal electrode having a thickness of 5 μm and a diameter of 10 μm was obtained on a silicon substrate having a thickness of 1000 μm.

Thus, as shown in the schematic cross-sectional view of FIG. 11, the substrate A having plural circular metal electrodes 310 was obtained on the silicon substrate 300.

(Manufacturing of Substrate B)

The substrate B was manufactured in the following manner for validation of the development residues in the solid-state imaging device (a form in which there is a solder resist layer on the back side) of one embodiment as above.

A solder resist layer having a pattern shape was formed on the side on which the circular metal electrode of the substrate A had been formed by photolithography using the following solder resist.

As the pattern of the solder resist layer, a pattern having an opening which exposes a part of the metal electrode as shown in FIG. 13 was taken.

Thus, as shown in the schematic cross-sectional view of FIG. 13, the substrate B with a constitution having the circular metal electrodes 310 and the solder resist layers 330 was obtained on the silicon substrate 300.

The components of the solder resist are as follows.

| | |
|---|---|
| Resin solution below | 155 parts |
| 2-(Acetyloxyiminomethyl)thioxanthen-9-one (photopolymerization initiator) | 2 parts |
| 2-Methyl-1-[4-(methyl thiophenyl)]-2-morpholinopropan-1-one (photopolymerization initiator) | 6 parts |
| 2,4-Diethylthioxanthone (sensitizer) | 1 part |
| C. I. pigment blue 15:6 (colorant) | 0.9 part |
| C. I. pigment yellow 199 (colorant) | 2.3 parts |
| Dipentaerythritol hexaacrylate (monomer) | 20 parts |
| Trimethylolpropane triacrylate (monomer) | 10 parts |
| Barium sulfate (filler) | 130 parts |
| Phenol novolak epoxy resin (EPPN-201 manufactured by Nippon Kayaku Co., Ltd.) (thermosetting component) | 15 parts |
| Bixylenol epoxy resin (YX-4000 manufactured by Epoxy Resins Co., Ltd.) | 30 parts |
| Melamine | 3 parts |
| Dipropylene glycol methyletheracetate | 5 parts |
| #150 (Aromatic organic solvent manufactured by Idemitsu Petrochemical Co., Ltd.) | 5 parts |

(Preparation of Resin Solution)

First, 660 g of a cresol novolak epoxy resin (EOCN-104S manufactured by Nippon Kayaku Co., Ltd.), 421.3 g of carbitol acetate, and 180.6 g of an solvent naphtha, were charged, followed by heating/stirring at 90° C. for dissolution. Then, the mixture was cooled to 60° C., 216 g of acrylic acid, 4.0 g of triphenylphosphine, and 1.3 g of p-methoxy phenol were added thereto, followed by performing a reaction at 100° C. for 12 hours. At this time, the acid value was 0.3 mgKOH/g. 241.7 g of tetrahydrophthalic anhydride was added thereto, followed by heating to 90° C. and allowing the reaction to proceed for 6 hours. Thus, a resin solution having a solid content concentration of 65% by mass, a solid content acid value of 77 mgKOH/g, a double bond equivalent (amount of resin by weight (g) per mole of unsaturated group) of 400 g/equivalent, and a weight average molecular weight of 8,000 was obtained.

<Manufacturing of Light-Shielding Film>

The black curable composition prepared above was spin-coated on the side on which the metal electrode of the substrate A had been formed, and then heated at 120° C. for 2 minutes on a hot plate to obtain a black curable composition-coated layer.

Then, the obtained coated layer was pattern-exposed at each exposure amount of 100 mJ/cm$^2$, 200 mJ/cm$^2$, 300 mJ/cm$^2$, 400 mJ/cm$^2$, and 500 mJ/cm$^2$ using an i-ray stepper exposure device.

Next, the coated layer after exposure was subjected to a puddle development at 23° C. for 60 seconds using a 0.3% aqueous tetramethyl ammonium hydroxide solution, then rinsed with a spin shower, and then washed with pure water to obtain a light-shielding film having a pattern shape.

Here, the light-shielding film was formed to have a pattern having an opening which exposes a part of the metal electrode 310 as shown in FIG. 12 (light-shielding film 320 in FIG. 12).

Thus, in the same manner except that the substrate B was used instead of the substrate A, a light-shielding film having a pattern shape was formed.

Here, the light-shielding film was formed to have a pattern having an opening which exposes a part of the metal electrode 310 as shown in FIG. 14 (specifically, a pattern overlapping the solder resist layer when seen in the normal direction to the substrate; the light-shielding film 340 in FIG. 14).

(Evaluation of Adhesion)

As for the SEM observation, a minimum exposure amount such that the peeling-off did not occur was evaluated as sensitivity. A smaller value of sensitivity indicates higher substrate adhesion.

(Evaluation of Light-Shielding Property)

A maximum transmittance in the wavelength region of 800 nm to 1200 nm was measured with a spectrophotometer (UV23600, manufactured by Shimadzu) using the obtained light-shielding color filter. A smaller numeral value indicates better results. A case where the maximum transmittance is less than 1% indicates a good light-shielding property.

The results are shown in Table 17 and Table 18.

TABLE 17

| | Black curable composition | Adhesion on substrate A (mJ/cm$^2$) | Adhesion on substrate B (mJ/cm$^2$) | Transmittance (%) |
|---|---|---|---|---|
| Example 3-119 | (B3-1) | 300 | 200 | 0.5 |
| Example 3-120 | (B3-2) | 250 | 150 | 0.5 |
| Example 3-121 | (B3-3) | 200 | 200 | 0.5 |
| Example 3-122 | (B3-4) | 250 | 200 | 0.5 |
| Example 3-123 | (B3-5) | 250 | 250 | 0.5 |
| Example 3-124 | (B3-6) | 400 | 350 | 0.5 |
| Example 3-125 | (B3-7) | 250 | 200 | 0.5 |
| Example 3-126 | (B3-8) | 200 | 150 | 0.5 |
| Example 3-127 | (B3-9) | 200 | 150 | 0.5 |
| Example 3-128 | (B3-10) | 250 | 200 | 0.5 |
| Example 3-129 | (B3-11) | 300 | 200 | 0.5 |
| Example 3-130 | (B3-12) | 300 | 200 | 0.5 |
| Example 3-131 | (B3-13) | 200 | 150 | 0.5 |
| Example 3-132 | (B3-14) | 100 | 100 | 0.5 |
| Example 3-133 | (B3-15) | 250 | 200 | 0.5 |
| Example 3-134 | (B3-16) | 150 | 100 | 0.5 |
| Example 3-135 | (B3-17) | 250 | 200 | 0.5 |
| Example 3-136 | (B3-18) | 150 | 100 | 0.5 |
| Example 3-137 | (B3-19) | 250 | 250 | 0.5 |
| Example 3-138 | (B3-20) | 350 | 300 | 0.5 |
| Example 3-139 | (B3-21) | 150 | 100 | 0.5 |
| Example 3-140 | (B3-22) | 400 | 300 | 0.5 |
| Example 3-141 | (B3-23) | 250 | 200 | 0.5 |
| Example 3-142 | (B3-24) | 200 | 150 | 0.5 |
| Example 3-143 | (B3-25) | 250 | 200 | 0.5 |
| Example 3-144 | (B3-26) | 300 | 300 | 0.5 |
| Example 3-145 | (B3-27) | 300 | 250 | 0.5 |
| Example 3-146 | (B3-28) | 350 | 300 | 0.5 |
| Example 3-147 | (B3-29) | 200 | 150 | 0.5 |
| Example 3-148 | (B3-30) | 200 | 150 | 0.5 |
| Example 3-149 | (B3-31) | 100 | 150 | 0.5 |
| Example 3-150 | (B3-32) | 250 | 200 | 0.5 |

TABLE 18

| | Black curable composition | Adhesion on substrate A (mJ/cm$^2$) | Adhesion on substrate B (mJ/cm$^2$) | Transmittance (%) |
|---|---|---|---|---|
| Example 3-151 | (B3-33) | 300 | 250 | 0.5 |
| Example 3-152 | (B3-34) | 200 | 150 | 0.5 |
| Example 3-153 | (B3-35) | 250 | 200 | 0.5 |
| Example 3-154 | (B3-36) | 400 | 350 | 0.5 |
| Example 3-155 | (B3-37) | 200 | 150 | 0.5 |
| Example 3-156 | (B3-38) | 350 | 300 | 0.5 |
| Example 3-157 | (B3-39) | 150 | 150 | 0.5 |
| Example 3-158 | (B3-40) | 200 | 150 | 0.5 |
| Example 3-159 | (B3-41) | 200 | 150 | 0.5 |
| Example 3-160 | (B3-42) | 150 | 150 | 0.5 |
| Example 3-161 | (B3-43) | 150 | 150 | 0.5 |
| Example 3-162 | (B3-44) | 150 | 150 | 0.5 |
| Example 3-163 | (B3-45) | 150 | 150 | 0.5 |
| Example 3-164 | (B3-46) | 200 | 150 | 0.5 |
| Example 3-165 | (B3-47) | 450 | 400 | 0.5 |
| Example 3-166 | (B3-48) | 200 | 150 | 0.5 |
| Example 3-167 | (B3-49) | 350 | 300 | 0.5 |
| Example 3-168 | (B3-50) | 350 | 350 | 0.5 |
| Example 3-169 | (B3-51) | 150 | 150 | 0.5 |
| Example 3-170 | (B3-52) | 100 | 100 | 0.5 |

TABLE 18-continued

| | Black curable composition | Adhesion on substrate A (mJ/cm$^2$) | Adhesion on substrate B (mJ/cm$^2$) | Transmittance (%) |
|---|---|---|---|---|
| Example 3-171 | (B3-53) | 400 | 250 | 0.8 |
| Example 3-172 | (B3-54) | 400 | 300 | 0.8 |
| Comparative Example 3-7 | (B3-57) | 450 | 500 | 0.5 |
| Comparative Example 3-8 | (B3-58) | 400 | 450 | 0.5 |
| Comparative Example 3-9 | (B3-59) | 700 | 700 | 1.4 |

From the result in Table 17 and Table 18, it can be understood that the infrared light-shielding film of the present invention exhibits a high adhesion to any one of copper as a metal electrode and a solder resist layer.

The invention claimed is:

1. A black curable composition for a wafer level lens, comprising:
   (A1) an inorganic pigment;
   (B1) a dispersion resin having a phosphoric acid group or a sulfonic acid group in a molecule thereof;
   (C1) a polymerization initiator; and
   (D1) a polymerizable compound,
   wherein (i) the (B1) dispersion resin comprises a copolymer of a monomer (b1-1) having a phosphoric acid group or a sulfonic acid group with a macromonomer (b1-2) having a weight average molecular weight of from 1,000 to 30,000; or (ii) the (B1) dispersion resin comprises a resin that has a polyether structure in the main chain thereof and is represented by the following Formula (I):

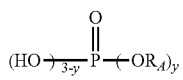

Formula (I)

wherein, in Formula (I), R$_A$ represents a molecular chain which has a number average molecular weight of from 500 to 30,000 and which is a polyether; and y represents 1 or 2.

2. The black curable composition according to claim 1, wherein the (A1) inorganic pigment comprises titanium black.

3. The black curable composition according to claim 1, further comprising (E) an organic pigment.

4. A wafer level lens, comprising, at a peripheral portion of a lens that is present on a substrate, a light-shielding section obtained using a black curable composition, the black curable composition comprising:
   (A1) an inorganic pigment;
   (B1) a dispersion resin having a phosphoric acid group or a sulfonic acid group in a molecule thereof;
   (C1) a polymerization initiator; and
   (D1) a polymerizable compound,
   wherein (i) the (B1) dispersion resin comprises a copolymer of a monomer (b1-1) having a phosphoric acid group or a sulfonic acid group with a macromonomer (b1-2) having a weight average molecular weight of from 1,000 to 30,000; or (iii) the (B1) dispersion resin comprises a resin that has a polyether structure or a polyester structure in the main chain thereof and is represented by the following Formula (I):

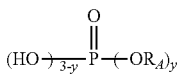

Formula (I)

wherein, in Formula (I), R$_A$ represents a molecular chain which has a number average molecular weight of from 500 to 30,000 and which is selected from a polyether or a polyester; and y represents 1 or 2.

5. A black curable composition for formation of a light-shielding film, comprising:
   (A2) an inorganic pigment;
   (B2) a dispersion resin which has at least one of a phosphoric acid group or a sulfonic acid group in a molecule thereof and has an acid value of from 10 mgKOH/g to 100 mgKOH/g;
   (C2) a polymerization initiator; and
   (D2) a polymerizable compound,
   wherein the light-shielding film blocks infrared light and is provided on one surface of a silicon substrate having an imaging device section on an opposite surface thereof,
   wherein (i) the (B2) dispersion resin comprises a copolymer of a monomer (b2-1) having a phosphoric acid group or a sulfonic acid group with a macromonomer (b2-2) having a weight average molecular weight of from 1,000 to 30,000; or (ii) the (B2) dispersion resin comprises a resin that has a polyether structure in the main chain thereof and is represented by the following Formula (I):

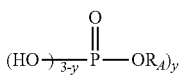

Formula (I)

wherein, in Formula (I), R$_A$ represents a molecular chain which has a number average molecular weight of from 500 to 30,000 and which is a polyether; and y represents 1 or 2.

6. The black curable composition according to claim 5, wherein the (A2) inorganic pigment comprises titanium black.

7. The black curable composition according to claim 5, wherein the (B2) dispersion resin has an acid value of from 20 mgKOH/g to 70 mgKOH/g.

8. The black curable composition according to claim 5, wherein the (C2) polymerization initiator is an oxime ester compound or a hexaarylbiimidazole compound.

9. The black curable composition according to claim 6, wherein the titanium black as the (A2) inorganic pigment has an average primary particle diameter of from 30 nm to 65 nm.

10. The black curable composition according to claim 5, wherein the content of the (B2) dispersion resin in terms of mass ratio is from 0.20 to 0.40 relative to the (A2) inorganic pigment.

11. A light-shielding film, which is formed using a black curable composition on one surface of a silicon substrate having an imaging device section on an opposite surface thereof, the black curable composition comprising:
   (A2) an inorganic pigment;
   (B2) a dispersion resin which has at least one of a phosphoric acid group or a sulfonic acid group in a molecule thereof and has an acid value of from 10 mgKOH/g to 100 mgKOH/g;

(C2) a polymerization initiator; and
(D2) a polymerizable compound,
wherein the light-shielding film blocks infrared light and is provided on one surface of a silicon substrate having an imaging device section on an opposite surface thereof,
wherein (i) the (B2) dispersion resin comprises a copolymer of a monomer (b2-1) having a phosphoric acid group or a sulfonic acid group with a macromonomer (b2-2) having a weight average molecular weight of from 1,000 to 30,000; or (iii) the (B2) dispersion resin comprises a resin that has a polyether structure or a polyester structure in the main chain thereof and is represented by the following Formula (I):

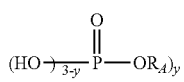

Formula (I)

wherein, in Formula (I), $R_A$ represents a molecular chain which has a number average molecular weight of from 500 to 30,000 and which is selected from a polyether or a polyester; and y represents 1 or 2.

12. A solid-state imaging device, comprising the light-shielding film according to claim 11 on one surface of a silicon substrate having an imaging device section on an opposite surface thereof.

13. The solid-state imaging device according to claim 12, comprising:
a silicon substrate having an imaging device section on one surface thereof;
a metal electrode provided on an opposite surface of the silicon substrate and electrically connected with the imaging device section; and
the light-shielding film according to claim 11, which is provided on the surface of the silicon substrate having the metal electrode provided thereon, and which is patterned so that at least a part of the metal electrode is exposed.

14. The solid-state imaging device according to claim 13, wherein a solder resist is provided between the metal electrode and the light-shielding film.

15. A method for manufacturing a light-shielding film, comprising:
applying a black curable composition on one surface of a silicon substrate having an imaging device section on an opposite surface thereof to form a black curable composition layer;
subjecting the black curable composition layer to pattern exposure; and
developing the black curable composition layer after exposure to form a pattern, wherein the black curable composition comprises:
(A2) an inorganic pigment;
(B2) a dispersion resin which has at least one of a phosphoric acid group or a sulfonic acid group in a molecule thereof and has an acid value of from 10 mgKOH/g to 100 mgKOH/g;
(C2) a polymerization initiator; and
(D2) a polymerizable compound,
wherein the light-shielding film blocks infrared light and is provided on one surface of a silicon substrate having an imaging device section on an opposite surface thereof,
wherein (i) the (B2) dispersion resin comprises a copolymer of a monomer (b2-1) having a phosphoric acid group or a sulfonic acid group with a macromonomer (b2-2) having a weight average molecular weight of from 1,000 to 30,000; or (iii) the (B2) dispersion resin comprises a resin that has a polyether structure or a polyester structure in the main chain thereof and is represented by the following Formula (I):

Formula (I)

wherein, in Formula (I), $R_A$ represents a molecular chain which has a number average molecular weight of from 500 to 30,000 and which is selected from a polyether or a polyester; and y represents 1 or 2.

16. A black curable composition, comprising:
(A3) an inorganic pigment;
(B3) a chain resin comprising a solvent-compatible moiety and a pigment-adsorbing moiety having a basic group, and not comprising an acidic group, the chain resin having an amine value of from 75 mgKOH/g to 150 mgKOH/g;
(C3) a polymerization initiator; and
(D3) a polymerizable compound.

17. The black curable composition according to claim 16, wherein the (A3) inorganic pigment comprises titanium black.

18. The black curable composition according to claim 16, wherein the solvent-compatible moiety comprises repeating units having an I/O value in a range from 0.05 to 1.50 in an amount of 80% by mass or more.

19. The black curable composition according to claim 16, wherein the solvent-compatible moiety comprises a repeating unit represented by the following Formula (I-A) or the following Formula (I-B):

(I-A)

wherein, in Formula (I-A), $R^1$ represents an alkoxy group, a cycloalkoxy group, or an aryloxy group; and $R^2$ represents a hydrogen atom, a halogen atom, or an alkyl group:

(I-B)

wherein, in Formula (I-B), $R^3$ represents an aryl group; and $R^4$ represents a hydrogen atom or an alkyl group.

20. The black curable composition according to claim 16, wherein the (C3) polymerization initiator is an oxime ester compound or a hexaarylbiimidazole compound.

21. The black curable composition according to any one of claims 16 to 20, further comprising (E3) an alkali-soluble resin that is other than the (B3) chain resin.

22. The black curable composition according to claim 16, further comprising (F3) an organic pigment.

23. A light-shielding color filter for a solid-state imaging device, comprising the black curable composition according to claim 16.

24. A solid-state imaging device, comprising the light-shielding color filter for a solid-state imaging device according to claim 23.

25. A wafer level lens, comprising, at a peripheral portion of a lens present on a substrate, a light-shielding film obtained using the black curable composition according to claim 16.

26. An infrared light-shielding film, which is formed, using the black curable composition according to claim 16, and on a silicon substrate having an imaging device section, on an opposite surface to a surface on which the imaging device is provided.

27. A solid-state imaging device, comprising the infrared light-shielding film according to claim 26 provided on a silicon substrate having an imaging device section, at an opposite surface to a surface on which the imaging device is provided.

28. A method for manufacturing an infrared light-shielding film, comprising:
- applying the black curable composition according to claim 16 to a silicon substrate having an imaging device section, on an opposite surface to a surface on which the imaging device is provided, to form a photosensitive layer;
- subjecting the photosensitive layer to pattern exposure; and
- developing the photosensitive layer after exposure to form a pattern.

29. The black curable composition according to claim 16, wherein the chain resin is a block copolymer.

\* \* \* \* \*